US011822243B2

(12) United States Patent
Tanigaki et al.

(10) Patent No.: US 11,822,243 B2
(45) Date of Patent: Nov. 21, 2023

(54) NEGATIVE-TYPE PHOTOSENSITIVE RESIN COMPOSITION, CURED FILM, ELEMENT AND DISPLAY DEVICE PROVIDED WITH CURED FILM, AND PRODUCTION METHOD THEREFOR

(71) Applicant: TORAY INDUSTRIES, INC., Tokyo (JP)

(72) Inventors: Yugo Tanigaki, Otsu (JP); Akihiro Ishikawa, Otsu (JP); Kazuto Miyoshi, Otsu (JP)

(73) Assignee: TORAY INDUSTRIES, INC., Tokyo (JP)

( * ) Notice: Subject to any disclaimer, the term of this patent is extended or adjusted under 35 U.S.C. 154(b) by 1257 days.

(21) Appl. No.: 16/333,449

(22) PCT Filed: Aug. 22, 2017

(86) PCT No.: PCT/JP2017/029877
§ 371 (c)(1),
(2) Date: Mar. 14, 2019

(87) PCT Pub. No.: WO2018/061525
PCT Pub. Date: Apr. 5, 2018

(65) Prior Publication Data
US 2019/0258164 A1 Aug. 22, 2019

(30) Foreign Application Priority Data

Sep. 30, 2016 (JP) .................................. 2016-193153

(51) Int. Cl.
*G03F 7/037* (2006.01)
*G03F 7/30* (2006.01)
(Continued)

(52) U.S. Cl.
CPC .............. *G03F 7/037* (2013.01); *C08F 20/28* (2013.01); *G02F 1/1335* (2013.01);
(Continued)

(58) Field of Classification Search
CPC .......... G03F 7/038; G03F 7/027; G03F 7/037; G03F 7/40
See application file for complete search history.

(56) References Cited

U.S. PATENT DOCUMENTS

2002/0081529 A1* 6/2002 Sonokawa ............ G03F 7/0752
430/944
2006/0159839 A1* 7/2006 Suwa ................... C08G 73/101
430/270.1
(Continued)

FOREIGN PATENT DOCUMENTS

| JP | 2002-6486 A | 1/2002 |
| JP | 2015-81935 A | 4/2015 |
| JP | 2015-111264 A | 6/2015 |

OTHER PUBLICATIONS

International Search Report, issued in PCT/JP2017/029877, PCT/ISA/210, dated Nov. 28, 2017.
(Continued)

*Primary Examiner* — John S Chu
(74) *Attorney, Agent, or Firm* — Birch, Stewart, Kolasch & Birch, LLP

(57) ABSTRACT

The present invention provides a negative-type photosensitive resin composition capable of obtaining a cured film suppressing generation of development residues caused by a pigment and having high sensitivity and excellent heat resistance and light blocking capability. A negative-type photosensitive resin composition contains an alkali-soluble resin (A), a radical-polymerizable compound (B), a photopolymerization initiator (C1), and a pigment (D1). In this resin composition, the radical-polymerizable compound (B)
(Continued)

contains a flexible chain-containing radical-polymerizable compound (B1), the flexible chain-containing radical-polymerizable compound (B1) contains a compound having (I) a structure derived from a compound having at least three hydroxyl groups in the molecule, (II) at least three ethylenically unsaturated double bond groups, and (III) at least one aliphatic chain, the aliphatic chain has an average molecular weight of 40 to 500, and the content of the pigment (D1) is 5 to 70 mass % of the total solid content.

20 Claims, 4 Drawing Sheets

(51) Int. Cl.

| | |
|---|---|
| *G03F 7/40* | (2006.01) |
| *G03F 7/027* | (2006.01) |
| *G02F 1/1335* | (2006.01) |
| *G02F 1/1339* | (2006.01) |
| *G03F 7/023* | (2006.01) |
| *G03F 7/032* | (2006.01) |
| *G03F 7/038* | (2006.01) |
| *G03F 7/075* | (2006.01) |
| *G03F 7/16* | (2006.01) |
| *G03F 7/20* | (2006.01) |
| *G03F 7/32* | (2006.01) |
| *C08F 20/28* | (2006.01) |
| *H05B 33/22* | (2006.01) |
| *H05B 33/10* | (2006.01) |
| *H05B 33/12* | (2006.01) |
| *G03F 7/105* | (2006.01) |
| *G03F 7/033* | (2006.01) |
| *H10K 50/00* | (2023.01) |
| *H10K 50/86* | (2023.01) |
| *H10K 59/122* | (2023.01) |
| *H10K 59/126* | (2023.01) |
| *H10K 85/40* | (2023.01) |
| *H10K 85/10* | (2023.01) |
| *H10K 59/12* | (2023.01) |

(52) U.S. Cl.
CPC ........ *G02F 1/1339* (2013.01); *G02F 1/13394* (2013.01); *G02F 1/133512* (2013.01); *G03F 7/027* (2013.01); *G03F 7/0233* (2013.01); *G03F 7/032* (2013.01); *G03F 7/033* (2013.01); *G03F 7/038* (2013.01); *G03F 7/0757* (2013.01); *G03F 7/105* (2013.01); *G03F 7/162* (2013.01); *G03F 7/168* (2013.01); *G03F 7/2002* (2013.01); *G03F 7/322* (2013.01); *G03F 7/40* (2013.01); *H05B 33/10* (2013.01); *H05B 33/12* (2013.01); *H05B 33/22* (2013.01); *H10K 50/00* (2023.02); *H10K 50/865* (2023.02); *H10K 59/122* (2023.02); *H10K 59/126* (2023.02); *H10K 85/111* (2023.02); *H10K 85/141* (2023.02); *H10K 85/40* (2023.02); *G02F 1/13398* (2021.01); *H10K 59/1201* (2023.02)

(56) References Cited

U.S. PATENT DOCUMENTS

| | | | |
|---|---|---|---|
| 2011/0028587 A1 | 2/2011 | Taguchi | |
| 2013/0327399 A1* | 12/2013 | Takanashi | H01L 31/049 |
| | | | 427/407.1 |
| 2014/0011125 A1* | 1/2014 | Inoue | C09D 11/324 |
| | | | 430/7 |
| 2015/0153646 A1 | 6/2015 | Hsieh et al. | |
| 2015/0253464 A1* | 9/2015 | Tseng | G03F 7/105 |
| | | | 252/586 |
| 2015/0293282 A1* | 10/2015 | Takishita | G02B 5/208 |
| | | | 430/7 |
| 2015/0366055 A1* | 12/2015 | Araki | B32B 27/281 |
| | | | 174/255 |
| 2016/0161847 A1* | 6/2016 | Araki | G03F 7/0035 |
| | | | 430/7 |

OTHER PUBLICATIONS

Written Opinion of the International Searching Authority, issued in PCT/JP2017/029877, PCT/ISA/237, dated Nov. 28, 2017.

\* cited by examiner

NEGATIVE-TYPE PHOTOSENSITIVE RESIN COMPOSITION, CURED FILM, ELEMENT AND DISPLAY DEVICE PROVIDED WITH CURED FILM, AND PRODUCTION METHOD THEREFOR

TECHNICAL FIELD

The present invention relates to a negative-type photosensitive resin composition and a cured film, an element, and a display device that use the same and to a production method for the display device.

BACKGROUND ART

In recent years, many display products, such as mobile phones, tablet PCs, and TV sets, incorporating thin organic electroluminescence (hereinafter abbreviated as "EL") display devices have been developed.

In general, an organic EL display device has a transparent electrode of, for example, indium tin oxide (hereinafter abbreviated as ITO) on the light extraction side of the light emitting element and a metal electrode of, for example, an alloy of magnesium and silver on the other side than the light extraction side of the light emitting element. Furthermore, in order to divide pixels of the light emitting element, an insulating layer called a pixel dividing layer is formed between the transparent electrode layer and the metal electrode layer. After forming the pixel dividing layer, a film of a light emitting material is formed by vapor deposition through a deposition mask to produce a light emitting layer in a region, which will act as a pixel region, where an opening is formed in the pixel dividing layer to expose the lower layer which is either a transparent electrode or a metal electrode. The transparent electrode or the metal electrode is normally formed by sputtering, but in order to prevent disconnection of the transparent electrode or the metal electrode formed, the pixel dividing layer is required to have a small-tapered pattern shape.

An organic EL display device has a self-luminous element that emits light using energy generated from recombination of electrons injected from the cathode and holes injected from the anode. Therefore, if there exists a substance that inhibits the movement of the electrons or holes or a substance working to form an energy level that inhibits the recombination of the electrons and holes, the luminous efficiency of the light emitting element will deteriorate or the light emitting material will be deactivated, leading to a shortened life of the light emitting element. The pixel dividing layer is formed at a position neighboring to the light emitting element, and accordingly degassing from the pixel dividing layer or an outflow of ion components can cause a decrease in the life of the organic EL display device. Therefore, the pixel dividing layer needs to have high heat resistance.

Furthermore, because the organic EL display device is a self-luminous element, incidence of external light, such as sun light outdoors, reduces visibility and contrast due to reflection of the external light. Therefore, a technology that reduces external light reflection is required.

As a technology that cuts off external light and reduces external light reflection, a black matrix used for a color filter in a liquid crystal display device can be cited. That is, this is a technology that uses a photosensitive resin composition containing a coloring agent such as a pigment to form a pixel dividing layer that has a light blocking capability, so that external light reflection is reduced (see, for example, Patent Literature 1).

CITATION LIST

Patent Literature

Patent Literature 1: JP 2015-111264 A

SUMMARY OF INVENTION

Technical Problem

However, when a pigment or the like as a coloring agent is contained in order to give the light blocking capability to the photosensitive resin composition, as the content of the pigment is increased, ultraviolet ray or the like at the time of pattern exposure is blocked, so that sensitivity upon exposure decreases. Accordingly, none of the conventionally known photosensitive resin compositions containing pigments have required characteristics to serve as a material for forming a pixel dividing layer of an organic EL display device. Specifically, these photosensitive resin compositions lacked in sensitivity, heat resistance, or light blocking capability.

In addition, when a pigment is contained in the photosensitive resin composition in order to improve the light blocking capability, the pigment is peeled off from a cured portion during alkali development, so that development residues caused by the pigment remain in an opening. Further, as the content of the pigment is increased, the development residues caused by the pigment also increase, and therefore, there has been a problem that it is difficult to achieve the light blocking capability and at the same time suppress the development residues.

Furthermore, the development residues caused by the pigment have also been a problem that they cause defects of an organic EL light emitting element, such as generation of dark spots in a light emitting region when the organic EL light emitting element is formed.

Thus, an object of the present invention is to obtain a negative-type photosensitive resin composition having high sensitivity, capable of obtaining a cured film excellent in heat resistance and light blocking capability, and capable of suppressing generation of development residues caused by a pigment.

Solution to Problem

A negative-type photosensitive resin composition according to the present invention is a negative-type photosensitive resin composition containing an alkali-soluble resin (A), a radical-polymerizable compound (B), a photopolymerization initiator (C1), and a pigment (D1).

In this resin composition, the radical-polymerizable compound (B) contains a flexible chain-containing radical-polymerizable compound (B1), the flexible chain-containing radical-polymerizable compound (B1) contains a compound having (I) a structure derived from a compound having at least three hydroxyl groups in the molecule, (II) at least three ethylenically unsaturated double bond groups, and (III) at least one aliphatic chain, the aliphatic chain has an average molecular weight of 40 to 500, and the content of the pigment (D1) is 5 to 70 mass % of the total solid content.

Advantageous Effects of Invention

According to the negative-type photosensitive resin composition according to the present invention, it is possible to obtain a cured film suppressing generation of development residues caused by a pigment and having high sensitivity and excellent heat resistance and light blocking capability.

DESCRIPTION OF EMBODIMENTS

Figure 1:
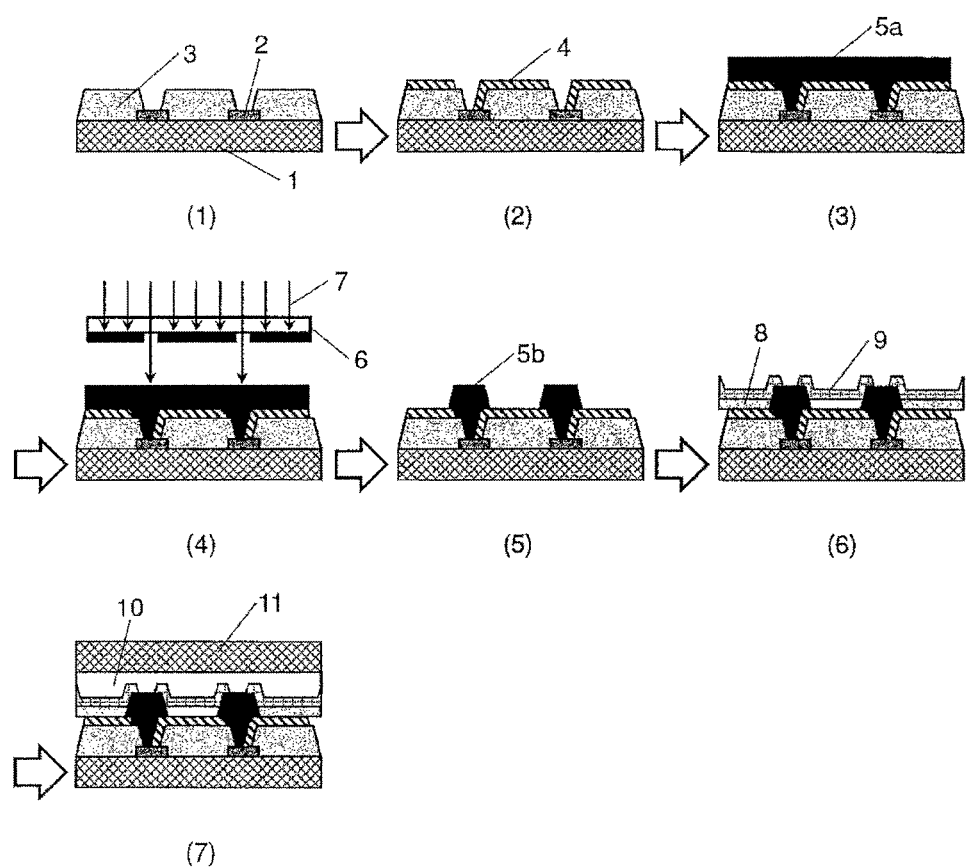
FIGS. 1(1) to (7) are processing diagrams exemplifying a production process of an organic EL display device that uses a cured film of a negative-type photosensitive resin composition according to the present invention.

The negative-type photosensitive resin composition according to the present invention is a negative-type photosensitive resin composition containing an alkali-soluble resin (A), a radical-polymerizable compound (B), a photopolymerization initiator (C1), and a pigment (D1).

In this resin composition, the radical-polymerizable compound (B) contains a flexible chain-containing radical-polymerizable compound (B1),
the flexible chain-containing radical-polymerizable compound (B1) contains a compound having (I) a structure derived from a compound having at least three hydroxyl groups in the molecule, (II) at least three ethylenically unsaturated double bond groups, and (III) at least one aliphatic chain,
the aliphatic chain has an average molecular weight of 40 to 500, and
the content of the pigment (D1) is 5 to 70 mass % of the total solid content.
<(A) First Resin>
The negative-type photosensitive resin composition according to the present invention preferably contains at least a first resin (A1) as the alkali-soluble resin (A) and at least one selected from the group consisting of a polyimide (A1-1), a polyimide precursor (A1-2), polybenzoxazole (A1-3), and a polybenzoxazole precursor (A1-4) as the first resin (A1).

In the present invention, the polyimide (A1-1), the polyimide precursor (A1-2), the polybenzoxazole (A1-3), and the polybenzoxazole precursor (A1-4) may each be a single resin or copolymers thereof.
<Polyimide (A1-1) and Polyimide Precursor (A1-2)>
Examples of the polyimide precursor (A1-2) include products of a reaction between a tetracarboxylic acid or a corresponding tetracarboxylic acid dianhydride, a tetracarboxylic acid diester dichloride, or the like and a diamine or a corresponding diisocyanate compound, trimethyl-silylated diamine, or the like, which contain a tetracarboxylic acid residue and/or a derivative residue thereof and also contain a diamine residue and/or a derivative residue thereof. Examples of the polyimide precursor (A1-2) include polyamic acid, polyamic acid ester, polyamic acid amide, or polyisoimide.

Examples of the polyimide (A1-1) include compounds formed by subjecting the aforementioned polyamic acid, polyamic acid ester, polyamic acid amide, or polyisoimide to dehydration and cyclization by heating or through a reaction using an acid or base, which contain a tetracarboxylic acid residue and/or a derivative residue thereof and also contain a diamine residue and/or a derivative residue thereof.

The polyimide precursor (A1-2) is a thermosetting resin that can be converted into a polyimide (A1-1) by heat-curing at a high temperature to cause dehydration and cyclization, thereby forming highly heat resistant imide bonds. Accordingly, the incorporation of a polyimide (A1-1), which contains highly heat resistant imide bonds, in the resin composition ensures the production of a cured film having a considerably improved heat resistance. Therefore, such a cured film is suited to applications that require high heat resistance. Furthermore, since the polyimide precursor (A1-2) is a resin that increases in heat resistance when dehydrated and cyclized, such a resin is preferred when a precursor having a structure with particular characteristics before dehydration and cyclization and forming a cured film with high heat resistance thereafter is desired.

In addition, the polyimide (A1-1) and polyimide precursor (A1-2) contain an imide bond and/or an amide bond that have polarity. Accordingly, if a pigment (D1) in particular is added as the coloring agent (D) which will be described later, these polar bonds interact strongly with the pigment (D1) to improve the dispersion stability of the pigment (D1).

From the viewpoint of obtaining a cured film having an improved heat resistance, it is preferable for the polyimide (A1-1) used for the present invention to contain a structural unit as represented by the following general formula (1):

[Chemical formula 1]

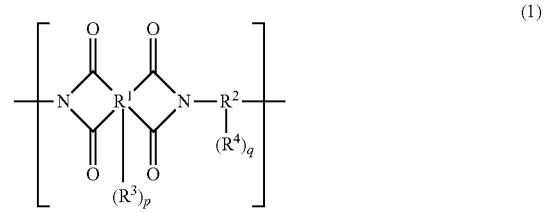

In general formula (1), $R^1$ is a tetravalent to decavalent organic group, and $R^2$ is a divalent to decavalent organic group. $R^3$ and $R^4$ are independently a phenolic hydroxyl group, a sulfonic acid group, a mercapto group, or a substituent group as represented by general formula (5) or general formula (6). Furthermore, p is an integer of 0 to 6 and q is an integer of 0 to 8.

In general formula (1), $R^1$ is a tetracarboxylic acid residue and/or a derivative residue thereof and $R^2$ is a diamine residue and/or a derivative residue thereof. Examples of such a tetracarboxylic acid derivative include tetracarboxylic acid dianhydride, tetracarboxylic acid dichloride, and tetracarboxylic acid active diester. Examples of such a diamine derivative include diisocyanate compounds and trimethyl-silylated diamine.

In general formula (1), $R^1$ is preferably a tetravalent to decavalent organic group having one or more selected from the group consisting of an aliphatic structure containing 2 to 20 carbon atoms, an alicyclic structure containing 4 to 20 carbon atoms, and an aromatic structure containing 6 to 30 carbon atoms, more preferably a tetravalent to decavalent organic group having one or more selected from the group consisting of an aliphatic structure containing 4 to 15 carbon atoms, an alicyclic structure containing 4 to 15 carbon atoms, and an aromatic structure containing 6 to 25 carbon atoms. On the other hand, $R^2$ is preferably a divalent to decavalent organic group having one or more selected from the group consisting of an aliphatic structure containing 2 to 20 carbon atoms, an alicyclic structure containing 4 to 20 carbon atoms, and an aromatic structure containing 6 to 30 carbon atoms, more preferably a divalent to decavalent organic group having one or more selected from the group consisting of an aliphatic structure containing 4 to 15 carbon atoms, an alicyclic structure containing 4 to 15 carbon atoms, and an aromatic structure containing 6 to 25 carbon atoms. Furthermore, q is preferably 1 to 8. The aforementioned aliphatic structures, alicyclic structures, and aromatic structures may each contain a heteroatom and may each be a substitution product or a non-substitution product.

[Chemical formula 2]

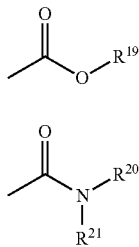

(5)

(6)

In general formulae (5) and (6), $R^{19}$ to $R^{21}$ each independently denote a hydrogen atom, an alkyl group containing 1 to 10 carbon atoms, an acyl group containing 2 to 6 carbon atoms, or an aryl group containing 6 to 15 carbon atoms. In general formulae (5) and (6), it is preferable that $R^{19}$ to $R^{21}$ each independently denote a hydrogen atom, an alkyl group containing 1 to 6 carbon atoms, an acyl group containing 2 to 4 carbon atoms, or an aryl group containing 6 to 10 carbon atoms. The above alkyl group, acyl group, and aryl group may each be either a substitution product or a non-substitution product.

It is preferable for the polyimide (A1-1) to contain a structural unit as represented by general formula (1) as primary component, and it is preferable for the structural units as represented by general formula (1) to account for 50 to 100 mol %, more preferably 60 to 100 mol %, and still more preferably 70 to 100 mol %, of all structural units derived from carboxylic acids and derivatives thereof in the polyimide (A1-1). When the content is 50 to 100 mol %, it is possible to improve heat resistance of a cured film.

From the viewpoint of obtaining a cured film with an improved heat resistance and ensuring an improved resolution after development, it is preferable for the polyimide precursor (A1-2) used for the present invention to contain a structural unit as represented by the following general formula (3):

[Chemical formula 3]

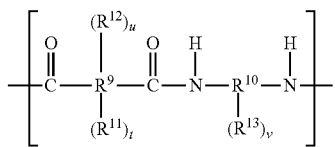

(3)

In general formula (3), $R^9$ is a tetravalent to decavalent organic group, and $R^{10}$ is a divalent to decavalent organic group. $R^{11}$ is a substituent group as represented by general formula (5) or general formula (6) given above; $R^{12}$ is a phenolic hydroxyl group, a sulfonic acid group, or a mercapto group; and $R^{13}$ is a phenolic hydroxyl group, a sulfonic acid group, a mercapto group, or a substituent group as represented by general formula (5) given above or general formula (6) given above. Furthermore, t is an integer of 2 to 8; u is an integer of 0 to 6; v is an integer of 0 to 8; and $2 \leq t+u \leq 8$.

In general formula (3), $R^9$ is a tetracarboxylic acid residue and/or a derivative residue thereof and $R^{10}$ is a diamine residue and/or a derivative residue thereof. Examples of such a tetracarboxylic acid derivative include tetracarboxylic acid dianhydride, tetracarboxylic acid dichloride, and tetracarboxylic acid active diester. Examples of such a diamine derivative include diisocyanate compounds and trimethyl-silylated diamine.

In general formula (3), $R^9$ is preferably a tetravalent to decavalent organic group having one or more selected from the group consisting of an aliphatic structure containing 2 to 20 carbon atoms, an alicyclic structure containing 4 to 20 carbon atoms, and an aromatic structure containing 6 to 30 carbon atoms, more preferably a tetravalent to decavalent organic group having one or more selected from the group consisting of an aliphatic structure containing 4 to 15 carbon atoms, an alicyclic structure containing 4 to 15 carbon atoms, and an aromatic structure containing 6 to 25 carbon atoms. On the other hand, $R^{10}$ is preferably a divalent to decavalent organic group having one or more selected from the group consisting of an aliphatic structure containing 2 to 20 carbon atoms, an alicyclic structure containing 4 to 20 carbon atoms, and an aromatic structure containing 6 to 30 carbon atoms, more preferably a divalent to decavalent organic group having one or more selected from the group consisting of an aliphatic structure containing 4 to 15 carbon atoms, an alicyclic structure containing 4 to 15 carbon atoms, and an aromatic structure containing 6 to 25 carbon atoms. Furthermore, v is preferably 1 to 8. The aforementioned aliphatic structures, alicyclic structures, and aromatic structures may each contain a heteroatom and may each be a substitution product or a non-substitution product.

It is preferable for the polyimide precursor (A1-2) to contain a structural unit as represented by general formula (3) as primary component, and it is preferable for the structural units as represented by general formula (3) to account for 50 to 100 mol %, more preferably 60 to 100 mol %, and still more preferably 70 to 100 mol %, of all structural units derived from carboxylic acids and derivatives thereof in the polyimide precursor (A1-2). When the content is 50 to 100 mol %, it is possible to improve resolution.

<(A1-3) Polybenzoxazole and (A1-4) Polybenzoxazole Precursor>

Examples of the polybenzoxazole precursor (A1-4) include products of a reaction between dicarboxylic acid, or a corresponding dicarboxylic acid dichloride, dicarboxylic acid active diester, or the like and a diamine such as a bisaminophenol compound, which contain a dicarboxylic acid residue and/or a derivative residue thereof and also contain a bisaminophenol compound residue and/or a derivative residue thereof. Examples of the polybenzoxazole precursor (A1-4) include polyhydroxyamide.

Examples of the polybenzoxazole (A1-3) include compounds produced by dehydrating and cyclizing dicarboxylic acid and a bisaminophenol compound, used as diamine, through a reaction using polyphosphoric acid and those produced by dehydrating and cyclizing the aforementioned polyhydroxyamide by heating or through a reaction using phosphoric acid anhydride, a base, or a carbodiimide compound, which contain a dicarboxylic acid residue and/or a derivative residue thereof and also contain a bisaminophenol compound residue and/or a derivative residue thereof.

The polybenzoxazole precursor (A1-4) is a thermosetting resin that can be converted into a polybenzoxazole (A1-3) by heat-curing at a high temperature to cause dehydration and cyclization, thereby forming highly heat resistant rigid benzoxazole rings. Accordingly, the incorporation of polybenzoxazole (A1-3), which contains highly heat resistant rigid benzoxazole rings, in the resin composition ensures the production of a cured film having considerably improved heat resistance. Therefore, such a cured film is suited to applications that require high heat resistance. Furthermore, since the polybenzoxazole precursor (A1-4) is a resin that increases in heat resistance when dehydrated and cyclized, such a resin is preferred when a precursor having a structure with particular characteristics before dehydration and cyclization and forming a cured film with high heat resistance thereafter is desired.

In addition, the polybenzoxazole (A1-3) and polybenzoxazole precursor (A1-4) have an oxazole bond and/or an amide bond that have polarity. Accordingly, if a pigment (D1) in particular is added as the coloring agent (D) which will be described later, these polar bonds interact strongly with the pigment (D1) to improve the dispersion stability of the pigment (D1).

From the viewpoint of obtaining a cured film having an improved heat resistance, it is preferable for a polybenzoxazole (A1-3) used for the present invention to contain a structural unit as represented by general formula (2):

[Chemical formula 4]

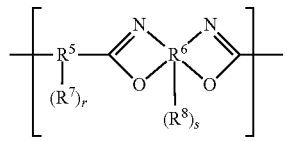

(2)

In general formula (2), $R^5$ is a divalent to decavalent organic group, and $R^6$ is a tetravalent to decavalent organic group having an aromatic structure. $R^7$ and $R^8$ are each independently a phenolic hydroxyl group, a sulfonic acid group, a mercapto group, or a substituent group as represented by general formula (5) given above or general formula (6) given above. Furthermore, r is an integer of 0 to 8 and s is an integer of 0 to 6.

In general formula (2), $R^5$ is a dicarboxylic acid residue and/or a derivative residue thereof and $R^6$ is a bisaminophenol compound residue and/or a derivative residue thereof. Examples of the dicarboxylic acid derivatives include dicarboxylic acid anhydride, dicarboxylic acid chloride, dicarboxylic acid active ester, tricarboxylic acid anhydride, tricarboxylic acid chloride, tricarboxylic acid active ester, and diformyl compounds.

In general formula (2), $R^5$ is preferably a divalent to decavalent organic group having one or more selected from the group consisting of an aliphatic structure containing 2 to 20 carbon atoms, an alicyclic structure containing 4 to 20 carbon atoms, and an aromatic structure containing 6 to 30 carbon atoms, more preferably a divalent to decavalent organic group having one or more selected from the group consisting of an aliphatic structure containing 4 to 15 carbon atoms, an alicyclic structure containing 4 to 15 carbon atoms, and an aromatic structure containing 6 to 25 carbon atoms. On the other hand, $R^6$ is preferably a tetravalent to decavalent organic group having an aromatic structure containing 6 to 30 carbon atoms, more preferably a tetravalent to decavalent organic group having an aromatic structure containing 6 to 25 carbon atoms. Furthermore, s is preferably 1 to 8. The aforementioned aliphatic structures, alicyclic structures, and aromatic structures may each contain a heteroatom and may each be a substitution product or a non-substitution product.

It is preferable for the polybenzoxazole (A1-3) to contain a structural unit as represented by general formula (2) as primary component, and it is preferable for the structural units as represented by general formula (2) to account for 50 to 100 mol %, more preferably 60 to 100 mol %, and still more preferably 70 to 100 mol %, of all structural units derived from amines and derivatives thereof in the polybenzoxazole (A1-3). When the content is 50 to 100 mol %, it is possible to improve heat resistance of a cured film.

From the viewpoint of obtaining a cured film with an improved heat resistance and ensuring an improved resolution after development, it is preferable for the polybenzoxazole precursor (A1-4) used for the present invention to contain a structural unit as represented by general formula (4):

[Chemical formula 5]

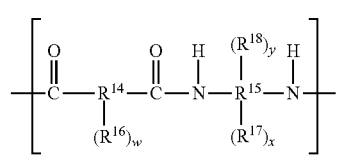

(4)

In general formula (4), $R^{14}$ is a divalent to decavalent organic group, and $R^{15}$ is a tetravalent to decavalent organic group having an aromatic structure. $R^{16}$ is a phenolic hydroxyl group, a sulfonic acid group, a mercapto group, or a substituent group as represented by general formula (5) or general formula (6) given above; $R^{17}$ is a phenolic hydroxyl group; and $R^{18}$ is a sulfonic acid group, a mercapto group, or a substituent group as represented by general formula (5) given above or general formula (6) given above. Furthermore, w is an integer of 0 to 8; x is an integer of 2 to 8; y is an integer of 0 to 6; and $2 \leq x+y \leq 8$.

In general formula (4), $R^{14}$ is a dicarboxylic acid residue and/or a derivative residue thereof and $R^{15}$ is a bisaminophenol compound residue and/or a derivative residue thereof. Examples of the dicarboxylic acid derivatives include dicarboxylic acid anhydride, dicarboxylic acid chloride, dicarboxylic acid active ester, tricarboxylic acid anhydride, tricarboxylic acid chloride, tricarboxylic acid active ester, and diformyl compounds.

In general formula (4), R is preferably a divalent to decavalent organic group having one or more selected from the group consisting of an aliphatic structure containing 2 to 20 carbon atoms, an alicyclic structure containing 4 to 20 carbon atoms, and an aromatic structure containing 6 to 30 carbon atoms, more preferably a divalent to decavalent organic group having one or more selected from the group consisting of an aliphatic structure containing 4 to 15 carbon atoms, an alicyclic structure containing 4 to 15 carbon atoms, and an aromatic structure containing 6 to 25 carbon atoms. On the other hand, $R^{15}$ is preferably a tetravalent to decavalent organic group having an aromatic structure containing 6 to 30 carbon atoms, more preferably a tetravalent to decavalent organic group having an aromatic structure containing 6 to 25 carbon atoms. The aforementioned aliphatic structures, alicyclic structures, and aromatic structures may each contain a heteroatom and may each be a substitution product or a non-substitution product.

It is preferable for the polybenzoxazole precursor (A1-4) to contain a structural unit as represented by general formula (4) as primary component, and it is preferable for the structural units as represented by general formula (4) to account for 50 to 100 mol %, more preferably 60 to 100 mol %, and still more preferably 70 to 100 mol %, of all structural units derived from amines and derivatives thereof in the polybenzoxazole precursor (A1-4). When the content is 50 to 100 mol %, it is possible to improve resolution.

<Tetracarboxylic Acid and Dicarboxylic Acid and Derivatives Thereof>

Examples of the tetracarboxylic acid include aromatic tetracarboxylic acid, alicyclic tetracarboxylic acid, and aliphatic tetracarboxylic acid. These tetracarboxylic acids may contain a heteroatom in addition to the oxygen atoms in the carboxyl group.

Examples of the aromatic tetracarboxylic acid and a derivative thereof include 1,2,4,5-benzenetetracarboxylic acid (pyromellitic acid), 3,3',4,4'-biphenyltetracarboxylic acid, 2,3,3',4'-biphenyltetracarboxylic acid, 2,2',3,3'-biphenyltetracarboxylic acid, 1,2,5,6-naphthalenetetracarboxylic acid, 1,4,5,8-naphthalenetetracarboxylic acid, 2,3,6,7-naphthalenetetracarboxylic acid, 3,3',4,4'-benzophenonetetracarboxylic acid, 2,2',3,3'-benzophenonetetracarboxylic acid, bis(3,4-dicarboxyphenyl) methane, bis(2,3-dicarboxyphenyl) methane, 1,1-bis(3,4-dicarboxyphenyl) ethane, 1,1-bis(2,3-dicarboxyphenyl) ethane, 2,2-bis(3,4-dicarboxyphenyl) propane, 2,2-bis(2,3-dicarboxyphenyl) propane, 2,2-bis[4-(3,4-dicarboxyphenoxy) phenyl] propane, 2,2-bis(3,4-dicarboxyphenyl) hexafluoropropane, 2,2-bis(2,3-dicarboxyphenyl) hexafluoropropane, bis(3,4-dicarboxyphenyl) sulfone, bis(3,4-dicarboxyphenyl) ether, 2,3,5,6-pyridinetetracarboxylic acid, 3,4,9,10-perylenetetracarboxylic acid, N,N'-bis[5,5'-hexafluoropropane-2,2-diyl-bis(2-hydroxyphenyl)] bis(3,4-dicarboxybenzoic acid amide), and other similar compounds having structures as described below, as well as tetracarboxylic acid dianhydrides thereof, tetracarboxylic acid dichlorides thereof, and tetracarboxylic acid active diesters thereof.

[Chemical formula 6]

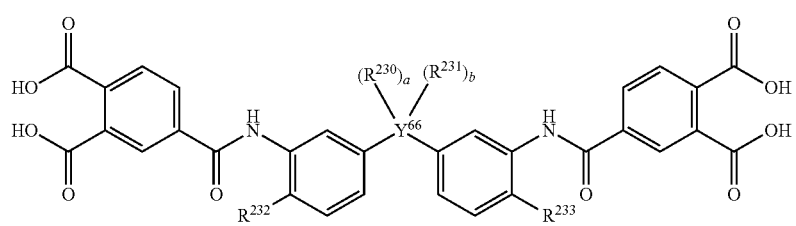

$Y^{66}$ is a direct bond, an oxygen atom, or an alkylene chain containing 1 to 4 carbon atoms. When $Y^{66}$ is a direct bond or oxygen atom, a and b are 0. When $Y^{66}$ is an alkylene chain containing 1 to 4 carbon atoms, $R^{230}$ and $R^{231}$ are each independently a hydrogen atom, an alkyl group containing 1 to 4 carbon atoms, an alkyl group containing 1 to 4 carbon atoms and 1 to 8 fluorine atoms. $R^{232}$ and $R^{233}$ are each independently a hydrogen atom, an alkyl group containing 1 to 4 carbon atoms, or a hydroxyl group. Furthermore, a and b are each independently an integer of 0 to 4. The above alkylene chains and alkyl groups may each be either a substitution product or a non-substitution product.

Examples of the alicyclic tetracarboxylic acid and a derivative thereof include bicyclo[2.2.2]octane-7-ene-2,3,5,6-tetracarboxylic acid, 1,2,4,5-cyclohexanetetracarboxylic acid, 1,2,3,4-cyclopentanetetracarboxylic acid, 1,2,3,4-cyclobutanetetracarboxylic acid, and 2,3,4,5-tetrahydrofurantetracarboxylic acid, as well as tetracarboxylic acid dianhydrides thereof, tetracarboxylic acid dichlorides thereof, and tetracarboxylic acid active diesters thereof.

Examples of the aliphatic tetracarboxylic acid and a derivative thereof include butane-1,2,3,4-tetracarboxylic acid, tetracarboxylic acid dianhydrides thereof, tetracarboxylic acid dichlorides thereof, and tetracarboxylic acid active diesters thereof.

A tricarboxylic acid and/or a derivative thereof may be used as the dicarboxylic acid and a derivative thereof in the polybenzoxazole (A1-3) and polybenzoxazole precursor (A1-4).

Examples of the dicarboxylic acid and the tricarboxylic acid include aromatic dicarboxylic acid, aromatic tricarboxylic acid, alicyclic dicarboxylic acid, alicyclic tricarboxylic acid, aliphatic dicarboxylic acid, and aliphatic tricarboxylic acid. These dicarboxylic acids and tricarboxylic acids may contain a non-oxygen heteroatom in addition to the oxygen atoms in the carboxyl group.

Examples of the aromatic dicarboxylic acid and a derivative thereof include phthalic acid, isophthalic acid, terephthalic acid, 4,4'-dicarboxybiphenyl, 2,2'-bis(trifluoromethyl)-4,4'-dicarboxybiphenyl, 4,4'-benzophenonedicarboxylic acid, 2,2-bis(4-carboxyphenyl) hexafluoropropane, 2,2-bis(3-carboxyphenyl) hexafluoropropane, and 4,4'-dicarboxydiphenyl ether, as well as dicarboxylic acid anhydrides thereof, dicarboxylic acid chlorides thereof, dicarboxylic acid active esters thereof, and diformyl compounds thereof.

Examples of the aromatic tricarboxylic acid and a derivative thereof include 1,2,4-benzenetricarboxylic acid, 1,3,5-benzenetricarboxylic acid, 2,4,5-benzophenonetricarboxylic acid, 2,4,4'-biphenyltricarboxylic acid, and 3,3',4'-tricarboxydiphenyl ether, as well as tricarboxylic acid anhydrides thereof, tricarboxylic acid chlorides thereof, tricarboxylic acid active esters thereof, and diformyl monocarboxylic acids thereof.

Examples of the alicyclic dicarboxylic acid and a derivative thereof include tetrahydrophthalic acid, 3-methyltetrahydrophthalic acid, 4-methylhexahydrophthalic acid, 1,4-cyclohexanedicarboxylic acid, and 1,2-cyclohexanedicarboxylic acid, as well as dicarboxylic acid anhydrides thereof, dicarboxylic acid chlorides thereof, dicarboxylic acid active esters thereof, and diformyl compounds thereof.

Examples of the alicyclic tricarboxylic acid and a derivative thereof include 1,2,4-cyclohexanetricarboxylic acid and 1,3,5-cyclohexanetricarboxylic acid, as well as tricarboxylic acid anhydrides thereof, tricarboxylic acid chlorides thereof, tricarboxylic acid active esters thereof, and diformylmonocarboxylic acids thereof.

Examples of the aliphatic dicarboxylic acid and a derivative thereof include itaconic acid, maleic acid, fumaric acid, malonic acid, succinic acid, and hexane-1,6-dicarboxylic acid, as well as dicarboxylic acid anhydrides thereof, dicarboxylic acid chlorides thereof, dicarboxylic acid active esters thereof, and diformyl compounds thereof.

Examples of the aliphatic tricarboxylic acid and a derivative thereof include hexane-1,3,6-tricarboxylic acid and propane-1,2,3-tricarboxylic acid, as well as tricarboxylic acid anhydrides thereof, tricarboxylic acid chlorides thereof, tricarboxylic acid active esters thereof, and diformylmonocarboxylic acids thereof.

<Diamine and Derivative Thereof>

Examples of diamines and derivatives thereof include aromatic diamine, bisaminophenol compounds, alicyclic diamine, alicyclic dihydroxydiamine, aliphatic diamine, and aliphatic dihydroxydiamine. These diamines and derivatives thereof may contain a heteroatom in addition to the nitrogen atoms and oxygen atoms in the amino groups and derivatives thereof.

Examples of the aromatic diamine, bisaminophenol compounds, and derivatives thereof include m-phenylene diamine, p-phenylene diamine, 1,4-bis(4-aminophenoxy) benzene, 4,4'-diaminobiphenyl, bis(4-aminophenoxy) biphenyl, 2,2'-dimethyl-4,4'-diaminobiphenyl, 2,2'-diethyl-4,4'-diaminobiphenyl, 3,3'-dimethyl-4,4'-diaminobiphenyl, 3,3'-diethyl-4,4'-diaminobiphenyl, 2,2',3,3'-tetramethyl-4,4'-diaminobiphenyl, 3,3',4,4'-tetramethyl-4,4'-diaminobiphenyl, 2,2'-bis(trifluoromethyl)-4,4'-diaminobiphenyl, 3,3'-diamino-4,4'-biphenol, 1,5-naphthalene diamine, 2,6-naphthalene diamine, 9,9-bis(3-amino-4-hydroxyphenyl) fluorene, 3,4'-diaminodiphenyl methane, 4,4'-diaminodiphenyl methane, bis(3-amino-4-hydroxyphenyl) methane, 1,1-bis(3-amino-4-hydroxyphenyl) ethane, 2,2-bis(3-amino-4-hydroxyphenyl) propane, 2,2-bis(4-aminophenyl) hexafluoropropane, 2,2-bis(3-amino-4-hydroxyphenyl) hexafluoropropane, 3,4'-diaminodiphenyl sulfone, 4,4'-diaminodiphenyl sulfone, bis(4-aminophenoxy phenyl) sulfone, bis(3-aminophenoxyphenyl) sulfone, bis(3-amino-4-hydroxyphenyl) sulfone, 3,4'-diaminodiphenyl sulfide, 4,4'-diaminodiphenyl sulfide, 3,4'-diaminodiphenyl ether, 4,4'-diaminodiphenyl ether, bis[4-(4-aminophenoxy) phenyl] ether, bis(3-amino-4-hydroxyphenyl) ether, 3-sulfonic 4,4'-diaminodiphenyl ether, dimercaptophenylene diamine, N,N'-bis[5,5'-hexafluoropropane-2,2-diyl-bis(2-hydroxyphenyl)] bis(3-aminobenzoic acid amide), and other similar compounds having structures as described below, as well as diisocyanate compounds thereof and trimethyl-silylated diamines thereof.

[Chemical formula 7]

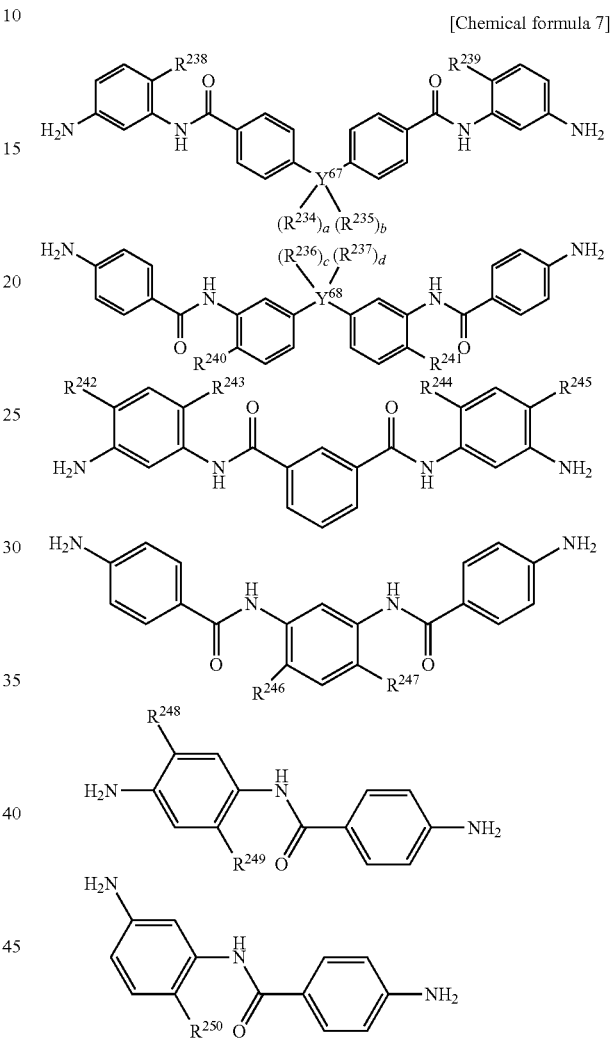

$Y^{67}$ and $Y^{68}$ are each independently a direct bond, an oxygen atom, or an alkylene chain containing 1 to 4 carbon atoms. When $Y^{67}$ and $Y^{68}$ are each a direct bond or an oxygen atom, a, b, c, and d are 0. When $Y^{67}$ and $Y^{68}$ are each an alkylene chain containing 1 to 4 carbon atoms, $R^{234}$ and $R^{237}$ are each independently a hydrogen atom, an alkyl group containing 1 to 4 carbon atoms, or an alkyl group containing 1 to 4 carbon atoms and 1 to 8 fluorine atoms. $R^{238}$ and $R^{250}$ are each independently a hydrogen atom, an alkyl group containing 1 to 4 carbon atoms, or a hydroxyl group. Furthermore, a, b, c, and d are each independently an integer of 0 to 4. The above alkylene chains and alkyl groups may each be either a substitution product or a non-substitution product.

Examples of the alicyclic diamines, alicyclic dihydroxydiamines, and derivative thereof include 1,2-cyclohexane diamine, 1,4-cyclohexane diamine, bis(4-aminocyclohexyl) methane, 3,6-dihydroxy-1,2-cyclohexane diamine, 2,5-dihydroxy-1,4-cyclohexane diamine, and bis(3-hydroxy-4-aminocyclohexyl) methane, as well as diisocyanate compounds thereof and trimethyl-silylated diamines.

Examples of the aliphatic diamines, aliphatic dihydroxydiamines, and derivatives thereof include 1,6-hexamethylene diamine and 2,5-dihydroxy-1,6-hexamethylene diamine, as well as diisocyanate compounds thereof and trimethyl-silylated diamines.

<Structural Unit Having Fluorine Atom>

It is preferable for one or more selected from the group consisting of the polyimide (A1-1), the polyimide precursor (A1-2), the polybenzoxazole (A1-3), and the polybenzoxazole precursor (A1-4) to contain a structural unit having a fluorine atom. The incorporation of a structural unit having a fluorine atom in one or more selected from the group consisting of the polyimide (A1-1), the polyimide precursor (A1-2), the polybenzoxazole (A1-3), and the polybenzoxazole precursor (A1-4) ensures an improved transparency and an improved sensitivity during light exposure. This also works to allow the film surface to have water repellency and depress the infiltration through the film surface during alkali development. The light exposure referred to here means the application of active actinic ray (radiation), such as the application of, for example, visible light, ultraviolet ray, electron beam, or X-ray. In view of generally used light sources, it is preferable to use an ultra-high pressure mercury lamp type light source that emits visible light, ultraviolet ray, etc., more preferably a light source that emits j-line (wavelength 313 nm), i-line (wavelength 365 nm), h-line (wavelength 405 nm), or g-line (wavelength 436 nm). Hereinafter, the term exposure means the application of active actinic ray (radiation).

In general, when using the polyimide (A1-1), the polyimide precursor (A1-2), the polybenzoxazole (A1-3), and/or the polybenzoxazole precursor (A1-4), it is necessary to use a high polarity solvent such as N-methyl-2-pyrrolidone, dimethyl sulfoxide, N,N-dimethyl formamide, and γ-butyrolactone, as the solvent described later to be used for dissolving these resins. However, if a pigment (D1) in particular is added as the coloring agent (D) described later, these high polarity solvents interact strongly with the pigment (D1), possibly deteriorating the dispersion stability improving effect of the first resin (A1), the second resin (A2) described later, or the dispersant (E) described later.

If one or more selected from the group consisting of the polyimide (A1-1), the polyimide precursor (A1-2), the polybenzoxazole (A1-3), and the polybenzoxazole precursor (A1-4) have a structural unit having a fluorine atom, it can work to improve the solubility in the solvent. Accordingly, this makes it possible to dissolve these resins with a reduced quantity of the aforementioned high polarity solvent or without using the high polarity solvent, serving to improve the dispersion stability of the pigment (D1).

Examples of such a structural unit having a fluorine atom contained in a polyimide (A1-1) and/or polyimide precursor (A1-2) include a structural unit derived from a tetracarboxylic acid having a fluorine atom and/or a derivative thereof, and a structural unit derived from a diamine having a fluorine atom and/or a derivative thereof.

Examples of such a structural unit having a fluorine atom contained in a polybenzoxazole (A1-3) and/or polybenzoxazole precursor (A1-4) include a structural unit derived from a dicarboxylic acid having a fluorine atom and/or a derivative thereof, and a structural unit derived from a bisaminophenol compound having a fluorine atom and/or a derivative thereof.

Examples of the tetracarboxylic acid having a fluorine atom and a derivative thereof include 2,2-bis(3,4-dicarboxyphenyl) hexafluoropropane, 2,2-bis(2,3-dicarboxyphenyl) hexafluoropropane, and N,N'-bis[5,5'-hexafluoropropane-2,2-diyl-bis(2-hydroxyphenyl)] bis(3,4-dicarboxybenzoic acid amide), as well as tetracarboxylic acid dianhydrides thereof, tetracarboxylic acid dichlorides thereof, and tetracarboxylic acid active diesters thereof.

Examples of the dicarboxylic acid having a fluorine atom and a derivative thereof include 2,2'-bis(trifluoromethyl)-4,4'-dicarboxybiphenyl, 2,2-bis(4-carboxyphenyl) hexafluoropropane, and 2,2-bis(3-carboxyphenyl) hexafluoropropane, as well as dicarboxylic acid anhydrides thereof, dicarboxylic acid chlorides thereof, dicarboxylic acid active esters thereof, and diformyl compounds thereof.

Examples of the diamine or bisaminophenol compound having a fluorine atom and a derivative thereof include 2,2'-bis(trifluoromethyl)-4,4'-diaminobiphenyl, 2,2-bis(4-aminophenyl) hexafluoropropane, 2,2-bis(3-amino-4-hydroxyphenyl) hexafluoropropane, and N,N'-bis[5,5'-hexafluoropropane-2,2-diyl-bis(2-hydroxyphenyl)] bis(3-aminobenzoic acid amide), as well as diisocyanate compounds thereof and trimethyl-silylated diamines thereof.

In one or more resins selected from the group consisting of the polyimide (A1-1), the polyimide precursor (A1-2), the polybenzoxazole (A1-3), and the polybenzoxazole precursor (A1-4), a structural unit having a fluorine atom preferably accounts for 30 to 100 mol % of all structural units. The content of the structural unit having a fluorine atom is preferably 50 mol % or more, and more preferably 70 mol % or more. A content of 30 to 100 mol % ensures improved sensitivity during light exposure.

In the one or more resins selected from the group consisting of the polyimide (A1-1), the polyimide precursor (A1-2), the polybenzoxazole (A1-3), and the polybenzoxazole precursor (A1-4), those structural units derived from one or more selected from the group consisting of tetracarboxylic acid having a fluorine atom, tetracarboxylic acid derivative having a fluorine atom, dicarboxylic acid having a fluorine atom, and dicarboxylic acid derivative having a fluorine atom preferably account for 30 to 100 mol % of all structural units derived from a carboxylic acid and a derivative thereof. The content of the structural unit having a fluorine atom is preferably 50 mol % or more, and more preferably 70 mol % or more. A content of 30 to 100 mol % ensures improved sensitivity during light exposure.

In the one or more resins selected from the group consisting of the polyimide (A1-1), the polyimide precursor (A1-2), the polybenzoxazole (A1-3), and the polybenzoxazole precursor (A1-4), those structural units derived from one or more selected from the group consisting of diamine having a fluorine atom, diamine derivative having a fluorine atom, bisaminophenol compound having a fluorine atom, and bisaminophenol compound derivative having a fluorine atom preferably account for 30 to 100 mol % of all structural units derived from an amine and a derivative thereof. The content of the structural unit having a fluorine atom is preferably 50 mol % or more, and more preferably 70 mol % or more. A content of 30 to 100 mol % ensures improved sensitivity during light exposure.

<Structural Unit Derived from Aromatic, Alicyclic, or Aliphatic Carboxylic Acid or Derivative Thereof>

It is preferable for the polyimide (A1-1) and/or polyimide precursor (A1-2) to contain a structural unit derived from an aromatic tetracarboxylic acid and/or a derivative thereof. If the polyimide (A1-1) and/or the polyimide precursor (A1-2) contains a structural unit derived from an aromatic carboxylic acid and/or a derivative thereof, the heat resistance of the aromatic group serves to produce a cured film with an improved heat resistance. The aromatic carboxylic acid and a derivative thereof are preferably an aromatic tetracarboxylic acid and/or a derivative thereof.

It is preferable for the structural units derived from aromatic tetracarboxylic acids and/or derivatives thereof to account for 50 to 100 mol %, more preferably 60 to 100 mol %, and still more preferably 70 to 100 mol %, of all structural units derived from carboxylic acids and derivatives thereof in the polyimide (A1-1). When the content is 50 to 100 mol %, it is possible to improve heat resistance of a cured film.

It is preferable for the structural units derived from aromatic tetracarboxylic acids and/or derivatives thereof to account for 50 to 100 mol %, more preferably 60 to 100 mol %, and still more preferably 70 to 100 mol %, of all structural units derived from carboxylic acids and derivatives thereof in the polyimide precursor (A1-2). When the content is 50 to 100 mol %, it is possible to improve heat resistance of a cured film.

The polyimide (A1-1) and/or the polyimide precursor (A1-2) may contain a structural unit derived from alicyclic carboxylic acid or aliphatic carboxylic acid and/or a derivative thereof. The alicyclic carboxylic acid, aliphatic carboxylic acid, and/or a derivative thereof is preferably alicyclic tetracarboxylic acid or aliphatic tetracarboxylic acid and/or a derivative thereof.

It is preferable for the polybenzoxazole (A1-3) and/or the polybenzoxazole precursor (A1-4) to contain a structural unit derived from aromatic carboxylic acid and/or a derivative thereof. If the polybenzoxazole (A1-3) and/or the polybenzoxazole precursor (A1-4) contains a structural unit derived from an aromatic carboxylic acid and/or a derivative thereof, the heat resistance of the aromatic group serves to produce a cured film with an improved heat resistance. The aromatic carboxylic acid and/or a derivative thereof is preferably aromatic dicarboxylic acid or aromatic tricarboxylic acid and/or a derivative thereof, of which aromatic dicarboxylic acid and/or a derivative thereof is more preferable.

It is preferable for the structural units derived from aromatic carboxylic acids and/or derivatives thereof to account for 50 to 100 mol %, more preferably 60 to 100 mol %, and still more preferably 70 to 100 mol %, of all structural units derived from carboxylic acids and derivatives thereof in the polybenzoxazole (A1-3). When the content is 50 to 100 mol %, it is possible to improve heat resistance of a cured film.

It is preferable for the structural units derived from aromatic carboxylic acids and/or derivatives thereof to account for 50 to 100 mol %, more preferably 60 to 100 mol %, and still more preferably 70 to 100 mol %, of all structural units derived from carboxylic acids and derivatives thereof in the polybenzoxazole precursor (A1-4). When the content is 50 to 100 mol %, it is possible to improve heat resistance of a cured film.

The polybenzoxazole (A1-3) and/or the polybenzoxazole precursor (A1-4) may contain a structural unit derived from alicyclic carboxylic acid, aliphatic carboxylic acid, and/or a derivative thereof. The alicyclic carboxylic acid or aliphatic carboxylic acid and a derivative thereof are preferably alicyclic dicarboxylic acid, aliphatic dicarboxylic acid, alicyclic tricarboxylic acid, or aliphatic tricarboxylic acid, and/or a derivative thereof, of which alicyclic dicarboxylic acid or aliphatic dicarboxylic acid and/or a derivative thereof is more preferable.

<Structural Unit Derived from Aromatic, Alicyclic, or Aliphatic Amine and Derivative Thereof>

It is preferable for one or more selected from the group consisting of the polyimide (A1-1), the polyimide precursor (A1-2), the polybenzoxazole (A1-3), and the polybenzoxazole precursor (A1-4) to contain a structural unit derived from an aromatic amine and/or a derivative thereof. If one or more selected from the group consisting of the polyimide (A1-1), the polyimide precursor (A1-2), the polybenzoxazole (A1-3), and the polybenzoxazole precursor (A1-4) contain a structural unit derived from an aromatic amine and/or a derivative thereof, the heat resistance of the aromatic group serves to produce a cured film with an improved heat resistance. The aromatic amine or a derivative thereof is preferably aromatic diamine, bisaminophenol compound, aromatic triamine, or tris-aminophenol compound, and/or a derivative thereof, of which aromatic diamine or bisaminophenol compound and/or a derivative thereof is more preferable.

It is preferable for the structural units derived from aromatic amines and/or derivatives thereof to account for 50 to 100 mol %, more preferably 60 to 100 mol %, and still more preferably 70 to 100 mol %, of all structural units derived from amines and derivatives thereof in the one or more resins selected from the group consisting of the polyimide (A1-1), the polyimide precursor (A1-2), the polybenzoxazole (A1-3), and the polybenzoxazole precursor (A1-4). When the content is 50 to 100 mol %, it is possible to improve heat resistance of a cured film.

One or more selected from the group consisting of the polyimide (A1-1), the polyimide precursor (A1-2), the polybenzoxazole (A1-3), and the polybenzoxazole precursor (A1-4) may contain a structural unit derived from an alicyclic amine or an aliphatic amine and/or a derivative thereof. The alicyclic amine or aliphatic amine and a derivative thereof are preferably alicyclic diamine, alicyclic dihydroxydiamine, aliphatic diamine, or aliphatic dihydroxydiamine and/or a derivative thereof.

<Structural Unit Derived from Diamine Having Silyl Group or Siloxane Bond or Derivative Thereof>

It is preferable for one or more selected from the group consisting of the polyimide (A1-1), the polyimide precursor (A1-2), the polybenzoxazole (A1-3), and the polybenzoxazole precursor (A1-4) to contain a structural unit derived from a diamine having a silyl group or a siloxane bond and/or a derivative thereof. If one or more selected from the group consisting of the polyimide (A1-1), the polyimide precursor (A1-2), the polybenzoxazole (A1-3), and the polybenzoxazole precursor (A1-4) contain a structural unit derived from a diamine having a silyl group or a siloxane bond and/or a derivative thereof, it leads to increased interaction at the interface between the cured film of the resin composition and the underlying substrate, and the cured film will have an improved adhesion to the underlying substrate and a high chemical resistance.

Examples of the diamine having a silyl group or a siloxane bond and a derivative thereof include 1,3-bis(3-aminopropyl) tetramethyl disiloxane and 1,9-bis(4-aminophenyl) octamethyl pentasiloxane.

It is preferable for the structural units derived from a diamine having a silyl group or a siloxane bond and/or a derivative thereof to account for 0.1 mol % or more, more preferably 0.5 mol % or more, and still more preferably 1 mol % or more, of all structural units derived from amines and derivatives thereof in the one or more resins selected from the group consisting of the polyimide (A1-1), the polyimide precursor (A1-2), the polybenzoxazole (A1-3), and the polybenzoxazole precursor (A1-4). A content of 0.1 mol % or more ensures an improved adhesion to the underlying substrate and the production of a cured film with an improved chemical resistance. On the other hand, the content is preferably 30 mol % or less, more preferably 20 mol % or less, and still more preferably 10 mol % or less. A content of 30 mol % or less ensures the production of a cured film having an improved heat resistance.

<Structural Unit Derived from Amine Having Oxyalkylene Structure and a Derivative Thereof>

It is preferable for one or more selected from the group consisting of the polyimide (A1-1), the polyimide precursor (A1-2), the polybenzoxazole (A1-3), and the polybenzoxazole precursor (A1-4) to contain a structural unit derived from an amine having an oxyalkylene structure and/or a derivative thereof. If one or more selected from the group consisting of the polyimide (A1-1), the polyimide precursor (A1-2), the polybenzoxazole (A1-3), and the polybenzoxazole precursor (A1-4) contains a structural unit derived from an amine having an oxyalkylene structure and/or a derivative thereof, it will be possible to form a cured film having a small-tapered pattern shape and produce a cured film having improved mechanical characteristics and an improved pattern processability in an alkaline developer.

The amine having an oxyalkylene structure or a derivative thereof is preferably a diamine having an oxyalkylene structure or a triamine having an oxyalkylene structure and/or a derivative thereof.

Examples of the diamine having an oxyalkylene structure and a derivative thereof include JEFFAMINE (registered trademark) D-230, D-400, D-2000, D-4000, HK-511, ED-600, ED-900, ED-2003, EDR-148, EDR-176, SD-231, SD-401, SD-2001, THF-100, THF-140, THF-170, XTJ-582, XTJ-578, XTJ-542, XTJ-548, and XTJ-559; and ELASTAMINE (registered trademark) RP-405, RP-409, RP-2005, RP-2009, RT-1000, RE-600, RE-900, RE-2000, HE-150, HE-180, HE-1700, HT-1700, RE1-1000, RE1-2005, RE1-2007, RP3-400, and RP3-5000 (all manufactured by HUNTSMAN Corporation).

Examples of the triamine having an oxyalkylene structure and a derivative thereof include JEFFAMINE (registered trademark) T-403, T-3000, T-5000, and ST-404 (all manufactured by HUNTSMAN Corporation).

It is preferable for the structural units derived from an amine having an oxyalkylene structure and/or a derivative thereof to account for 1 mol % or more, more preferably 5 mol % or more, and still more preferably 10 mol % or more, of all structural units derived from amines and derivatives thereof in the one or more resins selected from the group consisting of the polyimide (A1-1), the polyimide precursor (A1-2), the polybenzoxazole (A1-3), and the polybenzoxazole precursor (A1-4). A content of 1 mol % or more ensures the formation of a cured film having a small-tapered pattern shape and the production of a cured film with improved mechanical characteristics. On the other hand, the content is preferably 60 mol % or less, more preferably 50 mol % or less, and still more preferably 40 mol % or less. A content of 60 mol % or less ensures the production of a cured film having an improved heat resistance.

<End-Capping Agent>

One or more selected from the group consisting of the polyimide (A1-1), the polyimide precursor (A1-2), the polybenzoxazole (A1-3), and the polybenzoxazole precursor (A1-4) may have a chain end capped with an end-capping agent such as monoamine, dicarboxylic acid anhydride, monocarboxylic acid, monocarboxylic acid chloride, or monocarboxylic acid active ester. If one or more selected from the group consisting of the polyimide (A1-1), the polyimide precursor (A1-2), the polybenzoxazole (A1-3), and the polybenzoxazole precursor (A1-4) have a chain end capped with an end-capping agent, a coating liquid of a resin composition containing them will have improved storage stability.

Examples of monoamines that can be used as end-capping agents include 5-amino-8-hydroxyquinoline, 1-hydroxy-7-aminonaphthalene, 1-hydroxy-6-aminonaphthalene, 1-hydroxy-5-aminonaphthalene, 1-hydroxy-4-aminonaphthalene, 2-hydroxy-7-aminonaphthalene, 2-hydroxy-6-aminonaphthalene, 2-hydroxy-5-aminonaphthalene, 1-carboxy-7-aminonaphthalene, 1-carboxy-6-aminonaphthalene, 1-carboxy-5-aminonaphthalene, 2-carboxy-7-aminonaphthalene, 2-carboxy-6-aminonaphthalene, 2-carboxy-5-aminonaphthalene, 2-aminobenzoic acid, 3-aminobenzoic acid, 4-aminobenzoic acid, 4-aminosalicylic acid, 5-aminosalicylic acid, 6-aminosalicylic acid, 3-amino-4,6-dihydroxypyrimidine, 2-aminophenol, 3-aminophenol, 4-aminophenol, 2-aminothiophenol, 3-aminothiophenol, and 4-aminothiophenol.

Examples of dicarboxylic acid anhydrides that can be used as end-capping agents include phthalic acid anhydride, maleic acid anhydride, succinic acid anhydride, 5-norbornene-2,3-dicarboxylic acid anhydride, cyclohexanedicarboxylic acid anhydride, or 3-hydroxyphthalic acid anhydride.

Examples of monocarboxylic acids and monocarboxylic acid chlorides that can be used as end-capping agents include benzoic acid, 3-carboxyphenol, 4-carboxyphenol, 3-carboxythiophenol, 4-carboxythiophenol, 1-hydroxy-7-carboxynaphthalene, 1-hydroxy-6-carboxynaphthalene, 1-hydroxy-5-carboxynaphthalene, 1-mercapto-7-carboxynaphthalene, 1-mercapto-6-carboxynaphthalene, 1-mercapto-5-carboxynaphthalene, 3-carboxybenzene sulfonic acid, 4-carboxybenzene sulfonic acid, and monocarboxylic acid chlorides thereof; and monocarboxylic acid chlorides of terephthalic acid, phthalic acid, maleic acid, cyclohexanedicarboxylic acid, 1,5-dicarboxynaphthalene, 1,6-dicarboxynaphthalene, 1,7-dicarboxynaphthalene, and 2,6-dicarboxynaphthalene.

Examples of monocarboxylic acid active esters that can be used as end-capping agents include those monocarboxylic acid active ester compounds obtainable through a reaction between an acid chloride as listed above and N-hydroxybenzotriazole or N-hydroxy-5-norbornene-2,3-dicarboxyimide.

It is preferable for the structural units derived from end-capping agents to account for 1 mol % or more, more preferably 3 mol % or more, and still more preferably 5 mol % or more, of all structural units derived from amines, carboxylic acids, and derivatives thereof in the one or more resins selected from the group consisting of the polyimide (A1-1), the polyimide precursor (A1-2), the polybenzoxazole (A1-3), and the polybenzoxazole precursor (A1-4). A content of 1 mol % or more ensures that a coating liquid of the resin composition has an improved storage stability. On the other hand, the content is preferably 30 mol % or less, more preferably 25 mol % or less, and still more preferably 20 mol % or less. A content of 30 mol % or less ensures an improved resolution after development.

The content of the structural units derived from various carboxylic acids, amines, or derivatives thereof in the polyimide (A1-1), the polyimide precursor (A1-2), the polybenzoxazole (A1-3), and/or the polybenzoxazole precursor (A1-4) can be determined by a combination of $^1$H-NMR, $^{13}$C-NMR, $^{15}$N-NMR, IR, TOF-MS, elementary analysis, ash content measurement, and the like.

<Physical Properties of Polyimide (A1-1), Polyimide Precursor (A1-2), Polybenzoxazole (A1-3), and/or Polybenzoxazole Precursor (A1-4)>

For the one or more resins selected from the group consisting of the polyimide (A1-1), the polyimide precursor (A1-2), the polybenzoxazole (A1-3), and the polybenzoxazole precursor (A1-4), the number of repetitions n of structural units is preferably 5 or more, more preferably 10 or more, still more preferably 15 or more. A number of repetitions n of 5 or more ensures an improved resolution after development. On the other hand, the number of repetitions n is preferably 1,000 or less, more preferably 500 or less, and still more preferably 100 or less. A number of repetitions n of 1,000 or less ensures an improved leveling property during coating and an improved pattern processability in an alkaline developer.

For the one or more resins selected from the group consisting of the polyimide (A1-1), the polyimide precursor (A1-2), the polybenzoxazole (A1-3), and the polybenzoxazole precursor (A1-4), the polystyrene-based weight average molecular weight (hereinafter Mw) as determined by gel permeation chromatography (hereinafter GPC) is preferably 1,000 or more, more preferably 3,000 or more, and still more preferably 5,000 or more. A Mw of 1,000 or more ensures an improved resolution after development. On the other hand, the Mw is preferably 500,000 or less, more preferably 300,000 or less, and still more preferably 100,000 or less. A Mw of 500,000 or less ensures an improved leveling property during coating and an improved pattern processability in an alkaline developer.

The number-average molecular weight (hereinafter Mn) is preferably 1,000 or more, more preferably 3,000 or more, and still more preferably 5,000 or more in terms of polystyrene measured by GPC. A Mn of 1,000 or more ensures an improved resolution after development. On the other hand, the Mn is preferably 500,000 or less, more preferably 300,000 or less, and still more preferably 100,000 or less. A Mn of 500,000 or less ensures an improved leveling property during coating and an improved pattern processability in an alkaline developer.

The Mw and Mn of the polyimide (A1-1), the polyimide precursor (A1-2), the polybenzoxazole (A1-3), and the polybenzoxazole precursor (A1-4) can be easily determined as polystyrene-based values by GPC, light scattering, or X-ray small angle scattering. For the polyimide (A1-1), the polyimide precursor (A1-2), the polybenzoxazole (A1-3), and the polybenzoxazole precursor (A1-4), the number of repetitions n of structural units can be determined from the relation n=Mw/M where M is the molecular weight of the structural unit and Mw is the weight average molecular weight of the resin.

For the one or more resins selected from the group consisting of the polyimide (A1-1), the polyimide precursor (A1-2), the polybenzoxazole (A1-3), and the polybenzoxazole precursor (A1-4), the alkali dissolution rate is preferably 50 nm/min or more, more preferably 70 nm/min or more, and still more preferably 100 nm/min or more. An alkali dissolution rate of 50 nm/min or more ensures an improved resolution after development. On the other hand, the alkali dissolution rate is preferably 12,000 nm/min or less, more preferably 10,000 nm/min or less, and still more preferably 8,000 nm/min or less. An alkali dissolution rate of 12,000 nm/min or less ensures a decreased film loss during alkali development.

The alkali dissolution rate referred to herein means the decrease in film thickness that occurs in the following process: a solution prepared by dissolving a resin sample in γ-butyrolactone is spread over a Si wafer and prebaked at 120° C. for 4 minutes to form a prebaked film with a film thickness of 10 μm±0.5 μm, followed by immersing the prebaked film in a 2.38 mass % aqueous solution of tetramethyl ammonium hydroxide at 23±1° C. for 60 seconds and rinsing it with pure water for 30 seconds.

The polyimide (A1-1) and the polyimide precursor (A1-2) can be synthesized by generally known methods. Examples include a method in which a tetracarboxylic acid dianhydride is reacted with a diamine (partly substituted by a monoamine as end-capping agent) at 80° C. to 200° C. in a polar solvent such as N-methyl-2-pyrrolidone and a method in which a tetracarboxylic acid dianhydride (partly substituted by dicarboxylic acid anhydride, monocarboxylic acid, monocarboxylic acid chloride, or monocarboxylic acid active ester as end-capping agent) is reacted with a diamine at 80° C. to 200° C.

The polybenzoxazole (A1-3) and the polybenzoxazole precursor (A1-4) can be synthesized by generally known methods. Examples include a method in which a dicarboxylic acid active diester is reacted with a bisaminophenol compound (partly substituted by a monoamine as end-capping agent) at 80° C. to 250° C. in a polar solvent such as N-methyl-2-pyrrolidone and a method in which a dicarboxylic acid active diester (partly substituted by dicarboxylic acid anhydride, monocarboxylic acid, monocarboxylic acid chloride, or monocarboxylic acid active ester as end-capping agent) is reacted with a bisaminophenol compound at 80° C. to 250° C.

For the polyimide (A1-1) and the polyimide precursor (A1-2), the imide ring closure rate (degree of imidization) can be determined easily by, for example, a method as described below. First, the infrared absorption spectrum of the resin is examined to confirm the existence of absorption peaks attributed to the imide bond in the polyimide structure (near 1780 mm$^{-1}$ and 1377 cm$^{-1}$). Then, the resin is heat-cured at 350° C. for 1 hour, followed by examining its infrared absorption spectrum. The peak strength near 1780 cm$^{-1}$ or 1377 cm$^{-1}$ is measured and compared with that measured before the heat-curing to determine the quantity of the imide bonds existing in the resin before the heat-curing, followed by converting it into the degree of imidization.

For the polybenzoxazole (A1-3) or polybenzoxazole precursor (A1-4), the oxazole ring closure rate (degree of oxazole formation) can be determined easily by, for example, a method as described below. First, the infrared absorption spectrum of the resin is examined to confirm the existence of absorption peaks attributed to the oxazole bond in the polybenzoxazole structure (near 1574 cm$^{-1}$ and 1557 cm$^{-1}$). Then, the resin is heat-cured at 350° C. for 1 hour, followed by examining its infrared absorption spectrum. The peak strength near 1574 cm$^{-1}$ or 1557 cm$^{-1}$ is measured and compared with that measured before the heat-curing to determine the quantity of the oxazole bonds existing in the resin before the heat-curing, followed by converting it into the degree of oxazole formation.

<(A2) Second Resin>

It is preferable for the negative-type photosensitive resin composition according to the present invention to contain a second resin (A2) as the alkali-soluble resin (A).

As the second resin (A2), one or more selected from the group consisting of polysiloxane (A2-1), polycyclic side chain-containing resin (A2-2), acrylic resin (A2-3), and acid-modified epoxy resin (A2-4) is preferably contained.

In the present invention, the polysiloxane (A2-1), the polycyclic side chain-containing resin (A2-2), the acrylic resin (A2-3), and the acid-modified epoxy resin (A2-4) may each be a single resin or copolymers thereof.

<Polysiloxane (A2-1)>

Examples of the polysiloxane (A2-1) used for the present invention include those polysiloxanes produced by hydrolyzing one or more selected from the group consisting of trifunctional organosilanes, tetrafunctional organosilanes, difunctional organosilanes, and monofunctional organosilanes, followed by dehydration and condensation.

The polysiloxane (A2-1) is a thermosetting resin, and a highly heat resistant siloxane bond (Si—O) is formed when it is heat-cured at a high temperature to cause dehydration and condensation. Accordingly, the incorporation of the polysiloxane (A2-1), which contains highly heat resistant siloxane bonds, in the resin composition ensures the production of a cured film having an improved heat resistance. Furthermore, since the resin increases in heat resistance when dehydrated and condensed, it is preferred when a resin having particular characteristics before dehydration and condensation and forming a cured film with high heat resistance thereafter is desired.

Furthermore, the polysiloxane (A2-1) has a silanol group to act as a reactive group. Accordingly, if a pigment (D1) in particular is added as the coloring agent (D) which will be described later, the silanol group will be able to interact with and/or bond to the surface of the pigment (D1) and also able to interact with and/or bond to the surface-modifying group of the pigment (D1). Accordingly, this serves to improve the dispersion stability of the pigment (D1).

<Trifunctional Organosilane Unit, Tetrafunctional Organosilane Unit, Difunctional Organosilane Unit, and Monofunctional Organosilane Unit>

From the viewpoint of obtaining a cured film with an improved heat resistance and ensuring an improved resolution after development, it is preferable for the polysiloxane (A2-1) used for the present invention to contain a trifunctional organosilane unit and/or a tetrafunctional organosilane unit. The trifunctional organosilane unit is preferably an organosilane unit as represented by general formula (7). The tetrafunctional organosilane unit is preferably an organosilane unit as represented by general formula (8).

The polysiloxane (A2-1) used for the present invention may contain a difunctional organosilane unit from the viewpoint of obtaining a pattern shape with a smaller taper and a cured film with improved mechanical characteristics. The difunctional organosilane unit is preferably an organosilane unit as represented by general formula (9).

The polysiloxane (A2-1) used for the present invention may contain a monofunctional organosilane unit from the viewpoint of allowing the resin composition to give a coating liquid having an improved storage stability. The monofunctional organosilane unit is preferably an organosilane unit as represented by general formula (10).

[Chemical formula 8]

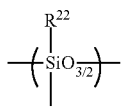

(7)

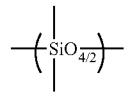

(8)

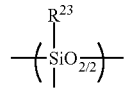

(9)

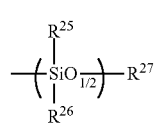

(10)

In general formulae (7) to (10), $R^{22}$ to $R^{27}$ are each independently a hydrogen atom, an alkyl group, a cycloalkyl group, an alkenyl group, or an aryl group. In general formulae (7) to (10), it is preferable that $R^{22}$ to $R^{27}$ are each independently a hydrogen atom, an alkyl group containing 1 to 10 carbon atoms, a cycloalkyl group containing 4 to 10 carbon atoms, an alkenyl group containing 2 to 10 carbon atoms, or an aryl group containing 6 to 15 carbon atoms, more preferably a hydrogen atom, an alkyl group containing 1 to 6 carbon atoms, a cycloalkyl group containing 4 to 7 carbon atoms, an alkenyl group containing 2 to 8 carbon atoms, or an aryl group containing 6 to 10 carbon atoms. The above alkyl group, cycloalkyl group, alkenyl group, and aryl group may each have a heteroatom, and may each be either a substitution product or a non-substitution product.

Organosilanes having organosilane units as represented by general formula (7) include, for example, trifunctional organosilanes such as methyl trimethoxysilane, methyl triethoxysilane, methyl tri-n-propoxy silane, ethyl trimethoxysilane, n-propyl trimethoxysilane, isopropyl trimethoxysilane, n-hexyl trimethoxysilane, n-decyl trimethoxysilane, cyclopentyl trimethoxysilane, cyclohexyl trimethoxysilane, 3-glycidoxypropyl trimethoxysilane, 2-(3,4-epoxycyclohexyl) ethyl trimethoxysilane, 3-[(3-ethyl-3-oxetanyl) methoxy] propyl trimethoxysilane, 3-aminopropyl trimethoxysilane, N-(2-aminoethyl)-3-aminopropyl trimethoxysilane, N-phenyl-3-aminopropyl trimethoxysilane, N-(vinylbenzyl)-2-aminoethyl-3-aminopropyl trimethoxysilane hydrochloride, 3-(4-aminophenyl) trimethoxysilane, 1-[4-(3-trimethoxysilylpropyl) phenyl] urea, 1-(3-trimethoxysilylpropyl) urea, 3-triethoxysilyl-N-(1,3-dimethylbutylidene) propyl amine, 3-mercaptopropyl trimethoxysilane, 3-isocyanate propyl triethoxysilane, 1,3,5-tris-(3-trimethoxysilylpropyl) isocyanuric acid, N-t-butyl-2-(3-trimethoxysilylpropyl) succinimide, and N-t-butyl-2-(3-triethoxysilylpropyl) succinimide.

In the polysiloxane (A2-1), organosilane units as represented by general formula (7) preferably account for 50 to 100 mol %, more preferably 60 to 100 mol %, and still more preferably 70 to 100 mol %, in terms of the molar ratio of Si atoms. When the content is 50 to 100 mol %, it is possible to improve heat resistance of a cured film.

Organosilanes having organosilane units as represented by general formula (8) include, for example, tetrafunctional organosilanes such as tetramethoxy silane, tetraethoxysilane, tetra-n-propoxy silane, tetraisopropoxy silane, tetra-n-butoxy silane, and tetraacetoxy silane; and silicate compounds such as Methyl Silicate 51 (manufactured by Fuso Chemical Co., Ltd.), M Silicate 51, Silicate 40, and Silicate 45 (all manufactured by Tama Chemicals Co., Ltd.), and Methyl Silicate 51, Methyl Silicate 53A, Ethyl Silicate 40, and Ethyl Silicate 48 (all manufactured by Colcoat Co., Ltd.). From the viewpoint of obtaining a cured film with an improved heat resistance and an improved resolution after development, tetramethoxy silane, tetraethoxy silane, tetra-n-propoxy silane, Methyl Silicate 51 (manufactured by Fuso Chemical Co., Ltd.), M Silicate 51 (manufactured by Tama Chemicals Co., Ltd.), and Methyl Silicate 51 (manufactured by Colcoat Co., Ltd.) are preferable.

In the polysiloxane (A2-1), organosilane units as represented by general formula (8) preferably account for 0 to 40 mol %, more preferably 0 to 30 mol %, and still more preferably 0 to 20 mol %, in terms of the molar ratio of Si atoms. When the content is 0 to 40 mol %, it is possible to improve heat resistance of a cured film and resolution after development.

Organosilanes having organosilane units as represented by general formula (9) include, for example, difunctional organosilanes such as dimethyl dimethoxysilane, dimethyl diethoxysilane, dimethyl diacetoxysilane, diethyl dimethoxysilane, diethyl diethoxysilane, di-n-propyl dimethoxysilane, di-n-butyl dimethoxysilane, dicyclopentyl dimethoxysilane, cyclohexylmethyl dimethoxysilane, 3-glycidoxypropylmethyl dimethoxysilane, N-(2-aminoethyl)-3-aminopropylmethyl dimethoxysilane, 3-mercaptopropylmethyl dimethoxysilane, and 3-isocyanate propylmethyl diethoxysilane; and difunctional organosilane oligomers such as 1,1,3,3-tetramethyl-1,3-dimethoxydisiloxane, 1,1,3,3-tetramethyl-1,3-diethoxydisiloxane, 1,1,3,3-tetraethyl-1,3-dimethoxydisiloxane, 1,1,3,3-tetraethyl-1,3-diethoxydisiloxane, and commercial products such as DMS-S12, DMS-S15, PDS-1615, and PDS-9931 (all manufactured by Gelest). From the viewpoint of obtaining a pattern shape with a smaller taper and a cured film with improved mechanical characteristics, dimethyl dimethoxysilane, dimethyl diethoxysilane, dimethyl diacetoxysilane, diethyl dimethoxysilane, diethyl diethoxysilane, diphenyl dimethoxysilane, diphenyl diethoxysilane, 1,1,3,3-tetramethyl-1,3-dimethoxydisiloxane, 1,1,3,3-tetramethyl-1,3-diethoxydisiloxane, 1,1,3,3-tetraethyl-1,3-dimethoxydisiloxane, and 1,1,3,3-tetraethyl-1,3-diethoxydisiloxane are preferable.

In the polysiloxane (A2-1), organosilane units as represented by general formula (9) preferably account for 0 to 60 mol %, more preferably 0 to 50 mol %, and still more preferably 0 to 40 mol %, in terms of the molar ratio of Si atoms. When the content is 0 to 60 mol %, it is possible to improve heat resistance of a cured film and resolution after development.

Organosilanes having organosilane units as represented by general formula (10) include, for example, monofunctional organosilanes such as trimethyl methoxysilane, trimethyl ethoxysilane, triethyl methoxysilane, triethyl ethoxysilane, tri-n-propyl methoxysilane, tri-n-propyl ethoxysilane, tri-n-butyl methoxysilane, tri-n-butyl ethoxysilane, (3-glycidoxypropyl) dimethyl methoxysilane, or (3-glycidoxypropyl) dimethyl ethoxysilane.

In the polysiloxane (A2-1), organosilane units as represented by general formula (10) preferably account for 0 to 20 mol %, more preferably 0 to 10 mol %, and still more preferably 0 to 5 mol %, in terms of the molar ratio of Si atoms. When the content is 0 to 20 mol %, it is possible to improve heat resistance of a cured film.

Examples of the polysiloxane (A2-1) used for the present invention include those polysiloxanes (A2-1) produced by hydrolyzing one or more selected from the group consisting of organosilanes as represented by general formula (7a), organosilanes as represented by general formula (8a), organosilanes as represented by general formula (9a), and organosilanes as represented by general formula (10a), followed by dehydration and condensation.

[Chemical formula 9]

(7a)

(8a)

(9a)

(10a)

In general formulae (7a) to (10a), $R^{22}$ to $R^{27}$ are each independently a hydrogen atom, an alkyl group, a cycloalkyl group, an alkenyl group, or an aryl group, and $R^{150}$ to $R^{159}$ are each independently a hydrogen atom, an alkyl group, an acyl group, or an aryl group. In general formulae (7a) to (10a), it is preferable that $R^{22}$ to $R^{27}$ are each independently a hydrogen atom, an alkyl group containing 1 to 10 carbon atoms, a cycloalkyl group containing 4 to 10 carbon atoms, an alkenyl group containing 2 to 10 carbon atoms, or an aryl group containing 6 to 15 carbon atoms, more preferably a hydrogen atom, an alkyl group containing 1 to 6 carbon atoms, a cycloalkyl group containing 4 to 7 carbon atoms, an alkenyl group containing 2 to 8 carbon atoms, or an aryl group containing 6 to 10 carbon atoms. It is also preferable that $R^{150}$ to $R^{159}$ are each independently a hydrogen atom, an alkyl group containing 1 to 6 carbon atoms, an acyl group containing 2 to 6 carbon atoms, or an aryl group containing 6 to 15 carbon atoms, more preferably a hydrogen atom, an alkyl group containing 1 to 4 carbon atoms, an acyl group containing 2 to 4 carbon atoms, or an aryl group containing 6 to 10 carbon atoms. The above alkyl group, cycloalkyl group, alkenyl group, aryl group, and acyl group may each have a heteroatom, and may each be either a substitution product or a non-substitution product.

In the polysiloxane (A2-1), organosilane units as represented by general formula (7), organosilane units as represented by general formula (8), organosilane units as represented by general formula (9), and organosilane units as represented by general formula (10) may be arrayed either regularly or irregularly. A regular array is formed by, for example, alternating copolymerization, periodic copolymerization, block copolymerization, or graft copolymerization. An irregular array is formed by, for example, random copolymerization.

In the polysiloxane (A2-1), furthermore, organosilane units as represented by general formula (7), organosilane units as represented by general formula (8), organosilane units as represented by general formula (9), and organosilane units as represented by general formula (10) may be arrayed either two-dimensionally or three-dimensionally. A two-dimensional array is formed by, for example, linear chains. A three-dimensional array is formed by, for example, ladder-like, cage-like, or network-like chains.

<Organosilane Unit Having Aromatic Group>

It is preferable for the polysiloxane (A2-1) used for the present invention to contain an organosilane unit having an aromatic group. The polysiloxane (A2-1) is preferably one obtained by using an organosilane containing an aromatic group as the organosilane containing an organosilane unit as represented by general formula (7), general formula (9), or general formula (10). If the polysiloxane (A2-1) contains an organosilane unit having an aromatic group, the heat resistance of the aromatic group serves to produce a cured film with an improved heat resistance.

If a pigment (D1) in particular is added as the coloring agent (D) which will be described later, and if in that case the polysiloxane (A2-1) contains an organosilane unit having an aromatic group, the steric hindrance of the aromatic group serves to improve the dispersion stability of the pigment (D1). If the pigment (D1) is an organic pigment (D1-1), the aromatic group in the polysiloxane (A2-1) interacts with the aromatic group in the organic pigment (D1-1), thereby serving to improve the dispersion stability of the organic pigment (D1-1).

Examples of the organosilane containing an organosilane unit as represented by general formula (7), general formula (9), or general formula (10), and having an aromatic group include trifunctional organosilanes such as phenyl trimethoxysilane, phenyl triethoxysilane, 4-tolyl trimethoxysilane, 4-hydroxyphenyl trimethoxysilane, 4-methoxyphenyl trimethoxysilane, 4-t-butylphenyl trimethoxysilane, 1-naphthyl trimethoxysilane, 2-naphthyl trimethoxysilane, 4-styryl trimethoxysilane, 2-phenylethyl trimethoxysilane, 4-hydroxybenzyl trimethoxysilane, 1-(4-hydroxyphenyl)ethyl trimethoxysilane, 2-(4-hydroxyphenyl)ethyl trimethoxysilane, and 4-hydroxy-5-(4-hydroxyphenylcarbonyloxy) pentyl trimethoxysilane; and difunctional organosilanes such as diphenyl dimethoxysilane and diphenyl diethoxysilane. From the viewpoint of producing a cured film with improved heat resistance, phenyl trimethoxysilane, 4-tolyl trimethoxysilane, 4-hydroxyphenyl trimethoxysilane, 4-methoxyphenyl trimethoxysilane, 1-naphthyl trimethoxysilane, 2-naphthyl trimethoxysilane, 4-styryl trimethoxysilane, 2-phenylethyl trimethoxysilane, 4-hydroxybenzyl trimethoxysilane, diphenyl dimethoxysilane, and diphenyl diethoxysilane are preferable; phenyl trimethoxysilane, 1-naphthyl trimethoxysilane, 2-naphthyl trimethoxysilane, diphenyl dimethoxysilane, and diphenyl diethoxysilane are more preferable; and 1-naphthyl trimethoxysilane, 2-naphthyl trimethoxysilane, diphenyl dimethoxysilane, and diphenyl diethoxysilane are more preferable.

In the polysiloxane (A2-1), organosilane units having aromatic groups preferably account for 5 mol % or more, more preferably 10 mol % or more, and still more preferably 15 mol % or more, in terms of the molar ratio of Si atoms. When the content is 5 mol % or more, it is possible to improve heat resistance of a cured film. On the other hand, the content is preferably 80 mol % or less, more preferably 75 mol % or less, and still more preferably 70 mol % or less. When the content is 80 mol % or less, it is possible to improve pattern processability in an alkaline developer. In particular, it is preferable that the molar ratio of Si atoms attributed to organosilane units having aromatic groups as represented by general formula (7), general formula (9), or general formula (10) is 5 mol % or more and 80 mol % or less.

Of the organosilanes as represented by general formula (7), general formula (9), or general formula (10) and having aromatic groups, phenyl trimethoxysilane, 4-tolyl trimethoxysilane, 4-hydroxyphenyl trimethoxysilane, 4-methoxyphenyl trimethoxysilane, 1-naphthyl trimethoxysilane, 2-naphthyl trimethoxysilane, 4-styryl trimethoxysilane, 2-phenylethyl trimethoxysilane, 4-hydroxybenzyl trimethoxysilane, diphenyl dimethoxysilane, and diphenyl diethoxysilane are preferable; phenyl trimethoxysilane, 1-naphthyl trimethoxysilane, 2-naphthyl trimethoxysilane, diphenyl dimethoxysilane, and diphenyl diethoxysilane are more preferable; and 1-naphthyl trimethoxysilane and 2-naphthyl trimethoxysilane are still more preferable; from the viewpoint of ensuring an improved pattern processability in an alkaline developer and an improved resolution after development.

<Organosilane Unit Having Ethylenically Unsaturated Double Bond Group>

It is preferable for the polysiloxane (A2-1) used for the present invention to contain an organosilane unit having an ethylenically unsaturated double bond group. The polysiloxane (A2-1) is preferably one obtained by using an organosilane having an ethylenically unsaturated double bond group as the organosilane containing an organosilane unit as represented by general formula (7), general formula (9), or general formula (10). The use of a polysiloxane (A2-1) containing an organosilane unit having an ethylenically unsaturated double bond group ensures accelerated UV curing to improve the sensitivity during light exposure.

Examples of the organosilane containing an organosilane unit as represented by general formula (7), general formula (9), or general formula (10), and having an ethylenically unsaturated double bond group include trifunctional organosilanes such as vinyl trimethoxysilane, vinyl triethoxysilane, 3-methacryloxypropyl trimethoxysilane, 3-methacryloxypropyl triethoxysilane, 3-acryloxypropyl trimethoxysilane, 3-acryloxypropyl triethoxysilane, and 4-styryl trimethoxysilane; and difunctional organosilanes such as 3-methacryloxypropylmethyl dimethoxysilane, 3-methacryloxypropylmethyl diethoxysilane, 3-acryloxypropylmethyl diethoxysilane, 3-acryloxypropyl methyldiethoxysilane, methylvinyl dimethoxysilane and divinyl diethoxysilane. From the viewpoint of ensuring an improved sensitivity during light exposure, vinyl trimethoxysilane, 3-methacryloxypropyl trimethoxysilane, 3-methacryloxypropylmethyl dimethoxysilane, 3-acryloxypropyl trimethoxysilane, 3-acryloxypropylmethyl dimethoxysilane, and 4-styryl trimethoxysilane are preferable.

In the case of using the organosilane containing an organosilane unit as represented by general formula (7), general formula (9), or general formula (10), and having an ethylenically unsaturated double bond group, a double bond equivalent of the polysiloxane (A2-1) is preferably 150 g/mol or more, more preferably 200 g/mol or more, and still more preferably 250 g/mol or more. A double bond equivalent of 150 g/mol or more ensures improved adhesion to the underlying substrate. On the other hand, the double bond equivalent is preferably 10,000 g/mol or less, more preferably 5,000 g/mol or less, and still more preferably 2,000 g/mol or less. A double bond equivalent of 10,000 g/mol or less ensures improved sensitivity during light exposure. Particularly, in the polysiloxane (A2-1), the double bond equivalent derived from organosilane unit as represented by general formula (7), general formula (9), or general formula (10), and having an ethylenically unsaturated double bond group is preferably 150 g/mol or more and 10,000 g/mol or less.

The double bond equivalent referred to herein is the weight of a resin per mole of ethylenically unsaturated double bond groups and expressed in g/mol. A value of double bond equivalent serves to calculate the number of ethylenically unsaturated double bond groups in the resin. The double bond equivalent can be calculated from the iodine value.

The iodine value referred to herein is the quantity of halogen, calculated as the weight of iodine, that reacts with 100 g of the resin and expressed in gI/100 g. After reacting 100 g of the resin with iodine monochloride, unreacted iodine is captured with an aqueous potassium iodide solution and the iodine value is determined by titrating the unreacted iodine with an aqueous sodium thiosulfate solution.

<Organosilane Unit Having Acidic Group>

It is preferable for the polysiloxane (A2-1) used for the present invention to contain an organosilane unit having an acidic group. The polysiloxane (A2-1) is preferably one obtained by using an organosilane containing an acidic group as the organosilane containing an organosilane unit as represented by general formula (7), general formula (9), or general formula (10). If the polysiloxane (A2-1) contains an organosilane unit having an acidic group, it ensures an improved pattern processability in an alkaline developer and an improved resolution after development.

The acidic group is preferably one that shows an acidity of less than pH 6. Examples of such an acidic group that shows an acidity of less than pH 6 include carboxyl group, carboxylic acid anhydride group, sulfonic acid group, phenolic hydroxyl group, hydroxyimide group, and silanol group. From the viewpoint of ensuring an improved pattern processability in an alkaline developer and an improved resolution after development, the carboxylic group, carboxylic acid anhydride group, phenolic hydroxyl group, and hydroxyimide group are preferable, and the carboxyl group and carboxylic acid anhydride group are more preferable.

Examples of the organosilane containing an organosilane unit as represented by general formula (7), general formula (9), or general formula (10) and having an acidic group include trifunctional organosilanes such as 2-(3-trimethoxysilylpropyl)-4-(N-t-butyl) amino-4-oxobutanoic acid, 3-(3-trimethoxysilylpropyl)-4-(N-t-butyl) amino-4-oxobutanoic acid, 3-trimethoxysilylpropyl succinic acid, 3-triethoxysilylpropyl succinic acid, 3-trimethoxysilyl propionic acid, 4-trimethoxysilyl butyric acid, 5-trimethoxysilyl valeric acid, 3-trimethoxysilylpropyl succinic acid anhydride, 3-triethoxysilylpropyl succinic acid anhydride, 4-(3-trimethoxysilylpropyl) cyclohexane-1,2-dicarboxylic acid anhydride, 4-(3-trimethoxysilylpropyl) phthalic acid anhydride, 4-hydroxyphenyl trimethoxysilane, 4-hydroxybenzyl trimethoxysilane, 1-(4-hydroxyphenyl)ethyl trimethoxysilane, 2-(4-hydroxyphenyl)ethyl trimethoxysilane, and 4-hydroxy-5-(4-hydroxyphenyl carbonyloxy)pentyl trimethoxysilane; difunctional organosilanes such as 3-methyldimethoxysilylpropyl succinic acid, 3-methyldimethoxysilyl propionic acid, and 3-methyldimethoxysilylpropyl succinic acid anhydride; and monofunctional organosilanes such as 3-dimethyl methoxysilylpropyl succinic acid, 3-dimethylmethoxysilyl propionic acid, and 3-dimethylmethoxysilylpropyl succinic acid anhydride. From the viewpoint of ensuring an improved pattern processability in an alkaline developer and an improved resolution after development, trifunctional organosilanes such as 2-(3-trimethoxysilylpropyl)-4-(N-t-butyl) amino-4-oxobutanoic acid, 3-(3-trimethoxysilylpropyl)-4-(N-t-butyl) amino-4-oxobutanoic acid, 3-trimethoxysilylpropyl succinic acid, 3-triethoxysilylpropyl succinic acid, 3-trimethoxysilyl propionic acid, 4-trimethoxysilyl butyric acid, 5-trimethoxysilyl valeric acid, 3-trimethoxysilylpropyl succinic acid anhydride, 3-triethoxysilylpropyl succinic acid anhydride, 4-(3-trimethoxysilylpropyl) cyclohexane-1,2-dicarboxylic acid anhydride, and 4-(3-trimethoxysilylpropyl) phthalic acid anhydride are preferable.

In the case of using organosilane containing an organosilane unit as represented by general formula (7), general formula (9), or general formula (10), and having an acidic group, an acid equivalent of the polysiloxane (A2-1) is preferably 280 g/mol or more, more preferably 300 g/mol or more, and still more preferably 400 g/mol or more. An acid equivalent of 280 g/mol or more ensures a decreased film loss during alkali development. On the other hand, the acid equivalent is preferably 1,400 g/mol or less, more preferably 1,100 g/mol or less, and still more preferably 950 g/mol or less. An acid equivalent of 1,400 g/mol or less ensures an improved pattern processability in an alkali developer and an improved resolution after development. Particularly, in the polysiloxane (A2-1), the acid equivalent derived from organosilane unit as represented by general formula (7), general formula (9), or general formula (10), and having an acidic group is preferably 280 g/mol or more and 1,400 g/mol or less. From the viewpoint of ensuring an improved pattern processability in an alkaline developer and an improved resolution after development, the acid equivalent is preferably the carboxylic acid equivalent.

The acid equivalent referred to herein is the weight of a resin per mole of acidic groups and expressed in g/mol. A value of acid equivalent serves to calculate the number of acidic groups in the resin. The acid equivalent can be calculated from the acid value.

The acid value referred to herein is the weight of potassium hydroxide that reacts with 1 g of a resin and expressed in mgKOH/g. It can be determined by titrating 1 g of the resin with an aqueous potassium hydroxide solution.

The content of various organosilane units in the polysiloxane (A2-1) can be determined by a combination of methods such as $^1$H-NMR, $^{13}$C-NMR, $^{29}$Si-NMR, IR, TOF-MS, elementary analysis, and ash content measurement.

<(A2-1) Physical Properties of Polysiloxane>

The polysiloxane (A2-1) used for the present invention preferably has a polystyrene based Mw of 500 or more, more preferably 700 or more, and still more preferably 1,000 or more, as determined by GPC. When Mw is 500 or more, it is possible to improve resolution after development. On the other hand, the Mw is preferably 100,000 or less, more preferably 50,000 or less, and still more preferably 20,000 or less. A Mw of 100,000 or less ensures an improved leveling property during coating and an improved pattern processability in an alkaline developer.

Polysiloxane (A2-1) can be synthesized by a generally known method. For example, a good method is to hydrolyze an organosilane in a reaction solvent, followed by dehydration and condensation. To carry out hydrolysis, dehydration, and condensation of an organosilane, a reaction solvent, water, and a catalyst (if required) are added, for example, to a mixture containing the organosilane, followed by heating while stirring at 50° C. to 150° C., preferably 90° C. to 130° C., for about 0.5 to 100 hours. During the heating and stirring, hydrolysis by-products (alcohols such as methanol) and condensation by-products (water) may be evaporated by distillation if necessary.

<Polycyclic Side Chain-Containing Resin (A2-2)>

Examples of the polycyclic side chain-containing resin (A2-2) used for the present invention include (I) a polycyclic side chain-containing resin obtained through a reaction of a phenol compound, a carboxylic acid anhydride, and an epoxy compound, (II) a polycyclic side chain-containing resin obtained through a reaction of an epoxy compound, a carboxylic acid compound, and an epoxy compound, and (III) a polycyclic side chain-containing resin obtained through a reaction of an epoxy compound, a carboxylic acid compound, and carboxylic acid anhydride.

The polycyclic side chain-containing resin (A2-2) is a thermosetting resin having a structure in which a backbone chain and a bulky side chain are connected through one atom and the bulky side chain has a ring structure such as fluorene ring which is highly heat resistant and rigid. Accordingly, if the resin composition to be used contains a polycyclic side chain-containing resin (A2-2) having a ring structure such as fluorene ring which is highly heat resistant and rigid, it ensures the production of a cured film having an improved heat resistance. Therefore, such a cured film is suited to applications that require heat resistance.

The polycyclic side chain-containing resin (A2-2) used for the present invention preferably has an ethylenically unsaturated double bond group. For the polycyclic side chain-containing resin (A2-2), ethylenically unsaturated double bond groups can be introduced easily into side chains branched from the backbone chain of the resin. Having an ethylenically unsaturated double bond group, the polycyclic side chain-containing resin (A2-2) is a photo-curing resin which develops a three dimensional crosslinked structure of carbon-carbon bonds when cured by UV exposure. Accordingly, a resin composition that contains a polycyclic side chain-containing resin (A2-2) having an ethylenically unsaturated double bond group in side chains shows an improved sensitivity during light exposure. Furthermore, the three dimensional crosslinked structure formed has an alicyclic structure or an aliphatic structure as primary component and accordingly, the softening point of the resin is prevented from rising, allowing a small-tapered pattern shape to be formed and enabling the production of a cured film with improved mechanical characteristics. Therefore, such a cured film is suited to applications that require good mechanical characteristics.

From the viewpoint of producing a cured film with an improved heat resistance, it is preferable for the polycyclic side chain-containing resin (A2-2) used for the present invention to contain one or more selected from the group consisting of a structural unit as represented by general formula (47), a structural unit as represented by general formula (48), a structural unit as represented by general formula (49), and a structural unit as represented by general formula (50). Furthermore, the polycyclic side chain-containing resin (A2-2) used for the present invention preferably contains an ethylenically unsaturated double bond group, and from the viewpoint of ensuring an improved sensitivity during light exposure and producing a cured film with improved mechanical characteristics, it is preferable for an ethylenically unsaturated double bond group to be contained at one or more positions selected from the group consisting of the backbone chain, side chain, and chain end.

[Chemical formula 10]

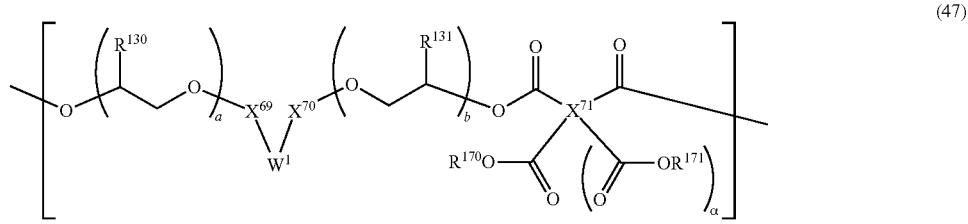

(47)

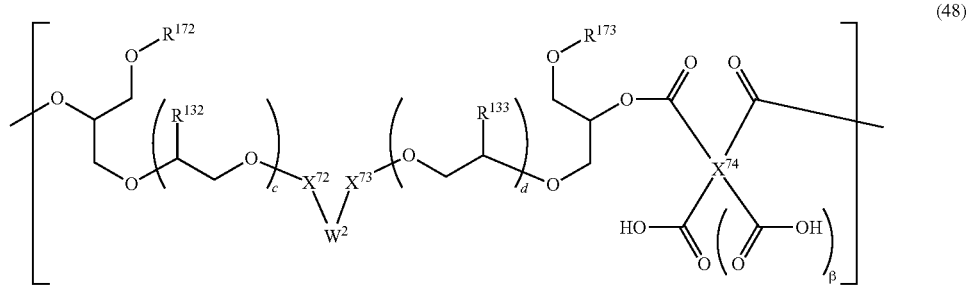

(48)

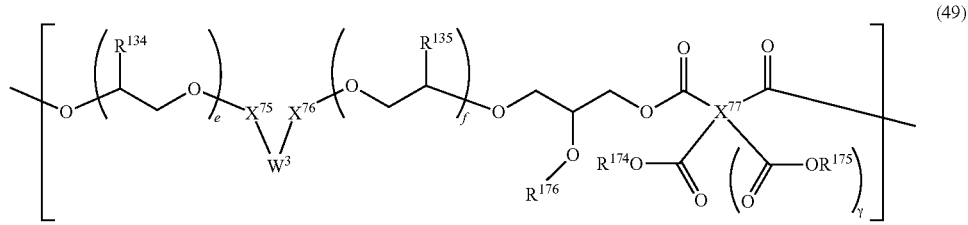

(49)

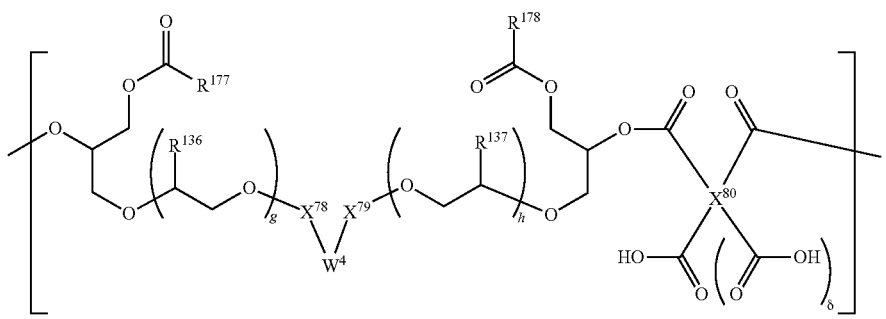

(50)

In general formula (47) to (50), $X^{69}$, $X^{70}$, $X^{72}$, $X^{73}$, $X^{75}$, $X^{76}$, $X^{78}$ and $X^{79}$ are each independently a monocyclic or fused polycyclic hydrocarbon ring. $X^{71}$, $X^{74}$, $X^{77}$ and $X^{80}$ are each independently a carboxylic acid and/or a derivative residue thereof in the form of a divalent to decavalent organic group. $W^1$ to $W^4$ are each independently an organic group having two or more aromatic groups. $R^{130}$ to $R^{137}$ are each independently a hydrogen atom or an alkyl group containing 1 to 6 carbon atoms, and $R^{170}$ to $R^{175}$, $R^{177}$ and $R^{178}$ are each independently a hydrogen atom or an organic group having an ethylenically unsaturated double bond group. $R^{176}$ is a hydrogen atom or an alkyl group containing 1 to 10 carbon atoms. Furthermore, a, b, c, d, e, f, g, and h are each independently an integer of 0 to 10, and α, β, γ, and δ are each independently 0 or 1.

In general formula (47) to (50), it is preferable that $X^{69}$, $X^{70}$, $X^{72}$, $X^{73}$, $X^{75}$, $X^{76}$, $X^{78}$ and $X^{79}$ are each independently a monocyclic or fused polycyclic divalent to decavalent hydrocarbon ring containing 6 to 15 carbon atoms, more preferably a monocyclic or fused polycyclic divalent to decavalent hydrocarbon ring containing 6 to 10 carbon atoms. On the other hand, $X^{71}$, $X^{74}$, $X^{77}$, and $X^{80}$ are each independently preferably a divalent to decavalent organic group having one or more selected from the group consisting of an aliphatic structure containing 2 to 20 carbon atoms, an alicyclic structure containing 4 to 20 carbon atoms, and an aromatic structure containing 6 to 30 carbon atoms, more preferably a divalent to decavalent organic group having one or more selected from the group consisting of an aliphatic structure containing 4 to 15 carbon atoms, an alicyclic structure containing 4 to 15 carbon atoms, and an aromatic structure containing 6 to 25 carbon atoms. Furthermore, it is preferable that $W^1$ to $W^4$ are each independently a substituent group as represented by any of general formulae (51) to (56). It is preferable that $R^{130}$ to $R^{137}$ are each independently a hydrogen atom or an alkyl group containing 1 to 4 carbon atoms, and also preferable that $R^{170}$ to $R^{175}$, $R^{177}$ and $R^{178}$ are each independently a substituent group as represented by general formula (57). Also, $R^{176}$ is preferably a hydrogen atom or an alkyl group containing 1 to 6 carbon atoms. The above organic groups each having an alkyl group, aliphatic structure, alicyclic structure, aromatic structure, monocyclic or fused polycyclic aromatic hydrocarbon ring, or ethylenically unsaturated double bond group may have heteroatoms and may each be either a substitution product or a non-substitution product.

[Chemical formula 11]

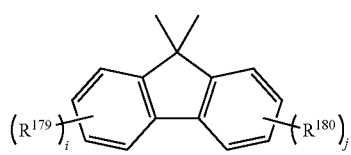

(51)

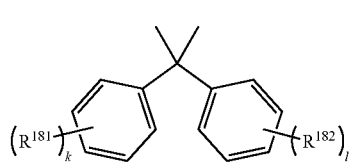

(52)

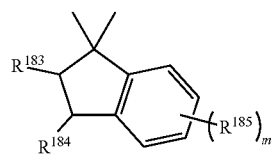

(53)

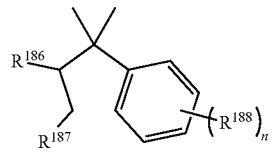

(54)

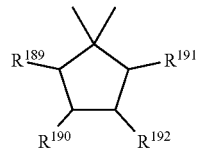

(55)

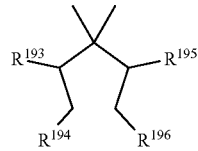

(56)

In general formulae (51) to (56), $R^{179}$ to $R^{182}$, $R^{185}$ and $R^{188}$ are each independently an alkyl group containing 1 to 10 carbon atoms. $R^{183}$, $R^{184}$, $R^{186}$, $R^{187}$, $R^{189}$, $R^{191}$ and $R^{193}$ to $R^{196}$ are each independently a hydrogen atom, an alkyl group containing 1 to 10 carbon atoms, a cycloalkyl group containing 4 to 10 carbon atoms, or an aryl group containing 6 to 15 carbon atoms. $R^{190}$ and $R^{192}$ are each independently a hydrogen atom, an alkyl group containing 1 to 10 carbon atoms, a cycloalkyl group containing 4 to 10 carbon atoms, or an aryl group containing 6 to 15 carbon atoms, and $R^{190}$ and $R^{192}$ may together form a ring. The ring formed by $R^{190}$ and $R^{192}$ is, for example, a benzene ring or a cyclohexane ring. At least either $R^{183}$ or $R^{184}$ is an aryl group containing 6 to 15 carbon atoms. At least either $R^{186}$ or $R^{187}$ is an aryl group containing 6 to 15 carbon atoms. At least either $R^{189}$ or $R^{190}$ is an aryl group containing 6 to 15 carbon atoms, and at least either $R^{191}$ or $R^{192}$ is an aryl group containing 6 to 15 carbon atoms. $R^{190}$ and $R^{192}$ may together form a ring. At least either $R^{193}$ or $R^{194}$ is an aryl group containing 6 to 15 carbon atoms, and at least either $R^{195}$ or $R^{196}$ is an aryl group containing 6 to 15 carbon atoms. Furthermore, i, j, k, l, m, and n are each independently an integer of 0 to 4. In general formulae (51) to (56), it is preferable that $R^{179}$ to $R^{182}$, $R^{185}$ and $R^{188}$ are each independently an alkyl group containing 1 to 6 carbon atoms. Furthermore, it is preferable that $R^{183}$, $R^{184}$, $R^{186}$, $R^{187}$, $R^{189}$, $R^{191}$ and $R^{193}$ to $R^{196}$ are each independently a hydrogen atom, an alkyl group containing 1 to 6 carbon atoms, a cycloalkyl group containing 4 to 7 carbon atoms, or an aryl group containing 6 to 10 carbon atoms. It is preferable that $R^{190}$ and $R^{192}$ are each independently a hydrogen atom, an alkyl group containing 1 to 6 carbon atoms, a cycloalkyl group containing 4 to 7 carbon atoms, or an aryl group containing 6 to 10 carbon atoms, and also preferable that the ring formed by $R^{190}$ and $R^{192}$ is a benzene ring. The above alkyl group, cycloalkyl group, and aryl group may each be either a substitution product or a non-substitution product.

[Chemical formula 12]

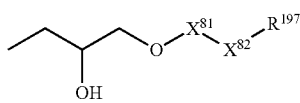

(57)

In general formula (57), $X^{81}$ is a direct bond, an alkylene chain containing 1 to 10 carbon atoms, a cycloalkylene chain containing 4 to 10 carbon atoms, or an arylene chain containing 6 to 15 carbon atoms, and $X^{82}$ is a direct bond or an arylene chain containing 6 to 15 carbon atoms. $R^{197}$ is a vinyl group, an aryl group, or a (meth)acrylic group. In general formula (57), $X^{81}$ is preferably a direct bond, an alkylene chain containing 1 to 6 carbon atoms, a cycloalkylene chain containing 4 to 7 carbon atoms, or an arylene chain containing 6 to 10 carbon atoms. Furthermore, $X^{82}$ is preferably a direct bond or an arylene chain containing 6 to 10 carbon atoms. The above alkylene chain, cycloalkylene chain, arylene chain, vinyl group, aryl group, and (meth) acrylic group may each be either a substitution product or a non-substitution product.

<Synthesis Method for Polycyclic Side Chain-Containing Resin (A2-2)>

The polycyclic side chain-containing resin (A2-2) used for the present invention is preferably a polycyclic side chain-containing resin (A2-2) produced by one or more synthesis methods selected from (I) to (IV) described below.

Polycyclic side chain-containing aromatic resin (A2-2) of (I): This category includes a polycyclic side chain-containing resin (A2-2) that can be produced by reacting a compound as represented by general formula (58) that contains two or more aromatic groups and a hydroxyl group in the molecule with an polyfunctional active carboxylic acid derivative (one or more selected from the group consisting of tetracarboxylic acid dianhydride, dicarboxylic acid dichloride, and dicarboxylic acid active diester) to prepare a resin and then subjecting it to a ring-opening addition reaction with an unsaturated compound as represented by general formula (60) that contains an ethylenically unsaturated double bond group and an epoxy group. The polyfunctional active carboxylic acid derivative is preferably a tetracarboxylic acid dianhydride. In addition to the polyfunctional active carboxylic acid derivative, the reaction components may also contain a tricarboxylic acid anhydride, dicarboxylic acid anhydride, monocarboxylic acid chloride, or monocarboxylic acid active ester as end-capping agents.

Polycyclic side chain-containing resin (A2-2) of (II): This category includes a polycyclic side chain-containing resin (A2-2) that can be produced by subjecting a compound as represented by general formula (58) that contains two or more aromatic groups and a hydroxyl group in the molecule with an unsaturated compound as represented by general formula (60) that contains an ethylenically unsaturated double bond group and an epoxy group to a ring-opening addition reaction to prepare a resin and then reacting it with a polyfunctional active carboxylic acid derivative (one or more selected from the group consisting of tetracarboxylic acid dianhydride, dicarboxylic acid dichloride, and dicarboxylic acid active diester). The polyfunctional active carboxylic acid derivative is preferably a tetracarboxylic acid dianhydride. In addition to the polyfunctional active carboxylic acid derivative, the reaction components may also contain a tricarboxylic acid anhydride, dicarboxylic acid anhydride, monocarboxylic acid chloride, or monocarboxylic acid active ester as end-capping agents.

Polycyclic side chain-containing resin (A2-2) of (III): This category includes a polycyclic side chain-containing resins (A2-2) that can be produced by subjecting a compound as represented by general formula (59) that contains two or more aromatic groups and an epoxy group in the molecule to a ring-opening addition reaction with an polyfunctional carboxylic acid (one or more selected from the group consisting of tetracarboxylic acid, tricarboxylic acid, and dicarboxylic acid) to prepare a resin and then subjecting it to a ring-opening addition reaction with an unsaturated compound as represented by general formula (60) that contains an ethylenically unsaturated double bond group and an epoxy group. The polyfunctional carboxylic acid is preferably a tetracarboxylic acid or a tricarboxylic acid. In addition to the polyfunctional carboxylic acid, the reaction components may also contain a monocarboxylic acid as end-capping agents.

Polycyclic side chain-containing aromatic resin (A2-2) of (IV): This category includes a polycyclic side chain-containing resin (A2-2) that can be produced by subjecting a compound as represented by general formula (59) that contains two or more aromatic groups and an epoxy group in the molecule to a ring-opening addition reaction with an unsaturated carboxylic acid that contains an ethylenically unsaturated double bond group to prepare a resin and then reacting it with a polyfunctional active carboxylic acid derivative (one or more selected from the group consisting of tetracarboxylic acid dianhydride, dicarboxylic acid dichloride, and dicarboxylic acid active diester). The polyfunctional active carboxylic acid derivative is preferably a tetracarboxylic acid dianhydride. In addition to the polyfunctional active carboxylic acid derivative, the reaction components may also contain a tricarboxylic acid anhydride, dicarboxylic acid anhydride, monocarboxylic acid chloride, or monocarboxylic acid active ester as end-capping agents.

[Chemical formula 13]

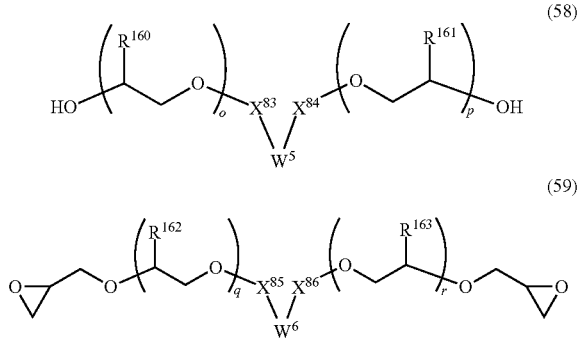

In general formulae (58) and (59), $X^{83}$ to $X^{86}$ are each independently a monocyclic or fused polycyclic aromatic hydrocarbon ring, and $W^5$ and $W^6$ are each independently an organic group having two or more aromatic groups. $R^{160}$ to $R^{163}$ are each independently a hydrogen atom or an alkyl group containing 1 to 6 carbon atoms. Furthermore, o, p, q, and r are each independently an integer of 0 to 10. In general formulae (58) and (59), it is preferable that $X^{83}$ to $X^{86}$ are each independently a monocyclic or fused polycyclic divalent to decavalent aromatic hydrocarbon ring containing 6 to 15 carbon atoms, more preferably a monocyclic or fused polycyclic divalent to decavalent aromatic hydrocarbon ring containing 6 to 10 carbon atoms. Furthermore, it is preferable that $W^5$ and $W^6$ are each independently a substituent group as represented by any of general formulae (51) to (56) given above. It is preferable that $R^{160}$ to $R^{163}$ are each independently a hydrogen atom or an alkyl group containing 1 to 4 carbon atoms. The aforementioned alkyl group or monocyclic or fused polycyclic aromatic hydrocarbon ring may each contain a heteroatom and may each be a substitution product or a non-substitution product.

[Chemical formula 14]

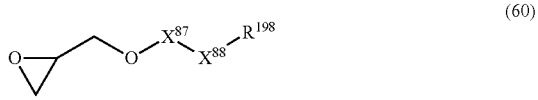

In general formula (60), $X^{87}$ is a direct bond, an alkylene chain containing 1 to 10 carbon atoms, a cycloalkylene chain containing 4 to 10 carbon atoms, or an arylene chain containing 6 to 15 carbon atoms. When $X^{87}$ is a direct bond or an arylene chain containing 6 to 15 carbon atoms, $X^{88}$ is a direct bond. When $X^{87}$ is an alkylene chain containing 1 to 10 carbon atoms or a cycloalkylene chain containing 4 to 10 carbon atoms, $X^{88}$ is a direct bond or an arylene chain containing 6 to 15 carbon atoms. $R^{198}$ is a vinyl group, an aryl group, or a (meth)acrylic group. In general formula (60), $X^{87}$ is preferably a direct bond, an alkylene chain containing 1 to 6 carbon atoms, a cycloalkylene chain containing 4 to 7 carbon atoms, or an arylene chain containing 6 to 10 carbon atoms. Furthermore, $X^{88}$ is preferably a direct bond or an arylene chain containing 6 to 10 carbon atoms. The above alkylene chain, cycloalkylene chain, arylene chain, vinyl group, aryl group, and (meth)acrylic group may each have a heteroatom and may each be either a substitution product or a non-substitution product.

Examples of the compound as represented by general formula (58) that contains two or more aromatic groups and a hydroxyl group in the molecule include 9,9-bis[4-(2-hydroxyethoxy)phenyl] fluorene, 9,9-bis[4-(3-hydroxypropoxy)phenyl] fluorene, 9,9-bis[4-(2-hydroxyethoxy)-3-methylphenyl] fluorene, 9,9-bis[4-(2-hydroxyethoxy)-3,5-dimethylphenyl] fluorene, 9,9-bis(4-hydroxyphenyl) fluorene, 9,9-bis(4-hydroxy-3-methylphenyl) fluorene, 9,9-bis(4-hydroxy-3,5-dimethylphenyl) fluorene, 1,1-bis(4-hydroxyphenyl)-1,1-diphenyl methane, 1,1-bis(4-hydroxyphenyl)-3-phenyl-2,3-dihydroindene, 1,1-bis(4-hydroxyphenyl)-1,3-diphenyl propane, 1,1-bis(4-hydroxyphenyl)-2,4-diphenyl cyclopentane, 2,2-bis(4-hydroxyphenyl)-2,3-dihydroindene, and 3,3-bis(4-hydroxyphenyl)-2,5-diphenyl pentane.

Examples of the compound as represented by general formula (59) that contains two or more aromatic groups and an epoxy group in the molecule include 9,9-bis[4-(2-glycidoxyethoxy)phenyl] fluorene, 9,9-bis[4-(3-glycidoxypropoxy)phenyl] fluorene, 9,9-bis[4-(2-glycidoxyethoxy)-3-methylphenyl] fluorene, 9,9-bis[4-(2-glycidoxyethoxy)-3,5-dimethylphenyl] fluorene, 9,9-bis(4-glycidoxyphenyl) fluorene, 9,9-bis(4-glycidoxy-3-methylphenyl) fluorene, 9,9-bis(4-glycidoxy-3,5-dimethylphenyl) fluorene, 1,1-bis(4-glycidoxyphenyl)-1,1-diphenyl methane, 1,1-bis(4-glycidoxyphenyl)-3-phenyl-2,3-dihydroindene, 1,1-bis(4-glycidoxyphenyl)-1,3-diphenyl propane, 1,1-bis(4-glycidoxyphenyl)-2,4-diphenyl cyclopentane, 2,2-bis(4-glycidoxyphenyl)-2,3-dihydroindene, and 3,3-bis(4-glycidoxyphenyl)-2,5-diphenyl pentane, as well as OGSOL (registered trademark) PG, PG-100, EG, EG-200, and EG-210 (all manufactured by Osaka Gas Chemicals Co., Ltd.).

Examples of the unsaturated compound as represented by general formula (60) that contains an ethylenically unsaturated double bond group and an epoxy group include glycidyl (meth)acrylate, (α-ethyl)glycidyl (meth)acrylate, (α-n-propyl)glycidyl (meth)acrylate, (3,4-epoxy)heptyl (meth)acrylate, glycidyl 2-vinylacetate, glycidyl 4-vinylcyclohexane carboxylate, glycidyl 4-vinylbenzoate, allylglycidyl ether, vinylglycidyl ether, 4-vinylbenzylglycidyl ether, α-methyl-4-vinylbenzylglycidyl ether, 2,4-bis(glycidyloxymethyl) styrene, and 2,4,6-tris-(glycidyloxymethyl styrene).

Examples of the unsaturated carboxylic acid that contains an ethylenically unsaturated double bond group include (meth)acrylic acid, itaconic acid, maleic acid, fumaric acid, mono(2-acryloxyethyl) succinate, mono(2-acryloxyethyl) phthalate, tetrahydrophthalate, 3-methyl tetrahydrophthalate, 2-vinylacetic acid, 2-vinylcyclohexane carboxylic acid, 3-vinylcyclohexane carboxylic acid, 4-vinylcyclohexane carboxylic acid, 2-vinylbenzoic acid, 3-vinylbenzoic acid, 4-vinylbenzoic acid, 4-hydroxyphenyl (meth)acrylate, and 2-hydroxyphenyl (meth)acrylate.

Examples of the tetracarboxylic acid, tetracarboxylic acid dianhydride, tricarboxylic acid, tricarboxylic acid anhydride, dicarboxylic acid, dicarboxylic acid anhydride, dicarboxylic acid dichloride, dicarboxylic acid active diester, monocarboxylic acid, monocarboxylic acid chloride, and monocarboxylic acid active ester include the aforementioned compounds such as tetracarboxylic acids and/or derivatives thereof, tricarboxylic acids and/or derivatives thereof, dicarboxylic acids and/or derivatives thereof, monocarboxylic acids, monocarboxylic acid chlorides, or monocarboxylic acid active esters.

Examples of catalysts used for the ring-opening addition reactions of the compound as represented by general formula (59) that contains two or more aromatic groups and an epoxy group in the molecule, the unsaturated compound as represented by general formula (60) that contains an ethylenically unsaturated double bond group and an epoxy group, or the unsaturated carboxylic acid that contains an ethylenically unsaturated double bond group include amine based catalysts such as triethyl amine, dimethyl aniline, tetramethylethylene diamine, 2,4,6-tris-(dimethylaminomethyl) phenol, dimethylbenzyl amine, and tri-n-octylamine; quaternary ammonium salts such as tetramethyl ammonium chloride, tetramethyl ammonium bromide, an tetramethyl ammonium fluoride; alkyl ureas such as tetramethyl urea; alkyl guanidines such as tetramethyl guanidine; tin based catalysts such as tin(II) bis(2-ethylhexanoate) and di-n-butyltin(IV) dilaurate; titanium based catalysts such as titanium(IV) tetrakis(2-ethylhexanoate); phosphorus based catalysts such as triphenyl phosphine and triphenyl phosphine oxide; chromium based catalysts such as tris(acetylacetonato)chromium(III), chromium(III) chloride, chromium(III) octenoate, and chromium(III) naphthenate; and cobalt based catalysts such as cobalt(II) octenoate.

<Structural Units Derived from One or More Selected from the Group Consisting of Tetracarboxylic Acid Having Fluorine Atom, Tetracarboxylic Acid Dianhydride Having Fluorine Atom, Tricarboxylic Acid Having Fluorine Atom, and Dicarboxylic Acid Having Fluorine Atom>

It is preferable for the polycyclic side chain-containing resin (A2-2) used for the present invention to contain a structural unit derived from one or more selected from the group consisting of tetracarboxylic acid having a fluorine atom, tetracarboxylic acid dianhydride having a fluorine atom, tricarboxylic acid having a fluorine atom, and dicarboxylic acid having a fluorine atom. If the polycyclic side chain-containing resin (A2-2) used for the present invention contains a structural unit derived from one or more selected from the group consisting of tetracarboxylic acid having a fluorine atom, tetracarboxylic acid dianhydride having a fluorine atom, tricarboxylic acid having a fluorine atom, and dicarboxylic acid having a fluorine atom, it ensures an improved transparency and an improved sensitivity during light exposure. This also works to allow the film surface to have water repellency and depress the infiltration through the film surface during alkali development.

Examples of the tetracarboxylic acid having a fluorine atom, tetracarboxylic acid dianhydride having a fluorine atom, tricarboxylic acid having a fluorine atom, and dicarboxylic acid having a fluorine atom include the aforementioned compounds such as tetracarboxylic acid having a fluorine atom, tetracarboxylic acid derivative having a fluorine atom, dicarboxylic acid having a fluorine atom, and dicarboxylic acid derivative having a fluorine atom.

In the polycyclic side chain-containing resin (A2-2), those structural units derived from one or more selected from the group consisting of tetracarboxylic acid having a fluorine atom, tetracarboxylic acid dianhydride having a fluorine atom, tricarboxylic acid having a fluorine atom, and dicarboxylic acid having a fluorine atom preferably account for 30 to 100 mol %, more preferably 50 to 100 mol %, and still more preferably 70 to 100 mol %, of all structural units derived from a tetracarboxylic acid, a dicarboxylic acid, and a derivative thereof. A content of 30 to 100 mol % ensures improved sensitivity during light exposure.

<Structural Units Derived from One or More Selected from the Group Consisting of Tetracarboxylic Acid Having Aromatic Group, Tetracarboxylic Acid Dianhydride Having Aromatic Group, Tricarboxylic Acid Having Aromatic Group, and Dicarboxylic Acid Having Aromatic Group>

It is preferable for the polycyclic side chain-containing resin (A2-2) used for the present invention to contain a structural unit derived from one or more selected from the group consisting of tetracarboxylic acid having an aromatic group, tetracarboxylic acid dianhydride having an aromatic group, tricarboxylic acid having an aromatic group, and dicarboxylic acid having an aromatic group. If the polycyclic side chain-containing resin (A2-2) used for the present invention contains a structural unit derived from one or more selected from the group consisting of tetracarboxylic acid having an aromatic group, tetracarboxylic acid dianhydride having an aromatic group, tricarboxylic acid having an aromatic group, and dicarboxylic acid having an aromatic group, the heat resistance of the aromatic group serves to produce a cured film with an improved heat resistance.

If a pigment (D1) in particular is added as the coloring agent (D) which will be described later, and if in that case the polycyclic side chain-containing resin (A2-2) contains a structural unit derived from a copolymerization component having an aromatic group, the steric hindrance of the aromatic group serves to improve the dispersion stability of the pigment (D1). If the pigment (D1) is an organic pigment (D1-1), the aromatic group in the polycyclic side chain-containing resin (A2-2) interacts with the aromatic group in the organic pigment (D1-1), thereby serving to improve the dispersion stability of the organic pigment (D1-1).

Examples of the tetracarboxylic acid having an aromatic group, tetracarboxylic acid dianhydride having an aromatic group, tricarboxylic acid having an aromatic group, and dicarboxylic acid having an aromatic group include the aforementioned compounds such as aromatic tetracarboxylic acids and/or derivatives thereof, aromatic tricarboxylic acids and/or derivatives thereof, and aromatic dicarboxylic acids and/or derivatives thereof.

In the polycyclic side chain-containing resin (A2-2), those structural units derived from one or more selected from the group consisting of tetracarboxylic acid having an aromatic group, tetracarboxylic acid dianhydride having an aromatic group, tricarboxylic acid having an aromatic group, and dicarboxylic acid having an aromatic group preferably account for 10 to 100 mol %, more preferably 20 to 100 mol %, and still more preferably 30 to 100 mol %, of all structural units derived from a tetracarboxylic acid, a dicarboxylic acid, and a derivative thereof. A content of 10 to 100 mol % ensures the production of a cured film having an improved heat resistance.

<Structural Units Derived from One or More Selected from the Group Consisting of Tetracarboxylic Acid Having Alicyclic Group, Tetracarboxylic Acid Dianhydride Having Alicyclic Group, Tricarboxylic Acid Having Alicyclic Group, and Dicarboxylic Acid Having Alicyclic Group>

It is preferable for the polycyclic side chain-containing resin (A2-2) used for the present invention to contain a structural unit derived from one or more selected from the group consisting of tetracarboxylic acid having an alicyclic group, tetracarboxylic acid dianhydride having an alicyclic group, tricarboxylic acid having an alicyclic group, and dicarboxylic acid having an alicyclic group. If the polycyclic side chain-containing resin (A2-2) used for the present invention contains a structural unit derived from one or more selected from the group consisting of tetracarboxylic acid having an alicyclic group, tetracarboxylic acid dianhydride having an alicyclic group, tricarboxylic acid having an alicyclic group, and dicarboxylic acid having an alicyclic group, the heat resistance and transparency of the alicyclic group serves to produce a cured film with an improved heat resistance and an improved transparency.

Examples of the tetracarboxylic acid having an alicyclic group, tetracarboxylic acid dianhydride having an alicyclic group, tricarboxylic acid having an alicyclic group, and dicarboxylic acid having an alicyclic group include the aforementioned compounds such as alicyclic tetracarboxylic acids and/or derivatives thereof, alicyclic tricarboxylic acids and/or derivatives thereof, and alicyclic dicarboxylic acids and/or derivatives thereof.

In the polycyclic side chain-containing resin (A2-2), those structural units derived from one or more selected from the group consisting of tetracarboxylic acid having an alicyclic group, tetracarboxylic acid dianhydride having an alicyclic group, tricarboxylic acid having an alicyclic group, and dicarboxylic acid having an alicyclic group preferably account for 5 mol % or more, more preferably 10 mol % or more, still more preferably 15 mol % or more, of all structural units derived from a tetracarboxylic acid, a dicarboxylic acid, and a derivative thereof. A content of 5 mol % or more ensures the production of a cured film having an improved heat resistance and an improved transparency. On the other hand, the content is preferably 90 mol % or less, more preferably 85 mol % or less, and still more preferably 75 mol % or less. A content of 90 mol % or less ensures the production of a cured film having improved mechanical characteristics.

<Acidic Group Derived from Tetracarboxylic Acid, Tetracarboxylic Acid Dianhydride, Tricarboxylic Acid, Tricarboxylic Acid Anhydride, or Dicarboxylic Acid Dianhydride>

The polycyclic side chain-containing resin (A2-2) used for the present invention contains a structural unit derived from a tetracarboxylic acid, tetracarboxylic acid dianhydride, tricarboxylic acid, tricarboxylic acid anhydride, or dicarboxylic dianhydride, and it is preferable that the polycyclic side chain-containing resin (A2-2) has an acidic group. If the polycyclic side chain-containing resin (A2-2) contains an acidic group, it ensures an improved pattern processability in an alkaline developer and an improved resolution after development.

The acidic group is preferably one that shows an acidity of less than pH 6. Examples of such an acidic group that shows an acidity of less than pH 6 include carboxyl group, carboxylic acid anhydride group, sulfonic acid group, phenolic hydroxyl group, and hydroxyimide group. From the viewpoint of ensuring an improved pattern processability in an alkaline developer and an improved resolution after development, the carboxylic group, carboxylic acid anhydride group, and phenolic hydroxyl group are preferable, and the carboxyl group and carboxylic acid anhydride group are more preferable.

Examples of the tetracarboxylic acid, tetracarboxylic acid dianhydride, tricarboxylic acid, tricarboxylic acid anhydride, and dicarboxylic acid dianhydride include the compounds described above.

The polycyclic side chain-containing resin (A2-2) used for the present invention preferably has an acid equivalent of 280 g/mol or more, more preferably 300 g/mol or more, and still more preferably 400 g/mol or more. An acid equivalent of 280 g/mol or more ensures a decreased film loss during alkali development. On the other hand, the acid equivalent is preferably 1,400 g/mol or less, more preferably 1,100 g/mol or less, and still more preferably 950 g/mol or less. An acid equivalent of 1,400 g/mol or less ensures an improved pattern processability in an alkali developer and an improved resolution after development. From the viewpoint of ensuring an improved pattern processability in an alkaline developer and an improved resolution after development, the acid equivalent is preferably the carboxylic acid equivalent.

The contents of structural units derived from various monomer components in a polycyclic side chain-containing resin (A2-2) can be determined by a combination of methods such as $^1$H-NMR, $^{13}$C-NMR, $^{29}$Si-NMR, IR, TOF-MS, elementary analysis, and ash content measurement.

<Physical Properties of Polycyclic Side Chain-Containing Resin (A2-2)>

The polycyclic side chain-containing resin (A2-2) used for the present invention preferably has a double bond equivalent of 150 g/mol or more, more preferably 200 g/mol or more, and still more preferably 250 g/mol or more. A double bond equivalent of 150 g/mol or more ensures improved adhesion to the underlying substrate. On the other hand, the double bond equivalent is preferably 10,000 g/mol or less, more preferably 5,000 g/mol or less, and still more preferably 2,000 g/mol or less. A double bond equivalent of 10,000 g/mol or less ensures improved sensitivity during light exposure.

The polycyclic side chain-containing resin (A2-2) used for the present invention preferably has a polystyrene based Mw of 500 or more, more preferably 1,000 or more, and still more preferably 1,500 or more, as determined by GPC. When Mw is 500 or more, it is possible to improve resolution after development. On the other hand, the Mw is preferably 100,000 or less, more preferably 50,000 or less, and still more preferably 20,000 or less. A Mw of 100,000 or less ensures an improved leveling property during coating and an improved pattern processability in an alkaline developer.

<Acrylic Resin (A2-3)>

Examples of the acrylic resin (A2-3) used for the present invention include acrylic resins obtainable through radical copolymerization of one or more copolymerization components selected from the group consisting of copolymerization components having acidic groups, copolymerization components derived from (meth)acrylic esters, and other copolymerization components.

The acrylic resin (A2-3) used for the present invention preferably has an ethylenically unsaturated double bond group. For the acrylic resin (A2-3), ethylenically unsaturated double bond groups can be introduced easily into side chains branched from the backbone chain of the resin. Having an ethylenically unsaturated double bond group, the acrylic resin (A2-3) is a photo-curing resin which develops a three dimensional crosslinked structure of carbon-carbon bonds when cured by UV exposure. Accordingly, a resin composition that contains the acrylic resin (A2-3) having an ethylenically unsaturated double bond group in side chains shows an improved sensitivity during light exposure. Furthermore, the three dimensional crosslinked structure formed has an alicyclic structure or an aliphatic structure as primary component and accordingly, the softening point of the resin is prevented from rising, allowing a small-tapered pattern shape to be formed and enabling the production of a cured film with improved mechanical characteristics. Therefore, such a cured film is suited to applications that require good mechanical characteristics.

From the viewpoint of ensuring an improved sensitivity during light exposure and a cured film with improved mechanical characteristics, it is preferable for the acrylic resin (A2-3) used for the present invention to contain a structural unit as represented by general formula (61) and/or a structural unit as represented by general formula (62).

[Chemical formula 15]

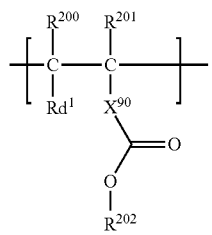

(61)

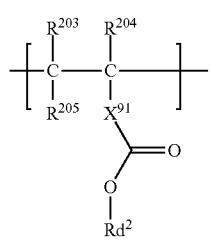

(62)

In general formulae (61) and (62), $Rd^1$ and $Rd^2$ are each independently an alkyl group containing 1 to 10 carbon atoms, a cycloalkyl group containing 4 to 15 carbon atoms, or an aryl group containing 6 to 15 carbon atoms, each also containing an ethylenically unsaturated double bond group. $R^{200}$ to $R^{205}$ are each independently a hydrogen atom, an alkyl group having 1 to 10 carbon atoms, a cycloalkyl group having 4 to 10 carbon atoms, or an aryl group having 6 to 15 carbon atoms. $X^{90}$ and $X^{91}$ are each independently a direct bond, an alkylene chain containing 1 to 10 carbon atoms, a cycloalkylene chain containing 4 to 10 carbon atoms, or an arylene chain containing 6 to 15 carbon atoms. In general formulae (61) and (62), it is preferable that $Rd^1$ and $Rd^2$ are each independently an alkyl group containing 1 to 6 carbon atoms, a cycloalkyl group containing 4 to 10 carbon atoms, or an aryl group containing 6 to 10 carbon atoms, each also containing an ethylenically unsaturated double bond group. Furthermore, it is preferable that $R^{200}$ to $R^{205}$ are each independently a hydrogen atom, an alkyl group having 1 to 6 carbon atoms, a cycloalkyl group having 4 to 7 carbon atoms, or an aryl group having 6 to 10 carbon atoms. It is also preferable that $X^{90}$ and $X^{91}$ are each independently a direct bond, an alkylene chain containing 1 to 6 carbon atoms, an cycloalkylene chain containing 4 to 7 carbon atoms, or an arylene chain containing 6 to 10 carbon atoms. The above alkyl group, cycloalkyl group, aryl group, alkylene chain, cycloalkylene chain, and arylene chain may each contain a heteroatom and may each be either a substitution product or a non-substitution product.

The acrylic resin (A2-3) used for the present invention is preferably an acrylic resin (A2-3) obtainable through a radical copolymerization of a copolymerization component having an acidic group or other copolymerization components. Such other copolymerization components are each preferably a copolymerization component having an aromatic group or a copolymerization component having an alicyclic group.

<Structural Unit Derived from Copolymerization Component Having Acidic Group>

The acrylic resin (A2-3) used for the present invention contains a structural unit derived from a copolymerization component having an acidic group and it is preferable that the acrylic resin (A2-3) has an acidic group. If the acrylic resin (A2-3) contains an acidic group, it ensures an improved pattern processability in an alkaline developer and an improved resolution after development.

The acidic group is preferably one that shows an acidity of less than pH 6. Examples of such an acidic group that shows an acidity of less than pH 6 include carboxyl group, carboxylic acid anhydride group, sulfonic acid group, phenolic hydroxyl group, and hydroxyimide group. From the viewpoint of ensuring an improved pattern processability in an alkaline developer and an improved resolution after development, the carboxylic group, carboxylic acid anhydride group, and phenolic hydroxyl group are preferable, and the carboxyl group and carboxylic acid anhydride group are more preferable.

Examples of the copolymerization component having an acidic group include (meth)acrylic acid, (meth)acrylic acid anhydride, itaconic acid, itaconic acid anhydride, maleic acid, fumaric acid, mono(2-acryloxyethyl) succinate, mono (2-acryloxyethyl) phthalate, mono(2-acryloxyethyl) tetrahydrophthalate, tetrahydrophthalate, 3-methyl tetrahydrophthalate, 2-vinylacetic acid, 2-vinylcyclohexane carboxylic acid, 3-vinylcyclohexane carboxylic acid, 4-vinylcyclohexane carboxylic acid, 2-vinylbenzoic acid, 3-vinylbenzoic acid, 4-vinylbenzoic acid, 4-hydroxyphenyl (meth)acrylate, and 2-hydroxyphenyl (meth)acrylate. From the viewpoint of ensuring an improved pattern processability in an alkaline developer and an improved resolution after development, (meth)acrylic acid, (meth)acrylic acid anhydride, itaconic acid, itaconic acid anhydride, maleic acid, fumaric acid, mono(2-acryloxyethyl) succinate, mono(2-acryloxyethyl) phthalate, and mono(2-acryloxyethyl) tetrahydrophthalate are preferable, and (meth)acrylic acid, (meth)acrylic acid anhydride, itaconic acid, itaconic acid anhydride, maleic acid, fumaric acid, and mono(2-acryloxyethyl) succinate are more preferable.

The acrylic resin (A2-3) used for the present invention preferably has an acid equivalent of 280 g/mol or more, more preferably 300 g/mol or more, and still more preferably 400 g/mol or more. An acid equivalent of 280 g/mol or more ensures a decreased film loss during alkali development. On the other hand, the acid equivalent is preferably 1,400 g/mol or less, more preferably 1,100 g/mol or less, and still more preferably 950 g/mol or less. An acid equivalent of 1,400 g/mol or less ensures an improved pattern processability in an alkali developer and an improved resolution after development. From the viewpoint of ensuring an improved pattern processability in an alkaline developer and an improved resolution after development, the acid equivalent is preferably the carboxylic acid equivalent.

Regarding the acrylic resin (A2-3) used for the present invention, it is preferable for the acrylic resin (A2-3) not to have an epoxy group when the acrylic resin (A2-3) has a carboxyl group. If the acrylic resin (A2-3) has both a carboxyl group and an epoxy group, the carboxyl group and the epoxy group can react with each other during storage of a coating liquid prepared from the resin composition. Therefore, the coating liquid prepared from the resin composition will have a decreased storage stability. A preferable example of the acrylic resin (A2-3) that has no epoxy group is one produced through a radical copolymerization of a copolymerization component that has a carboxyl group or a carboxylic acid anhydride group and another copolymerization component that has no epoxy group.

<Structural Unit Derived from Copolymerization Component Having Aromatic Group>

It is preferable for the acrylic resin (A2-3) used for the present invention to contain a structural unit derived from a copolymerization component having an aromatic group. If the acrylic resin (A2-3) contains a structural unit derived from a copolymerization component having an aromatic group, the heat resistance of the aromatic group serves to produce a cured film with an improved heat resistance.

If a pigment (D1) in particular is incorporated as the coloring agent (D) which will be described later, and if in that case the acrylic resin (A2-3) contains a structural unit derived from a copolymerization component having an aromatic group, the steric hindrance of the aromatic group serves to improve the dispersion stability of the pigment (D1). If the pigment (D1) is an organic pigment (D1-1), the aromatic group in the acrylic resin (A2-3) interacts with the aromatic group in the organic pigment (D1-1), thereby serving to improve the dispersion stability of the organic pigment (D1-1).

Examples of the copolymerization component having an aromatic group include mono(2-acryloxyethyl) phthalate, 4-hydroxyphenyl (meth) acrylate, 2-hydroxyphenyl (meth) acrylate, phenyl (meth)acrylate, 4-tolyl (meth) acrylate, 4-styryl (meth) acrylate, 1-naphthyl (meth) acrylate, 2-naphthyl (meth) acrylate, 4-biphenyl (meth)acrylate, benzyl (meth)acrylate, phenylethyl (meth)acrylate, styrene, 4-methylstyrene, 2-methylstyrene, 3-methylstyrene, and α-methylstyrene. From the viewpoint of producing a cured film with an improved heat resistance, mono(2-acryloxyethyl) phthalate, 4-hydroxyphenyl (meth) acrylate, 2-hydroxyphenyl (meth) acrylate, phenyl (meth)acrylate, 4-tolyl (meth)acrylate, 4-styryl (meth) acrylate, 1-naphthyl (meth) acrylate, 2-naphthyl (meth)acrylate, 4-biphenyl (meth)acrylate, styrene, 4-methylstyrene, 2-methylstyrene, 3-methylstyrene, and α-methylstyrene are preferable, and 1-naphthyl (meth) acrylate, 2-naphthyl (meth)acrylate, and styrene are more preferable.

In the acrylic resin (A2-3), the structural units derived from copolymerization components having aromatic groups preferably account for 10 mol % or more, more preferably 20 mol % or more, and still more preferably 30 mol % or more, of all structural units derived from copolymerization components. A content of 10 mol % or more ensures the production of a cured film having an improved heat resistance. On the other hand, the content is preferably 80 mol % or less, more preferably 75 mol % or less, and still more preferably 70 mol % or less. A content of 80 mol % or less ensures improved sensitivity during light exposure.

<Structural Unit Derived from Copolymerization Component Containing Alicyclic Group>

It is preferable for the acrylic resin (A2-3) used for the present invention to contain a structural unit derived from a copolymerization component having an alicyclic group. If the acrylic resin (A2-3) contains a structural unit derived from a copolymerization component having an alicyclic group, the heat resistance and transparency of the alicyclic group serves to produce a cured film with an improved heat resistance and an improved transparency.

Examples of the copolymerization component having an alicyclic group include mono(2-acryloxyethyl) tetrahydrophthalate, cyclopentyl (meth) acrylate, cyclohexyl (meth)acrylate, cyclohexenyl (meth)acrylate, 4-methoxycyclohexyl (meth) acrylate, (2-isopropyloxycarbonyl)ethyl (meth)acrylate, (2-cyclopentyloxycarbonyl) ethyl (meth) acrylate, (2-cyclohexyloxycarbonyl)ethyl (meth) acrylate, (2-cyclohexenyloxycarbonyl)ethyl (meth)acrylate, [2-(4-methoxycyclohexyl)oxycarbonyl]ethyl (meth) acrylate, 2-norbornyl (meth) acrylate, isobornyl (meth) acrylate, tricyclodecanyl (meth) acrylate, tetracyclodecanyl (meth) acrylate, dicyclopentenyl (meth) acrylate, adamanthyl (meth)acrylate, adamanthylmethyl (meth) acrylate, and [(1-methyl) adamanthyl] (meth)acrylate. From the viewpoint of ensuring the production of a cured film with an improved heat resistance and improved transparency, 2-norbornyl (meth) acrylate, isobornyl (meth) acrylate, tricyclodecanyl (meth) acrylate, tetracyclodecanyl (meth) acrylate, dicyclopentenyl (meth) acrylate, adamanthyl (meth) acrylate, adamanthylmethyl (meth)acrylate, and [(1-methyl) adamanthyl] (meth)acrylate are preferable.

In the acrylic resin (A2-3), the structural units derived from copolymerization components having alicyclic groups preferably account for 5 mol % or more, more preferably 10 mol % or more, and still more preferably 15 mol % or more, of all structural units derived from copolymerization components. A content of 5 mol % or more ensures the production of a cured film having an improved heat resistance and an improved transparency. On the other hand, the content is preferably 90 mol % or less, more preferably 85 mol % or less, and still more preferably 75 mol % or less. A content of 90 mol % or less ensures the production of a cured film having improved mechanical characteristics.

The acrylic resin (A2-3) used for the present invention is preferably a resin obtainable through a ring-opening addition reaction of the acrylic resin (A2-3) obtainable through a radical copolymerization of a copolymerization component having an acidic group or other copolymerization components with an unsaturated compound as represented by general formula (60) that contains an ethylenically unsaturated double bond group and an epoxy group. Features of general formula (60) given above are described above.

Examples of the unsaturated compound as represented by general formula (60) that contains an ethylenically unsaturated double bond group and an epoxy group include glycidyl (meth)acrylate, (α-ethyl)glycidyl (meth)acrylate, (α-n-propyl)glycidyl (meth)acrylate, (3,4-epoxy)heptyl (meth) acrylate, (3,4-epoxycyclohexyl)methyl (meth)acrylate, glycidyl 2-vinylacetate, glycidyl 4-vinylcyclohexane carboxylate, glycidyl 4-vinylbenzoate, allylglycidyl ether, vinylglycidyl ether, 4-vinylbenzylglycidyl ether, α-methyl-4-vinylbenzylglycidyl ether, 2,4-bis(glycidyloxymethyl) styrene, and 2,4,6-tris-(glycidyloxymethyl styrene).

Examples of catalysts used for the ring-opening addition reaction of the unsaturated compound as represented by general formula (60) that contains an ethylenically unsaturated double bond group and an epoxy group include amine based catalysts such as triethyl amine, dimethyl aniline, tetramethylethylene diamine, 2,4,6-tris-(dimethylaminomethyl) phenol, dimethylbenzyl amine, and tri-n-octylamine; quaternary ammonium salts such as tetramethyl ammonium chloride, tetramethyl ammonium bromide, and tetramethyl ammonium fluoride; alkyl ureas such as tetramethyl urea; alkyl guanidines such as tetramethyl guanidine; tin based catalysts such as tin(II) bis(2-ethylhexanoate) and di-n-butyltin(IV) dilaurate; titanium based catalysts such as titanium(IV) tetrakis(2-ethylhexanoate); phosphorus based catalysts such as triphenyl phosphine and triphenyl phosphine oxide; chromium based catalysts such as tris(acetylacetonato)chromium(III), chromium(III) chloride, chromium(III) octenoate, and chromium(III) naphthenate; and cobalt based catalysts such as cobalt(II) octenoate.

The contents of structural units derived from various copolymerization components in the acrylic resin (A2-3) can be determined by a combination of methods such as $^1$H-NMR, $^{13}$C-NMR, $^{29}$Si-NMR, IR, TOF-MS, elementary analysis, and ash content measurement.

<Physical Properties of Acrylic Resin (A2-3)>

The acrylic resin (A2-3) used for the present invention preferably has a double bond equivalent of 150 g/mol or more, more preferably 200 g/mol or more, and still more preferably 250 g/mol or more. A double bond equivalent of 150 g/mol or more ensures improved adhesion to the underlying substrate. On the other hand, the double bond equivalent is preferably 10,000 g/mol or less, more preferably 5,000 g/mol or less, and still more preferably 2,000 g/mol or less. A double bond equivalent of 10,000 g/mol or less ensures improved sensitivity during light exposure.

The acrylic resin (A2-3) used for the present invention preferably has a polystyrene based Mw of 1,000 or more, more preferably 3,000 or more, and still more preferably 5,000 or more, as determined by GPC. A Mw of 1,000 or more ensures an improved resolution after development. On the other hand, the Mw is preferably 100,000 or less, more preferably 70,000 or less, and still more preferably 50,000 or less. A Mw of 100,000 or less ensures an improved leveling property during coating and an improved pattern processability in an alkaline developer.

The acrylic resin (A2-3) can be synthesized by a generally known method. For example, a good method is to perform radical copolymerization of copolymerization components in air or nitrogen in the presence of a radical polymerization initiator. As a process for such radical copolymerization, a reaction container is placed in air or sufficiently purged with nitrogen by bubbling, reduced pressure deaeration, etc., and then copolymerization components and a radical polymerization initiator are added to a reaction solvent, followed by continuing the reaction at 60° C. to 110° C. for 30 to 500 minutes. In addition, a chain transfer agent such as thiol compounds and/or a polymerization terminator such as phenol compounds may be used as required.

<Acid-Modified Epoxy Resin (A2-4)>

Examples of the acid-modified epoxy resin (A2-4) used for the present invention include (I) an acid-modified epoxy resin produced by reacting a phenol compound, a carboxylic acid anhydride, and an epoxy compound, (II) an acid-modified epoxy resin produced by reacting an alcohol compound, a carboxylic acid anhydride, and an epoxy compound, (III) an acid-modified epoxy resin produced by reacting an epoxy compound, a carboxylic acid compound, and an epoxy compound, and (IV) an acid-modified epoxy resin produced by reacting an epoxy compound, a carboxylic acid compound, and a carboxylic acid anhydride.

The acid-modified epoxy resin (A2-4) is a thermosetting resin and its epoxy resin backbone, which forms the skeleton, has a highly heat resistant aromatic ring structure. Accordingly, the incorporation of an acid-modified epoxy resin in the resin composition ensures the production of a cured film with an improved heat resistance. Therefore, such a cured film is suited to applications that require heat resistance.

The acid-modified epoxy resin (A2-4) used for the present invention has an ethylenically unsaturated double bond group. For the acid-modified epoxy resin (A2-4), ethylenically unsaturated double bond groups can be introduced easily into side chains branched from the backbone chain of the resin. Having an ethylenically unsaturated double bond group, the acid-modified epoxy resin is a photo-curing resin which develops a three dimensional crosslinked structure of carbon-carbon bonds when cured by UV exposure. Accordingly, a resin composition that contains an acid-modified epoxy resin having an ethylenically unsaturated double bond group in side chains shows an improved sensitivity during light exposure. Furthermore, the three dimensional cross-linked structure formed has an alicyclic structure or an aliphatic structure as primary component and accordingly, the softening point of the resin is prevented from rising, allowing a small-tapered pattern shape to be formed and enabling the production of a cured film with improved mechanical characteristics. Therefore, such a cured film is suited to applications that require good mechanical characteristics.

The acid-modified epoxy resin (A2-4) used for the present invention has a carboxyl group and/or a carboxylic acid anhydride group to act as alkali-soluble groups. The existence of a carboxyl group and/or a carboxylic acid anhydride group ensures an improved resolution after development.

From the viewpoint of producing a cured film with an improved heat resistance, it is preferable for the acid-modified epoxy resin (A2-4) used for the present invention to contain one or more selected from the group consisting of a structural unit as represented by general formula (35), a structural unit as represented by general formula (36), a structural unit as represented by general formula (37), a structural unit as represented by general formula (38), a structural unit as represented by general formula (41), a structural unit as represented by general formula (42), and a structural unit as represented by general formula (43). Furthermore, the acid-modified epoxy resin (A2-4) used for the present invention has an ethylenically unsaturated double bond group, and from the viewpoint of ensuring an improved sensitivity during light exposure and producing a cured film with improved mechanical characteristics, it is preferable for an ethylenically unsaturated double bond group to be contained at one or more positions selected from the group consisting of the backbone chain, side chain, and chain end.

[Chemical formula 16]

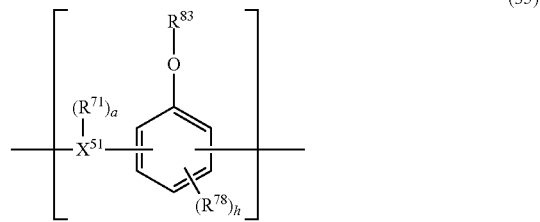

(35)

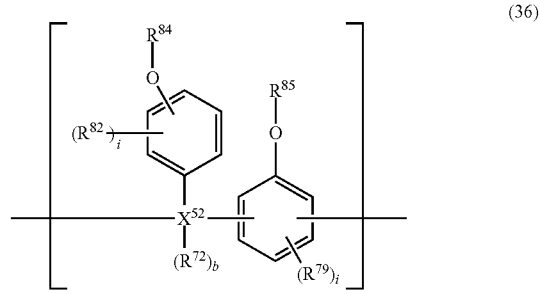

(36)

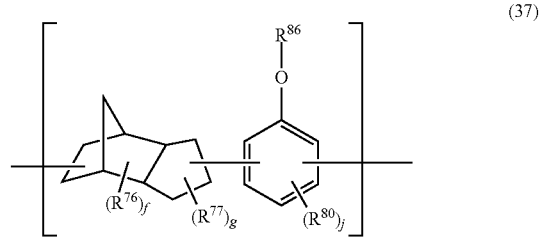

(37)

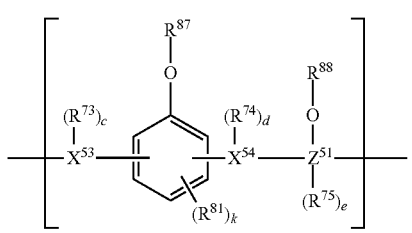
(38)

In general formulae (35) to (38), $X^{51}$ to $X^{54}$ are each independently an aliphatic structure containing 1 to 6 carbon atoms. $Z^{51}$ is a trivalent to decavalent fused polycyclic aromatic hydrocarbon ring containing 10 to 15 carbon atoms. $R^{71}$ to $R^{75}$ are each independently an alkyl group containing 1 to 10 carbon atoms, a cycloalkyl group containing 4 to 10 carbon atoms, or an aryl group containing 6 to 15 carbon atoms; $R^{76}$ and $R^{77}$ are each independently an alkyl group containing 1 to 10 carbon atoms; $R^{78}$ to $R^{82}$ are each independently a halogen, an alkyl group containing 1 to 10 carbon atoms, a cycloalkyl group containing 4 to 10 carbon atoms, or an aryl group containing 6 to 15 carbon atoms; and $R^{83}$ to $R^{88}$ are each independently a substituent group as represented by general formula (39). Furthermore; a, b, c, d, and e are each independently an integer of 0 to 10; f is an integer of 0 to 8, g is an integer of 0 to 6; h, i, j, and k are each independently an integer of 0 to 3; and l is an integer of 0 to 4. In general formulae (35) to (38), it is preferable that $X^{51}$ to $X^{54}$ are each independently an aliphatic structure containing 1 to 4 carbon atoms. It is preferable that $R^{71}$ to $R^{75}$ are each independently an alkyl group containing 1 to 6 carbon atoms, a cycloalkyl group containing 4 to 7 carbon atoms, or an aryl group containing 6 to 10 carbon atoms; it is preferable that $R^{76}$ and $R^{77}$ are each independently an alkyl group containing 1 to 6 carbon atoms; and it is preferable that $R^{78}$ to $R^{82}$ are each independently a halogen, an alkyl group containing 1 to 6 carbon atoms, a cycloalkyl group containing 4 to 7 carbon atoms, or an aryl group containing 6 to 10 carbon atoms. The above alkyl group, cycloalkyl group, aryl group, aliphatic structure, and fused polycyclic aromatic hydrocarbon ring may each have a heteroatom, and may each be either a substitution product or a non-substitution product.

[Chemical formula 17]

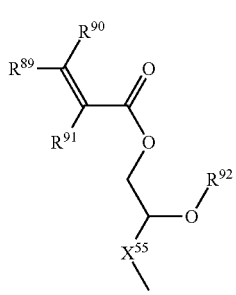
(39)

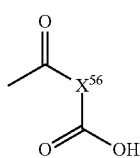
(40)

In general formula (39), $X^{55}$ is an alkylene chain containing 1 to 6 carbon atoms or an cycloalkylene chain containing 4 to 10 carbon atoms. $R^{89}$ to $R^{91}$ are each independently a hydrogen atom, an alkyl group containing 1 to 10 carbon atoms, or an aryl group containing 6 to 15 carbon atoms. $R^{92}$ is a hydrogen atom or a substituent group as represented by general formula (40). In general formula (39), it is preferable that $X^{55}$ is an alkylene chain containing 1 to 4 carbon atoms or a cycloalkylene chain containing 4 to 7 carbon atoms. It is preferable that $R^{89}$ and $R^{90}$ are each independently a hydrogen atom or an alkyl group containing 1 to 4 carbon atoms, and more preferably a hydrogen atom. $R^{91}$ is preferably a hydrogen atom or an alkyl group containing 1 to 4 carbon atoms, and more preferably a hydrogen atom or a methyl group. In general formula (40), $X^{56}$ is an alkylene chain containing 1 to 6 carbon atoms or an cycloalkylene chain containing 4 to 10 carbon atoms. In general formula (40), it is preferable that $X^{56}$ is an alkylene chain containing 1 to 4 carbon atoms or a cycloalkylene chain containing 4 to 7 carbon atoms. The above alkylene chains, cycloalkylene chains, alkyl groups, and aryl group may each be either a substitution product or a non-substitution product.

[Chemical formula 18]

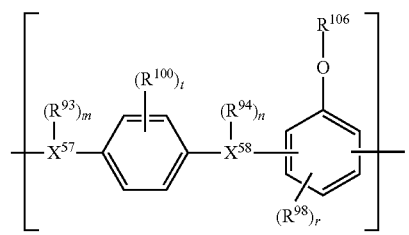
(41)

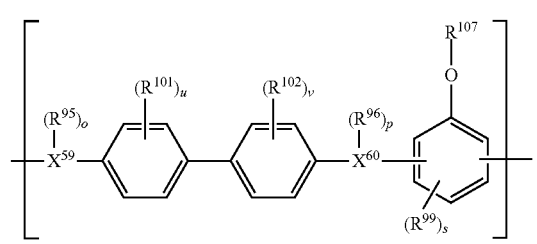
(42)

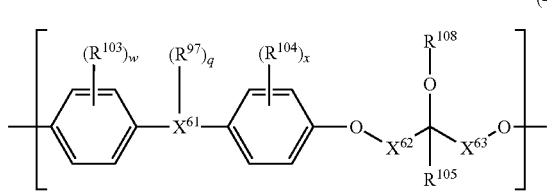
(43)

In general formulae (41) to (43), $X^{57}$ to $X^{61}$ are each independently an aliphatic structure containing 1 to 6 carbon atoms, and $X^{62}$ and $X^{63}$ are each independently an alkylene chain containing 1 to 6 carbon atoms, or a cycloalkylene chain containing 4 to 10 carbon atoms. $R^{93}$ to $R^{97}$ are each independently an alkyl group containing 1 to 10 carbon atoms, a cycloalkyl group containing 4 to 10 carbon atoms, or an aryl group containing 6 to 15 carbon atoms; $R^{98}$ to $R^{104}$ are each independently a halogen, an alkyl group containing 1 to 10 carbon atoms, a cycloalkyl group containing 4 to 10 carbon atoms, or an aryl group containing 6 to 15 carbon atoms; $R^{105}$ is a hydrogen atom or an alkyl group containing 1 to 6 carbon atoms; $R^{106}$ and $R^{107}$ are each independently a substituent group as represented by general formula (39); and $R^{108}$ is a hydrogen atom, a substituent group as represented by general formula (39), or a substituent group as represented by general formula (40). Furthermore, m, n, o, p, and q are each independently an integer of 0 to 10, r and s are each independently an integer of 0 to 3, and t, u, v, w, and x are each independently an integer of 0 to 4. In general formulae (41) to (43), it is preferable that $X^{57}$ to $X^{61}$ are each independently an aliphatic structure containing 1 to 4 carbon atoms, and it is preferable that $X^{62}$ and $X^{63}$ are each independently an alkylene chain containing 1 to 4 carbon atoms or a cycloalkylene chain containing 4 to 7 carbon atoms. It is preferable that $R^{93}$ to $R^{97}$ are each independently an alkyl group containing 1 to 6 carbon atoms, a cycloalkyl group containing 4 to 7 carbon atoms, or an aryl group containing 6 to 10 carbon atoms; it is preferable that $R^{98}$ to $R^{104}$ are each independently a halogen, an alkyl group containing 1 to 6 carbon atoms, a cycloalkyl group containing 4 to 7 carbon atoms, or an aryl group containing 6 to 10 carbon atoms; and it is preferable that $R^{105}$ is a hydrogen atom or an alkyl group containing 1 to 4 carbon atoms. The above alkylene chain, cycloalkylene chain, alkyl group, cycloalkyl group, aryl group, and aliphatic structure may each have a heteroatom and may each be either a substitution product or a non-substitution product.

Of the various acid-modified epoxy resins (A2-4) used for the present invention, those acid-modified epoxy resins (A2-4) having structural units as represented by general formula (43) preferably have a substituent group as represented by general formula (44) and/or a substituent group as represented by general formula (45) at chain ends.

[Chemical formula 19]

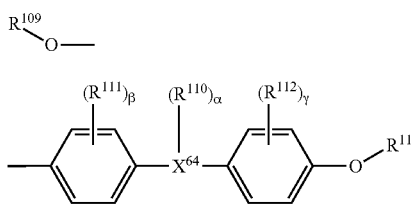

(44)

(45)

In general formula (44), $R^{109}$ is a substituent group as represented by general formula (39). In general formula (45), $X^{64}$ is an aliphatic structure containing 1 to 6 carbon atoms. $R^{64}$ is an alkyl group containing 1 to 10 carbon atoms, a cycloalkyl group containing 4 to 10 carbon atoms, or an aryl group containing 6 to 15 carbon atoms, and $R^{111}$ and $R^{112}$ are each independently a halogen, an alkyl group containing 1 to 10 carbon atoms, a cycloalkyl group containing 4 to 10 carbon atoms, or an aryl group containing 6 to 15 carbon atoms. $R^{113}$ is a substituent group as represented by general formula (39). Here, a is an integer of 0 to 10. Furthermore, β and γ are each an integer of 0 to 4. In general formula (45), it is preferable that $X^{64}$ is an aliphatic structure containing 1 to 4 carbon atoms. It is preferable that $R^{110}$ is an alkyl group containing 1 to 6 carbon atoms, a cycloalkyl group containing 4 to 7 carbon atoms, or an aryl group containing 6 to 10 carbon atoms, and it is preferable that $R^{111}$ and $R^{112}$ are each independently a halogen, an alkyl group containing 1 to 6 carbon atoms, a cycloalkyl group containing 4 to 7 carbon atoms, or an aryl group containing 6 to 10 carbon atoms.

<Structural Unit Derived from One or More Selected from the Group Consisting of Tetracarboxylic Acid Having Aromatic Group, Tricarboxylic Acid Having Aromatic Group, Tricarboxylic Acid Anhydride Having Aromatic Group, Dicarboxylic Acid Having Aromatic Group, and Dicarboxylic Acid Anhydride Having Aromatic Group>

It is preferable for the acid-modified epoxy resin (A2-4) used for the present invention to contain a structural unit derived from one or more selected from the group consisting of tetracarboxylic acid having an aromatic group, tricarboxylic acid having an aromatic group, tricarboxylic acid anhydride having an aromatic group, dicarboxylic acid having an aromatic group, and dicarboxylic acid anhydride having an aromatic group. If the acid-modified epoxy resin (A2-4) contains a structural unit derived from a component having an aromatic group, the heat resistance of the aromatic group serves to produce a cured film with an improved heat resistance.

If a pigment (D1) in particular is incorporated as the coloring agent (D) which will be described later, and if in that case the acid-modified epoxy resin (A2-4) contains a structural unit derived from a component having an aromatic group, the steric hindrance of the aromatic group serves to improve the dispersion stability of the pigment (D1). If the pigment (D1) is an organic pigment (D1-1), the aromatic group in the acid-modified epoxy resin (A2-4) interacts with the aromatic group in the organic pigment (D1-1), thereby serving to improve the dispersion stability of the organic pigment (D1-1).

Examples of the tetracarboxylic acid having an aromatic group, tricarboxylic acid having an aromatic group, tricarboxylic acid anhydride having an aromatic group, dicarboxylic acid having an aromatic group, and dicarboxylic acid anhydride having an aromatic group include compounds such as the aforementioned aromatic tetracarboxylic acids and/or derivatives thereof, aromatic tricarboxylic acids and/or derivatives thereof, or aromatic dicarboxylic acids and/or derivatives thereof.

In the acid-modified epoxy resin (A2-4), those structural units derived from one or more selected from the group consisting of tetracarboxylic acid having an aromatic group, tricarboxylic acid having an aromatic group, tricarboxylic acid anhydride having an aromatic group, dicarboxylic acid having an aromatic group, and dicarboxylic acid anhydride having an aromatic group preferably account for 10 to 100 mol %, more preferably 20 to 100 mol %, and still more preferably 30 to 100 mol %, of all structural units derived from a tetracarboxylic acid, a dicarboxylic acid, and a derivative thereof. A content in the above range ensures the production of a cured film having an improved heat resistance.

<Structural Unit Derived from One or More Selected from the Group Consisting of Tetracarboxylic Acid Having Alicyclic Group, Tricarboxylic Acid Having Alicyclic Group, Tricarboxylic Acid Anhydride Having Alicyclic Group, Dicarboxylic Acid Having Alicyclic Group, and Dicarboxylic Acid Anhydride Having Alicyclic Group>

It is preferable for the acid-modified epoxy resin (A2-4) used for the present invention to contain a structural unit derived from one or more selected from the group consisting of tetracarboxylic acid having an alicyclic group, tricarboxylic acid having an alicyclic group, tricarboxylic acid anhydride having an alicyclic group, dicarboxylic acid having an alicyclic group, and dicarboxylic acid anhydride having an alicyclic group. If the acid-modified epoxy resin (A2-4) contains a structural unit derived from a component having an alicyclic group, the heat resistance and transparency of the alicyclic group serves to produce a cured film with an improved heat resistance and an improved transparency.

Examples of the tetracarboxylic acid having an alicyclic group, tricarboxylic acid having an alicyclic group, tricarboxylic acid anhydride having an alicyclic group, dicarboxylic acid having an alicyclic group, and dicarboxylic acid anhydride having an alicyclic group include compounds such as the aforementioned alicyclic tetracarboxylic acids and/or derivatives thereof, alicyclic tricarboxylic acids and/or derivatives thereof, or alicyclic dicarboxylic acids and/or derivatives thereof.

In the acid-modified epoxy resin (A2-4), those structural units derived from one or more selected from the group consisting of tetracarboxylic acid having an alicyclic group, tricarboxylic acid having an alicyclic group, tricarboxylic acid anhydride having an alicyclic group, dicarboxylic acid having an alicyclic group, and dicarboxylic acid anhydride having an alicyclic group preferably account for 5 mol % or more, more preferably 10 mol % or more, still more preferably 15 mol % or more, of all structural units derived from a tetracarboxylic acid, a dicarboxylic acid, and a derivative thereof. A content in the above range ensures the production of a cured film having an improved heat resistance and an improved transparency. On the other hand, the content is preferably 90 mol % or less, more preferably 85 mol % or less, and still more preferably 75 mol % or less. A content in the above range ensures the production of a cured film having improved mechanical characteristics.

<Acidic Group Derived from Tetracarboxylic Acid, Tricarboxylic Acid, Tricarboxylic Acid Anhydride, or Dicarboxylic Acid Anhydride>

The acid-modified epoxy resin (A2-4) used for the present invention preferably contains a structural unit derived from a tetracarboxylic acid, tricarboxylic acid, tricarboxylic acid anhydride, or dicarboxylic acid anhydride, and the acid-modified epoxy resin (A2-4) preferably has an acidic group. If the acid-modified epoxy resin (A2-4) contains an acidic group, it ensures an improved pattern processability in an alkaline developer and an improved resolution after development.

The acidic group is preferably one that shows an acidity of less than pH 6. Examples of such an acidic group that shows an acidity of less than pH 6 include carboxyl group, carboxylic acid anhydride group, sulfonic acid group, phenolic hydroxyl group, and hydroxyimide group. From the viewpoint of ensuring an improved pattern processability in an alkaline developer and an improved resolution after development, the carboxylic group, carboxylic acid anhydride group, and phenolic hydroxyl group are preferable, and the carboxyl group and carboxylic acid anhydride group are more preferable.

Examples of the tetracarboxylic acid, tricarboxylic acid, tricarboxylic acid anhydride, and dicarboxylic acid anhydride include the compounds described above.

The contents of structural units derived from various monomer components in the acid-modified epoxy resin (A2-4) can be determined by a combination of methods such as $^1$H-NMR, $^{13}$C-NMR, $^{29}$Si-NMR, IR, TOF-MS, elementary analysis, and ash content measurement.

<Specific Examples of Acid-Modified Epoxy Resin (A2-4)>

Examples of the acid-modified epoxy resin (A2-4) used for the present invention include KAYARAD (registered trademark) PCR-1222H, PCR-1173H, PCR-1221H, PCR-1220H, CCR-1171H, CCR-1307H, CCR-1309H, CCR-1291H, CCR-1235, TCR-1348H, TCR-1323H, TCR-1347H, TCR-1338H, TCR-1352H, TCR-1353H, TCR-1354H, TCR-1355H, TCR-1356H, ZAR-1494H, ZAR-2001H, ZAR-1035, ZAR-2000, ZFR-1401H, ZFR-1491H, ZCR-1797H, ZCR-1798H, ZCR-1569H, ZCR-1798H, ZCR-1761H, ZCR-1601H, ZXR-1807H, ZXR-1816H, ZXR-1810H, ZCR-6001H, ZCR-6002H, ZCR-8001H, and ZCR-8002H (all manufactured by Nippon Kayaku Co., Ltd.); and NK OLIGO (registered trademark) EA-6340, EA-7140, and EA-7340 (all manufactured by Shin-Nakamura Chemical Co., Lid.).

<Physical Properties of Acid-Modified Epoxy Resin (A2-4)>

The acid-modified epoxy resin (A2-4) used for the present invention preferably has a polystyrene based Mw of 500 or more, more preferably 1,000 or more, and still more preferably 1,500 or more, as determined by GPC. A Mw in the above range ensures an improved resolution after development. On the other hand, the Mw is preferably 100,000 or less, more preferably 50,000 or less, and still more preferably 20,000 or less. A Mw in the above range ensures an improved leveling property during coating and an improved pattern processability in an alkaline developer.

In the negative-type photosensitive resin composition according to the present invention, it is preferable for the first resin (A1) to account for 25 mass % or more, more preferably 35 mass % or more, still more preferably 45 mass % or more, still more preferably 51 mass % or more, and particularly preferably 60 mass % or more, of the total quantity of the first resin (A1) and the second resin (A2), which account for 100 mass %. A content of 25 mass % or more ensures the production of a cured film having an improved heat resistance. On the other hand, it is preferable for the first resin (A1) to account for 90 mass % or less, more preferably 85 mass % or less, still more preferably 80 mass % or less, and particularly preferably 75 mass % or less. A content of 90 mass % or less ensures the formation of a cured film having a small-tapered pattern shape.

If the contents of the first resin (A1) and the second resin (A2) are in the above preferable ranges in the negative-type photosensitive resin composition according to the present invention, it ensures not only the production of a cured film with an improved heat resistance, but also the formation of a pattern shape with a small taper. Thus, a cured film produced from the negative-type photosensitive resin composition according to the present invention can be used suitably in components that require a high heat resistance and a pattern shape with a small taper such as insulation layers in, for example, pixel dividing layers of organic EL display devices. If a cured film of the negative-type photosensitive resin composition according to the present invention is used in components that are considered to suffer problems related to heat resistance and pattern shape, such as defect or declined property of an element due to degassing caused by heat decomposition and a break of an electrode wiring due to a high-taper pattern shape, it will be possible to produce a high reliability element that is free from such problems. In addition, since the negative-type photosensitive resin composition according to the present invention contains the coloring agent (D) which will be described later, it serves for prevention of the electrode wiring from becoming visible and for reduction of external light reflection, leading to an improved contrast in image displaying.

In the negative-type photosensitive resin composition according to the present invention, an alkali-soluble resin (A) that has no ethylenically unsaturated double bond group may be incorporated as the alkali-soluble resin (A).

The alkali-soluble resin (A) that has no ethylenically unsaturated double bond group is a resin that does not undergo photo-crosslinking with the radical-polymerizable compound (B), which will be described later, in the UV curing during light exposure. The incorporation of the resin ensures formation of a pattern with a small taper shape after heat curing. This is presumed to be because excess curing during UV curing is suppressed and the reflow property during heat curing can be maintained. In addition, the negative-type photosensitive resin composition according to the present invention contains the flexible chain-containing radical-polymerizable compound (B1), which will be described later, and since UV curing during light exposure is accelerated, even if the alkali-soluble resin (A) that has no ethylenically unsaturated double bond group is incorporated, sufficient crosslink density can be maintained in the light-exposed part.

<Radical-Polymerizable Compound (B)>

The negative-type photosensitive resin composition according to the present invention further contains a radical-polymerizable compound (B).

The radical-polymerizable compound (B) is a compound that has an ethylenically unsaturated double bond group in the molecule. During light exposure, radicals are generated from the photo-initiator (C1) which will be described later, to cause radical polymerization of the radical-polymerizable compound (B), and the light-exposed part of the film of the resin composition becomes insoluble in the alkaline developer, thereby serving to form a negative-type pattern.

The incorporation of the radical-polymerizable compound (B) in the negative-type photosensitive resin composition serves to accelerate the UV curing during light exposure to ensure an improved sensitivity during light exposure. In addition, the crosslink density after heat curing will increase, leading to a cured film with an improved hardness.

It is preferable for the radical-polymerizable compound (B) to be a (meth)acrylic group-containing compound because such a compound will be radically polymerized easily. It is more preferable for the compound to have two or more (meth)acrylic groups in the molecule from the viewpoint of ensuring an improved sensitivity during light exposure and production of a cured film with an increased hardness. The radical-polymerizable compound (B) preferably has a double bond equivalent of 80 to 400 g/mol from the viewpoint of ensuring an improved sensitivity during light exposure and production of a cured film with an increased hardness.

Examples of the radical-polymerizable compound (B) include diethylene glycol di(meth)acrylate, triethylene glycol di(meth)acrylate, tetraethylene glycol di(meth)acrylate, propylene glycol di(meth)acrylate, 1,3-butanediol di(meth)acrylate, 1,4-butanediol di(meth)acrylate, 1,6-hexanediol di(meth)acrylate, 1,9-nonanediol di(meth)acrylate, 1,10-decanediol di(meth)acrylate, neopentyl glycol di(meth)acrylate, trimethylolpropane di(meth)acrylate, trimethylolpropane tri(meth)acrylate, dimethylol propane tri(meth)acrylate, ditrimethylolpropane tetra(meth)acrylate, glycerin tri(meth)acrylate, pentaerythritol tri(meth)acrylate, pentaerythritol tetra(meth)acrylate, dipenta erythritol penta(meth)acrylate, dipenta erythritol hexa(meth)acrylate, tripentaerythritol hepta(meth)acrylate, tripentaerythritol octa(meth)acrylate, tetrapentaerythritol nona(meth)acrylate, tetrapentaerythritol deca(meth)acrylate, pentapentaerythritol undeca(meth)acrylate, pentapentaerythritol dodeca(meth)acrylate, dimethylol-tricyclodecane di(meth)acrylate, ethoxylated bisphenol A di(meth)acrylate, 2,2-bis[4-(3-(meth)acryloxy-2-hydroxypropoxy) phenyl] propane, 1,3,5-tris-((meth)acryloxyethyl) isocyanuric acid, and 1,3-bis ((meth)acryloxyethyl) isocyanuric acid, as well as acid-modified forms thereof. From the viewpoint of ensuring an improved sensitivity during light exposure and production of a cured film with an increased hardness, preferable are trimethylolpropane tri(meth)acrylate, ditrimethylolpropane tri(meth)acrylate, ditrimethylolpropane tetra(meth)acrylate, pentaerythritol tri(meth)acrylate, pentaerythritol tetra(meth)acrylate, dipentaerythritol penta(meth)acrylate, dipentaerythritol hexa(meth)acrylate, tripentaerythritol hepta(meth)acrylate, tripentaerythritol octa(meth)acrylate, dimethylol-tricyclodecane di(meth)acrylate, 2,2-bis[4-(3-(meth)acryloxy-2-hydroxypropoxy)phenyl]propane, 1,3,5-tris((meth)acryloxyethyl)isocyanuric acid, and 1,3-bis ((meth)acryloxyethyl)isocyanuric acid, as well as acid-modified forms thereof. From the viewpoint of ensuring an improved resolution after development, furthermore, also preferable are compounds that are produced by subjecting a compound having two or more glycidoxy groups in the molecule and an unsaturated carboxylic acid having an ethylenically unsaturated double bond group to a ring-opening addition reaction and then reacting the resulting compound with a polybasic carboxylic acid or a polybasic carboxylic acid anhydride.

In the negative-type photosensitive resin composition according to the present invention, the radical-polymerizable compound (B) preferably accounts for 15 parts by mass or more, more preferably 20 parts by mass or more, still more preferably 25 parts by mass or more, and particularly preferably 30 parts by mass or more, relative to the total quantity of the alkali-soluble resin (A) and the radical-polymerizable compound (B) which accounts for 100 parts by mass. A content of 15 parts by mass or more ensures an improved sensitivity during exposure and the formation of a cured film having a small-tapered pattern shape. On the other hand, the content of the radical-polymerizable compound (B) is preferably 65 parts by mass or less, more preferably 60 parts by mass or less, still more preferably 55 parts by mass or less, and particularly preferably 50 parts by mass or less. A content of 65 parts by mass or less ensures the production of a cured film with an improved heat resistance and the formation of a pattern shape with a small taper.

<Flexible Chain-Containing Radical-Polymerizable Compound (B1)>

As the negative-type photosensitive resin composition according to the present invention, the radical-polymerizable compound (B) contains a flexible chain-containing radical-polymerizable compound (B1).

The flexible chain-containing radical-polymerizable compound (B1) is a compound that has a plurality of ethylenically unsaturated double bond groups and a flexible backbone such as an aliphatic chain or an oxyalkylene chain in the molecule and is a compound that has (I) a structure derived from a compound having at least three hydroxyl groups in the molecule, (II) at least three ethylenically unsaturated double bond groups, and (III) at least one aliphatic chain and in which the aliphatic chain has an average molecular weight of 40 to 500.

The incorporation of the flexible chain-containing radical-polymerizable compound (B1) serves to efficiently proceed the UV curing during light exposure to ensure an improved sensitivity during light exposure. In addition, when the pigment (D1) is particularly incorporated as the coloring agent (D) which will be described later, the pigment (D1) is immobilized on a cured portion by crosslinking during UV curing of the flexible chain-containing radical-polymerizable compound (B1), whereby it is possible to ensures reduction of the quantity of residue left after development derived from the pigment (D1). This is presumed to be due to having a flexible backbone such as an aliphatic chain, the collision probability between the ethylenically unsaturated double bond groups among the molecules increases, the UV curing is accelerated, and the crosslink density increases.

When a benzofuranone based black pigment (D1a-1a) is particularly incorporated as the pigment (D1) which will be described later, development residues caused by the pigment may be generated due to insufficient alkali resistance of the pigment. That is, when the surface of the benzofuranone based black pigment (D1a-1a) is exposed to an alkaline developer during development, a portion of the surface is decomposed or dissolved to remain, on a substrate, as the development residues caused by the pigment. In such a case, the incorporation of the flexible chain-containing radical-polymerizable compound (B1) can suppress generation of development residues caused by the pigment. As above, this is presumed to be due to accelerating UV curing and increasing the crosslink density, the benzofuranone based black pigment (D1a-1a)) is immobilized on a cured portion, and decomposition or dissolution due to an alkali developer is inhibited.

It is preferable for the flexible chain-containing radical-polymerizable compound (B1) to be a (meth)acrylic group-containing compound because such a compound will be radically polymerized easily. It is more preferable for the compound to have three or more (meth)acrylic groups in the molecule from the viewpoint of ensuring an improved sensitivity during light exposure and suppression of residues after development.

Examples of the flexible chain-containing radical-polymerizable compound (B1) include (1) a flexible chain-containing radical-polymerizable compound produced by reacting an alcohol compound, an oxygen-containing cyclic compound, and an unsaturated carboxylic acid compound, (2) a flexible chain-containing radical-polymerizable compound produced by reacting an alcohol compound, a nitrogen-containing cyclic compound, and an unsaturated carboxylic acid compound, (3) a flexible chain-containing radical-polymerizable compound produced by reacting an alcohol compound, a carboxylic acid derivative, and an unsaturated carboxylic acid compound, and (4) a flexible chain-containing radical-polymerizable compound produced by reacting an alcohol compound, an amide compound, and an unsaturated carboxylic acid compound.

The flexible chain-containing radical-polymerizable compound (B1) is preferably a flexible chain-containing radical-polymerizable compound (B1) produced by one or more synthesis methods selected from (1) to (4) described below.

Examples of the flexible chain-containing radical-polymerizable compound (B1) in (1) include a compound produced by reacting an unsaturated carboxylic acid derivative having an ethylenically unsaturated double bond group (unsaturated carboxylic acid, unsaturated carboxylic anhydride, unsaturated carboxylic chloride, and unsaturated carboxylic acid-active ester) with a compound produced by subjecting a compound having at least three hydroxyl groups in the molecule and an oxygen-containing cyclic compound to a ring-opening addition reaction. It is preferable for the compound having at least three hydroxyl groups in the molecule to be a polyhydric alcohol compound. It is preferable for the oxygen-containing cyclic compound to be a lactone compound, an epoxy compound, or an oxetane compound.

Examples of the flexible chain-containing radical-polymerizable compound (B1) in (2) include a compound produced by reacting an unsaturated carboxylic acid derivative having an ethylenically unsaturated double bond group (unsaturated carboxylic acid, unsaturated carboxylic anhydride, unsaturated carboxylic chloride, and unsaturated carboxylic acid-active ester) with a compound produced by subjecting a compound having at least three hydroxyl groups in the molecule and a nitrogen-containing cyclic compound to a ring-opening addition reaction. It is preferable for the compound having at least three hydroxyl groups in the molecule to be a polyhydric alcohol compound. It is preferable for the nitrogen-containing cyclic compound to be a lactam compound or an aziridine compound.

Examples of the flexible chain-containing radical-polymerizable compound (B1) in (3) include a compound produced by reacting an unsaturated carboxylic acid derivative having an ethylenically unsaturated double bond group (one or more selected from the group consisting of carboxylic acid, carboxylic anhydride, carboxylic chloride, and carboxylic acid-active ester) with a compound produced by reacting the compound having at least three hydroxyl groups in the molecule and a carboxylic acid derivative having a hydroxy group in the molecule (one or more selected from the group consisting of carboxylic acid, carboxylic anhydride, carboxylic chloride, and carboxylic acid-active ester). It is preferable for the compound having at least three hydroxyl groups in the molecule to be a polyhydric alcohol compound.

Examples of the flexible chain-containing radical-polymerizable compound (B1) in (4) include a compound produced by reacting an unsaturated carboxylic acid derivative having an ethylenically unsaturated double bond group (one or more selected from the group consisting of carboxylic acid, carboxylic anhydride, carboxylic chloride, and carboxylic acid-active ester) with a compound produced by reacting a compound having at least three hydroxyl groups in the molecule and a carboxylic acid amide compound having a hydroxy group in the molecule. It is preferable for the compound having at least three hydroxyl groups in the molecule to be a polyhydric alcohol compound.

In the flexible chain-containing radical-polymerizable compound (B1), it is preferable for (I) the structure derived from a compound having at least three hydroxyl groups in the molecule to be a structure derived from a polyhydric alcohol compound having at least three hydroxy groups in the molecule.

Examples of the polyhydric alcohol compound having at least three hydroxyl groups in the molecule include trimethylolmethane, trimethylolethane, trimethylolpropane, trimethylolbutane, trimethylolhexane, ditrimethylolmethane, ditrimethylolethane, ditrimethylolpropane, glycerin, pentaerythritol, dipentaerythritol, tripentaerythritol, tetrapentaerythritol, pentapentaerythritol, 1,3,5-tris(hydroxymethyl) isocyanurate, and 1,3,5-tris(hydroxyethyl) isocyanurate.

In the flexible chain-containing radical-polymerizable compound (B1), it is preferable for (II) at least three ethylenically unsaturated double bond groups to be a structure derived from an unsaturated carboxylic acid derivative that contains an ethylenically unsaturated double bond group.

Examples of the unsaturated carboxylic acid derivative that contains an ethylenically unsaturated double bond group include (meth)acrylic acid, itaconic acid, maleic acid, fumaric acid, mono(2-acryloxyethyl) succinate, mono(2-acryloxyethyl) phthalate, tetrahydrophthalate, 3-methyl-tetrahydrophthalate, 2-vinylacetic acid, 2-vinylcyclohexane carboxylic acid, 3-vinylcyclohexane carboxylic acid, 4-vinylcyclohexane carboxylic acid, 2-vinylbenzoic acid, 3-vinylbenzoic acid, and 4-vinylbenzoic acid, as well as carboxylic anhydrides thereof, carboxylic acid chlorides thereof, and carboxylic acid-active esters thereof.

(III) At least one aliphatic chain in the flexible chain-containing radical-polymerizable compound (B1) is a structure bonding (I) the structure derived from a compound having at least three hydroxyl groups in the molecule and (II) at least three ethylenically unsaturated double bond groups. It is preferable for (III) at least one aliphatic chain to be a structure derived from one or more selected from the group consisting of a lactone compound, an epoxy compound, an oxetane compound, a lactam compound, an aziridine compound, a carboxylic acid derivative having a hydroxy group in the molecule, and a carboxylic acid amide compound having a hydroxy group in the molecule.

Examples of the lactone compound include β-propiolactone, γ-butyrolactone, δ-valerolactone, and ε-caprolactone.

Examples of the epoxy compound include ethylene oxide, propylene oxide, butylene oxide, and hexylene oxide.

Examples of the oxetane compound include oxetane, 2-methyloxetane, 2-ethyloxetane, and 2-propyloxetane.

Examples of the lactam compound include β-propiolactam, γ-butyrolactam, δ-valerolactam, and ε-caprolactam.

Examples of the aziridine compound include aziridine, 2-methylaziridine, 2-ethylaziridine, and 2-propylaziridine.

Examples of the carboxylic acid derivative having a hydroxy group in the molecule include hydroxyacetic acid, 3-hydroxypropionic acid, 4-hydroxybutyric acid, 5-hydroxyvaleric acid, and 6-hydroxycaproic acid.

Examples of the carboxylic acid amide compound having a hydroxy group in the molecule include hydroxyacetic acid amide, 3-hydroxypropionic acid amide, 4-hydroxybutyric acid amide, 5-hydroxy valeric acid amide, and 6-hydroxycaproic acid amide.

(III) At least one aliphatic chain in the flexible chain-containing radical-polymerizable compound (B1) has an average molecular weight of 40 to 500. The average molecular weight of the aliphatic chain is preferably 50 or more, more preferably 60 or more, still more preferably 70 or more, and particularly preferably 80 or more. An average molecular weight of 50 or more ensures an improved sensitivity during light exposure and reduction of the quantity of residue left after development. On the other hand, the average molecular weight of the aliphatic chain is preferably 400 or less, more preferably 350 or less, still more preferably 300 or less, and particularly preferably 250 or less. An average molecular weight of 400 or less ensures an improved sensitivity during light exposure and reduction of the quantity of residue left after development.

It is preferable for the flexible chain-containing radical-polymerizable compound (B1) to be a compound having a group represented by general formula (24).

[Chemical formula 20]

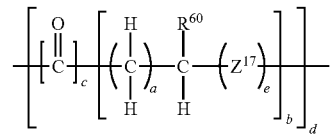
(24)

(29)

(30)

In general formula (24), $R^{60}$ is a hydrogen atom or an alkyl group containing 1 to 10 carbon atoms. $Z^{17}$ represents a group represented by general formula (29) or a group represented by general formula (30). a is an integer of 1 to 10, b is an integer of 1 to 4, c is 0 or 1, d is an integer of 1 to 4, and e is 0 or 1. When c is 0, d is 1. In general formula (30), $R^{67}$ is a hydrogen atom or an alkyl group containing 1 to 10 carbon atoms. In general formula (24), $R^{60}$ is preferably a hydrogen atom or an alkyl group containing 1 to 4 carbon atoms. a is preferably an integer of 1 to 6, b is preferably 1 or 2, c is preferably 1, d is preferably 1 or 2, and e is preferably 1. In general formula (30), $R^{67}$ is preferably a hydrogen atom or an alkyl group containing 1 to 4 carbon atoms, and more preferably a hydrogen atom or a methyl group. In general formula (24), when c is 1, the quantity of residue left after development can be reduced.

It is preferable for the flexible chain-containing radical-polymerizable compound (B1) to be a compound represented by general formula (27) and/or a compound represented by general formula (28).

[Chemical formula 21]

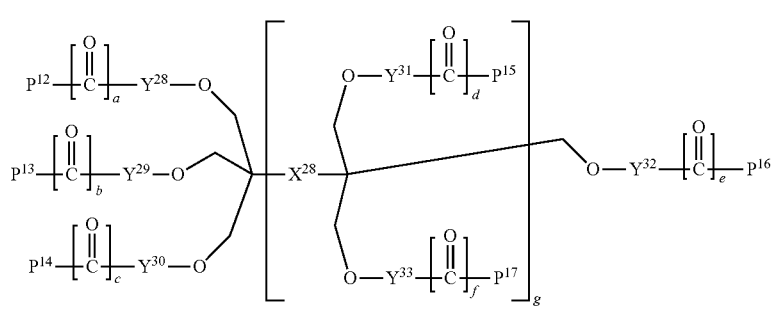
(27)

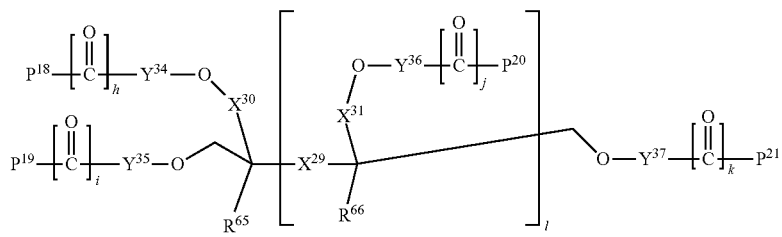

(28)

In general formula (27), $X^{28}$ is a divalent organic group. $Y^{28}$ to $Y^{33}$ are each independently a direct bond or a group represented by general formula (24) given above, and at least one of $Y^{28}$ to $Y^{33}$ is a group represented by general formula (24) given above. $P^{12}$ to $P^{17}$ are each independently a hydrogen atom or a group represented by general formula (25), and at least three of $P^{12}$ to $P^{17}$ are groups represented by general formula (25). Furthermore, a, b, c, d, e, and f are each independently 0 or 1, and g is an integer of 0 to 10. In general formula (27), $X^{28}$ is preferably a divalent organic group having one or more selected from the group consisting of an aliphatic structure containing 1 to 10 carbon atoms, an alicyclic structure containing 4 to 20 carbon atoms, and an aromatic structure containing 6 to 30 carbon atoms, more preferably a divalent organic group having one or more selected from the group consisting of an aliphatic structure containing 1 to 6 carbon atoms, an alicyclic structure containing 4 to 15 carbon atoms, and an aromatic structure containing 6 to 25 carbon atoms. Furthermore, a, b, c, d, e, and f are each independently preferably 1, and g is preferably 0 to 5. The aforementioned aliphatic structures, alicyclic structures, and aromatic structures may each contain a heteroatom and may each be a substitution product or a non-substitution product. Among $Y^{28}$ to $Y^{33}$ in general formula (27), the number of groups represented by general formula (24) given above is preferably 2 or more, more preferably 3 or more, still more preferably 4 or more. Among $Y^{28}$ to $Y^{33}$, when the number of groups represented by general formula (24) given above is 2 or more, it is possible to ensure an improved sensitivity during light exposure and ensure reduction of the quantity of residue left after development.

In general formula (28), $X^{29}$ is a divalent organic group. $X^{30}$ and $X^{31}$ are each independently a direct bond or an alkylene chain containing 1 to 10 carbon atoms. $Y^{34}$ to $Y^{37}$ are each independently a direct bond or a group represented by general formula (24) given above, and at least one of $Y^{34}$ to $Y^{37}$ is a group represented by general formula (24) given above. $R^{65}$ and $R^{66}$ are each independently a hydrogen atom or an alkyl group containing 1 to 10 carbon atoms. $P^{18}$ to $P^{21}$ are each independently a hydrogen atom or a group represented by general formula (25), and at least three of $P^{18}$ to $P^{21}$ are groups represented by general formula (25). Furthermore, h, i, j and k are each independently 0 or 1, and l is an integer of 0 to 10. In general formula (28), $X^{29}$ is preferably a divalent organic group having one or more selected from the group consisting of an aliphatic structure containing 1 to 10 carbon atoms, an alicyclic structure containing 4 to 20 carbon atoms, and an aromatic structure containing 6 to 30 carbon atoms, more preferably a divalent organic group having one or more selected from the group consisting of an aliphatic structure containing 1 to 6 carbon atoms, an alicyclic structure containing 4 to 15 carbon atoms, and an aromatic structure containing 6 to 25 carbon atoms. $X^{30}$ and $X^{31}$ are each independently preferably a direct bond or an alkylene chain containing 1 to 6 carbon atoms. It is preferable that $R^{65}$ and $R^{66}$ are each independently a hydrogen atom or an alkyl group containing 1 to 6 carbon atoms. Furthermore, h, i, j and k are each independently preferably 1, and l is preferably 0 to 5. The aforementioned alkyl groups, alkylene groups, aliphatic structures, alicyclic structures, and aromatic structures may each contain a heteroatom and may each be a substitution product or a non-substitution product. Among $Y^{34}$ to $Y^{37}$ in general formula (28), the number of groups represented by general formula (24) given above is preferably 2 or more, more preferably 3 or more, still more preferably 4 or more. Among $Y^{34}$ to $Y^{37}$, when the number of groups represented by general formula (24) given above is 2 or more, it is possible to ensure an improved sensitivity during light exposure and ensure reduction of the quantity of residue left after development.

[Chemical formula 22]

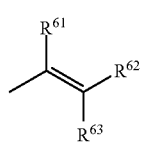

(25)

In general formula (25), $R^{61}$ to $R^{63}$ are each independently a hydrogen atom, an alkyl group containing 1 to 10 carbon atoms, or an aryl group containing 6 to 15 carbon atoms. In general formula (25), $R^{61}$ is preferably a hydrogen atom or an alkyl group containing 1 to 4 carbon atoms, and more preferably a hydrogen atom or a methyl group. It is preferable that $R^{62}$ and $R^{63}$ are each independently a hydrogen atom or an alkyl group containing 1 to 4 carbon atoms, and more preferably a hydrogen atom.

It is more preferable for the flexible chain-containing radical-polymerizable compound (B1) to be a compound represented by general formula (23).

[Chemical formula 23]

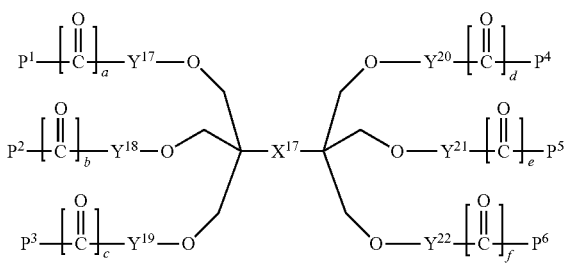

(23)

In general formula (23), $X^{17}$ is a divalent organic group. $Y^{17}$ to $Y^{22}$ are each independently a direct bond or a group represented by general formula (24) given above, and at least one of $Y^{17}$ to $Y^{22}$ is a group represented by general formula (24) given above. $P^1$ to $P^6$ are each independently a hydrogen atom or a group represented by general formula (25) given above, and at least three of $P^1$ to $P^6$ are groups represented by general formula (25) given above. Furthermore, a, b, c, d, e, and f are each independently 0 or 1. In general formula (23), $X^{17}$ is preferably a divalent organic group having one or more selected from the group consisting of an aliphatic structure containing 1 to 10 carbon atoms, an alicyclic structure containing 4 to 20 carbon atoms, and an aromatic structure containing 6 to 30 carbon atoms, more preferably a divalent organic group having one or more selected from the group consisting of an aliphatic structure containing 1 to 6 carbon atoms, an alicyclic structure containing 4 to 15 carbon atoms, and an aromatic structure containing 6 to 25 carbon atoms. Furthermore, a, b, c, d, e, and f are each independently preferably 1. The aforementioned aliphatic structures, alicyclic structures, and aromatic structures may each contain a heteroatom and may each be a substitution product or a non-substitution product. Among $Y^{17}$ to $Y^{22}$ in general formula (23), the number of groups represented by general formula (24) given above is preferably 2 or more, more preferably 3 or more, still more preferably 4 or more. Among $Y^{17}$ to $Y^{22}$, when the number of groups represented by general formula (24) given above is 2 or more, it is possible to ensure an improved sensitivity during light exposure and ensure reduction of the quantity of residue left after development.

It is also preferable for the flexible chain-containing radical-polymerizable compound (B1) to be a compound represented by general formula (26).

[Chemical formula 24]

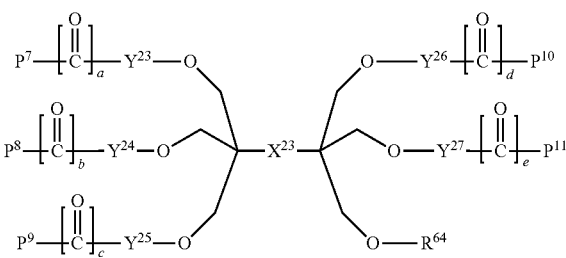

(26)

In general formula (26), $X^{23}$ is a divalent organic group. $Y^{23}$ to $Y^{27}$ are each independently a direct bond or a group represented by general formula (24) given above, and at least one of $Y^{23}$ to $Y^{27}$ is a group represented by general formula (24) given above. $P^7$ to $P^{11}$ are each independently a hydrogen atom or a group represented by general formula (25) given above, and at least three of $P^7$ to $P^{11}$ are groups represented by general formula (25) given above. $R^{64}$ is a hydrogen atom, an alkyl group containing 1 to 10 carbon atoms, or an aryl group containing 6 to 15 carbon atoms. Furthermore, a, b, c, d, and e are each independently 0 or 1. In general formula (26), $X^{23}$ is preferably a divalent organic group having one or more selected from the group consisting of an aliphatic structure containing 1 to 10 carbon atoms, an alicyclic structure containing 4 to 20 carbon atoms, and an aromatic structure containing 6 to 30 carbon atoms, more preferably a divalent organic group having one or more selected from the group consisting of an aliphatic structure containing 1 to 6 carbon atoms, an alicyclic structure containing 4 to 15 carbon atoms, and an aromatic structure containing 6 to 25 carbon atoms. $R^{64}$ is preferably a hydrogen atom or an alkyl group containing 1 to 4 carbon atoms. Furthermore, a, b, c, d, and e are each independently preferably 1. The aforementioned alkyl groups, aryl groups, aliphatic structures, alicyclic structures, and aromatic structures may each contain a heteroatom and may each be a substitution product or a non-substitution product. Among $Y^{23}$ to $Y^{27}$ in general formula (26), the number of groups represented by general formula (24) given above is preferably 2 or more, more preferably 3 or more, still more preferably 4 or more. Among $Y^{23}$ to $Y^{27}$, when the number of groups represented by general formula (24) given above is 2 or more, it is possible to ensure an improved sensitivity during light exposure and reduction of the quantity of residue left after development.

The flexible chain-containing radical-polymerizable compound (B1) preferably has at least one lactone-modified chain and/or at least one lactam-modified chain.

The lactone-modified chain and the lactam-modified chain refer to structures derived from a lactone compound and a lactam compound of (III) at least one aliphatic chain in the flexible chain-containing radical-polymerizable compound (B1).

The incorporation of at least one lactone-modified chain and/or at least one lactam-modified chain in the flexible chain-containing radical-polymerizable compound (B1) ensures reduction of the quantity of residue left after development.

In the case where the flexible chain-containing radical-polymerizable compound (B1) is a compound represented by general formula (27) given above, a compound represented by general formula (28) given above, a compound represented by general formula (23) given above, or a compound represented by general formula (26) given above, when c is 1 in general formula (24) given above, the flexible chain-containing radical-polymerizable compound (B1) contains at least one lactone-modified chain and/or at least one lactam-modified chain.

The double bond equivalent of the flexible chain-containing radical-polymerizable compound (B1) is preferably 100 g/mol or more, more preferably 120 g/mol or more, still more preferably 150 g/mol or more, even more preferably 170 g/mol or more, and particularly preferably 200 g/mol or more. A double bond equivalent of 100 g/mol or more ensures an improved sensitivity during light exposure and reduction of the quantity of residue left after development. On the other hand, the double bond equivalent of the flexible chain-containing radical-polymerizable compound (B1) is preferably 800 g/mol or less, more preferably 600 g/mol or less, still more preferably 500 g/mol or less, and particularly preferably 450 g/mol or less. A double bond equivalent of 800 g/mol or less ensures an improved sensitivity during light exposure and reduction of the quantity of residue left after development.

The molecular weight of the flexible chain-containing radical-polymerizable compound (B1) is preferably 600 or more, more preferably 700 or more, still more preferably 800 or more, even more preferably 900 or more, and particularly preferably 1,000 or more. A molecular weight of 700 or more ensures an improved sensitivity during light exposure and reduction of the quantity of residue left after development. On the other hand, the molecular weight of the flexible chain-containing radical-polymerizable compound (B1) is preferably 3,000 or less, more preferably 2,700 or less, still more preferably 2,400 or less, and particularly preferably 2,200 or less. A molecular weight of 3,000 or less ensures an improved sensitivity during light exposure and reduction of the quantity of residue left after development.

Examples of the flexible chain-containing radical-polymerizable compound (B1) include ethoxylated dipentaerythritol hexa(meth)acrylate, propoxylated dipentaerythritol hexa(meth)acrylate, butoxylated dipentaerythritol hexa(meth)acrylate, ε-caprolactone modified dipentaerythritol tetra(meth)acrylate, ε-caprolactone modified dipentaerythritol penta(meth)acrylate, ε-caprolactone modified dipentaerythritol hexa(meth)acrylate, δ-valerolactone modified dipentaerythritol penta(meth)acrylate, δ-valerolactone modified dipentaerythritol hexa(meth)acrylate, γ-butyrolactone modified dipentaerythritol penta(meth)acrylate, γ-butyrolactone modified dipentaerythritol hexa(meth)acrylate, β-propiolactone modified dipentaerythritol penta(meth)acrylate, β-propiolactone modified dipentaerythritol hexa(meth)acrylate, ε-caprolactam modified dipentaerythritol penta(meth)acrylate, ε-caprolactam modified dipentaerythritol hexa(meth)acrylate, δ-valerolactam modified dipentaerythritol penta(meth)acrylate, δ-valerolactam modified dipentaerythritol hexa(meth)acrylate, γ-butyrolactam modified dipentaerythritol penta(meth)acrylate, γ-butyrolactam modified dipentaerythritol hexa(meth)acrylate, β-propiolactam modified dipentaerythritol penta(meth)acrylate, β-propiolactam modified dipentaerythritol hexa(meth)acrylate, ε-caprolactone modified trimethylolethane tri(meth)acrylate, ε-caprolactone modified trimethylolpropane tri(meth)acrylate, ε-caprolactone modified ditrimethylolpropane tri(meth)acrylate, ε-caprolactone modified ditrimethylolpropane tetra(meth)acrylate, ε-caprolactone modified glycerol tri(meth)acrylate, ε-caprolactone modified pentaerythritol tri(meth)acrylate, ε-caprolactone modified pentaerythritol tetra(meth)acrylate, ε-caprolactone modified tripentaerythritol hepta(meth)acrylate, ε-caprolactone modified tripentaerythritol octa(meth)acrylate, ε-caprolactone modified 1,3,5-tris((meth)acryloxymethyl)isocyanuric acid, ε-caprolactone modified 1,3,5-tris((meth)acryloxyethyl)isocyanuric acid, "KAYARAD" (registered trademark) DPEA-12, DP-3060, DPCA-20, DPCA-30, DPCA-60, and DPCA-120 (all manufactured by Nippon Kayaku Co., Ltd.); and "NK ESTER" (registered trademark) A-DPH-6E, A-DPH-12E, A-DPH-6EL, A-DPH-12EL, A-DPH-6P, M-DPH-6E, M-DPH-12E, M-DPH-6P, A-DPH-1CL, A-DPH-2CL, A-DPH-3CL, A-DPH-4CL, A-DPH-5CL, A-DPH-6CL, ATM-4CL, ATM-8CL, ATM-4VL, ATM-8VL, ATM-4BL, ATM-8BL, AD-TMP-4CL, AD-TMP-8CL, A-9300-1CL, and A-9300-3CL (all manufactured by Shin-Nakamura Chemical Co., Ltd.).

From the viewpoint of ensuring an improved sensitivity during light exposure and suppression of residues after development, the flexible chain-containing radical-polymerizable compound (B1) is preferably ε-caprolactone modified dipentaerythritol tetra(meth)acrylate, ε-caprolactone modified dipentaerythritol penta(meth)acrylate, ε-caprolactone modified dipentaerythritol hexa(meth)acrylate, δ-valerolactone modified dipentaerythritol penta(meth)acrylate, δ-valerolactone modified dipentaerythritol hexa(meth)acrylate, γ-butyrolactone modified dipentaerythritol penta(meth)acrylate, γ-butyrolactone modified dipentaerythritol hexa(meth)acrylate, β-propiolactone modified dipentaerythritol penta(meth)acrylate, β-propiolactone modified dipentaerythritol hexa(meth)acrylate, ε-caprolactam modified dipentaerythritol penta(meth)acrylate, ε-caprolactam modified dipentaerythritol hexa(meth)acrylate, δ-valerolactam modified dipentaerythritol penta(meth)acrylate, δ-valerolactam modified dipentaerythritol hexa(meth)acrylate, γ-butyrolactam modified dipentaerythritol penta(meth)acrylate, γ-butyrolactam modified dipentaerythritol hexa(meth)acrylate, β-propiolactam modified dipentaerythritol penta(meth)acrylate, β-propiolactam modified dipentaerythritol hexa(meth)acrylate, "KAYARAD" (registered trademark) DPCA-20, DPCA-30, DPCA-60, or DPCA-120 (all manufactured by Nippon Kayaku Co., Ltd.); or "NK ESTER" (registered trademark) A-DPH-1CL, A-DPH-2CL, A-DPH-3CL, A-DPH-4CL, A-DPH-5CL, or A-DPH-6CL, and more preferably ε-caprolactone modified dipentaerythritol penta(meth)acrylate, ε-caprolactone modified dipentaerythritol hexa(meth)acrylate, "KAYARAD" (registered trademark) DPCA-20, DPCA-30, DPCA-60, or DPCA-120; or "NK ESTER" (registered trademark) A-DPH-1CL, A-DPH-2CL, A-DPH-3CL, A-DPH-4CL, A-DPH-5CL, or A-DPH-6CL (all manufactured by Nippon Kayaku Co., Ltd.).

In the negative-type photosensitive resin composition according to the present invention, the flexible chain-containing radical-polymerizable compound (B1) preferably accounts for 5 parts by mass or more, more preferably 10 parts by mass or more, still more preferably 15 parts by mass or more, and particularly preferably 20 parts by mass or more, relative to the total quantity of the alkali-soluble resin (A) and the radical-polymerizable compound (B) which accounts for 100 parts by mass. A content of 5 parts by mass or more ensures an improved sensitivity during light exposure and reduction of the quantity of residue left after development. On the other hand, the content of the flexible chain-containing radical-polymerizable compound (B1) is preferably 50 parts by mass or less, more preferably 45 parts by mass or less, still more preferably 40 parts by mass or less, even more preferably 35 parts by mass or less, and particularly preferably 30 parts by mass or less. A content of 50 parts by mass or less ensures the formation of a cured film having a small-tapered pattern shape.

<(B2) Flexible Chain-Containing Bifunctional Radical-Polymerizable Compound>

It is preferable for the negative-type photosensitive resin composition according to the present invention, the radical-polymerizable compound (B) to further contain a flexible chain-containing bifunctional radical-polymerizable compound (B2).

The flexible chain-containing bifunctional radical-polymerizable compound (B2) is a compound that has two ethylenically unsaturated double bond groups and a flexible backbone such as an aliphatic chain in the molecule and is a compound that has (I) a structure derived from a compound having at least two hydroxyl groups in the molecule, (II) two ethylenically unsaturated double bond groups, and (III) at least one lactone-modified chain and/or lactam-modified chain and is preferably a compound in which the average molecular weights of the lactone-modified chain and the lactam-modified chain are 40 to 500.

The incorporation of the flexible chain-containing bifunctional radical-polymerizable compound (B2) serves to efficiently proceed the UV curing during light exposure to ensure an improved sensitivity during light exposure. In addition, when the pigment (D1) is particularly incorporated as the coloring agent (D) which will be described later, the pigment (D1) is immobilized on a cured portion by crosslinking during UV curing of the flexible chain-containing bifunctional radical-polymerizable compound (B2), whereby it is possible to reduce the quantity of residue left after development derived from the pigment (D1) and to form a pattern with a small taper shape after heat curing. This is presumed to be due to having a flexible backbone such as an aliphatic chain, the collision probability between the ethylenically unsaturated double bond groups among the molecules increases, the UV curing is accelerated, and the crosslink density increases, and, in addition, excessive curing is suppressed, so that the reflow property during heat curing can be maintained.

When the benzofuranone based black pigment (D1a-1a)) is particularly incorporated as the black coloring agent (Da) which will be described later, development residues caused by the pigment may be generated due to insufficient alkali resistance of the pigment, as described above. Also in such a case, the incorporation of the flexible chain-containing bifunctional radical-polymerizable compound (B2) can suppress generation of development residues caused by the pigment. As above, this is presumed to be due to accelerating UV curing and increasing the crosslink density, the benzofuranone based black pigment (D1a-1a) is immobilized on a cured portion, and decomposition or dissolution due to an alkali developer is inhibited.

It is preferable for the flexible chain-containing bifunctional radical-polymerizable compound (B2) to be a (meth)acrylic group-containing compound because such a compound will be radically polymerized easily. It is more preferable for the compound to have two (meth)acrylic groups in the molecule from the viewpoint of ensuring an improved sensitivity during light exposure and suppression of residues after development.

Examples of the flexible chain-containing bifunctional radical-polymerizable compound (B2) include (1) a flexible chain-containing bifunctional radical-polymerizable compound produced by reacting an alcohol compound, a lactone compound, and an unsaturated carboxylic acid compound, (2) a flexible chain-containing bifunctional radical-polymerizable compound produced by reacting an alcohol compound, a lactam compound, and an unsaturated carboxylic acid compound, (3) a flexible chain-containing bifunctional radical-polymerizable compound produced by reacting an alcohol compound, a carboxylic acid derivative, and an unsaturated carboxylic acid compound, and (4) a flexible chain-containing bifunctional radical-polymerizable compound produced by reacting an alcohol compound, an amide compound, and an unsaturated carboxylic acid compound.

The flexible chain-containing bifunctional radical-polymerizable compound (B2) is preferably a flexible chain-containing bifunctional radical-polymerizable compound (B2) produced by one or more synthesis methods selected from (1) to (4) described below.

Examples of the flexible chain-containing bifunctional radical-polymerizable compound (B2) in (1) include a compound produced by reacting an unsaturated carboxylic acid derivative having an ethylenically unsaturated double bond group (unsaturated carboxylic acid, unsaturated carboxylic anhydride, unsaturated carboxylic chloride, and unsaturated carboxylic acid-active ester) with a compound produced by subjecting a compound having at least two hydroxyl groups in the molecule and a lactone compound to a ring-opening addition reaction. It is preferable for the compound having at least two hydroxyl groups in the molecule to be a polyhydric alcohol compound.

Examples of the flexible chain-containing bifunctional radical-polymerizable compound (B2) in (2) include a compound produced by reacting an unsaturated carboxylic acid derivative having an ethylenically unsaturated double bond group (unsaturated carboxylic acid, unsaturated carboxylic anhydride, unsaturated carboxylic chloride, and unsaturated carboxylic acid-active ester) with a compound produced by subjecting a compound having at least two hydroxyl groups in the molecule and a lactam compound to a ring-opening addition reaction. It is preferable for the compound having at least two hydroxyl groups in the molecule to be a polyhydric alcohol compound.

Examples of the flexible chain-containing bifunctional radical-polymerizable compound (B2) in (3) include a compound produced by reacting an unsaturated carboxylic acid derivative having an ethylenically unsaturated double bond group (one or more selected from the group consisting of carboxylic acid, carboxylic anhydride, carboxylic chloride, and carboxylic acid-active ester) with a compound produced by reacting the compound having at least two hydroxyl groups in the molecule and a carboxylic acid derivative having a hydroxy group in the molecule (one or more selected from the group consisting of carboxylic acid, carboxylic anhydride, carboxylic chloride, and carboxylic acid-active ester). It is preferable for the compound having at least two hydroxyl groups in the molecule to be a polyhydric alcohol compound.

Examples of the flexible chain-containing bifunctional radical-polymerizable compound (B2) in (4) include a compound produced by reacting an unsaturated carboxylic acid derivative having an ethylenically unsaturated double bond group (one or more selected from the group consisting of carboxylic acid, carboxylic anhydride, carboxylic chloride, and carboxylic acid-active ester) with a compound produced by reacting a compound having at least two hydroxyl groups in the molecule and a carboxylic acid amide compound having a hydroxy group in the molecule. It is preferable for the compound having at least two hydroxyl groups in the molecule to be a polyhydric alcohol compound.

In the flexible chain-containing bifunctional radical-polymerizable compound (B2), it is preferable for (I) the structure derived from a compound having at least two hydroxyl groups in the molecule to be a structure derived from a polyhydric alcohol compound having at least two hydroxy groups in the molecule.

Examples of the polyhydric alcohol compound having at least two hydroxyl groups in the molecule include diethylene glycol, triethylene glycol, tetraethylene glycol, propylene glycol, 1,3-butanediol, 1,4-butanediol, 1,6-hexanediol, 1,9-nonanediol, 1,10-decanediol, neopentyl glycol, hydroxypivalic acid neopentyl glycol, trimethylolmethane, trimethylolethane, trimethylolpropane, ditrimethylolmethane, ditrimethylolethane, ditrimethylolpropane, glycerin, pentaerythritol, dimethylol-tricyclodecane, 1,3-bis(hydroxymethyl) isocyanurate, and 1,3-bis(hydroxyethyl) isocyanurate.

In the flexible chain-containing bifunctional radical-polymerizable compound (B2), it is preferable for (II) two ethylenically unsaturated double bond groups to be a structure derived from an unsaturated carboxylic acid derivative that contains an ethylenically unsaturated double bond group.

Examples of the unsaturated carboxylic acid derivative that contains an ethylenically unsaturated double bond group include (meth)acrylic acid, itaconic acid, maleic acid, fumaric acid, mono(2-acryloxyethyl) succinate, mono(2-acryloxyethyl) phthalate, tetrahydrophthalate, 3-methyl-tetrahydrophthalate, 2-vinylacetic acid, 2-vinylcyclohexane carboxylic acid, 3-vinylcyclohexane carboxylic acid, 4-vinylcyclohexane carboxylic acid, 2-vinylbenzoic acid, 3-vinylbenzoic acid, and 4-vinylbenzoic acid, as well as carboxylic anhydrides thereof, carboxylic acid chlorides thereof, and carboxylic acid-active esters thereof.

(III) At least one lactone-modified chain and/or lactam-modified chain in the flexible chain-containing bifunctional radical-polymerizable compound (B2) is a structure bonding (I) the structure derived from a compound having at least two hydroxyl groups in the molecule and (II) two ethylenically unsaturated double bond groups. It is preferable for (III) at least one lactone-modified chain and/or lactam-modified chain to be a structure derived from one or more selected from the group consisting of a lactone compound, a lactam compound, a carboxylic acid derivative having a hydroxy group in the molecule, and a carboxylic acid amide compound having a hydroxy group in the molecule.

Examples of the lactone compound include β-propiolactone, γ-butyrolactone, δ-valerolactone, and ε-caprolactone.

Examples of the lactam compound include β-propiolactam, γ-butyrolactam, δ-valerolactam, and ε-caprolactam.

Examples of the carboxylic acid derivative having a hydroxy group in the molecule include hydroxyacetic acid, 3-hydroxypropionic acid, 4-hydroxybutyric acid, 5-hydroxyvaleric acid, and 6-hydroxycaproic acid.

Examples of the carboxylic acid amide compound having a hydroxy group in the molecule include hydroxyacetic acid amide, 3-hydroxypropionic acid amide, 4-hydroxybutyric acid amide, 5-hydroxy valeric acid amide, and 6-hydroxycaproic acid amide.

(III) At least one lactone-modified chain and/or lactam-modified chain in the flexible chain-containing bifunctional radical-polymerizable compound (B2) has an average molecular weight of 40 to 500. The average molecular weights of the lactone-modified chain and the lactam-modified chain are preferably 50 or more, more preferably 60 or more, still more preferably 70 or more, and particularly preferably 80 or more. An average molecular weight of 50 or more ensures an improved sensitivity during light exposure and reduction of the quantity of residue left after development. On the other hand, the average molecular weights of the lactone-modified chain and the lactam-modified chain are preferably 400 or less, more preferably 350 or less, still more preferably 300 or less, and particularly preferably 250 or less. An average molecular weight of 400 or less ensures an improved sensitivity during light exposure and reduction of the quantity of residue left after development.

It is preferable for the flexible chain-containing bifunctional radical-polymerizable compound (B2) to be a compound represented by general formula (31) and/or a compound represented by general formula (32).

[Chemical formula 25]

(31)

(32)

In general formula (31), $X^{38}$ is a divalent organic group. $Y^{38}$ and $Y^{39}$ are each independently a direct bond, a group represented by general formula (33), or a group represented by general formula (34), and at least one of $Y^{38}$ and $Y^{39}$ is a group represented by general formula (34). $P^{22}$ and $P^{23}$ are groups as represented by general formula (25). Furthermore, a and b are each independently 0 or 1. In general formula (31), $X^{38}$ is preferably a divalent organic group having one or more selected from the group consisting of an aliphatic structure containing 1 to 10 carbon atoms, an alicyclic structure containing 4 to 20 carbon atoms, and an aromatic structure containing 6 to 30 carbon atoms, more preferably a divalent organic group having one or more selected from the group consisting of an aliphatic structure containing 1 to 6 carbon atoms, an alicyclic structure containing 4 to 15 carbon atoms, and an aromatic structure containing 6 to 25 carbon atoms. Furthermore, a and b are each independently preferably 1. The aforementioned aliphatic structures, alicyclic structures, and aromatic structures may each contain a heteroatom and may each be a substitution product or a non-substitution product.

In general formula (32), $X^{39}$ and $X^{40}$ are each independently a divalent organic group. $Y^{40}$ and $Y^{41}$ are each independently a direct bond, a group represented by general formula (33), or a group represented by general formula (34), and at least one of $Y^{40}$ and $Y^{41}$ is a group represented by general formula (34). $Z^{38}$ is a direct bond or oxygen. $P^{24}$ and $P^{25}$ are groups as represented by general formula (25). Furthermore, c and d are each independently 0 or 1. In general formula (32), $X^{39}$ and $X^{40}$ are preferably a divalent organic group having one or more selected from the group consisting of an aliphatic structure containing 1 to 10 carbon atoms, an alicyclic structure containing 4 to 20 carbon atoms, and an aromatic structure containing 6 to 30 carbon atoms, more preferably a divalent organic group having one or more selected from the group consisting of an aliphatic structure containing 1 to 6 carbon atoms, an alicyclic structure containing 4 to 15 carbon atoms, and an aromatic structure containing 6 to 25 carbon atoms. Furthermore, c and d are each independently preferably 1. The aforementioned aliphatic structures, alicyclic structures, and aromatic structures may each contain a heteroatom and may each be a substitution product or a non-substitution product.

[Chemical formula 26]

(33)

-continued

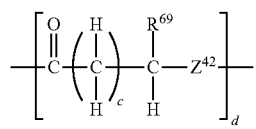  (34)

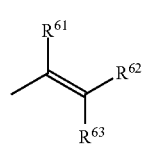  (25)

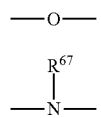  (29)

  (30)

In general formula (33), $R^{68}$ is a hydrogen atom or an alkyl group containing 1 to 10 carbon atoms. Furthermore, a is an integer of 1 to 10, and b is an integer of 1 to 4. In general formula (34), $R^{69}$ is a hydrogen atom or an alkyl group containing 1 to 10 carbon atoms. $Z^{42}$ represents a group represented by general formula (29) or a group represented by general formula (30). Furthermore, c is an integer of 1 to 10, and d is an integer of 1 to 4. In general formula (25), $R^{61}$ to $R^{63}$ are each independently a hydrogen atom, an alkyl group containing 1 to 10 carbon atoms, or an aryl group containing 6 to 15 carbon atoms. In general formula (30), $R^{67}$ is a hydrogen atom or an alkyl group containing 1 to 10 carbon atoms. In general formula (33), $R^{68}$ is preferably a hydrogen atom or an alkyl group containing 1 to 4 carbon atoms. a is preferably an integer of 1 to 6, and b is preferably 1 or 2. In general formula (34), $R^{69}$ is preferably a hydrogen atom or an alkyl group containing 1 to 4 carbon atoms. c is preferably an integer of 1 to 6, and d is preferably 1 or 2. In general formula (25), $R^{61}$ is preferably a hydrogen atom or an alkyl group containing 1 to 4 carbon atoms, and more preferably a hydrogen atom or a methyl group. It is preferable that $R^{62}$ and $R^{63}$ are each independently a hydrogen atom or an alkyl group containing 1 to 4 carbon atoms, and more preferably a hydrogen atom. In general formula (30), $R^{67}$ is preferably a hydrogen atom or an alkyl group containing 1 to 4 carbon atoms, and more preferably a hydrogen atom or a methyl group.

The double bond equivalent of the flexible chain-containing bifunctional radical-polymerizable compound (B2) is preferably 100 g/mol or more, more preferably 120 g/mol or more, still more preferably 150 g/mol or more, even more preferably 170 g/mol or more, and particularly preferably 200 g/mol or more. A double bond equivalent of 100 g/mol or more ensures an improved sensitivity during light exposure and reduction of the quantity of residue left after development. On the other hand, the double bond equivalent of the flexible chain-containing bifunctional radical-polymerizable compound (B2) is preferably 800 g/mol or less, more preferably 600 g/mol or less, still more preferably 500 g/mol or less, and particularly preferably 450 g/mol or less. A double bond equivalent of 800 g/mol or less ensures an improved sensitivity during light exposure and reduction of the quantity of residue left after development.

The molecular weight of the flexible chain-containing bifunctional radical-polymerizable compound (B2) is preferably 200 or more, more preferably 250 or more, still more preferably 300 or more, even more preferably 350 or more, and particularly preferably 400 or more. A molecular weight of 200 or more ensures an improved sensitivity during light exposure and reduction of the quantity of residue left after development. On the other hand, the molecular weight of the flexible chain-containing bifunctional radical-polymerizable compound (B2) is preferably 1,000 or less, more preferably 900 or less, still more preferably 800 or less, and particularly preferably 700 or less. A molecular weight of 1,000 or less ensures an improved sensitivity during light exposure and reduction of the quantity of residue left after development.

Examples of the flexible chain-containing bifunctional radical-polymerizable compound (B2) include ε-caprolactone modified hydroxypivalic acid neopentyl glycol di(meth)acrylate, δ-valerolactone modified hydroxypivalic acid neopentyl glycol di(meth)acrylate, γ-butyrolactone modified hydroxypivalic acid neopentyl glycol di(meth)acrylate, β-propiolactone modified hydroxypivalic acid neopentyl glycol di(meth)acrylate, ε-caprolactam modified hydroxypivalic acid neopentyl glycol di(meth)acrylate, δ-valerolactam modified hydroxypivalic acid neopentyl glycol di(meth)acrylate, γ-butyrolactam modified hydroxypivalic acid neopentyl glycol di(meth)acrylate, β-propiolactam modified hydroxypivalic acid neopentyl glycol di(meth)acrylate, ε-caprolactone modified diethylene glycol di(meth)acrylate, ε-caprolactone modified triethylene glycol di(meth)acrylate, ε-caprolactone modified tetraethylene glycol di(meth)acrylate, ε-caprolactone modified propylene glycol di(meth)acrylate, ε-caprolactone modified 1,3-butanediol di(meth)acrylate, ε-caprolactone modified 1,4-butanediol di(meth)acrylate, ε-caprolactone modified 1,6-hexanediol di(meth)acrylate, ε-caprolactone modified 1,9-nonanediol di(meth)acrylate, ε-caprolactone modified 1,10-decanediol di(meth)acrylate, ε-caprolactone modified neopentyl glycol di(meth)acrylate, ε-caprolactone modified trimethylolethane di(meth)acrylate, ε-caprolactone modified trimethylolpropane di(meth)acrylate, ε-caprolactone modified ditrimethylolpropane di(meth)acrylate, ε-caprolactone modified glycerin di(meth)acrylate, ε-caprolactone modified pentaerythritol di(meth)acrylate, ε-caprolactone modified dimethylol-tricyclodecane di(meth)acrylate, ε-caprolactone modified 1,3-bis((meth)acryloxyethyl)isocyanurate, and ε-caprolactone modified 1,3-bis((meth)acryloxyethyl)isocyanurate, as well as "KAYARAD" (registered trademark) HX-220 and HX-620 (all manufactured by Nippon Kayaku Co., Ltd.).

From the viewpoint of ensuring an improved sensitivity during light exposure and suppression of residues after development, the flexible chain-containing bifunctional radical-polymerizable compound (B2) is preferably ε-caprolactone modified hydroxypivalic acid neopentyl glycol di(meth)acrylate, δ-valerolactone modified hydroxypivalic acid neopentyl glycol di(meth)acrylate, γ-butyrolactone modified hydroxypivalic acid neopentyl glycol di(meth)acrylate, β-propiolactone modified hydroxypivalic acid neopentyl glycol di(meth)acrylate, ε-caprolactam modified hydroxypivalic acid neopentyl glycol di(meth)acrylate, δ-valerolactam modified hydroxypivalic acid neopentyl glycol di(meth)acrylate, γ-butyrolactam modified hydroxypivalic acid neopentyl glycol di(meth)acrylate, β-propiolactam modified hydroxypivalic acid neopentyl glycol di(meth)acrylate, ε-caprolactone modified trimethylolethane di(meth)acrylate, ε-caprolactone modified trimethylolpropane di(meth)acrylate, ε-caprolactone modified ditrimethylolpropane di(meth)acrylate, ε-caprolactone modified glycerin di(meth)acrylate, ε-caprolactone modified pentaerythritol di(meth)acrylate, caprolactone modified dimethylol-tricyclodecane di(meth)acrylate, ε-caprolactone modified 1,3-bis((meth)acryloxyethyl)isocyanurate, or ε-caprolactone modified 1,3-bis((meth)acryloxyethyl)isocyanurate, as well as "KAYARAD" (registered trademark) HX-220 or HX-620 (all manufactured by Nippon Kayaku Co., Ltd.).

In the negative-type photosensitive resin composition according to the present invention, the flexible chain-containing bifunctional radical-polymerizable compound (B2) preferably accounts for 1 part by mass or more, more preferably 3 parts by mass or more, still more preferably 5 parts by mass or more, even more preferably 7 parts by mass or more, and particularly preferably 10 parts by mass or more, relative to the total quantity of the alkali-soluble resin (A) and the radical-polymerizable compound (B) which accounts for 100 parts by mass. A content of 1 part by mass or more ensures an improved sensitivity during light exposure and reduction of the quantity of residue left after development. On the other hand, the content of the flexible chain-containing bifunctional radical-polymerizable compound (B2) is preferably 40 parts by mass or less, more preferably 35 parts by mass or less, still more preferably 30 parts by mass or less, even more preferably 25 parts by mass or less, and particularly preferably 20 parts by mass or less. A content of 40 parts by mass or less ensures the formation of a cured film having a small-tapered pattern shape.

<Negative-Type Photosensitivity>

The negative-type photosensitive resin composition according to the present invention further contains the photo-initiator (C1) as a photosensitizer (C). In addition, a photo-acid generator (C2) may be optionally incorporated.

<Photo-Initiator (C1)>

A photo-initiator (C1) is a compound that generates radicals as a result of bond cleavage and/or a reaction when exposed to light.

The incorporation of the photo-initiator (C1) acts to cause radical polymerization of the radical-polymerizable compound (B), and the light-exposed part of the film of the resin composition becomes insoluble in the alkaline developer, thereby serving to form a negative-type pattern. Furthermore, UV curing during light exposure is promoted to improve the sensitivity.

Preferable examples of the photo-initiator (C1) include benzyl ketal based photo-initiator, α-hydroxyketone based photo-initiator, α-aminoketone based photo-initiator, acyl phosphine oxide based photo-initiator, oxime ester based photo-initiator, acridine based photo-initiator, titanocene based photo-initiator, benzophenone based photo-initiator, acetophenone based photo-initiator, aromatic keto ester based photo-initiator, and benzoic acid ester based photo-initiator, of which α-hydroxyketone based photo-initiator, α-aminoketone based photo-initiator, acyl phosphine oxide based photo-initiator, oxime ester based photo-initiator, acridine based photo-initiator, and benzophenone based photo-initiator are more preferable from the viewpoint of ensuring an improved sensitivity during light exposure, and among others, α-aminoketone based photo-initiator, acyl phosphine oxide based photo-initiator, and oxime ester based photo-initiator are still more preferable.

Examples of the benzyl ketal based photo-initiator include 2,2-dimethoxy-1,2-diphenyl ethane-1-one.

Examples of the α-hydroxyketone based photo-initiator include 1-(4-isopropyl phenyl)-2-hydroxy-2-methylpropane-1-one, 2-hydroxy-2-methyl-1-phenylpropane-1-one, 1-hydroxycyclohexylphenyl ketone, 1-[4-(2-hydroxyethoxy) phenyl]-2-hydroxy-2-methylpropane-1-one, and 2-hydroxy-1-[4-[4-(2-hydroxy-2-methylpropionyl) benzyl] phenyl]-2-methylpropane-1-one.

Examples of the α-aminoketone based photo-initiator include 2-methyl-1-[4-(methylthio) phenyl]-2-morpholinopropane-1-one, 2-benzyl-2-dimethylamino-1-(4-morpholinophenyl)-butane-1-one, 2-dimethylamino-2-(4-methylbenzyl)-1-(4-morpholinophenyl)-butane-1-one, and 3,6-bis(2-methyl-2-morpholinopropionyl)-9-octyl-9H-carbazole.

Examples of the acyl phosphine oxide based photo-initiator include 2,4,6-trimethylbenzoyl-diphenylphosphine oxide, bis(2,4,6-trimethylbenzoyl)-phenylphosphine oxide, and bis(2,6-dimethoxybenzoyl)-(2,4,4-trimethylpentyl) phosphine oxide.

Examples of the oxime ester based photo-initiator include 1-phenylpropane-1,2-dione-2-(O-ethoxycarbonyl) oxime, 1-phenylbutane-1,2-dione-2-(O-methoxycarbonyl) oxime, 1,3-diphenylpropane-1,2,3-trione-2-(O-ethoxycarbonyl) oxime, 1-[4-(phenylthio)phenyl] octane-1,2-dione-2-(O-benzoyl) oxime, 1-[4-[4-(carboxyphenyl)thio]phenyl] propane-1,2-dione-2-(O-acetyl) oxime, 1-[9-ethyl-6-(2-methylbenzoyl)-9H-carbazole-3-yl] ethanone-1-(O-acetyl) oxime, 1-[9-ethyl-6-[2-methyl-4-[1-(2,2-dimethyl-1,3-dioxolan-4-yl) methyloxy] benzoyl]-9H-carbazole-3-yl] ethanone-1-(O-acetyl) oxime, and 1-(9-ethyl-6-nitro-9H-carbazole-3-yl)-1-[2-methyl-4-(1-methoxypropane-2-yloxy) phenyl] methanone-1-(O-acetyl) oxime.

Examples of the acridine based photo-initiator include 1,7-bis(acridine-9-yl)-n-heptane.

Examples of the titanocene based photo-initiator include bis($\eta^5$-2,4-cyclopentadiene-1-yl)-bis[2,6-difluoro-3-(1H-pyrrole-1-yl)phenyl] titanium (IV) and bis($\eta^5$-3-methyl-2,4-cyclopentadiene-1-yl)-bis(2,6-difluorophenyl) titanium (IV).

Examples of the benzophenone based photo-initiator include benzophenone, 4,4'-bis(dimethylamino)benzophenone, 4,4'-bis(diethylamino)benzophenone, 4-phenylbenzophenone, 4,4-dichlorobenzophenone, 4-hydroxybenzophenone, alkylated benzophenone, 3,3',4,4'-tetrakis(t-butylperoxycarbonyl)benzophenone, 4-methylbenzophenone, dibenzylketone, and fluorenone.

Examples of the acetophenone based photo-initiator include 2,2-diethoxyacetophenone, 2,3-diethoxyacetophenone, 4-t-butyldichloroacetophenone, benzalacetophenone, and 4-azidebenzalacetophenone.

Examples of the aromatic keto ester based photo-initiator include methyl 2-phenyl-2-oxyacetate.

Examples of the benzoic acid ester based photo-initiator include ethyl 4-(dimethylamino)benzoate, (2-ethyl)hexyl 4-(dimethylamino)benzoate, ethyl 4-(diethylamino)benzoate, and methyl 2-benzoylbenzoate.

In the negative-type photosensitive resin composition according to the present invention, the photo-initiator (C1) preferably accounts for 0.1 parts by mass or more, more preferably 0.5 parts by mass or more, still more preferably 0.7 parts by mass or more, and particularly preferably 1 part by mass or more, relative to the total quantity of the alkali-soluble resin (A) and the radical-polymerizable compound (B) which accounts for 100 parts by mass. A content of 0.1 parts by mass or more ensures improved sensitivity during light exposure. On the other hand, the content of the photo-initiator (C1) is preferably 25 parts by mass or less, more preferably 20 parts by mass or less, still more preferably 17 parts by mass or less, and particularly preferably 15 parts by mass or less. A content of 25 parts by mass or less ensures an improved resolution after development and the formation of a cured film having a small-tapered pattern shape.

<Photo-Acid Generator (C2)>

The negative-type photosensitive resin composition according to the present invention may further contain the photo-acid generator (C2) as the photosensitizer (C).

The photo-acid generator (C2) is a compound that generates an acid as a result of bond cleavage when exposed to light.

The incorporation of the photo-acid generator (C2) serves to accelerate the UV curing during light exposure to ensure an improved sensitivity. In addition, the crosslink density after the heat-curing of the resin composition will increase, leading to a cured film with an improved chemical resistance.

There are ionic compounds and nonionic compounds that can work as the photo-acid generator (C2).

The ionic compounds are preferably free of heavy metals or halogen ions, and triorganosulfonium salt based compounds are more preferable. Such triorganosulfonium salt based compounds include, for example, methane sulfonates, trifluoromethane sulfonates, camphor sulfonates, and 4-toluene sulfonates of triphenyl sulfonium; methane sulfonates, trifluoromethane sulfonates, camphor sulfonates, and 4-toluene sulfonates of dimethyl-1-naphthyl sulfonium; methane sulfonates, trifluoromethane sulfonates, camphor sulfonates, and 4-toluene sulfonates of dimethyl(4-hydroxy-1-naphthyl) sulfonium; methane sulfonates, trifluoromethane sulfonates, camphor sulfonates, and 4-toluene sulfonates of dimethyl (4,7-dihydroxy-1-naphthyl) sulfonium; methane sulfonates, trifluoromethane sulfonates, camphor sulfonates, and 4-toluene sulfonates of diphenyl iodonium.

Examples of the nonionic photo-acid generator (C2) include halogen-containing compounds, diazomethane compounds, sulfone compounds, sulfonic acid ester compounds, carboxylic acid ester compounds, sulfone imide compounds, phosphoric acid ester compounds, and sulfone benzotriazole compounds.

Of these photo-acid generators (C2), nonionic compounds are preferable to ionic compounds from the viewpoint of solubility and cured film's insulation properties. From the viewpoint of the strength of the acid to be generated, more preferable are those which generate benzenesulfonic acid, 4-toluenesulfonic acid, perfluoroalkylsulfonic acid, or phosphoric acid. Sulfonic acid ester compounds, sulfonimide compound, and iminosulfonic acid ester compounds are still more preferable from the viewpoint of high sensitivity in terms of the quantum yield for the j-line (wavelength 313 nm), line (wavelength 365 nm), h-line (wavelength 405 nm), and g-line (wavelength 436 nm) and the transparency of the resulting cured films.

In the negative-type photosensitive resin composition according to the present invention, the photo-acid generator (C2) preferably accounts for 0.1 parts by mass or more, more preferably 0.5 parts by mass or more, still more preferably 0.7 parts by mass or more, and particularly preferably 1 part by mass or more, relative to the total quantity of the alkali-soluble resin (A) and the radical-polymerizable compound (B) which accounts for 100 parts by mass. A content of 0.1 parts by mass or more ensures improved sensitivity during light exposure. On the other hand, the content of the photo-acid generator (C2) is preferably 25 parts by mass or less, more preferably 20 parts by mass or less, still more preferably 17 parts by mass or less, and particularly preferably 15 parts by mass or less. A content of 25 parts by mass or less ensures an improved resolution after development and the formation of a pattern shape with a small taper.

<Coloring Agent (D)>

The negative-type photosensitive resin composition according to the present invention further contains a coloring agent (D).

The coloring agent (D) is a compound that absorbs light in a specific wavelength range and in particular, it is a compound that acts to color a material when absorbing light in the visible light wavelength range (380 to 780 nm).

The incorporation of the coloring agent (D) serves to obtain a colored film from a resin composition and impart coloring capability to the film prepared from a resin composition to allow the light penetrating the film of the resin composition or the light reflected by the film of the resin composition to have a desired color. It also serves to impart light blocking capability so that light in a light in a wavelength range is absorbed by the coloring agent (D) and removed from the light penetrating the film of the resin composition or the light reflected by the film of the resin composition.

The coloring agent (D) may be a compound that absorbs light in a visible light wavelength range for coloring in white, red, orange, yellow, green, blue, or violet. Two or more of such coloring agents may be used in combination to ensure an improved toning capability so that the color coordinates of the light penetrating the film of the resin composition or the light reflected by the film of the resin composition can be adjusted as desired.

For the negative-type photosensitive resin composition according to the present invention, the coloring agent (D) preferably contains the pigment (D1) and/or the dye (D2) which will be described later. For the negative-type photosensitive resin composition according to the present invention, the coloring agent (D) preferably contains a black coloring agent (Da) and/or a non-black coloring agent (Db).

The black coloring agent (Da) is a compound that acts to color a material black by absorbing light in a visible light wavelength range.

If containing the black coloring agent (Da), the film of a resin composition turns black to improve the light blocking capability so that the light penetrating the film of the resin composition or reflected by the film of the resin composition is blocked efficiently. Thus, such a film can be used suitably in such components as light blocking films for black matrices of color filters, black column spacers of liquid crystal display devices, etc., pixel dividing layers and TFT planarization layers of organic EL display devices, that require increased contrast realized by depression of external light reflection.

From the viewpoint of light blocking capability, the black coloring agent (Da) is preferably a compound that can color a material black by absorbing light over the entire visible light wavelength range. It is also preferable for the coloring agent (D) to be a mixture of two or more selected from the group consisting of coloring agents of white, red, orange, yellow, green, blue, and violet. A combination of two or more of these coloring agents (D) can act to color a material pseudo-black to ensure an improved light blocking capability.

For the negative-type photosensitive resin composition according to the present invention, the black coloring agent (Da) preferably contains one or more selected from the group consisting of the black pigment (D1a) which will be described later, the black dye (D2a-1), and a mixture of two or more dyes (D2a-2), and the incorporation of the black pigment (D1a) which will be described later, is particularly preferable from the viewpoint of light blocking capability.

The non-black coloring agent (Db) is a compound that acts to color a material by absorbing light in a visible light wavelength range. Examples thereof include coloring agents that serve for coloring in non-black colors including white, red, orange, yellow, green, blue, and violet, as described above.

The incorporation of the black coloring agent (Da) and a non-black coloring agent (Db) serves to impart light blocking capability, and coloring capability and/or toning capability to the film of a resin composition.

For the negative-type photosensitive resin composition according to the present invention, the non-black coloring agent (Db) preferably contains the non-black pigment (D1b) and/or the non-black dye (D2b) which will be described later, and more preferably contains the non-black pigment (D1b) which will be described later, from the viewpoint of light blocking capability, and heat resistance or weather resistance.

In the negative-type photosensitive resin composition according to the present invention, it is preferable for the coloring agent (D) to account for 15 mass % or more, more preferably 20 mass % or more, still more preferably 25 mass % or more, and particularly preferably 30 mass % or more, of the total quantity of the alkali-soluble resin (A), the coloring agent (D), and the dispersant (E) which will be described later, which accounts for 100 mass %. When the content is 15 mass % or more, it is possible to improve light blocking capability, coloring capability, or toning capability. On the other hand, it is preferable for the coloring agent (D) to account for 80 mass % or less, more preferably 75 mass % or less, still more preferably 70 mass % or less, and particularly preferably 65 mass % or less. A content of 80 mass % or less ensures improved sensitivity during light exposure.

Furthermore, it is preferable for the coloring agent (D) to account for 5 mass % or more, more preferably 10 mass % or more, still more preferably 15 mass % or more, and particularly more preferably 20 mass % or more, of the total solid content, excluding the solvent, of the negative-type photosensitive resin composition according to the present invention. A content of 5 mass % or more ensures an improved light blocking capability, coloring capability, or toning capability. On the other hand, it is preferable for the coloring agent (D) to account for 70 mass % or less, more preferably 65 mass % or less, still more preferably 60 mass % or less, even more preferably 55 mass % or less, and particularly preferably 50 mass % or less. A content of 70 mass % or less ensures improved sensitivity during light exposure.

<Pigment (D1)>

For the negative-type photosensitive resin composition according to the present invention, the coloring agent (D) contains the pigment (D1). As an embodiment relating to the incorporation of the pigment (D1) in the coloring agent (D), it is preferable that a pigment (D1) is contained as the black coloring agent (Da) and/or the non-black coloring agent (Db).

The pigment (D1) is a compound that works to color a material by physical adsorption of the pigment (D1) on the surface of the material or interaction of the pigment (D1) with the surface of the material, and it is insoluble in most solvents etc. The pigment (D1) serves for coloring with high hiding power and can prevent color fading from being caused by ultraviolet ray etc.

The incorporation of the pigment (D1) ensures coloring in a color with high hiding power and allows the film of the resin composition to have an improved light blocking capability and weather resistance.

The number average particle diameter of the pigment (D1) is preferably 1 to 1,000 nm, more preferably 5 to 500 nm, and still more preferably 10 to 200 nm. If the pigment (D1) has a number average particle diameter of 1 to 1,000 nm, the film of the resin composition will have an improved light blocking capability and the pigment (D1) will have an improved dispersion stability.

Here, the number average particle diameter of the pigment (D1) can be determined from laser scattering attributed to the Brownian movement of the pigment (D1) in a solution (dynamic light scattering method) that is measured by a submicronic particle size distribution measuring apparatus (N4-PLUS, manufactured by Beckman Coulter K.K.) or a zeta potential/particle diameter/molecular weight measuring apparatus (Zetasizer Nano ZS, manufactured by Sysmex Corporation). On the other hand, the number average particle diameter of the pigment (D1) in a cured film prepared from a resin composition can be measured by using a scanning electron microscope (hereinafter referred to as "SEM") and a transmission electron microscope (hereinafter referred to as "TEM") TEM. The number average particle diameter of the pigment (D1) is measured directly at a magnification of 50,000 to 200,000 times. If the pigment (D1) is in the form of perfectly spherical particles, the diameter of the perfect sphere is measured and used as the number average particle diameter. If the pigment (D1) is not in the form of perfectly spherical particles, the longest size across each particle (hereinafter longest diameter) and the longest size in the direction perpendicular to the longest diameter (hereinafter shortest diameter) are measured and the longest diameter and the shortest diameter are averaged to calculate the biaxial average diameter, which is adopted as the number average particle diameter.

Examples of the pigment (D1) include the organic pigment (D1-1) and an inorganic pigment (D1-2).

The incorporation of the organic pigment (D1-1) serves to impart coloring capability or toning capability to films of the resin composition. Being an organic substance, furthermore, it will work to permit transmission or blocking of light in an intended specific wavelength range if it undergoes chemical structure modifications or functionality changes and therefore, its toning capability can be improved by varying the transmission spectrum or absorption spectrum of the film of the resin composition. In addition, organic pigments have better insulation properties and lower dielectricity than most inorganic pigments and accordingly, the incorporation of an organic pigment serves to produce a film with an improved resistance value. In particular, it serves to reduce light emission defects and improve the reliability when applied to insulation layers such as pixel dividing layers in organic EL display devices.

Examples of the organic pigments (D1-1) include phthalocyanine based pigments, anthraquinone based pigments, quinacridone based pigments, pyranthrone based pigments, dioxazine based pigments, thioindigo based pigments, diketopyrrolopyrrole based pigments, quinophtharone based pigments, threne based pigments, indoline based pigments, isoindoline based pigments, isoindolinone based pigments, benzofuranone based pigments, perylene based pigments, aniline based pigments, azo based pigments, azo methine based pigments, condensed azo based pigments, carbon black, metal complex based pigments, lake pigments, toner pigments, and fluorescent pigments. From the viewpoint of heat resistance, anthraquinone based pigments, quinacridone based pigments, pyranthrone based pigments, diketopyrrolopyrrole based pigments, benzofuranone based pigments, perylene based pigments, condensed azo based pigments, and carbon black are preferable.

Examples of the phthalocyanine based pigments include copper phthalocyanine based compounds, halogenated copper phthalocyanine based compounds, and metal-free phthalocyanine based compounds.

Examples of the anthraquinone based pigments include aminoanthraquinone based compounds, diaminoanthraquinone based compounds, anthrapyrimidine based compounds, flavanthrone based compounds, anthanthrone based compounds, indanthrone based compounds, pyranthrone based compounds, and violanthrone based compounds.

Examples of the azo based pigments include disazo based compounds and polyazo based compounds.

The incorporation of the inorganic pigment (D1-2) serves to impart coloring capability or toning capability to films of the resin composition. Being an inorganic substance and higher in heat resistance and weather resistance, furthermore, it will serve to provide a film of the resin composition that has an improved heat resistance and weather resistance.

Examples of the inorganic pigment (D1-2) include titanium oxide, barium carbonate, zirconium oxide, Chinese white, zinc sulfide, lead white, calcium carbonate, barium sulfate, white carbon, alumina white, silicon dioxide, kaolin clay, talc, bentonite, colcothar, molybdenum red, molybdate orange, chrome vermilion, chrome yellow, cadmium yellow, yellow ferric oxide, titanium yellow, chromium oxide, viridian, titanium cobalt green, cobalt green, cobalt chromium green, Victoria green, ultramarine blue, Prussian blue, cobalt blue, cerulean blue, cobalt silica blue, cobalt zinc silica blue, manganese violet, cobalt violet, graphite, and silver tin alloy, as well as fine particles, oxides, composite oxides, sulfides, sulfates, nitrates, carbonates, nitrides, carbides, and acid nitrides of metals such as titanium, copper, iron, manganese, cobalt, chrome, nickel, zinc, calcium, and silver.

For the negative-type photosensitive resin composition according to the present invention, it is preferable for the pigment (D1) to contain the black pigment (D1a), or the black pigment (D1a) and non-black pigment (D1b) which will be described later.

The pigment (D1) accounts for 5 to 70 mass %, of the total solid content, excluding the solvent, of the negative-type photosensitive resin composition according to the present invention.

The content of the pigment (D1) is more preferably 10 mass % or more, further preferably 15 mass % or more, and particularly preferably 20 mass % or more. When the content is 10 mass % or more, it is possible to improve light blocking capability, coloring capability, or toning capability. On the other hand, it is preferable for the pigment (D1) to account for 65 mass % or less, more preferably 60 mass % or less, still more preferably 55 mass % or less, and particularly preferably 50 mass % or less. A content of 65 mass % or less ensures improved sensitivity during light exposure.

<Black Pigment (D1a) and Non-Black Pigment (D1b)>

For the negative-type photosensitive resin composition according to the present invention, it is preferable for the pigment (D1) to contain a black pigment (D1a), or a black pigment (D1a) and a non-black pigment (D1b).

The black pigment (D1a) is a pigment that acts to color a material black by absorbing light in a visible light wavelength range.

The incorporation of the black pigment (D1a) ensures the production of a black film of the resin composition and, since it is also high in hiding power, the film of the resin composition will have an improved light blocking capability.

For the negative-type photosensitive resin composition according to the present invention, the black coloring agent (Da) is preferably the black pigment (D1a), and the black pigment (D1a) is preferably one or more selected from the group consisting of the black organic pigment (D1a-1), the black inorganic pigment (D1a-2), and a mixture of two or more color pigments (D1a-3) which will be described later.

The non-black pigment (D1b) is a pigment that serves for coloring in a non-black color such as violet, blue, green, yellow, orange, red, and white by absorbing light in a visible light wavelength range.

The incorporation of the non-black pigment (D1b) serves to provide a colored film of a resin composition and impart coloring capability or toning capability. The use of a combination of two or more non-black pigments (D1b) serves to provide a film of a resin composition having intended color coordinates to ensure an improved toning capability.

The non-black pigment (D1b) is, for example, a pigment that serves for coloring in a non-black color such as white, red, orange, yellow, green, blue, and violet as described later.

For the negative-type photosensitive resin composition according to the present invention, the non-black pigment (D1b) is preferably the non-black organic pigment (D1b-1) and/or the non-black inorganic pigment (D1b-2) which will be described later.

<Black Organic Pigment (D1a-1), Black Inorganic Pigment (D1a-2), and a Mixture of Two or More Pigments (D1a-3)>

For the negative-type photosensitive resin composition according to the present invention, the black pigment (D1a) is preferably one or more selected from the group consisting of a black organic pigment (D1a-1), a black inorganic pigment (D1a-2), and a mixture of two or more color pigments (D1a-3).

The black organic pigment (D1a-1) is an organic pigment that acts to color a material black by absorbing light in a visible light wavelength range.

The incorporation of the black organic pigment (D1a-1) ensures the production of a black film of the resin composition and, since it is also high in hiding power, the film of the resin composition will have an improved light blocking capability. Being an organic substance, furthermore, it will work to permit transmission or blocking of light in an intended specific wavelength range if it undergoes chemical structure modifications or functionality changes and therefore, its toning capability can be improved by varying the transmission spectrum or absorption spectrum of the film of the resin composition. In addition, the black organic pigment (D1a-1) has better insulation properties and lower dielectricity than most inorganic pigments and accordingly, the incorporation of the black organic pigment (D1a-1) serves to produce a film with an improved resistance value. In particular, it serves to reduce light emission defects and improve the reliability when applied to insulation layers such as pixel dividing layers in organic EL display devices.

Examples of the black organic pigment (D1a-1) include anthraquinone based black pigments, benzofuranone based black pigments, perylene based black pigments, aniline based black pigments, azo based black pigments, azomethine based black pigments, and carbon black.

Examples of carbon black include channel black, furnace black, thermal black, acetylene black, and lamp black. Channel black is preferable from the viewpoint of light blocking capability.

Examples of the black organic pigment (D1a-1) include Pigment Black 1, 6, 7, 12, 20, 31, or 32. (Each figure shows a color index number (hereinafter C. I. number)).

<Surface-Treated Carbon Black>

The carbon black is preferably in the form of carbon black particles having treated surfaces. Preferable examples of the surface treatment include surface treatment for introducing an acidic group, surface treatment with a silane coupling agent, and treatment for coating with resin.

Performing surface treatment for introducing an acidic group or surface treatment with a silane coupling agent serves to modify the surface conditions of the particles by making the surfaces of the carbon black particles acidic, hydrophilic, hydrophobic, etc., allowing the resin contained in the resin composition and the dispersant (E) which will be described later to work for improving the dispersion stability.

The acidic group to be introduced into carbon black by the surface treatment for acidic group introduction is a substituent group having an acidity as Broensted acid. Examples of the acidic group include carboxyl group, sulfonic acid group, and phosphoric acid group.

The acidic group to be introduced into carbon black may be a part of a salt. Examples of a cation that can form a salt with an acidic group include various metal ions, cations of nitrogen-containing compounds, arylammonium ions, alkylammonium ions, and ammonium ions. From the viewpoint of insulation properties of the cured film, arylammonium ions, alkylammonium ions, and ammonium ions are preferable.

The quantity (number of moles) of the acidic group introduced into carbon black is preferably 1 mmol or more, more preferably 5 mmol or more, in 100 g of the carbon black. A quantity (number of moles) of 1 mmol or more ensures an improved dispersion stability of the carbon black. On the other hand, the quantity (number of moles) is preferably 200 mmol or less, more preferably 150 mmol or less. A quantity (number of moles) of 200 mmol or less ensures an improved dispersion stability of the carbon black.

Examples of substituent groups to be introduced into carbon black by the surface treatment with a silane coupling agent (hereinafter surface-treating organosilane) for modifying the surface conditions of carbon black particles include acidic groups, basic groups, hydrophilic groups, and hydrophobic groups. Examples of the acidic groups, basic groups, hydrophilic groups, and hydrophobic groups include alkylsilyl groups and arylsilyl groups, as well as alkylsilyl groups and arylsilyl groups having hydroxyl groups, carboxyl groups, or amino groups.

Good methods for surface treatment with a surface-treating organosilane include mixing and treating a surface-treating organosilane and carbon black. Furthermore, a reaction solvent, water, or catalyst may be added as required.

Examples of the surface-treating organosilane include generally known ones such as methyl trimethoxysilane, methyl triethoxysilane, methyl tri-n-butoxysilane, methyl trichlorosilane, methyl triacetoxysilane, ethyl trimethoxysilane, n-propyl trimethoxysilane, n-hexyl trimethoxysilane, n-decyl trimethoxysilane, phenyl trimethoxysilane, 4-hydroxyphenyl trimethoxysilane, 3-aminopropyl trimethoxysilane, 4-aminophenyl trimethoxysilane, and 3-trimethoxysilylpropyl succinic acid anhydride.

The surface-treating organosilane preferably accounts for 0.01 parts by mass or more, more preferably 0.05 parts by mass or more, relative to the total quantity of the carbon black and the surface-treating organosilane, which accounts for 100 parts by mass. A content of 0.01 parts by mass or more ensures an improved dispersion stability of the carbon black. On the other hand, the surface-treating organosilane preferably accounts for 20 parts by mass or less, more preferably 15 parts by mass or less. A content of 20 parts by mass or less ensures an improved dispersion stability of the carbon black.

It is also preferable for the carbon black to be in the form of carbon black particles having surfaces coated with resin. Coating treatment using a resin (hereinafter coating resin) that can coat carbon black serves to coat the surfaces of the carbon black particles with a low-conductivity coating resin having insulation properties that can modify the surface conditions of the particles, thereby serving to produce a cured film with an improved light blocking capability and insulation properties. This also serves to reduce the leak current to ensure the production of display devices with an improved reliability. Therefore, such a cured film is suited to applications that require insulation properties.

Examples of the coating resin include polyamide, polyamide-imide, epoxy resin, novolac resin, phenol resin, urea resin, melamine resin, polyurethane, diallylphthalate resin, alkylbenzene resin, polystyrene, polycarbonate, polybutylene terephthalate, and modified polyphenylene oxide.

The coating resin preferably accounts for 0.1 parts by mass or more, more preferably 0.5 parts by mass or more, relative to the total quantity of the carbon black and the coating resin, which accounts for 100 parts by mass. A content of 0.1 parts by mass or more ensures the production of a cured film having an improved light blocking capability and insulation properties. On the other hand, the coating resin preferably accounts for 40 parts by mass or less, more preferably 30 parts by mass or less. A content of 40 parts by mass or less ensures the production of a cured film having an improved light blocking capability and insulation properties.

The black inorganic pigment (D1a-2) is an inorganic pigment that acts to color a material black by absorbing light in a visible light wavelength range.

The incorporation of the black inorganic pigment (D1a-2) ensures the production of a black film of the resin composition and, since it is also high in hiding power, the film of the resin composition will have an improved light blocking capability. Being an inorganic substance and higher in heat resistance and weather resistance, furthermore, it will serve to provide a film of the resin composition that has an improved heat resistance and weather resistance.

Examples of the black inorganic pigment (D1a-2) include fine particles, oxides, composite oxides, sulfides, sulfates, nitrates, carbonates, nitrides, carbides, and acid nitrides of graphite, silver tin alloy, and metals such as titanium, copper, iron, manganese, cobalt, chrome, nickel, zinc, calcium, and silver. From the viewpoint of improving the light blocking capability, fine particles, oxides, composite oxides, sulfides, nitrides, carbides, and acid nitrides of titanium or silver are preferable, and nitrides and acid nitrides of titanium are more preferable.

The mixture of two or more pigments (D1a-3) is a combination of two or more pigments selected from pigments of white, red, orange, yellow, green, blue, and violet to work as a pigment mixture for coloring in pseudo-black.

The incorporation of the mixture of two or more pigments (D1a-3) ensures the production of a black film of the resin composition and, since it is also high in hiding power, the film of the resin composition will have an improved light blocking capability. Being a mixture of two or more pigments, furthermore, it can work to permit transmission or blocking of light in an intended specific wavelength range and therefore, its toning capability can be improved by varying the transmission spectrum or absorption spectrum of the film of the resin composition.

Examples of pigments serving for coloring in red include Pigment Red 9, 48, 97, 122, 123, 144, 149, 166, 168, 177, 179, 180, 192, 209, 215, 216, 217, 220, 223, 224, 226, 227, 228, 240, and 250 (each figure shows a C. I. number).

Examples of pigments serving for coloring in orange include Pigment Orange 12, 36, 38, 43, 51, 55, 59, 61, 64, 65, and 71 (each figure shows a C. I. number).

Examples of pigments serving for coloring in yellow include Pigment Yellow 12, 13, 17, 20, 24, 83, 86, 93, 95, 109, 110, 117, 125, 129, 137, 138, 139, 147, 148, 150, 153, 154, 166, 168, and 185 (each figure shows a C. I. number).

Examples of pigments serving for coloring in green include Pigment Green 7, 10, 36, and 58 (each figure shows a C. I. number).

Examples of pigments serving for coloring in blue include Pigment Blue 15, 15:3, 15:4, 15:6, 22, 60, and 64 (each figure shows a C. I. number).

Examples of pigments serving for coloring in violet include Pigment Violet 19, 23, 29, 30, 32, 37, 40, and 50 (each figure shows a C. I. number).

Examples of pigments serving for coloring in white include titanium oxide, barium carbonate, zirconium oxide, Chinese white, zinc sulfide, lead white, calcium carbonate, barium sulfate, white carbon, alumina white, silicon dioxide, kaolin clay, talc, and bentonite.

<Non-Black Organic Pigment (D1b-1) and Non-Black Inorganic Pigment (D1b-2)>

For the negative-type photosensitive resin composition according to the present invention, the non-black pigment (D1b) is preferably a non-black organic pigment (D1b-1) and/or a non-black inorganic pigment (D1b-2).

The non-black organic pigment (D1b-1) is an organic pigment that serves for coloring in a non-black color such as white, red, orange, yellow, green, blue, and violet by absorbing light in a visible light wavelength range.

The incorporation of the non-black organic pigment (D1b-1) serves to provide a colored film of a resin composition and impart coloring capability or toning capability. Being an organic substance, furthermore, it will work to permit transmission or blocking of light in an intended specific wavelength range if it undergoes chemical structure modifications or functionality changes and therefore, its toning capability can be improved by varying the transmission spectrum or absorption spectrum of the film of the resin composition. The use of a combination of two or more non-black organic pigments (D1b-1) serves to provide a film of a resin composition having intended color coordinates to ensure an improved toning capability.

The non-black organic pigment (D1b-1) is an organic pigment that serves for coloring in a non-black color such as white, red, orange, yellow, green, blue, and violet.

Examples of the non-black organic pigment (D1b-1) include phthalocyanine based pigments, anthraquinone based pigments, quinacridone based pigments, pyranthrone based pigments, dioxazine based pigments, thioindigo based pigments, diketopyrrolopyrrole based pigments, quinophtharone based pigments, threne based pigments, indoline based pigments, isoindoline based pigments, isoindolinone based pigments, benzofuranone based pigments, perylene based pigments, aniline based pigments, azo based pigments, azo methine based pigments, metal complex based pigments, lake pigments, toner pigments, and fluorescent pigments.

The non-black inorganic pigment (D1b-2) is an inorganic pigment that serves for coloring in a non-black color such as white, red, orange, yellow, green, blue, and violet by absorbing light in a visible light wavelength range.

The incorporation of the non-black inorganic pigment (D1b-2) serves to provide a colored film of a resin composition and impart coloring capability or toning capability. Being an inorganic substance and higher in heat resistance and weather resistance, furthermore, it will serve to provide a film of the resin composition that has an improved heat resistance and weather resistance. The use of a combination of two or more non-black inorganic pigments (D1b-2) serves to provide a film of a resin composition having intended color coordinates to ensure an improved toning capability.

The use of a combination of two or more non-black inorganic pigments (D1b-2) serves to provide a film of a resin composition having intended color coordinates to ensure an improved toning capability.

The non-black inorganic pigments (D1b-2) is an inorganic pigment that serves for coloring in a non-black color such as white, red, orange, yellow, green, blue, and violet.

Examples of the non-black inorganic pigments (D1b-2) include titanium oxide, barium carbonate, zirconium oxide, Chinese white, zinc sulfide, lead white, calcium carbonate, barium sulfate, white carbon, alumina white, silicon dioxide, kaolin clay, talc, bentonite, colcothar, molybdenum red, molybdenum orange, chrome vermilion, chrome yellow, cadmium yellow, yellow ferric oxide, titanium yellow, chrome oxide, viridian, titanium cobalt green, cobalt green, cobalt chrome green, Victoria green, ultramarine blue, Prussian blue, cobalt blue, cerulean blue, cobalt silica blue, cobalt zinc silica blue, manganese violet, and cobalt violet.

<Benzofuranone Based Black Pigment (D1a-1a)), Perylene Based Black Pigment (D1a-1b), and Azo Based Black Pigment (D1a-1c)>

For the negative-type photosensitive resin composition according to the present invention, the black organic pigment (D1a-1) is preferably one or more selected from the group consisting of the benzofuranone based black pigment (D1a-1a)), a perylene based black pigment (D1a-1b), and an azo based black pigment (D1a-1c).

The benzofuranone based black pigment (D1a-1a)) is a compound having a benzofuran-2(3H)-one structure or a benzofuran-3(2H)-one structure in the molecule and serving for coloring in black by absorbing light in a visible light wavelength range.

The incorporation of the benzofuranone based black pigment (D1a-1a)) ensures the production of a black film of the resin composition and, since it is also high in hiding power, the film of the resin composition will have an improved light blocking capability. In particular, as compared with common organic pigments, it is higher in light blocking capability per unit pigment content in a resin composition and accordingly, a smaller quantity of it can be as effective in imparting light blocking capability. The incorporation of the benzofuranone based black pigment (D1a-1a), therefore, ensures the production of a film with an improved light blocking capability, and also ensures an improved sensitivity during light exposure. Furthermore, it absorbs light in a visible light wavelength range while transmitting light in an ultraviolet wavelength range (for example, 400 nm or less), thereby ensuring an improved sensitivity during light exposure. Being an organic substance, furthermore, it will work to permit transmission or blocking of light in an intended specific wavelength range if it undergoes chemical structure modifications or functionality changes and therefore, its toning capability can be improved by varying the transmission spectrum or absorption spectrum of the film of the resin composition. In particular, being able to improve the transmittance in a near-infrared wavelength range (for example, 700 nm or more), it can be applied suitably to uses that require light blocking capability and utilize light in a near-infrared wavelength range. In addition, having better insulation properties and lower dielectricity than most inorganic pigments and organic pigments and accordingly, the incorporation of the benzofuranone based black pigment (D1a-1a) serves to produce a film with an improved resistance value. In particular, it serves to reduce light emission defects and improve the reliability when applied to insulation layers such as pixel dividing layers in organic EL display devices.

The benzofuranone based black pigment (D1a-1a) is preferably a benzofuranone compound as represented by any of general formulae (63) to (68).

[Chemical formula 27]

(63)

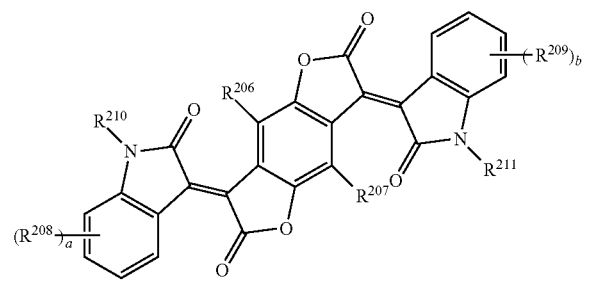

(64)

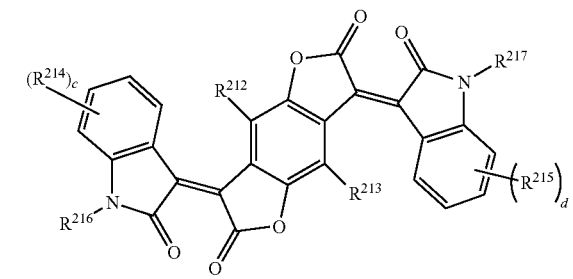

(65)

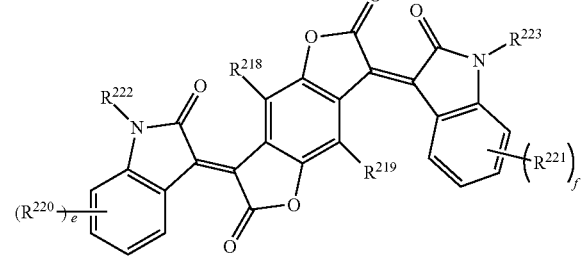

In general formulae (63) to (65), $R^{206}$, $R^{207}$, $R^{212}$, $R^{213}$, $R^{218}$, and $R^{219}$ are each independently a hydrogen atom, a halogen atom, an alkyl group containing 1 to 10 carbon atoms, or an alkyl group containing 1 to 10 carbon atoms and 1 to 20 fluorine atoms. $R^{208}$, $R^{209}$, $R^{214}$, $R^{215}$, $R^{220}$, and $R^{221}$ are each independently a hydrogen atom, a halogen atom, $R^{251}$, COOH, COOR$^{251}$, COO—, CONH$_2$, CONHR$^{251}$, CONR$^{251}$R$^{252}$, CN, OH, OR$^{251}$, OCOR$^{251}$, OCONH$_2$, OCONHR$^{251}$, OCONR$^{251}$R$^{252}$, NO$_2$, NH$_2$, NHR$^{251}$, NR$^{251}$R$^{252}$, NHCOR$^{251}$, NR$^{251}$COR$^{252}$, N=CH$_2$, N=CHR$^{251}$, N=CR$^{251}$R$^{252}$, SH, SR$^{251}$, SOR$^{251}$, SO$_2$R$^{251}$, SO$_3$R$^{251}$, SO$_3$H, SO$_3$, SO$_2$NH$_2$, SO$_2$NHR$^{251}$, or SO$_2$NR$^{251}$R$^{252}$, and $R^{251}$ and $R^{252}$ are each independently an alkyl group containing 1 to 10 carbon atoms, a cycloalkyl group containing 4 to 10 carbon atoms, an alkenyl group containing 2 to 10 carbon atoms, a cycloalkenyl group containing 4 to 10 carbon atoms, or alkynyl group containing 2 to 10 carbon atoms. A plurality selected from $R^{208}$, $R^{209}$, $R^{214}$, $R^{215}$, $R^{220}$, and $R^{221}$ may be connected by a direct bond, oxygen atom bridge, sulfur atom bridge, NH bridge, or NR$^{251}$ bridge to form a ring. $R^{210}$, $R^{211}$, $R^{216}$, $R^{217}$, $R^{222}$, and $R^{223}$ are each independently a hydrogen atom, an alkyl group containing 1 to 10 carbon atoms, or an aryl group containing 6 to 15 carbon atoms. Furthermore, a, b, c, d, e, and f are each independently an integer of 0 to 4.

In general formulae (63) to (65), it is preferable that $R^{206}$, $R^{207}$, $R^{212}$, $R^{213}$, $R^{218}$, and $R^{219}$ are each independently a hydrogen atom, a halogen atom, an alkyl group containing 1 to 6 carbon atoms, or an alkyl group containing 1 to 6 carbon atoms and 1 to 12 fluorine atoms. Furthermore, $R^{251}$ and $R^{252}$ are each independently an alkyl group containing 1 to 6 carbon atoms, a cycloalkyl group containing 4 to 7 carbon atoms, an alkenyl group containing 2 to 6 carbon atoms, an cycloalkenyl group containing 4 to 7 carbon atoms, or an alkynyl group containing 2 to 6 carbon atoms. Moreover, $R^{210}$, $R^{211}$, $R^{216}$, $R^{217}$, $R^{222}$, and $R^{223}$ are each independently a hydrogen atom, an alkyl group containing 1 to 6 carbon atoms, or an aryl group containing 6 to 10 carbon atoms. The above alkyl group, cycloalkyl group, alkenyl group, cycloalkenyl group, alkynyl group, and aryl group may have a heteroatom, and may each be either a substitution product or a non-substitution product.

[Chemical formula 28]

(66)

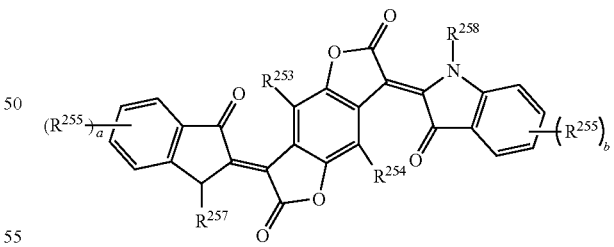

(67)

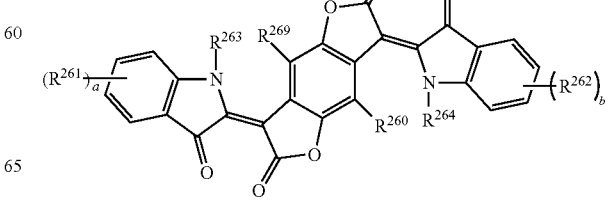

-continued (68)

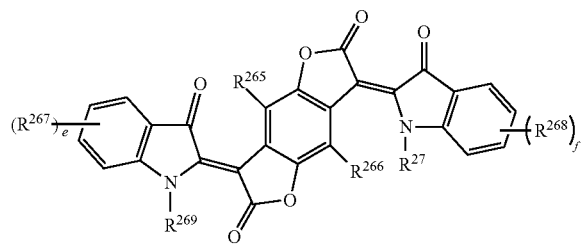

In general formulae (66) to (68), $R^{253}$, $R^{254}$, $R^{259}$, $R^{260}$, $R^{265}$, and $R^{266}$ are each independently a hydrogen atom, a halogen atom, an alkyl group containing 1 to 10 carbon atoms, or an alkyl group containing 1 to 10 carbon atoms and 1 to 20 fluorine atoms. $R^{255}$, $R^{256}$, $R^{261}$, $R^{262}$, $R^{267}$, and $R^{268}$ are each independently a hydrogen atom, a halogen atom, $R^{271}$, COOH, COOR$^{271}$, COO—, CONH$_2$, CONHR$^{271}$, CONR$^{271}$R$^{272}$, CN, OH, OR$^{271}$, OCOR$^{271}$, OCONH$_2$, OCONHR$^{271}$, OCONR$^{271}$R$^{272}$, NO$_2$, NH$_2$, NHR$^{271}$, NR$^{271}$R$^{272}$, NHCOR$^{271}$, NR$^{271}$COR$^{272}$, N=CH$_2$, N=CHR$^{271}$, N=CR$^{271}$R$^{272}$, SH, SR$^{271}$, SOR$^{271}$, SO$_2$R$^{271}$, SO$_3$R$^{271}$, SO$_3$H, SO$_3$, SO$_2$NH$_2$, SO$_2$NHR$^{271}$, or SO$_2$NR$^{271}$R$^{272}$, and $R^{271}$ and $R^{272}$ are each independently an alkyl group containing 1 to 10 carbon atoms, a cycloalkyl group containing 4 to 10 carbon atoms, an alkenyl group containing 2 to 10 carbon atoms, a cycloalkenyl group containing 4 to 10 carbon atoms, or alkynyl group containing 2 to 10 carbon atoms. A plurality selected from $R^{255}$, $R^{256}$, $R^{261}$, $R^{262}$, $R^{267}$, and $R^{268}$ may be connected by a direct bond, oxygen atom bridge, sulfur atom bridge, NH bridge, or NR$^{271}$ bridge to form a ring. $R^{257}$, $R^{258}$, $R^{263}$, $R^{264}$, $R^{269}$, and $R^{270}$ are each independently a hydrogen atom, an alkyl group containing 1 to 10 carbon atoms, or an aryl group containing 6 to 15 carbon atoms. Furthermore, a, b, c, d, e, and f are each independently an integer of 0 to 4.

In general formulae (66) to (68), it is preferable that $R^{253}$, $R^{254}$, $R^{259}$, $R^{260}$, $R^{265}$, and $R^{266}$ are each independently a hydrogen atom, a halogen atom, an alkyl group containing 1 to 6 carbon atoms, or an alkyl group containing 1 to 6 carbon atoms and 1 to 12 fluorine atoms. Furthermore, $R^{271}$ and $R^{272}$ are each independently an alkyl group containing 1 to 6 carbon atoms, a cycloalkyl group containing 4 to 7 carbon atoms, an alkenyl group containing 2 to 6 carbon atoms, an cycloalkenyl group containing 4 to 7 carbon atoms, or an alkynyl group containing 2 to 6 carbon atoms. Moreover, $R^{257}$, $R^{258}$, $R^{263}$, $R^{264}$, $R^{269}$ and $R^{270}$ are each independently a hydrogen atom, an alkyl group containing 1 to 6 carbon atoms, or an aryl group containing 6 to 10 carbon atoms. The above alkyl group, cycloalkyl group, alkenyl group, cycloalkenyl group, alkynyl group, and aryl group may have a heteroatom, and may each be either a substitution product or a non-substitution product.

Examples of the benzofuranone based black pigment (D1a-1a)) include IRGAPHOR (registered trademark) BLACK S0100CF (manufactured by BASF), black pigments as described in International Publication WO 2010-081624, and black pigments as described in International Publication WO 2010-081756.

The perylene based black pigment (D1a-1b) is a compound having a perylene structure in the molecule and serving for coloring in black by absorbing light in a visible light wavelength range.

The incorporation of the perylene based black pigment (D1a-1b) ensures the production of a black film of the resin composition and, since it is also high in hiding power, the film of the resin composition will have an improved light blocking capability. In particular, as compared with common organic pigments, it is higher in light blocking capability per unit pigment content in a resin composition and accordingly, a smaller quantity of it can be as effective in imparting light blocking capability. The incorporation of the perylene based black pigment (D1a-1b), therefore, ensures the production of a film with an improved light blocking capability, and also ensures an improved sensitivity during light exposure. Being an organic substance, furthermore, it will work to permit transmission or blocking of light in an intended specific wavelength range if it undergoes chemical structure modifications or functionality changes and therefore, its toning capability can be improved by varying the transmission spectrum or absorption spectrum of the film of the resin composition. In particular, being able to improve the transmittance in a near-infrared wavelength range (for example, 700 nm or more), it can be applied suitably to uses that require light blocking capability and utilize light in a near-infrared wavelength range. In addition, having better insulation properties and lower dielectricity than most inorganic pigments and organic pigments and accordingly, the incorporation of the perylene based black pigment (D1a-1b) serves to produce a film with an improved resistance value. In particular, it serves to reduce light emission defects and improve the reliability when applied to insulation layers such as pixel dividing layers in organic EL display devices.

The perylene based black pigment (D1a-1b) is preferably a perylene compound as represented by any of general formulae (69) to (71).

[Chemical formula 29]

(69)

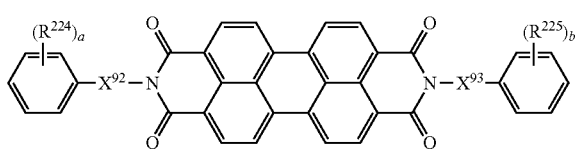

(70)

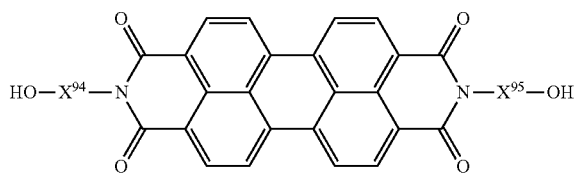

(71)

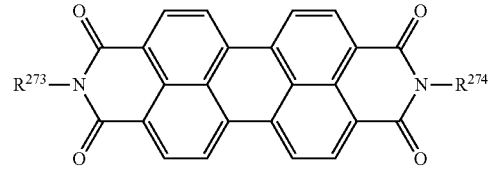

In general formulae (69) to (71), $X^{92}$, $X^{93}$, $X^{94}$, and $X^{95}$ are each independently an alkylene chain containing 1 to 10 carbon atoms. $R^{224}$ and $R^{225}$ are each independently a hydrogen atom, a hydroxyl group, an alkoxy group containing 1 to 6 carbon atoms, or an acyl group containing 2 to 6 carbon atoms. $R^{273}$ and $R^{274}$ are each independently a hydrogen atom or an alkyl group containing 1 to 10 carbon atoms. Furthermore, a and b are each an integer of 0 to 5. In general formulae (69) to (71), it is preferable that $X^{92}$, $X^{93}$, $X^{94}$, and $X^{95}$ are each independently an alkylene chain containing 1 to 6 carbon atoms. Furthermore, it is preferable that $R^{224}$ and $R^{225}$ are each independently a hydrogen atom, a hydroxyl group, an alkoxy group containing 1 to 4 carbon atoms, or an acyl group containing 2 to 4 carbon atoms. It is preferable that $R^{273}$ and $R^{274}$ are each independently a hydrogen atom or an alkyl group containing 1 to 6 carbon atoms. The above alkylene chain, alkoxy group, acyl group, and alkyl group may have a heteroatom, and may each be either a substitution product or a non-substitution product.

Examples of the perylene based black pigment (D1a-1b) include Pigment Black 31 and 32 (each figure shows a C. I. number).

In addition to the above ones, other examples include PALIOGEN (registered trademark) BLACK S0084, K0084, L0086, K0086, EH0788, and FK4281 (all manufactured by BASF).

Furthermore, it is preferable for the benzofuranone based black pigment (D1a-1a)) and/or perylene based black pigment (D1a-1b) to account for 5 mass % or more, more preferably 10 mass % or more, still more preferably 15 mass % or more, and particularly preferably 20 mass % or more, of the total solid content, excluding the solvent, of the negative-type photosensitive resin composition according to the present invention. A content of 5 mass % or more ensures an improved light blocking capability and toning capability. On the other hand, it is preferable for the benzofuranone based black pigment (D1a-1a)) and/or perylene based black pigment (D1a-1b) to account for 70 mass % or less, more preferably 65 mass % or less, still more preferably 60 mass % or less, even more preferably 55 mass % or less, and particularly preferably 50 mass % or less. A content of 70 mass % or less ensures improved sensitivity during light exposure.

The azo based black pigment (D1a-1c) is a compound having an azo group in the molecule and serving for coloring in black by absorbing light in a visible light wavelength range.

The incorporation of the azo based black pigment (D1a-1c) ensures the production of a black film of the resin composition and, since it is also high in hiding power, the film of the resin composition will have an improved light blocking capability. In particular, as compared with common organic pigments, it is higher in light blocking capability per unit pigment content in a resin composition and accordingly, a smaller quantity of it can be as effective in imparting light blocking capability. The incorporation of the azo based black pigment (D1a-1c), therefore, ensures the production of a film with an improved light blocking capability, and also ensures an improved sensitivity during light exposure. Being an organic substance, furthermore, it will work to permit transmission or blocking of light in an intended specific wavelength range if it undergoes chemical structure modifications or functionality changes and therefore, its toning capability can be improved by varying the transmission spectrum or absorption spectrum of the film of the resin composition. In particular, being able to improve the transmittance in a near-infrared wavelength range (for example, 700 nm or more), it can be applied suitably to uses that require light blocking capability and utilize light in a near-infrared wavelength range. In addition, having better insulation properties and lower dielectricity than most inorganic pigments and organic pigments and accordingly, the incorporation of the azo based black pigment (D1a-1c) serves to produce a film with an improved resistance value. In particular, it serves to reduce light emission defects and improve the reliability when applied to insulation layers such as pixel dividing layers in organic EL display devices.

It is preferable for the azo based black pigment (D1a-1c) to be an azo compound as represented by general formula (72).

[Chemical formula 30]

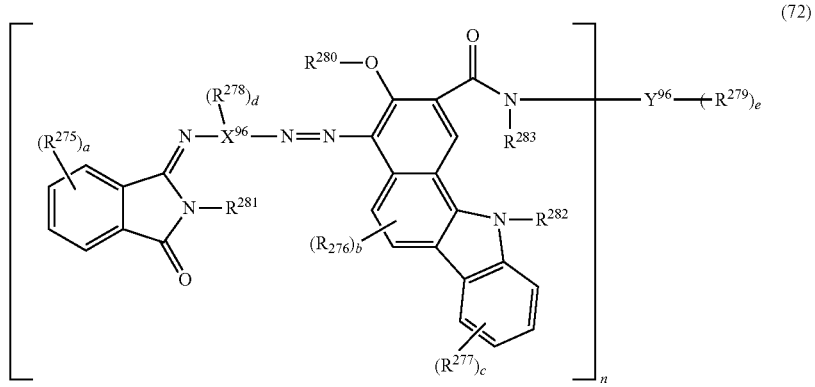

In general formula (72), $X^{96}$ is an arylene chain having 6 to 15 carbon atoms. $Y^{96}$ is an arylene chain having 6 to 15 carbon atoms. $R^{275}$, $R^{276}$, and $R^{277}$ are each independently a halogen atom or an alkyl group containing 1 to 10 carbon atoms. $R^{278}$ is a halogen atom, an alkyl group containing 1 to 10 carbon atoms, an alkoxy group containing 1 to 6 carbon atoms or a nitro group. $R^{279}$ is a halogen atom, an alkyl group containing 1 to 10 carbon atoms, an alkoxy group containing 1 to 6 carbon atoms, an acylamino group containing 2 to 10 carbon atoms or a nitro group. $R^{280}$, $R^{281}$, $R^{282}$, and $R^{283}$ are each independently a hydrogen atom or an alkyl group containing 1 to 10 carbon atoms. Furthermore, a is an integer of 0 to 4; b is an integer of 0 to 2; c is an integer of 0 to 4; d and e are each independently an integer of 0 to 8; and n is an integer of 1 to 4. In general formula (72), $X^{96}$ is preferably an arylene chain containing 6 to 10 carbon atoms. $Y^{96}$ is preferably an arylene chain having 6 to 10 carbon atoms. $R^{275}$, $R^{276}$, and $R^{277}$ are each independently preferably a halogen atom or an alkyl group containing 1 to 6 carbon atoms. $R^{278}$ is a halogen atom, an alkyl group containing 1 to 6 carbon atoms, an alkoxy group containing 1 to 4 carbon atoms or a nitro group. $R^{279}$ is preferably a halogen atom, an alkyl group containing 1 to 6 carbon atoms, an alkoxy group containing 1 to 4 carbon atoms, an acylamino group containing 2 to 8 carbon atoms or a nitro group. $R^{280}$, $R^{281}$, $R^{282}$, and $R^{283}$ are each independently preferably a hydrogen atom or an alkyl group containing 1 to 6 carbon atoms. n is preferably 1 or 2. The above arylene chain, alkyl group, alkoxy group, and acylamino group may have a heteroatom, and may each be either a substitution product or a non-substitution product.

Examples of the azo based black pigment (D1a-1c) include "CHROMOFINE" (registered trademark) BLACK A1103 (manufactured by Dainichiseika Color & Chemicals Mfg. Co., Ltd.), the black pigment described in JP 1-170601 A, and the black pigment described in JP 2-034664 A.

Furthermore, it is preferable for one or more selected from the group consisting of the benzofuranone based black pigment (D1a-1a)), the perylene based black pigment (D1a-1b), and the azo based black pigment (D1a-1c) to account for 5 mass % or more, more preferably 10 mass % or more, still more preferably 15 mass % or more, and particularly preferably 20 mass % or more, of the total solid content, excluding the solvent, of the negative-type photosensitive resin composition according to the present invention. A content of 5 mass % or more ensures an improved light blocking capability and toning capability. On the other hand, it is preferable for one or more selected from the group consisting of the benzofuranone based black pigment (D1a-1a)), the perylene based black pigment (D1a-1b), and the azo based black pigment (D1a-1c) to account for 70 mass % or less, more preferably 65 mass % or less, still more preferably 60 mass % or less, even more preferably 55 mass % or less, and particularly preferably 50 mass % or less. A content of 70 mass % or less ensures improved sensitivity during light exposure.

<Covering Layer (DC)>

For the negative-type photosensitive resin composition according to the present invention, it is preferable for the black organic pigment (D1a-1) to further contain a covering layer (DC).

The covering layer (DC) is, for example, a layer for covering a pigment surface, which is formed by treatment, such as surface treatment with a silane coupling agent, surface treatment with silicate, surface treatment with metal alkoxide, or covering treatment with a resin.

The incorporation of the covering layer (DC) can reform the surface state of particles, and, for example, acidification, basification, hydrophilization, or hydrophobization of surfaces of particles or the black organic pigment (D1a-1) is performed, so that acid resistance, alkali resistance, solvent resistance, dispersion stability, heat resistance or the like can be improved. As a result, it is possible to suppress generation of development residues caused by the pigment. The formation of a covering layer having insulation properties on the particle surface improves insulation properties of a cured film, and due to reduction of leak electric current or the like, the reliability of displays and the like can be improved.

When the benzofuranone based black pigment (D1a-1a)) is particularly incorporated as the black organic pigment (D1a-1), development residues caused by the pigment may be generated due to insufficient alkali resistance of the pigment, as described above.

As a result of verifying the principle of generation of development residues, it has been found that development residues are generated due to lack of chemical durability intrinsic to the benzofuranone based black pigment (D1a-1a)). The benzofuranone based black pigment (D1a-1a) has much lower alkali resistance than that of black organic pigments such as carbon black and many non-black organic pigments. Thus, when the unexposed part is dissolved and removed during alkali development, due to a contact with an alkaline developer through a resin component, the crystal structure of the benzofuranone based black pigment (D1a-1a)) is broken to be dissolved or semi-dissolved and thus to be decomposed, and the resulting decomposed component is secured on the substrate, so that development residues caused by the pigment are generated at the unexposed part. The decomposition of the benzofuranone based black pigment (D1a-1a) brings about discoloration from black to brown, deterioration of the light blocking capability, and occurrence of a decomposition smell, and the properties inherent to the benzofuranone based black pigment (D1a-1a)) are lost.

When a pixel dividing layer in an organic EL display device is formed by a negative-type photolithography method in which an exposed part is photo-cured by pattern exposure through a photomask to lower alkali solubility and an unexposed part is dissolved and removed with an alkali developer, in addition to the development residues at the unexposed part as described above, also when a film of a cured portion peels off during alkali development and re-adhered onto a substrate of an opening, development residues are generated. As described above, in order to prevent disconnection of a transparent electrode or a metal electrode formed on the pixel dividing layer, the pixel dividing layer is required to have a pattern shape with a small taper. During heat curing, when a film after development is reflowed to form a pattern shape with a small taper, it is necessary to suppress excessive curing of an exposed part during UV light exposure. Thus, during alkali development, the alkali developer is likely to permeate into a film surface and a film side surface of the cured portion, and it is presumed that the benzofuranone based black pigment (D1a-1a)) is decomposed to abruptly lower interfacial adhesion strength between the pigment and the resin, and the film of the cured portion peels off to generate development residues. Development residues at the opening cause display failure such as occurrence of dark spots or reduction in brightness in a pixel part of the organic EL display device.

When the benzofuranone based black pigment (D1a-1a)) is particularly incorporated as the black organic pigment (D1a-1), the incorporation of the covering layer (DC) in the benzofuranone based black pigment (D1a-1a)) can improve alkali resistance of the pigment and suppress generation of development residues caused by the pigment.

The average coverage by the covering layer (DC) to the black organic pigment (D1a-1) is preferably 50% or more, preferably 70% or more, more preferably 80% or more, and still more preferably 90% or more. When the average coverage by the covering layer (DC) is 80% or more, it is possible to suppress residue generation during development.

The average coverage by the covering layer (DC) to the black organic pigment (D1a-1) can be calculated by, for example, the following method. First, a two-component room temperature-curable acrylic transparent resin (Techovit 4006; manufactured by Heraeus Kulzer Gmbh) is used as an embedding resin and impregnated with a black pigment to be reacted and cured, and thus to obtain an observation sample. The observation sample is roughly mechanically polished using diamond abrasive paper, and then a smooth cross section is formed on a portion of the observation sample by argon ion beam polishing using an ion milling apparatus (IM 4000; manufactured by Hitachi High-Technologies Corporation). Using a transmission electron microscope (H9500; manufactured by Hitachi High-Technologies Corporation), the cross section is observed under conditions of an accelerating voltage of 300 kV with an enlarging magnification of 50,000 to 200,000 times, and the lightness and contrast of a display monitor are adjusted so that the outer periphery of particles of the black pigment can be recognized as a contrast difference, thus obtaining an image of the cross section. With respect to 100 black pigment particles randomly selected, the coverage M (%) of each black pigment is obtained by the following formula to calculate the number average value, whereby an average coverage N (%) can be obtained.

$$\text{Coverage } M(\%) = \{L1/(L1+L2)\} \times 100$$

L1: Total length (nm) of a portion covered with the covering layer in the outer periphery of the particle.

L2: Total length (nm) of a portion not covered with the covering layer (portion where an interface and the embedding resin are in direct contact with each other) in the outer periphery of the particle.

L1+L2: Outer peripheral length (nm) of the particle.

The form of the covering layer (DC) functions as a protective layer that contributes to improvement in alkali resistance, and examples thereof include a form in which a particulate covering material is deposited in a layer form on the particle surface of the pigment, a form in which the covering material is formed on the particle surface of the pigment to have a uniform film shape, and a form in which both forms are mixed. The covering layer (DC) is preferably dense with less voids. On the other hand, if the covering layer (DC) has the form in which a particulate covering material is deposited in a layer form, when a pigment dispersion liquid is prepared from the black organic pigment (D1a-1), the covering layer (DC) functions as a sacrificial layer, and even when excessive mechanical energy is applied in a dispersing step, exposure of the particle surface of the pigment can be suppressed. Examples of the shape of the particulate covering material of the covering layer (DC) include a spherical shape and an amorphous shape. The number average particle diameter of the particulate covering material of the covering layer (DC) is preferably 10 nm or less, and more preferably 5 nm or less. When the number average particle diameter of the particulate covering material is 10 nm or less, diffused reflection of light on the particle surface of the pigment can be suppressed, and jet-blackness inherent to the benzofuranone based black pigment (D1a-1a)) can be maintained. When the particulate covering material of the covering layer (DC) is not spherical, a biaxial average diameter obtained by averaging a major axis diameter and a minor axis diameter is taken as the number average particle diameter. In addition, a locally supported covering material is also included as the covering layer (DC).

<Silica Covering Layer (DC-1), Metal Oxide Covering Layer (DC-2), and Metal Hydroxide Covering Layer (DC-3)>

As the covering layer (DC), one kind selected from the group consisting of a silica covering layer (DC-1), a metal oxide covering layer (DC-2), and a metal hydroxide covering layer (DC-3) is preferably contained. Since silica, a metal oxide, and a metal hydroxide have a function of imparting alkali resistance to a pigment, it is possible to suppress generation of development residues caused by the pigment.

The silica incorporated in the silica covering layer (DC-1) is a generic term for silicon dioxides and their hydrates. The metal oxide incorporated in the metal oxide covering layer (DC-2) is a generic term for metal oxides and their hydrates. As an example of the metal oxide, alumina can be mentioned, and examples thereof include alumina ($Al_2O_3$) and alumina hydrate ($Al_2O_3 \cdot nH_2O$). Examples of the metal hydroxide incorporated in the metal hydroxide covering layer (DC-3) include aluminum hydroxide ($Al(OH)_3$).

For the covering layer (DC), the surface preferably has a hydroxy group. Due to having a hydroxyl group on the surface of the covering layer (DC), the dispersibility in the alkali-soluble resin (A) can be improved. In addition, since the dispersibility in an alkali developer can also be improved, the dispersibility of the pigment during alkali development can be maintained, and it is possible to suppress generation of development residues caused by the pigment, such as coarse aggregates of the pigment. Examples of the hydroxyl group on the surface of the covering layer (DC) include a hydroxyl group remaining on the particle surface of the pigment in a process of precipitating silica, a metal oxide, or a metal hydroxide on the particle surface of the pigment, and a hydroxyl group formed by modification of silica or a metal oxide.

Examples of the covering layer (DC) having a hydroxy group on the surface include one in a form in which a covering material having a surface hydroxyl group such as silica, alumina, aluminum hydroxide, zirconia, zirconium hydroxide or titanium oxide is located in the outermost layer of the covering layer (DC). It is preferable for the hydroxy group to be a hydroxy group (silanol group) bonded to a silicon atom, a hydroxy group (aluminol group) bonded to an aluminum atom, a hydroxy group (zirconol group) bonded to a zirconium atom, or a hydroxy group (titanol group) bonded to a titanium atom, and from the viewpoint of a low dielectric constant, the hydroxy group bonded to a silicon atom is more preferable. It is preferable for the covering layer (DC) to be the silica covering layer (DC-1) since the silica covering layer (DC-1) has on its surface a hydroxy group bonded to a silicon atom. Since silica has a low dielectric constant, even when the content of the covering layer (DC) of the black organic pigment (D1a-1) is large, an increase in the dielectric constant of the pixel dividing layer can be suppressed.

The silica covering layer (DC-1), the metal oxide covering layer (DC-2), and the metal hydroxide covering layer (DC-3) in the covering layer (DC) can be analyzed by, for example, an X-ray diffraction method. As an X-ray diffraction apparatus, a powder X-ray diffraction apparatus (manufactured by Mac Science Co., Ltd.) may be used, for example. The mass of silicon atoms or metal atoms incorporated in the silica covering layer (DC-1), the metal oxide covering layer (DC-2), and the metal hydroxide covering layer (DC-3) is rounded off to one decimal place. The mass of the pigment particles excluding the covering layer (DC) incorporated in the black organic pigment (D1a-1) having the covering layer (DC) can be obtained by the following method, for example. The pigment whose mass has been measured is put into a mortar and ground with a pestle to remove the covering layer (DC), and then the pigment is immersed in an amide-based solvent such as N,N-dimethylformamide to dissolve only the pigment particles and remove them by filtration. This operation is repeated until the filter product completely disappears the blackness, and then the mass of the filter product is measured to calculate the mass of the pigment particles from a difference between the mass of the filter product and the mass of the pigment.

The metal oxide or metal hydroxide incorporated in the metal oxide covering layer (DC-2) or the metal hydroxide covering layer (DC-3) is preferably one having chemical durability such as alkali resistance, heat resistance and light resistance, Vickers hardness capable of withstanding mechanical energy input optimized appropriately in the dispersing step, and physical durability such as abrasion resistance. Examples of metal oxide and metal hydroxide include alumina, zirconia, zinc oxide, titanium oxide, and iron oxide. Alumina or zirconia is preferable from the viewpoints of insulating properties, UV transmittance and near infrared transmittance, and alumina is more preferable from the viewpoint of dispersibility in an alkali-soluble resin and a solvent. The metal oxide and the metal hydroxide may be surface-modified with a group containing an organic group.

As silica, metal oxide or metal hydroxide incorporated in the silica covering layer (DC-1), the metal oxide covering layer (DC-2), or the metal hydroxide covering layer (DC-3), crystal water may be incorporated. Due to the incorporation of crystal water, depending on a dispersion medium in the pigment dispersion liquid or the negative-type photosensitive resin composition, it is possible to suppress a pigment sediment in a hard cake form which is generated with passage of time after dispersion by wet media dispersion. In the process of forming the pixel dividing layer using the negative-type photosensitive resin composition according to the present invention, part or all of the crystal water may be removed by heating.

The silica covering layer (DC-1), the metal oxide covering layer (DC-2), and the metal hydroxide covering layer (DC-3) may be in a form in which one or more selected from the group consisting of silicon atoms, oxides of a single metal atom, and hydroxides of a single metal atom are deposited on the pigment particle surface. Furthermore, they may be in the form in which a composite oxide in which silicon atoms and one or more types of metal atoms, or one or more types of metal atoms are chemically bonded via oxygen atoms are deposited on the pigment particle surface. Examples of the composite oxide include silica-alumina composite oxide, silica-zirconia composite oxide, silica-alumina-zirconia composite oxide, and alumina-zirconia composite oxide. The incorporation of the composite oxide in the covering layer (DC) can enhance the bonding force between two or more different kinds of covering materials and suppress peeling of the covering layer (DC).

When the covering layer (DC) contains the silica covering layer (DC-1), due to surface irregularities of the silica covering layer (DC-1), as the covering amount increases, or as the pigment concentration in the pixel dividing layer increases, pattern linearity may be deteriorated. On the other hand, the formation of an alumina covering layer as the metal oxide covering layer (DC-2) on the surface of the silica covering layer (DC-1) can suppress deterioration of pattern linearity. Alumina is effective in improving dispersibility in an aqueous pigment suspension even in a pigment particle size regulating step performed after the pigment surface treatment step, so that a secondary aggregated particle diameter can be adjusted to a desired range, and furthermore productivity and quality stability can be improved. For the metal oxide covering layer (DC-2) incorporated in the covering layer (DC), the covering amount of the alumina covering layer is preferably 10 parts by mass or more and more preferably 20 parts by mass or more, relative to the total quantity of silica incorporated in the silica covering layer (DC-1), which accounts for 100 parts by mass.

When the covering layer (DC) contains the silica covering layer (DC-1), silica preferably accounts for 1 part by mass or more, more preferably 2 parts by mass or more, and still more preferably 5 parts by mass or more, relative to the total quantity of the particles of the pigment, which accounts for 100 parts by mass. When the content is 1 part by mass or more, the coverage of the particle surface of the pigment can be increased, and the generation of development residues caused by the pigment can be suppressed. On the other hand, silica preferably accounts for 20 parts by mass or less, and more preferably 10 parts by mass or less. When the content is 20 parts by mass or less, the pattern linearity of the pixel dividing layer can be improved. The content of silica includes a case where it does not become a single component inside the covering layer (DC) and on the surface layer, and a case where a difference occurs in dehydration amount due to thermal history, and the content of silica is a value in terms of silicon dioxide equivalent, that is calculated from a silicon atom content, and is a value in terms of $SiO_2$ equivalent.

When the covering layer (DC) contains the metal oxide covering layer (DC-2) and/or the metal hydroxide covering layer (DC-3), the total content of metal oxide and metal hydroxide is preferably 0.1 parts by mass or more and more preferably 0.5 parts by mass or more, relative to the total quantity of the particles of the pigment, which accounts for 100 parts by mass. When the total content is 0.1 parts by mass or more, dispersibility and pattern linearity can be improved. When the covering layer (DC) does not contain the silica covering layer (DC-1), the total content of metal oxide and metal hydroxide is preferably 2 parts by mass or more and more preferably 5.0 parts by mass or more. On the other hand, the total content of metal oxide and metal hydroxide is preferably 15 parts by mass or less and more preferably 10 parts by mass or less. When the total content is set to 15.0 parts by mass or less, in the negative-type photosensitive composition according to the present invention designed to have a viscosity of 15 mPa·s or less, it is possible to suppress the occurrence of a concentration gradient of the pigment and to improve storage stability of a coating liquid. The content of metal oxide and metal hydroxide is a value in terms of metal oxide and metal hydroxide equivalent calculated from the metal atom content as well as the silica content. That is, in the case of alumina, zirconia and titanium oxide, the contents are respectively a value in terms of $Al_2O_3$ equivalent, a value in terms of $ZrO_2$ equivalent and a value in terms of $TiO_2$ equivalent. The total content of metal oxide and metal hydroxide is the content when either the metal oxide or the metal hydroxide is incorporated, and is the total amount when both the metal oxide and the metal hydroxide are incorporated.

As the covering layer (DC), hydroxyl on the surface of silica, metal oxide or metal hydroxide incorporated in the silica covering layer (DC-1), the metal oxide covering layer (DC-2), or the metal hydroxide covering layer (DC-3) is used as a reaction point, and the covering layer (DC) may be surface-modified with an organic group by using a silane coupling agent. It is preferable for the organic group to be an ethylenically unsaturated double bond group. The surface modification with a silane coupling agent having an ethylenically unsaturated double bond group can impart radical polymerizability to the black organic pigment (D1a-1), so that bonding force at an interface between the pigment and the resin can be increased by photo-curing during UV light exposure. Thus, even when the exposure amount is small during UV light exposure or even when shower pressure at which an alkali developer and/or a rinsing liquid is discharged during alkali development is strong, it is possible to suppress peeling of the film of the cured portion and to suppress generation of development residues caused by the pigment of an unexposed part.

Examples of the silane coupling agent that contains an ethylenically unsaturated double bond group include trifunctional organosilanes such as vinyl trimethoxysilane, vinyl triethoxysilane, 3-methacryloxypropyl trimethoxysilane, 3-methacryloxypropyl triethoxysilane, 3-acryloxypropyl trimethoxysilane, 3-acryloxypropyl triethoxysilane, and 4-styryl trimethoxysilane; and difunctional organosilanes such as 3-methacryloxypropylmethyl dimethoxysilane, 3-methacryloxypropylmethyl diethoxysilane, 3-acryloxypropylmethyl diethoxysilane, 3-acryloxypropyl methyldiethoxysilane, methylvinyl dimethoxysilane and divinyl diethoxysilane.

Depending on a dispersion medium, if necessary, surface modification is performed using a silane coupling agent that has no ethylenically unsaturated double bond group, such as methyl trimethoxysilane, methyl triethoxysilane, methyl trichlorosilane, methyl triacetoxysilane, phenyltrimethoxysilane, dimethyldimethoxysilane, diphenyldimethoxysilane, 4-hydroxyphenyl trimethoxysilane, 3-aminopropyl trimethoxysilane, or 3-trimethoxysilylpropyl succinic acid anhydride, so that the surface conditions of the pigment particles may be modified, and dispersibility may be controlled.

For the black organic pigment (D1a-1) that has the covering layer (DC), the outermost layer may be subjected to a surface treatment with an organic surface treatment agent. When the outermost layer is subjected to the surface treatment, wettability to a resin or a solvent can be improved. Examples of the organic surface treatment agent include trimethylol ethane, trimethylol propane, triethanol amine and derivatives thereof.

Examples of a method of forming the covering layer (DC) on the particle surface of the pigment include (1) a method of forming a covering layer of silica, metal oxide and/or metal hydroxide by a precipitation method using alkali metal salt as a silicon source and/or a metal element source, (2) a method of forming a covering layer of metal oxide and/or metal hydroxide by a hydrolysis method using a soluble metal compound as a metal element source, (3) a method of forming a covering layer of silica, metal oxide and/or metal hydroxide by a sol-gel method using tetrafunctional silane and/or metal alkoxide as a silicon source and/or metal element source, and (4) a method of forming a covering layer of silica by a polysilazane method using perhydropolysilazane as a silicon source. A precipitation method or a hydrolysis method is preferable from the viewpoint of easy control of reaction and high productivity.

As the covering layer (DC), a resin covering layer formed by covering treatment with a resin may be further incorporated. The incorporation of the resin covering layer serves to coat the particle surface with a low-conductivity resin having insulation properties that can modify the surface conditions of the particles, thereby serving to produce a cured film with an improved light blocking capability and insulation properties. This also serves to reduce the leak current to ensure the production of display devices with an improved reliability. Examples of the resin used for the covering treatment with the resin include polyamide, polyamide-imide, epoxy resin, novolac resin, phenol resin, urea resin, melamine resin, polyurethane, diallylphthalate resin, alkylbenzene resin, polystyrene, polycarbonate, polybutylene terephthalate, and modified polyphenylene oxide.

<Dye (D2)>

For the negative-type photosensitive resin composition according to the present invention, the coloring agent (D) preferably contains a dye (D2). As an embodiment relating to the incorporation of the dye (D2) in the coloring agent (D), it is preferable that a dye (D2) is contained as the black coloring agent (Da) and/or the non-black coloring agent (Db).

The dye (D2) is a compound that works to color a material as a result of a substituent group such as an ionic group and hydroxyl group in the dye (D2) being chemically adsorbed on or strongly interacting with the surface structure of the material, and it is soluble in most solvents etc. The coloring by the dye (D2) is achieved as a result of the adsorption of individual molecules on the material, leading to a high coloring power and a high color development efficiency.

The incorporation of the dye (D2) ensures coloring in a color with high coloring power and allows the film of the resin composition to have an improved coloring capability and toning capability.

Examples of the dye (D2) include direct dye, reactive dye, sulfur dye, vat dye, acidic dye, metallized dye, metallized acidic dye, basic dye, mordant dye, acidic mordant dye, disperse dye, cation dye, or fluorescent whitening dye. Here, the disperse dye is a dye which is insoluble or poorly soluble in water and does not have an anionic ionizable group such as a sulfonic acid group or a carboxy group.

Examples of the dye (D2) include anthraquinone based dye, azo based dye, azine based dye, phthalocyanine based dye, methine based dye, oxazine based dye, quinoline based dye, indigo based dye, indigoid based dye, carbonium based dye, threne based dye, perinone based dye, perylene based dye, triaryl methane based dye, and xanthene based dye. From the viewpoint of the solubility in the solvents described later and heat resistance, preferable are anthraquinone based dye, azo based dye, azine based dye, methine based dye, triaryl methane based dye, and xanthene based dye.

For the negative-type photosensitive resin composition according to the present invention, it is preferable for the dye (D2) to contain one or more selected from the group consisting of the black dye (D2a-1), the mixture of two or more dyes (D2a-2), and the non-black dye (D2b) that will be described later.

Furthermore, it is preferable for the dye (D2) to account for 0.01 mass % or more, more preferably 0.05 mass % or more, and still more preferably 0.1 mass % or more, of the total solid content, excluding the solvent, of the negative-type photosensitive resin composition according to the present invention. When the content is 0.01 mass % or more, it is possible to improve coloring capability or toning capability. On the other hand, the content of the dye (D2) is preferably 50 mass % or less, more preferably 45 mass % or less, and still more preferably 40 mass % or less. A content of 50 mass % or less ensures the production of a cured film having an improved heat resistance.

<Black Dye (D2a-1), Mixture of Two or More Dyes (D2a-2), and Non-Black Dye (D2b)>

For the negative-type photosensitive resin composition according to the present invention, it is preferable for the dye (D2) to contain one or more selected from the group consisting of the black dye (D2a-1), the mixture of two or more dyes (D2a-2), and the non-black dye (D2b).

The black dye (D2a-1) is a dye that acts to color a material black by absorbing light in a visible light wavelength range.

The incorporation of the black dye (D2a-1) ensures the production of a black film of the resin composition and, since it is also high in coloring capability, the film of the resin composition will have an improved light blocking capability.

Useful examples of the black dye (D2a-1) include generally known ones such as Solvent Black 3, 5, 7, 22, 27, 29, and 34, Mordant Black 1, 11, and 17, Acid Black 2 and 52, and Direct Black 19 and 154 (each figure shows a C. I. number).

The mixture of two or more dyes (D2a-2) is a combination of two or more dyes selected from dyes of white, red, orange, yellow, green, blue, and violet to work as a dye mixture for coloring in pseudo-black.

The incorporation of the mixture of two or more dyes (D2a-2) ensures the production of a black film of the resin composition and, since it is also high in coloring capability, the film of the resin composition will have an improved light blocking capability. Being a mixture of two or more dyes, furthermore, it can work to permit transmission or blocking of light in an intended specific wavelength range and therefore, its toning capability can be improved by varying the transmission spectrum or absorption spectrum of the film of the resin composition.

Examples of dyes serving for coloring in red include generally known ones such as Direct Red 2, 23, 62, 111, 207, and 247, Acid Red 35, 80, 111, 143, 211, and 397, Reactive Red 3, 21, 35, 40, and 55, and Basic Red 12, 22, 35, 45, and 46 (each figure shows a C. I. number).

Examples of dyes serving for coloring in orange include Basic Orange 21 and 23 (each figure shows a C. I. number).

Examples of dyes serving for coloring in yellow include generally known ones such as Direct Yellow 8, 27, 87, 100, 130, and 163, Acid Yellow 17, 40, 76, 110, 222, and 227, Reactive Yellow 2, 13, 23, 35, and 42, and Basic Yellow 1, 11, 21, 32, and 40 (each figure shows a C. I. number).

Examples of dyes serving for coloring in green include generally known ones such as Acid Green 16 (each figure shows a C. I. number).

Examples of dyes serving for coloring in blue include generally known ones such as Acid Blue 9, 45, 80, 83, 90, and 185 (each figure shows a C. I. number).

Examples of dyes serving for coloring in violet include generally known ones such as Direct Violet 7, 47, 66, 90, and 101, Acid Violet 5, 11, 34, 75, and 126, Reactive Violet 1, 16, 22, 27, and 34, and Basic Violet 1, 10, 20, 35, and 48 (each figure shows a C. I. number).

The non-black dye (D2b) is a dye that serves for coloring in a non-black color such as white, red, orange, yellow, green, blue, and violet by absorbing light in a visible light wavelength range.

The incorporation of a non-black dye (D2b) serves to provide a colored film of a resin composition and impart coloring capability or toning capability. The use of a combination of two or more non-black dyes (D2b) serves to provide a film of a resin composition having intended color coordinates to ensure an improved toning capability.

The non-black dye (D2b) is a dye that serves for coloring in a non-black color such as white, red, orange, yellow, green, blue, and violet as described above.

A cured film prepared by curing the negative-type photosensitive resin composition according to the present invention preferably has an optical density of 0.3 or more, more preferably 0.5 or more, still more preferably 0.7 or more, and particularly preferably 1.0 or more, per micrometer of film thickness. If the optical density per micrometer of film thickness is 0.3 or more, the resulting cured film will serve to improve the light blocking capability, thereby preventing the electrode wiring from becoming visible and reducing the external light reflection to ensure an improved contrast in image displaying in display devices such as organic EL display devices and liquid crystal display devices. Thus, such a film can be used suitably in such components as light blocking films for black matrices of color filters, black column spacers of liquid crystal display devices, etc., pixel dividing layers and TFT planarization layers of organic EL display devices, that require increased contrast realized by depression of external light reflection. On the other hand, the optical density is preferably 5.0 or less, more preferably 4.0 or less, and still more preferably 3.0 or less, per micrometer of film thickness. If the optical density per micrometer of film thickness is 5.0 or less, it ensures an improved sensitivity during light exposure and the formation of a cured film having a small-tapered pattern shape. The optical density per micrometer of film thickness of a cured film can be controlled by varying the components and their contents of the coloring agent (D) described above.

<Dispersant (E)>

The negative-type photosensitive resin composition according to the present invention preferably further contains a dispersant (E).

The dispersant (E) is a compound that has a surface affinity group to interact with the surface of disperse dye or the like as the aforementioned pigment (D1) and/or dye (D2) and a dispersion stabilization structure to improve the dispersion stability of the disperse dye as the pigment (D1) and/or the dye (D2). Such dispersion stabilization structures of the dispersant (E) include polymer chains and/or substituent groups with electrostatic charges.

If the resin composition contains a disperse dye as the pigment (D1) and/or the dye (D2), the incorporation of the dispersant (E) serves to improve its dispersion stability to ensure an improved resolution after development. In particular, if for example the pigment (D1) is in the form of particles crushed to a number average particle diameter of 1 µm or less, the surface area of the particles of the pigment (D1) will increase and the particles of the pigment (D1) will undergo aggregation easily. On the other hand, if the pigment (D1) is contained, the surface of the crushed pigment (D1) will interact with the surface affinity group in the dispersant (E), and the dispersion stabilization structure of the dispersant (E) will give rise to steric hindrance and/or electrostatic repulsion, which can work to impede the aggregation of the particles of the pigment (D1) to ensure an improved dispersion stability.

Examples of the dispersant (E) having a surface affinity group include a dispersant (E) having only an amine value, a dispersant (E) having both an amine value and an acid value, a dispersant (E) having only an acid value, and a dispersant (E) having neither an amine value nor an acid value. From the viewpoint of improving the dispersion stability of the particles of the pigment (D1), it is preferable to adopt a dispersant (E) having only an amine value or a dispersant (E) having both an amine value and an acid value.

It is preferable for the dispersant (E) having a surface affinity group to have a structure in which the amino group and/or the acidic group working as surface affinity groups form a salt with an acid and/or a base.

Examples of the dispersant (E) having only an amine value include DISPERBYK (registered trademark) -108, -109, -160, -161, -162, -163, -164, -166, -167, -168, -182, -184, -185, -2000, -2008, -2009, -2022, -2050, -2055, -2150, -2155, -2163, -2164, and -2061; BYK (registered trademark) -9075, -9077, -LP-N6919, -LP-N21116, and -LP-N21324 (all manufactured by BYK-Chemie Japan); EFKA (registered trademark) 4015, 4020, 4046, 4047, 4050, 4055, 4060, 4080, 4300, 4330, 4340, 4400, 4401, 4402, 4403, and 4800 (all manufactured by BASF); Ajisper (registered trademark) PB711 (manufactured by Ajinomoto Fine-Techno Co., Inc.);

and SOLSPERSE (registered trademark) 13240, 13940, 20000, 71000, and 76500 (all manufactured by Lubrizol).

Examples of the dispersant (E) having both an amine value and an acid value include ANTI-TERRA (registered trademark) -U100 and -204; DISPERBYK (registered trademark) -106, -140, -142, -145, -180, -2001, -2013, -2020, -2025, -187, and -191; BYK (registered trademark) -9076 (manufactured by BYK-Chemie Japan); Ajisper (registered trademark) PB821, PB880, and PB881 (all manufactured by Ajinomoto Fine-Techno Co., Inc.); and SOLSPERSE (registered trademark) 9000, 11200, 13650, 24000, 32000, 32500, 32500, 32600, 33000, 34750, 35100, 35200, 37500, 39000, 56000, and 76500 (all manufactured by Lubrizol).

Examples of the dispersant (E) having only an acid value include DISPERBYK (registered trademark) -102, -110, -111, -118, -170, -171, -174, -2060, and -2096; BYK (registered trademark) -P104, -P105, and -220S (all manufactured by BYK-Chemie Japan); and SOLSPERSE (registered trademark) 3000, 16000, 17000, 18000, 21000, 26000, 28000, 36000, 36600, 38500, 41000, 41090, 53095, and 55000 (all manufactured by Lubrizol).

Examples of the dispersant (E) having neither an amine value nor an acid value include DISPERBYK (registered trademark) -103, -2152, -2200, and -192 (all manufactured by BYK-Chemie Japan); and SOLSPERSE (registered trademark) 27000, 54000, and X300 (all manufactured by Lubrizol).

The amine value of a dispersant (E) is preferably 5 mgKOH/g or more, more preferably 8 mgKOH/g or more, and still more preferably 10 mgKOH/g or more. An amine value of 5 mgKOH/g or more ensures an improved dispersion stability of the pigment (D1). On the other hand, the amine value is preferably 150 mgKOH/g or less, more preferably 120 mgKOH/g or less, and still more preferably 100 mgKOH/g or less. An amine value of 150 mgKOH/g or less ensures an improved storage stability of the resin composition.

The amine value referred to herein is the weight of the equivalent amount of potassium hydroxide to an acid that reacts with 1 g of the dispersant (E) and it is expressed in mgKOH/g. It can be determined by neutralizing 1 g of the dispersant (E) with an acid, followed by titration with an aqueous potassium hydroxide solution. From the amine value, the amine equivalent (in g/mol), which represents the weight of resin per mol of amino group, can be calculated and then the number of amino groups in the dispersant (E) can be determined, The acid value of a dispersant (E) is preferably 5 mgKOH/g or more, more preferably 8 mgKOH/g or more, and still more preferably 10 mgKOH/g or more. An acid value of 5 mgKOH/g or more ensures an improved dispersion stability of the pigment (D1). On the other hand, the acid value is preferably 200 mgKOH/g or less, more preferably 170 mgKOH/g or less, and still more preferably 150 mgKOH/g or less. An acid value of 200 mgKOH/g or less ensures an improved storage stability of the resin composition.

The acid value referred to herein is the weight of potassium hydroxide that reacts with 1 g of the dispersant (E) and expressed in mgKOH/g. It can be determined by titrating 1 g of the dispersant (E) with an aqueous potassium hydroxide solution. From the acid value, the acid equivalent (in g/mol), which represents the weight of resin per mol of acid group, can be calculated and then the number of acid groups in the dispersant (E) can be determined, Examples of a dispersant (E) having a polymer chain include acrylic resin based dispersants, polyoxyalkylene ether based dispersants, polyester based dispersants, polyurethane based dispersants, polyol based dispersants, polyethylene imine based dispersants, and polyallyl amine based dispersants. From the viewpoint of pattern processability in an alkaline developer, acrylic resin based dispersants, polyoxyalkylene ether based dispersants, polyester based dispersants, polyurethane based dispersants, and polyol based dispersants are preferable.

If the negative-type photosensitive resin composition according to the present invention contains a disperse dye as the pigment (D1) and/or the dye (D2), it is preferable for the dispersant (E) to account for 1 mass % or more, more preferably 5 mass % or more, and still more preferably 10 mass % or more, of the total quantity of the pigment (D1) and/or the disperse dye and the dispersant (E), which accounts for 100 mass %, in the negative-type photosensitive resin composition according to the present invention. A content 1 mass % or more ensures an improved dispersion stability of the pigment (D1) and/or disperse dye and an improved resolution after development. On the other hand, the content of the dispersant (E) is preferably 60 mass % or less, more preferably 55 mass % or less, and still more preferably 50 mass % or less. A content of 60 mass % or less ensures the production of a cured film having an improved heat resistance.

<Sensitizer>

The negative-type photosensitive resin composition according to the present invention preferably further contains a sensitizer.

The sensitizer is a compound that absorbs energy obtained from light exposure, generates excited triplet electrons through internal conversion and intersystem crossing, and acts for energy transfer to the aforementioned photo-initiator (C1) or the like.

The incorporation of the sensitizer serves to improve the sensitivity during light exposure. Regarding the mechanism, it is inferred as follows: the sensitizer absorbs long-wavelength light that is not absorbed by the photo-initiator (C1) or the like and its energy is transferred from the sensitizer to the photo-initiator (C1) or the like, leading to an improved efficiency of photo-reaction.

The sensitizer is preferably a thioxanthone based one. Examples of the thioxanthone based sensitizer include thioxanthone, 2-methyl thioxanthone, 2-chlorothioxanthone, 2-isopropyl thioxanthone, 2,4-dimethyl thioxanthone, 2,4-diethyl thioxanthone, and 2,4-dichlorothioxanthone.

In the negative-type photosensitive resin composition according to the present invention, the sensitizer preferably accounts for 0.01 parts by mass or more, more preferably 0.1 parts by mass or more, still more preferably 0.5 parts by mass or more, and particularly preferably 1 part by mass or more, relative to the total quantity of the alkali-soluble resin (A) and the radical-polymerizable compound (B), which accounts for 100 parts by mass. A content of 0.01 parts by mass or more ensures improved sensitivity during light exposure. On the other hand, the content of the sensitizer is preferably 15 parts by mass or less, more preferably 13 parts by mass or less, still more preferably 10 parts by mass or less, and particularly preferably 8 parts by mass or less. A content of 15 parts by mass or less ensures an improved resolution after development and the formation of a cured film having a small-tapered pattern shape.

<Chain Transfer Agent>

The negative-type photosensitive resin composition according to the present invention preferably further contains a chain transfer agent.

The chain transfer agent is a compound that receives radicals from growing polymer chain ends of polymer chains resulting from radical polymerization during light exposure and transfers the radicals to other polymer chains.

The incorporation of the chain transfer agent serves to improve the sensitivity during light exposure. Regarding the mechanism, it is inferred that radical crosslinking progresses deeply into the film as the radicals generated by light exposure are transferred to other polymer chains by the chain transfer agent. In particular, if for example the resin composition contains a black coloring agent (Da) as the aforementioned coloring agent (D), the light applied for exposure may be absorbed significantly by the black coloring agent (Da), possibly preventing the light from reaching deep portions of the film. On the other hand, if a chain transfer agent is contained, radicals will be transferred by the chain transfer agent to allow radical crosslinking to reach deep portions of the film, thereby ensuring an improved sensitivity during light exposure.

Furthermore, the inclusion of a chain transfer agent makes it possible to form a cured film having a pattern shape with a small taper. Regarding the mechanism, it is inferred that the transfer of radicals caused by the chain transfer agent serves to control the molecular weight of the polymer chains resulting from the radical polymerization during light exposure. If a chain transfer agent is contained, therefore, it prevents significantly high-molecular weight polymer chains from being produced by excessive radical polymerization during light exposure, thereby resulting in a film having an appropriately depressed softening point. It is considered that this serves to improve the reflow property of the pattern during heat curing, leading to the formation of a pattern shape with a small taper.

The chain transfer agent is preferably a thiol based chain transfer agent. Examples of the thiol based chain transfer agent include β-mercaptopropionic acid, methyl β-mercaptopropionate, 2-ethylhexyl β-mercaptopropionate, stearyl β-mercaptopropionate, β-mercaptobutanoic acid, methyl thioglycolate, 1,4-bis(3-mercaptobutanoyloxy)butane, ethylene glycol bis(thioglycolate), trimethylol ethane tris-(3-mercaptopropionate), trimethylol ethane tris-(3-mercaptobutyrate), trimethylolpropane tris-(3-mercaptopropionate), trimethylolpropane tris-(3-mercaptobutyrate), trimethylolpropane tris-(thioglycolate), 1,3,5-tris-[(3-mercaptopropionyloxy)ethyl] isocyanuric acid, 1,3,5-tris-[(3-mercaptobutanoyloxy) ethyl] isocyanuric acid, pentaerythritol tetrakis (3-mercaptopropionate), pentaerythritol tetrakis(3-mercaptobutyrate), pentaerythritol tetrakis(thioglycolate), dipentaerythritol hexakis(3-mercaptopropionate), and dipentaerythritol hexakis(3-mercaptobutyrate). From the viewpoint of improving the sensitivity during light exposure and forming a small-tapered pattern shape, preferable are trimethylol ethane tris-(3-mercaptopropionate), trimethylol ethane tris-(3-mercaptobutyrate), trimethylolpropane tris-(3-mercaptopropionate), trimethylolpropane tris-(3-mercaptobutyrate), 1,3,5-tris-[(3-mercaptopropionyloxy)ethyl] isocyanuric acid, 1,3,5-tris-[(3-mercaptobutanoyloxy)ethyl] isocyanuric acid, pentaerythritol tetrakis(3-mercaptopropionate), pentaerythritol tetrakis(3-mercaptobutyrate), dipentaerythritol hexakis(3-mercaptopropionate), and dipentaerythritol hexakis(3-mercaptobutyrate).

In the negative-type photosensitive resin composition according to the present invention, the chain transfer agent preferably accounts for 0.01 parts by mass or more, more preferably 0.1 parts by mass or more, still more preferably 0.5 parts by mass or more, and particularly preferably 1 part by mass or more, relative to the total quantity of the alkali-soluble resin (A) and the radical-polymerizable compound (B), which accounts for 100 parts by mass. A content of 0.01 parts by mass or more ensures an improved sensitivity during exposure and the formation of a pattern shape with a small taper. On the other hand, the content of the chain transfer agent is preferably 15 parts by mass or less, more preferably 13 parts by mass or less, still more preferably 10 parts by mass or less, and particularly preferably 8 parts by mass or less. A content of 15 parts by mass or less ensures an improved resolution after development and the production of a cured film with an improved heat resistance.

<Polymerization Terminator>

The negative-type photosensitive resin composition according to the present invention preferably further contains a polymerization terminator.

A polymerization terminator is a compound that can work to terminate radical polymerization by capturing radicals generated during light exposure or radicals located at growing polymer chain ends of polymer chains formed by the radical polymerization during light exposure and holding the radicals in a stable state.

The inclusion of a polymerization terminator in an appropriate quantity serves to reduce the quantity of residue left after development to ensure an improved resolution after development. Regarding the mechanism, it is inferred that the excess radicals generated during light exposure or the excess radicals located at growing chain ends of high-molecular weight polymers are captured by the polymerization terminator to arrest excessive progress of the radical polymerization.

The polymerization terminator is preferably a phenolic polymerization terminator. Examples of the phenolic polymerization terminator include 4-methoxyphenol, 1,4-hydroquinone, 1,4-benzoquinone, 2-t-butyl-4-methoxyphenol, 3-t-butyl-4-methoxyphenol, 4-t-butyl catechol, 2,6-di-t-butyl-4-methyl phenol, 2,5-di-t-butyl-1,4-hydroquinone, 2,5-di-t-amyl-1,4-hydroquinone, and "IRGANOX" (registered trademark) 1010, 1035, 1076, 1098, 1135, 1330, 1726, 1425, 1520, 245, 259, 3114, 565, and 295 (all manufactured by BASF).

In the negative-type photosensitive resin composition according to the present invention, the polymerization terminator preferably accounts for 0.01 parts by mass or more, more preferably 0.03 parts by mass or more, still more preferably 0.05 parts by mass or more, and particularly preferably 0.1 parts by mass or more, relative to the total quantity of the alkali-soluble resin (A) and the radical-polymerizable compound (B), which accounts for 100 parts by mass. A content of 0.01 parts by mass or more ensures an improved resolution after development and the production of a cured film with an improved heat resistance. Furthermore, the content of the polymerization terminator is preferably 10 parts by mass or less, more preferably 8 parts by mass or less, still more preferably 5 parts by mass or less, and particularly preferably 3 parts by mass or less. A content of 10 parts by mass or less ensures improved sensitivity during light exposure.

<Crosslinking Agent>

The negative-type photosensitive resin composition according to the present invention preferably further contains a crosslinking agent.

The crosslinking agent is a compound that has a crosslinkable group to form a bond with resin.

The incorporation of the crosslinking agent ensures the production of a cured film with an improved hardness and chemical resistance. Regarding the mechanism, it is inferred that the crosslinking agent serves to introduce new crosslinked structures in the cured film of the resin composition to improve the crosslink density.

The crosslinking agent is preferably a compound that has, in its molecule, two or more thermally crosslinking groups such as alkoxymethyl group, methylol group, epoxy group, and oxetanyl group.

Examples of a compound having two or more of alkoxy methyl groups and methylol groups in the molecule include DML-PC, DML-PEP, DML-OC, DML-OEP, DML-34X, DML-PTBP, DML-PCHP, DML-OCHP, DML-PFP, DML-PSBP, DML-POP, DML-MBOC, DML-MBPC, DML-MTrisPC, DML-BisOC-Z, DML-BisOCHP-Z, DML-BPC, DML-BisOC-P, DMOM-PC, DMOM-PTBP, DMOM-MBPC, TriML-P, TriML-35XL, TML-HQ, TML-BP, TML-pp-BPF, TML-BPE, TML-BPA, TML-BPAF, TML-BPAP, TMOM-BP, TMOM-BPE, TMOM-BPA, TMOM-BPAF, TMOM-BPAP, HML-TPPHBA, HML-TPHAP, HMOM-TPPHBA, and HMOM-TPHAP (all manufactured by Honshu Chemical Industry Co., Ltd.); and NIKALAC (registered trademark) MX-290, MX-280, MX-270, MX-279, MW-100LM, MW-30HM, MW-390, and MX-750LM (all manufactured by Sanwa Chemical Co., Ltd.).

Examples of a compound having two or more epoxy groups in the molecule include Epolite (registered trademark) 40E, 100E, 200E, 400E, 70P, 200P, 400P, 1500NP, 80MF, 4000, and 3002 (all manufactured by Kyoeisha Chemical Co., Ltd.), Denacol (registered trademark) EX-212L, EX-214L, EX-216L, EX-321L, and EX-850L (all manufactured by Nagase ChemteX Corporation), jER (registered trademark) 828, 1002, 1750, 1007, YX8100-BH30, E1256, E4250, and E4275 (all manufactured by Mitsubishi Chemical Corporation), GAN, GOT, EPPN-502H, NC-3000, and NC-6000 (all manufactured by Nippon Kayaku Co., Ltd.), EPICLON (registered trademark) EXA-9583, HP4032, N695, and HP7200 (all manufactured by DIC Corporation), TECHMORE (registered trademark) VG-3101L (manufactured by Printec, Inc.), TEPIC (registered trademark) S, G, and P (all manufactured by Nissan Chemical Industries, Ltd.), and Epotohto (registered trademark) YH-434L (manufactured by Tohto Kasei Co., Ltd.).

Examples of a compound having two or more oxetanyl groups in the molecule include ETERNACOLL (registered trademark) EHO, OXBP, OXTP, and OXMA (all manufactured by Ube Industries, Ltd.), and oxetanized phenol novolacs.

In the negative-type photosensitive resin composition according to the present invention, the crosslinking agent preferably accounts for 0.1 parts by mass or more, more preferably 0.5 parts by mass or more, and still more preferably 1 part by mass or more, relative to the total quantity of the alkali-soluble resin (A) and the radical-polymerizable compound (B), which accounts for 100 parts by mass. A content of 0.1 parts by mass or more ensures the production of a cured film having an improved hardness and chemical resistance. On the other hand, the content of the crosslinking agent is preferably 70 parts by mass or less, more preferably 60 parts by mass or less, and still more preferably 50 parts by mass or less. A content of 70 parts by mass or less ensures the production of a cured film having an improved hardness and chemical resistance.

<Silane Coupling Agent>

The negative-type photosensitive resin composition according to the present invention preferably further contains a silane coupling agent.

The silane coupling agent is a compound that has a hydrolysable silyl group or silanol group.

The incorporation of a silane coupling agent serves to increase the interaction at the interface between the cured film of the resin composition and the underlying substrate, thereby ensuring an improved adhesion to the underlying substrate and the production of a cured film with an improved chemical resistance.

The silane coupling agent is preferably a trifunctional organosilane, a tetrafunctional organosilane, or a silicate compound.

Examples of trifunctional organosilane include methyltrimethoxysilane, methyltriethoxysilane, methyltri-n-propoxysilane, ethyltrimethoxysilane, n-propyltrimethoxysilane, isopropyltrimethoxysilane, n-hexyltrimethoxysilane, n-decyltrimethoxysilane, cyclopentyltrimethoxysilane, cyclohexyltrimethoxysilane, vinyltrimethoxysilane, 3-methacryloxypropyltrimethoxysilane, 3-acryloxy propyl trimethoxysilane, phenyltrimethoxysilane, 4-tolyltrimethoxysilane, 4-hydroxyphenyltrimethoxysilane, 4-methoxyphenyltrimethoxysilane, 1-naphthyltrimethoxysilane, 2-naphthyltrimethoxysilane, 4-styryltrimethoxysilane, 3-glycidoxypropyltrimethoxysilane, 2-(3,4-epoxycyclohexyl)ethyltrimethoxysilane, 3-trimethoxysilyipropyisuccinic acid, 3-trimethoxysilylpropionic acid, 3-trimethoxysilylpropyl succinic anhydride, trifluoromethyltrimethoxysilane, 3,3,3-trifluoropropyltrimethoxysilane, 3-[(3-ethyl-3-oxetanyl)methoxy]propyltrimethoxysilane, 3-aminopropyltrimethoxysilane, N-(2-aminoethyl)-3-aminopropyltrimethoxysilane, N-phenyl-3-aminopropyltrimethoxysilane, N-(vinylbenzyl)-2-aminoethyl-3-aminopropyltrimethoxysilane hydrochlorate salt, 3-(4-aminophenyl)propyltrimethoxysilane, 1-[4-(3-trimethoxysilylpropyl)phenyl]urea, 1-(3-trimethoxysilylpropyl)urea, 3-triethoxysilyl-N-(1,3-dimethylbutylidene)propyl amine, 3-mercaptopropyltrimethoxysilane, 3-isocyanate propyltriethoxysilane, 1,3,5-tris(3-trimethoxysilylpropyl)isocyanuric acid, N-t-butyl-2-(3-trimethoxysilylpropyl) succinimide, and N-t-butyl-2-(3-triethoxysilylpropyl) succinimide.

Examples of a tetrafunctional organosilane or silicate compound include organosilanes as represented by general formula (73).

[Chemical formula 31]

(73)

In general formula (73), $R^{226}$ to $R^{229}$ are each independently a hydrogen atom, an alkyl group, an acyl group, or an aryl group, and x is an integer of 1 to 15.

In general formula (73), it is preferable for $R^{226}$ to $R^{229}$ to be each independently a hydrogen atom, an alkyl group containing 1 to 6 carbon atoms, an acyl group containing 2 to 6 carbon atoms, or an aryl group containing 6 to 15 carbon atoms, more preferably a hydrogen atom, an alkyl group containing 1 to 4 carbon atoms, an acyl group containing 2 to 4 carbon atoms, or an aryl group containing 6 to 10 carbon atoms. The above alkyl group, acyl group, and aryl group may each be either a substitution product or a non-substitution product.

Examples of organosilanes as represented by general formula (73) include tetrafunctional organosilanes such as tetramethoxysilane, tetraethoxysilane, tetra-n-propoxysilane, tetraisopropoxysilane, tetra-n-butoxysilane, and tetraacetoxysilane; and silicate compounds such as Methyl Silicate 51 (manufactured by Fuso Chemical Co., Ltd.), M Silicate 51, Silicate 40, and Silicate 45 (all manufactured by Tama Chemicals Co., Ltd.), and Methyl Silicate 51, Methyl Silicate 53A, Ethyl Silicate 40, and Ethyl Silicate 48 (all manufactured by Colcoat Co., Ltd.).

In the negative-type photosensitive resin composition according to the present invention, the silane coupling agent preferably accounts for 0.01 parts by mass or more, more preferably 0.1 parts by mass or more, still more preferably 0.5 parts by mass or more, and particularly preferably 1 part by mass or more, relative to the total quantity of the alkali-soluble resin (A) and the radical-polymerizable compound (B), which accounts for 100 parts by mass. A content of 0.01 parts by mass or more ensures an improved adhesion to the underlying substrate and the production of a cured film with an improved chemical resistance. On the other hand, the content of the silane coupling agent is preferably 15 parts by mass or less, more preferably 13 parts by mass or less, still more preferably 10 parts by mass or less, and particularly preferably 8 parts by mass or less. A content of 15 parts by mass or less ensures an improved resolution after development.

<Surfactant>

The negative-type photosensitive resin composition according to the present invention may further contain a surfactant.

The surfactant is a compound that has a hydrophilic structure and a hydrophobic structure.

The incorporation of an appropriate quantity of a surfactant serves to allow the resin composition to have an appropriately controlled surface tension, thereby ensuring an improved leveling property during coating and an improved film thickness uniformity of the coating film.

The surfactant is preferably a fluorine resin based surfactant, silicone based surfactant, polyoxyalkylene ether based surfactant, or acrylic resin based surfactant.

Examples of the fluorine resin based surfactant include Megafac (registered trademark) F-142D, F-172, F-173, F-183, F-444, F-445, F-470, F-475, F-477, F-555, F-558, and F-559 (all manufactured by DIC Corporation), Eftop (registered trademark) EF301, EF303, and EF352 (all manufactured by Mitsubishi Materials Electronic Chemicals Co., Ltd.), Fluorad (registered trademark) FC-430 and FC-431 (both manufactured by Sumitomo 3M Limited), AsahiGuard (registered trademark) AG710 (manufactured by Asahi Glass Co., Ltd.), Surflon (registered trademark) S-382, SC-101, SC-102, SC-103, SC-104, SC-105, and SC-106 (all manufactured by AGC Seimi Chemical Co., Ltd.), BM-1000 and BM-1100 (both manufactured by Yusho Co., Ltd.), and Futargent (registered trademark) 710FM and 730LM (both manufactured by Neos Co., Ltd.).

Examples of the silicone based surfactant include SH28PA, SH7PA, SH21PA, SH30PA, and ST94PA (all manufactured by Dow Corning Toray Co., Ltd.) and BYK (registered trademark) -301, -306, -307, -331, -333, -337, and -345 (all manufactured by BYK-Chemie Japan).

Examples of the polyoxyalkylene ether based surfactant include Futargent (registered trademark) 212M, 209F, 208G, 240G, 212P, 220P, 228P, NBX-15, FTX-218, and DFX-218 (all manufactured by Neos Co., Ltd.).

Examples of the acrylic resin based surfactant include BYK (registered trademark) -350, -352, -354, -355, -356, -358N, -361N, -392, -394, and -399 (all manufactured by BYK-Chemie Japan).

In the negative-type photosensitive resin composition according to the present invention, the surfactant preferably accounts for 0.001 mass % or more, more preferably 0.005 mass % or more, and still more preferably 0.01 mass % or more, of the total quantity of the negative-type photosensitive resin composition. A content of 0.001 mass % or more ensures an improved leveling property during coating. On the other hand, the surfactant preferably accounts for 1 mass % or less, more preferably 0.5 mass % or less, and still more preferably 0.03 mass % or less. A content of 1 mass % or less ensures an improved leveling property during coating.

<Solvent>

The negative-type photosensitive resin composition according to the present invention preferably further contains a solvent.

The solvent is a compound that can dissolve the various resins and various additives added to the resin composition.

The incorporation of the solvent ensures uniform dissolution of the various resins and various additives added to the resin composition and the production of a cured film with an improved transmittance. Furthermore, it will be possible to control the viscosity of the resin composition appropriately, allowing a film with a desired film thickness to be formed on the substrate. In addition, it will be possible to appropriately control the surface tension of the resin composition or the drying speed during coating, thereby ensuring an improved leveling property during coating and an improved film thickness uniformity of the coated film.

From the viewpoint of the solubilities of the various resins and various additives, the solvent is preferably a compound having an alcoholic hydroxyl group, a compound having a carbonyl group, or a compound having three or more ether bonds. In addition, it is also preferable for the compound to have a boiling point of 110° C. to 250° C. under atmospheric pressure. A boiling point of 110° C. or more allows the solvent to volatilize moderately during coating to cause drying of the coating film, thereby preventing uneven coating and ensuring an improved film thickness uniformity. On the other hand, a boiling point of 250° C. or less serves to reduce the quantity of the solvent remaining in the coating film. Accordingly, the film shrinkage during heat curing can be reduced to ensure the production of a cured film with a higher flatness and an improved film thickness uniformity.

Examples of a compound having an alcoholic hydroxyl group and a boiling point of 110° C. to 250° C. under atmospheric pressure include hydroxyacetone, 4-hydroxy-2-butanone, 3-hydroxy-3-methyl-2-butanone, 4-hydroxy-3-methyl-2-butanone, 5-hydroxy-2-pentanone, 4-hydroxy-2-pentanone, 4-hydroxy-4-methyl-2-pentanone (also called diacetone alcohol), methyl lactate, ethyl lactate, n-propyl lactate, n-butyl lactate, methyl 2-hydroxy-2-methyl-propionate, methyl 2-hydroxy-3-methyl-butanoate, ethylene glycol monomethyl ether, ethylene glycol monoethyl ether, ethylene glycol mono-n-propyl ether, ethylene glycol mono-n-butyl ether, propylene glycol monomethyl ether, propylene glycol monoethyl ether, propylene glycol mono-n-propyl ether, propylene glycol mono-n-butyl ether, propylene glycol mono-t-butyl ether, diethylene glycol monomethyl ether, diethylene glycol monoethyl ether, diethylene glycol mono-n-propyl ether, dipropylene glycol monomethyl ether, dipropylene glycol monoethyl ether, dipropylene glycol mono-n-propyl ether, dipropylene glycol mono-n-butyl ether, tripropylene glycol monomethyl ether, 3-methoxy-1-butanol, 3-methoxy-3-methyl-1-butanol, 1,3-butanediol, 1,4-butanediol, tetrahydrofurfuryl alcohol, n-butanol, and n-pentanol. From the viewpoint of improving the leveling property during coating, preferable are diacetone alcohol, ethyl lactate, ethylene glycol monomethyl ether, propylene glycol monomethyl ether, diethylene glycol monomethyl ether, dipropylene glycol monomethyl ether, 3-methoxy-1-butanol, 3-methoxy-3-methyl-1-butanol, and tetrahydrofurfuryl alcohol.

Examples of a compound having an carbonyl group and a boiling point of 110° C. to 250° C. under atmospheric pressure include n-butyl acetate, isobutyl butyl acetate, methyl 3-methoxy-propionate, methyl 3-ethoxy-propionate, ethoxy ethyl acetate, 3-methoxy-n-butyl acetate, 3-methyl-3-methoxy-n-butyl acetate, 3-methyl-3-methoxy-n-butyl propionate, ethylene glycol monomethyl ether acetate, ethylene glycol monoethyl ether acetate, ethylene glycol monobutyl ether acetate, propylene glycol monomethyl ether acetate, propylene glycol monoethyl ether acetate, propylene glycol monobutyl ether acetate, diethylene glycol monomethyl ether acetate, diethylene glycol monoethyl ether acetate, diethylene glycol mono-n-butyl ether acetate, dipropylene glycol monomethyl ether acetate, dipropylene glycol monoethyl ether acetate, cyclohexanol acetate, propylene glycol diacetate, 1,3-butanediol diacetate, 1,4-butanediol diacetate, methyl n-butyl ketone, methyl isobutyl ketone, diisobutyl ketone, 2-heptanone, acetylacetone, cyclopentanone, cyclohexanone, cycloheptanone, γ-butyrolactone, γ-valerolactone, δ-valerolactone, propylene carbonate, N-methyl-2-pyrrolidone, N,N'-dimethyl formamide, N,N'-dimethyl acetamide, and 1,3-dimethyl-2-imidazolidinone. From the viewpoint of improving the leveling property during coating, preferable are 3-methoxy-n-butyl acetate, 3-methyl-3-n-butyl acetate, propylene glycol monomethyl ether acetate, dipropylene glycol monomethyl ether acetate, and γ-butyrolactone.

Examples of a compound having three or more ether bonds and a boiling point of 110° C. to 250° C. under atmospheric pressure include diethylene glycol dimethyl ether, diethylene glycol diethyl ether, diethylene glycol ethyl methyl ether, diethylene glycol di-n-propyl ether, dipropylene glycol dimethyl ether, dipropylene glycol diethyl ether, dipropylene glycol methyl-n-propyl ether, dipropylene glycol ethyl methyl ether, and dipropylene glycol di-n-propyl ether. From the viewpoint of improving the leveling property during coating, preferable are diethylene glycol dimethyl ether, diethylene glycol ethyl methyl ether, and dipropylene glycol dimethyl ether.

For the negative-type photosensitive resin composition according to the present invention, the content of the solvent may be adjusted appropriately to suite the coating method to be used etc. For example, a content of 50 to 95 mass % of the total quantity of the negative-type photosensitive resin composition is commonly adopted when the spin coating technique is used to form a coating film.

As the coloring agent (D), if a disperse dye is to be added as the pigment (D1) and/or the dye (D2), it is preferable to use a solvent having a carbonyl group or an ester bond. The incorporation of a solvent having a carbonyl group or an ester bond ensures an improved dispersion stability of the disperse dye as the pigment (D1) and/or the dye (D2). Regarding the solvent, furthermore, the use of a solvent having an acetate bond is more preferable from the viewpoint of dispersion stability. The incorporation of a solvent having an acetate bond ensures an improved dispersion stability of the disperse dye as the pigment (D1) and/or the dye (D2).

Examples of the solvent having an acetate bond include n-butyl acetate, isobutyl acetate, 3-methoxy-n-butyl acetate, 3-methyl-3-methoxy-n-butyl acetate, ethylene glycol monomethyl ether acetate, ethylene glycol monoethyl ether acetate, ethylene glycol monobutyl ether acetate, propylene glycol monomethyl ether acetate, propylene glycol monoethyl ether acetate, propylene glycol monobutyl ether acetate, diethylene glycol monomethyl ether acetate, diethylene glycol monoethyl ether acetate, diethylene glycol mono-n-butyl ether acetate, dipropylene glycol monomethyl ether acetate, dipropylene glycol monoethyl ether acetate, cyclohexanol acetate, propylene glycol diacetate, 1,3-butanediol diacetate, and 1,4-butanediol diacetate.

In the negative-type photosensitive resin composition according to the present invention, the solvent having a carbonyl group or an ester bond preferably accounts for 30 to 100 mass %, more preferably 50 to 100 mass %, and still more preferably 70 to 100 mass %, of the total solvent quantity. A content of 30 to 100 mass % ensures an improved dispersion stability of the pigment (D1).

<Other Additives>

The negative-type photosensitive resin composition according to the present invention may further contain another resin or a precursor thereof. Examples of such another resin or a precursor thereof include polyamide, polyamide-imide, epoxy resin, novolak resin, urea resin, polyurethane, and precursors thereof.

<Production Method for the Negative-Type Photosensitive Resin Composition According to the Present Invention>

Described below is a typical production method for the negative-type photosensitive resin composition according to the present invention. For example, a dispersant (E) is added to a solution of the first resin (A1) and the second resin (A2), and the pigment (D1) is dispersed in this mixed solution using a dispersing machine to prepare a pigment dispersion liquid. Subsequently, a radical-polymerizable compound (B), a photo-initiator (C1), other additives, and an appropriate solvent are added to this pigment dispersion liquid and stirred for 20 minutes to 3 hours to prepare a uniform solution. After the stirring, the resulting solution is filtered to produce the negative-type photosensitive resin composition according to the present invention.

Examples of the dispersing machine include ball mill, bead mill, sand grinder, triple roll mill, and high-speed impact mill. From the viewpoint of ensuring an improved dispersion efficiently and finer dispersion, it is preferable to use a bead mill. Examples of the bead mill include CoBall Mill, basket mill, pin mill, and DYNO mill. Examples of the beads for bead mills include titania beads, zirconia beads, and zircon beads. These bead mills preferably have a bead diameter of 0.01 to 6 mm, more preferably 0.015 to 5 mm, and still more preferably 0.03 to 3 mm. If both the diameter of the primary particles of the pigment (D1) and that of the secondary particles formed through aggregation of the primary particles are several hundreds of nanometers or less, it is preferable to use fine beads of 0.015 to 0.1 mm. In this case, it is desirable to adopt a bead mill equipped with a centrifugal separation type separator that can separate the fine beads from the pigment dispersion liquid. If the pigment (D1) contains large particles of several hundreds of nanometers or more, it is preferable to use beads of 0.1 to 6 mm from the viewpoint of improving the dispersion efficiently.

<Processes Using the Negative-Type Photosensitive Resin Composition According to the Present Invention>

Cured films formed from the negative-type photosensitive resin composition according to the present invention can serve suitably for applications such as pixel dividing layers in organic EL display devices, color filters, black matrices of color filters, black column spacers of liquid crystal display devices, gate insulation films of semiconductors, interlaminar insulation films of semiconductors, protection films for metal wiring, insulation films for metal wiring, and planarization films for TFTs.

<Cured Pattern Having a Pattern Shape with a Small Taper>

The negative-type photosensitive resin composition according to the present invention serves to produce a cured film having a pattern shape with a small taper. In the cross section of a cured pattern prepared from the negative-type photosensitive resin composition according to the present invention and included in a cured film, each inclined slope preferably have a taper angle of 1° or more, more preferably 5° or more, still more preferably 10° or more, still more preferably 12° or more, and particularly preferably 15° or more. A taper angle of 1° or more ensures the production of a display device with an improved resolution because it permits high density integration and arrangement of light emitting elements. In the cross section of the cured pattern included in the cured film, each inclined slope preferably have a taper angle of 60° or less, more preferably 55° or less, still more preferably 50° or less, still more preferably 45° or less, and particularly preferably 40° or less. A taper angle of 60° or less serves to prevent disconnection when forming electrodes such as transparent electrodes and reflecting electrodes. It also serves to depress the electric field concentration along edges of electrodes, thereby decreasing the degradation of the light emitting elements.

<Production Processes for Organic EL Display Device>

As an example of processes that use the negative-type photosensitive resin composition according to the present invention, a process that uses a cured film prepared from the composition as a light-blocking, pixel dividing layer in an organic EL display device is described below with reference FIG. 1. First, (1) a thin film transistor (hereinafter TFT) 2 is formed on a glass substrate 1, followed by forming a film of a photosensitivity material for a TFT planarization film, performing pattern processing by photolithography, and heat-curing it to form a cured film 3 for TFT planarization. Next, (2) a film of a silver-palladium-copper alloy (hereinafter APC) is formed by sputtering, followed by etching it through a photoresist for pattern processing to form an APC layer, forming a film of indium tin oxide (hereinafter ITO) on the APC layer by sputtering, and etching it through a photoresist for pattern processing to form a reflecting electrode 4 as a first electrode. Subsequently, (3) the negative-type photosensitive resin composition according to the present invention is spread and prebaked to form a prebaked film 5a. Next, (4) active actinic ray 7 is applied through a mask 6 that has an intended pattern. Then, (5) development is performed for pattern processing, followed by performing bleaching light exposure and middle-baking as required and heat-curing to form a cured pattern 5b having an intended pattern for a light-blocking pixel dividing layer. Subsequently, (6) a film of an EL luminescence material is formed by deposition through a mask to produce an EL luminescence layer 8, forming a film of a magnesium-silver alloy (hereinafter MgAg) by deposition, and etching it through a photoresist for pattern processing to form a transparent electrode 9 as a second electrode. Then, (7) a film of a photosensitive material is formed as a planarization film, followed by performing pattern processing by photolithography, heat-curing it to form a cured film 10 for planarization, and subsequently joining a cover glass 11 to produce an organic EL display device having a light-blocking pixel dividing layer of the negative-type photosensitive resin composition according to the present invention.

<Production Processes for Liquid Crystal Display Device>

Figure 2:
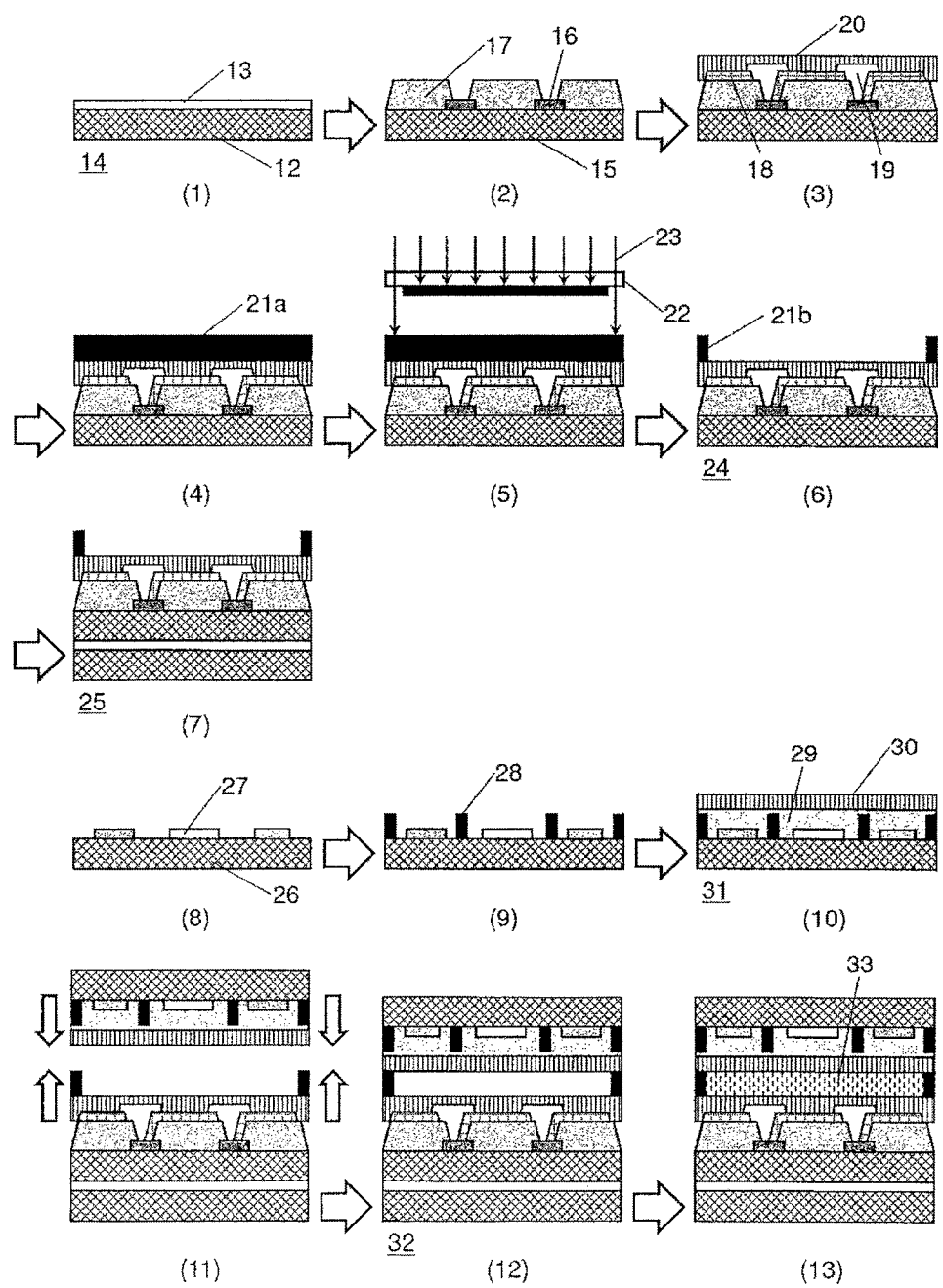
FIGS. 2(1) to (13) are processing diagrams exemplifying a production process of a liquid crystal display device that uses the cured film of the negative-type photosensitive resin composition according to the present invention.

As another example of processes that use the negative-type photosensitive resin composition according to the present invention, a process that uses a cured film of the composition as a black column spacer (hereinafter BCS) for liquid crystal display device and a black matrix (hereinafter BM) of a color filter is described below with reference to FIG. 2. First, (1) a backlight unit (hereinafter BLU) 13 is formed on a glass substrate 12 to prepare a glass substrate 14 having a BLU.

In addition, (2) a TFT 16 is formed on another glass substrate 15, followed by forming a film of a photosensitivity material for a TFT planarization film, performing pattern processing by photolithography, and heat-curing it to form a cured film 17 for TFT planarization. Then, (3) an ITO film is formed by sputtering, etching it through a photoresist for pattern processing, forming a transparent electrode 18, and forming thereon a planarization film 19 and an alignment layer 20. Subsequently, (4) the negative-type photosensitive resin composition according to the present invention is spread and prebaked to form a prebaked film 21a. Next, (5) active actinic ray 23 is applied through a mask 22 that has an intended pattern. Then, (6) development is performed for pattern processing, followed by performing bleaching light exposure and middle-baking as required and heat-curing to form a cured pattern 21b having an intended pattern for a light-blocking BCS, thus obtaining a glass substrate 24 having a BCS. Subsequently, (7) the glass substrate 14 and the glass substrate 24 are joined together to produce a glass substrate 25 having a BLU and a BCS.

In addition, (8) a three-color (red, green, and blue) filter 27 is formed on another glass substrate 26. Next, (9) in the same manner as described above, a cured pattern 28 having an intended pattern for a light-blocking BM is formed from the negative-type photosensitive resin composition according to the present invention. Then, (10) a film photosensitive material for planarization is formed, followed by performing pattern processing by photolithography, and heat-curing it to form a cured film 29 for planarization, and forming an alignment layer 30 thereon to produce a color filter substrate 31. Subsequently, (11) the glass substrate 25 and the color filter substrate 31 are joined together to produce (12) a glass substrate 32 having a BLU, a BCS, and a BM. Subsequently, (13) liquid crystal is injected to form a liquid crystal layer 33 to produce a liquid crystal display device having a BCS and a BM made of the negative-type photosensitive resin composition according to the present invention.

As described above, according to the production methods for an organic EL display device and a liquid crystal display device which uses the negative-type photosensitive resin composition according to the present invention, it is possible to obtain a cured film having high heat resistance and light blocking capability which has been pattern-processed and contains polyimide and/or polybenzo-oxazole, leading to improvement in the yield of production, improvement in the performance, and improvement in the reliability of organic EL display devices and liquid crystal display devices.

According to the process that uses the negative-type photosensitive resin composition according to the present invention, since the resin composition is photosensitive, direct pattern processing by photolithography is feasible. Therefore, in comparison with a process that uses photoresist, the number of steps can be reduced, so that improvement of productivity, process time reduction and takt time reduction with regard to organic EL display devices and liquid crystal display devices can be achieved.

<Display Device Using Cured Film Prepared from the Negative-Type Photosensitive Resin Composition According to the Present Invention>

The negative-type photosensitive resin composition according to the present invention serves to obtain a pattern shape with a small taper and produce a cured film excellent in heat resistance. Thus, the cured film can be used suitably in components that require a high heat resistance and a pattern shape with a small taper such as insulation layers in, for example, pixel dividing layers of organic EL display devices. If a cured film of the negative-type photosensitive resin composition according to the present invention is used in components that are considered to suffer problems related to heat resistance and pattern shape, such as defect or declined property of an element due to degassing caused by heat decomposition and a break of an electrode wiring due to a high-taper pattern shape, it will be possible to produce a high reliability element that is free from such problems. In addition, since the cured film is excellent in light blocking capability, it serves for prevention of the electrode wiring from becoming visible and for reduction of external light reflection, leading to an improved contrast in image displaying. Therefore, if a cured film prepared from the negative-type photosensitive resin composition according to the present invention is used as the pixel dividing layer in an organic EL display device, the contrast can be improved without forming a polarizing plate and a quarter wave plate on the light extraction side of the light emitting element.

In the display device according to the present invention, the cured film has a cured pattern, in the cross section of the cured pattern, the inclined slope preferably has a taper angle of 1 to 60° as described above. A taper angle of 1° or more ensures the production of a display device with an improved resolution because it permits high density integration and arrangement of light emitting elements. A taper angle of 60° or less serves to prevent disconnection when forming electrodes such as transparent electrodes and reflecting electrodes. It also serves to depress the electric field concentration along edges of electrodes, thereby decreasing the degradation of the light emitting elements.

The display device according to the present invention preferably has a curved display portion. The curvature radius of this curved surface is preferably 0.1 mm or more, more preferably 0.3 mm or more, from the viewpoint of reducing display defects attributed to disconnection in curved display portions of the display device. It is preferable for the curvature radius of the curved surface to be 10 mm or less, more preferably 7 mm or less, and still more preferably 5 mm or less, from the viewpoint of reducing the size and increasing the resolution of the display device.

In the display device according to the present invention, the aperture ratio of an opening of the pixel dividing layer in a display area is preferably 20% or less. When the aperture ratio is 20% or less, high resolution/high definition of the display device can be achieved, and, at the same time, the area of the pixel dividing layer that reduces external light reflection increases, so that the contrast of the display device can be improved. On the other hand, as the aperture ratio of the opening of the pixel dividing layer decreases, the contribution to occurrence of display failure such as occurrence of dark spots due to development residues or reduction in brightness increases. Thus, when the pixel dividing layer is formed using the negative-type photosensitive resin composition according to the present invention, generation of development residues can be suppressed, and therefore, it is possible to suppress occurrence of display failure of the display device and to improve reliability.

A production method for a display device that uses the negative-type photosensitive resin composition according to the present invention includes the steps of (1) to (4) described below.

(1) A step for forming a coating film of the negative-type photosensitive resin composition according to the present invention on a substrate,
(2) A step for applying active actinic ray to the coating film of the resin composition through a photomask,
(3) A step for developing it with an alkaline solution to form a pattern of the resin composition, and,
(4) A step for heating the pattern to produce a cured pattern of the resin composition.

<Step for Forming Coating Film>

The production method for a display device that uses the negative-type photosensitive resin composition according to the present invention includes: (1) a step for forming a coating film of a negative-type photosensitive resin composition on a substrate.

Available methods for forming a coating film of the negative-type photosensitive resin composition according to the present invention include, for example, a method in which the resin composition is spread over a substrate and a method in which the resin composition is spread in a pattern over a substrate.

The substrate may be in the form of a substrate having electrodes and wiring of an oxide containing one or more selected from the group consisting of indium, tin, zinc, aluminum, and gallium, a metal (molybdenum, silver, copper, aluminum, chrome, titanium, etc.), or CNT (carbon nanotube) formed on a glass plate.

Oxides that contain one or more selected from the group consisting of indium, tin, zinc, aluminum, and gallium include indium tin oxide (ITO), indium zinc oxide (IZO), aluminum zinc oxide (AZO), indium gallium zinc oxide (IGZO), and zinc oxide (ZnO).

<Method for Spreading the Negative-Type Photosensitive Resin Composition According to the Present Invention on a Substrate>

Available methods for spreading the negative-type photosensitive resin composition according to the present invention on a substrate include, for example, micro gravure coating, spin coating, dip coating, curtain flow coating, roll coating, spray coating, and slit coating. The coating thickness depends on the coating method used, solid content in the resin composition, viscosity thereof, and the like, but commonly, coating is performed in such a manner that the film thickness will be 0.1 to 30 μm after spreading and prebaking.

It is preferable to spread the negative-type photosensitive resin composition according to the present invention on a substrate and then prebake it to form a film. The prebaking can be achieved by using an oven, hot plate, infrared ray, flash annealing device, laser annealing device, or the like. The prebaking temperature is preferably in the range of 50° C. to 150° C. The prebaking time is preferably in the range of 30 seconds to several hours. The prebaking may be performed in two or more stages such as prebaking at 80° C. for 2 minutes, followed by prebaking at 120° C. for 2 minutes.

<Method for Spreading the Negative-Type Photosensitive Resin Composition According to the Present Invention in a Pattern on a Substrate>

Available methods for spreading the negative-type photosensitive resin composition according to the present invention in a pattern on a substrate include, for example, letterpress printing, intaglio printing, stencil printing, planographic printing, screen printing, ink jet printing, offset printing, and laser printing. The coating thickness depends on the coating method used, solid content in the photosensitive resin composition according to the present invention, viscosity thereof, and the like, but commonly, coating is performed in such a manner that the film thickness will be 0.1 to 30 μm after spreading and prebaking.

It is preferable to spread the negative-type photosensitive resin composition according to the present invention in a pattern on a substrate and then prebake it to form a film. The prebaking can be achieved by using an oven, hot plate, infrared ray, flash annealing device, laser annealing device, or the like. The prebaking temperature is preferably in the range of 50° C. to 150° C. The prebaking time is preferably in the range of 30 seconds to several hours. The prebaking may be performed in two or more stages such as prebaking at 80° C. for 2 minutes, followed by prebaking at 120° C. for 2 minutes.

<Method for Pattern Processing of Coating Film Formed on Substrate>

Available methods for pattern processing of a coating film of the negative-type photosensitive resin composition according to the present invention formed on a substrate include, for example, direct pattern processing by photolithography and pattern processing by etching. The method of direct pattern processing by photolithography is preferable from the viewpoint of decreasing the number of steps to ensure an improved productivity and a shortened process time.

<Step for Applying Active Actinic Ray Through Photomask>

The production method for a display device that uses the negative-type photosensitive resin composition according to the present invention includes: (2) a step for applying active actinic ray to a coating film of the resin composition through a photomask.

The negative-type photosensitive resin composition according to the present invention is spread on a substrate and prebaked to form a film, which is then exposed to light by using a light exposure device such as stepper, mirror projection mask aligner (MPA), and parallel light mask aligner (PLA). Available active actinic rays used for light exposure include ultraviolet light, visible light, electron beam, X-ray, KrF (wavelength 248 nm) laser, and ArF (wavelength 193 nm) laser. It is preferable to use the j-line (wavelength 313 nm), i-line (wavelength 365 nm), K-line (wavelength 405 nm), or g-line (wavelength 436 nm) of a mercury lamp. The quantity of light exposure is commonly about 100 to 40,000 J/m$^2$ (10 to 4,000 mJ/cm$^2$) (as measured by -line illuminance meter), and light may be exposed through a photomask having a desired pattern as required.

Another good procedure is to perform light exposure and then perform post-exposure baking. Post-exposure baking can serve effectively for improving the resolution after development, and widening the allowable range of the development conditions. The post-exposure baking can be achieved by using an oven, hot plate, infrared ray, flash annealing device, laser annealing device, or the like. The post-exposure baking temperature is preferably 50° C. to 180° C., and more preferably 60° C. to 150° C. The post-exposure baking time is preferably in the range of 10 seconds to several hours. A post-exposure baking time of 10 seconds to several hours can ensure smooth progress of the reaction and a shortened development time.

<Step for Development with Alkaline Solution to Form Pattern>

The production method for a display device that uses the negative-type photosensitive resin composition according to the present invention includes: (3) a step for development with an alkaline solution to form a pattern of the resin composition.

After light-exposure, development is performed using an automatic development apparatus. Since the negative-type photosensitive resin composition according to the present invention has a negative-type photosensitivity, the unexposed parts are removed by the developer after development to produce a relief pattern.

Alkaline developers are generally used for development. Preferable alkaline developers include, for example, organic alkaline solutions and aqueous solutions of compounds that show alkalinity, of which aqueous solutions of compounds that show alkalinity, that is, alkaline aqueous solutions are more preferable from an environmental viewpoint.

Such organic alkaline solutions and compounds that show alkalinity include, for example, 2-aminoethanol, 2-(dimethylamino) ethanol, 2-(diethylamino)ethanol, diethanolamine, methylamine, ethylamine, dimethylamine, diethylamine, triethylamine, (2-dimethylamino)ethyl acetate, (2-dimethylamino)ethyl (meth) acrylate, cyclohexylamine, ethylenediamine, hexamethylenediamine, ammonia, tetramethylammonium hydroxide, tetraethylammonium hydroxide, sodium hydroxide, potassium hydroxide, magnesium hydroxide, calcium hydroxide, barium hydroxide, sodium carbonate, and potassium carbonate.

An organic solvent may be used as the developer. Examples of the organic solvent include the aforementioned solvents, ethyl acetate, ethyl pyruvate, ethyl 3-methoxypropionate, ethyl 3-ethoxypropionate, N-methyl-2-pyrolidone, dimethyl sulfoxide, and hexamethyl phosphortriamide.

The developer to be used may be a mixed solution that contains both an organic solvent as given above and a poor solvent for the negative-type photosensitive resin composition according to the present invention. Examples of the poor solvent for the negative-type photosensitive resin composition according to the present invention include water, methanol, ethanol, isopropyl alcohol, toluene, and xylene.

Examples of the method for development include a method in which a developer as given above is directly applied to the exposed film, or in which a developer as given above is radiated in the form of mist to the exposed film, a method in which the exposed film is immersed in a developer as given above, and a method in which after being immersed in a developer as given above, the exposed film is irradiated with ultrasonic waves. It is preferable that the exposed film is brought into contact with the developer for 5 seconds to 10 minutes.

It is preferable for the relief pattern resulting from the development to be washed with a rinsing liquid. The rinsing liquid is preferably water when an alkaline aqueous solution is used as developer.

Examples of the rinsing liquid include aqueous solutions of alcohols such as ethanol and isopropyl alcohol, aqueous solutions of esters such as propylene glycol monomethyl ether acetate, and aqueous solutions of compounds that show acidity such as carbon dioxide gas, hydrochloric acid, and acetic acid.

An organic solvent may be used as the rinsing liquid. From the viewpoint of the affinity with developers, preferable examples of the organic solvent include methanol, ethanol, isopropyl alcohol, ethyl acetate, ethyl lactate, ethyl pyruvate, propylene glycol monomethyl ether, propylene glycol monomethyl ether acetate, methyl 3-methoxypropionate, ethyl 3-ethoxypropionate, and 2-heptanone.

After obtaining a pattern of the negative-type photosensitive resin composition according to the present invention, photolithography may be performed to achieve bleaching light exposure. Bleaching light exposure serves to control the pattern shape of the heat-cured film as desired. It also serves to produce a cured film with a higher transparency.

Bleaching light exposure can be performed using an exposure machine such as stepper, mirror projection mask aligner (MPA), and parallel light mask aligner (PLA). Available active actinic rays used for bleaching light exposure include ultraviolet light, visible light, electron beam, X-ray, KrF (wavelength 248 nm) laser, and ArF (wavelength 193 nm) laser. It is preferable to use the line (wavelength 313 nm), i-line (wavelength 365 nm), K-line (wavelength 405 nm), or g-line (wavelength 436 nm) of a mercury lamp. The quantity of light exposure is commonly about 500 to 500,000 $J/m^2$ (50 to 50,000 $mJ/cm^2$) (as measured by i-line illuminance meter), and light may be exposed through a mask having a desired pattern as required.

Middle-baking may be performed after producing a pattern of the negative-type photosensitive resin composition according to the present invention. Middle-baking serves to ensure an improved resolution after heat curing and also allow a desired pattern shape to be obtained after heat curing. The middle-baking can be achieved by using an oven, hot plate, infrared ray, flash annealing device, laser annealing device, or the like. The middle-baking temperature is preferably 50° C. to 250° C., and more preferably 70° C. to 220° C. The prebaking time is preferably in the range of 10 seconds to several hours. The middle-baking may be performed in two or more stages such as middle-baking at 100° C. for 5 minutes, followed by middle-baking at 150° C. for 5 minutes.

<Step for Heating Pattern to Produce Cured Pattern>

The production method for a display device that uses the negative-type photosensitive resin composition according to the present invention includes: (4) a step for heating the pattern of the resin composition to produce a cured pattern of the resin composition.

The heating of the patterned film of the negative-type photosensitive resin composition according to the present invention formed on a substrate can be carried out by using an oven, hot plate, infrared ray, flash anneal device, laser anneal device, or the like. The heating to heat-cure the pattern film of the negative-type photosensitive resin composition according to the present invention serves to ensure the production of a cured film with an improved heat resistance and also ensure a small-tapered pattern shape.

The heat-curing temperature is preferably 150° C. or more, more preferably 200° C. or more, and still more preferably 250° C. or more. A heat-curing temperature of 150° C. or more ensures the formation of a cured film with an increased heat resistance and the formation of a cured film with a pattern shape with a smaller taper. On the other hand, from the viewpoint of shortening the tact time, the heat-curing temperature is preferably 500° C. or less, more preferably 450° C. or less, and still more preferably 400° C. or less.

The heat-curing time is preferably 1 minute or more, more preferably 5 minutes or more, still more preferably 10 minutes or more, and particularly preferably 30 minutes or more. A heat-curing time of 1 minute or more ensures a pattern shape with a smaller taper after heat-curing. On the other hand, from the viewpoint of shortening the tact time, the heat-curing time is preferably 300 minutes or less, more preferably 250 minutes or less, still more preferably 200 minutes or less, and particularly preferably 150 minutes or less. The heat-curing may be performed in two or more stages such as heat-curing at 150° C. for 30 minutes, followed by heat-curing at 250° C. for 30 minutes.

Furthermore, the negative-type photosensitive resin composition according to the present invention serves to produce cured films that can be used suitably for applications such as pixel dividing layers in organic EL display devices, color filters, black matrices of color filters, black column spacers of liquid crystal display devices, gate insulation films of semiconductors, interlaminar insulation films of semiconductors, protection films for metal wiring, insulation films for metal wiring, and planarization films for TFTs. Particularly, because of being excellent in light blocking capability, the cured film is suitable as a pixel dividing layer and a black matrix of a color filter that have light blocking capability in an organic EL display device or a black column spacer in a liquid crystal display device. In addition, it will be possible to produce elements and display devices in which the cured film is used for the aforementioned purposes.

Furthermore, according to the production method for a display device which uses the negative-type photosensitive resin composition according to the present invention, it is possible to obtain a cured film having high heat resistance and light blocking capability which has been pattern-processed and contains polyimide and/or polybenzo-oxazole, leading to improvement in the yield of production, improvement in the performance, and improvement in the reliability of organic EL display devices and liquid crystal display devices. Moreover, since the negative-type photosensitive resin composition according to the present invention is capable of being directly pattern-processed by photolithography, the number of steps can be reduced in comparison with the processing that uses photoresist, so that it becomes possible to improve productivity, reduce the process time, and reduce the takt time.

EXAMPLES

The present invention will now be illustrated more specifically with reference to Examples and Comparative examples, but it should be understood that the invention is not construed as being limited to the scopes thereof. Some of the compounds used are referred to using abbreviations as listed below.

5CPL-1: ε-caprolactone modified dipentaerythritol pentaacrylate having five oxypentylene carbonyl structures in the molecule 6FDA: 2,2-(3,4-dicarboxyphenyl)hexafluoropropane dianhydride; 4,4'-hexafluoropropane-2,2-diyl-bis(1,2-phthalic acid anhydride)

A-9300-3CL: "NK ESTER" (registered trademark) A-9300-3CL (manufactured by Shin-Nakamura Chemical Co., Lid.; ε-caprolactone modified 1,3,5-tris (acryloxyethyl) isocyanuric acid having three oxypentylene carbonyl structures in the molecule)

AcrTMS: 3-acryloxypropyl trimethoxysilane

A-DPH-12E: "NK ESTER" (registered trademark) A-DPH-12E (manufactured by Shin-Nakamura Chemical Co., Lid.; ethoxylated dipentaerythritol hexaacrylate having 12 oxyethylene structures in the molecule)

A-DPH-6E: "NK ESTER" (registered trademark) A-DPH-6E (manufactured by Shin-Nakamura Chemical Co., Lid.; ethoxylated dipentaerythritol hexaacrylate having six oxyethylene structures in the molecule)

A-DPH-6P: "NK ESTER" (registered trademark) A-DPH-6P (manufactured by Shin-Nakamura Chemical Co., Ltd.; propoxylated dipentaerythritol hexaacrylate having six oxypropylene structures in the molecule)

AD-TMP-4CL: "NK ESTER" (registered trademark) AD-TMP-4CL (manufactured by Shin-Nakamura Chemical Co., Ltd.; ε-caprolactone modified ditrimethylolpropane tetra acrylate having four oxypentylene carbonyl structures in the molecule)

APC: Argentum-Palladium-Cupper (silver-palladium-copper alloy)

ATM-4CL: "NK ESTER" (registered trademark) ATM-4CL (manufactured by Shin-Nakamura Chemical Co., Ltd.; ε-caprolactone modified pentaerythritol tetraacrylate having four oxypentylene carbonyl structures in the molecule)

ATM-4VL: "NK ESTER" (registered trademark) ATM-4VL (manufactured by Shin-Nakamura Chemical Co., Ltd.; δ-valerolactone modified pentaerythritol tetraacrylate having four oxybutylene carbonyl structures in the molecule)

ATM-8CL: "NK ESTER" (registered trademark) ATM-8CL (manufactured by Shin-Nakamura Chemical Co., Ltd.; ε-caprolactone modified pentaerythritol tetraacrylate having eight oxypentylene carbonyl structures in the molecule)

BAHF: 2,2-bis(3-amino-4-hydroxyphenyl) hexafluoropropane

BFE: 1,2-bis(4-formylphenyl) ethane

BGPF: 9,9-bis(4-glycidoxyphenyl) fluorene

BHPF: 9,9-bis(4-hydroxyphenyl) fluorene

Bis-A-AF: 2,2-bis(4-aminophenyl) hexafluoropropane

Bk-A1103: "CHROMOFINE" (registered trademark) BLACK A1103 (manufactured by Dainichiseika Color & Chemicals Mfg. Co., Ltd.; azo based black pigment with primary particle diameter of 50 to 100 nm)

Bk-S0084: "PALIOGEN" (registered trademark) BLACK S0084 (manufactured by BASF; perylene based black pigments with primary particle diameter of 50 to 100 nm)

Bk-S0100CF: IRGAPHOR (registered trademark) BLACK S0100CF (manufactured by BASF, benzofuranone based black pigments with primary particle diameter of 40 to 80 nm)

D.BYK-167: DISPERBYK (registered trademark)-167 (manufactured by BYK-Chemie Japan, dispersant having an amine value)

DFA: N,N-dimethylformamide dimethyl acetal

DMeDMS: dimethyldimethoxysilane

DPCA-20: "KAYARAD" (registered trademark) DPCA-20 (manufactured by Nippon Kayaku Co., Ltd.; ε-caprolactone modified dipentaerythritol hexaacrylate having two oxypentylene carbonyl structures in the molecule)

DPCA-30: "KAYARAD" (registered trademark) DPCA-30 (manufactured by Nippon Kayaku Co., Ltd.; ε-caprolactone modified dipentaerythritol hexaacrylate having three oxypentylene carbonyl structures in the molecule)

DPCA-60: "KAYARAD" (registered trademark) DPCA-60 (manufactured by Nippon Kayaku Co., Ltd.; ε-caprolactone modified dipentaerythritol hexaacrylate having six oxypentylene carbonyl structures in the molecule)

DPCA-120: "KAYARAD" (registered trademark) DPCA-120 (manufactured by Nippon Kayaku Co., Ltd.; ε-caprolactone modified dipentaerythritol hexaacrylate having twelve oxypentylene carbonyl structures in the molecule)

DPHA: KAYARAD (registered trademark) DPHA (manufactured by Nippon Kayaku Co., Ltd., dipentaerythritol hexaacrylate)

GMA: glycidyl methacrylate

HFHA: N,N'-bis[5,5'-hexafluoropropane-2,2-diyl-bis(2-hydroxyphenyl)] bis(3-aminobenzoic acid amide)

HX-220: "KAYARAD" (registered trademark) HX-220 (manufactured by Nippon Kayaku Co., Ltd.; ε-caprolactone modified hydroxypivalic acid neopentyl glycol diacrylate having two oxypentylene carbonyl structures in the molecule)

IGZO: indium gallium zinc oxide

ITO: indium tin oxide

MAA: methacrylic acid

MAP: 3-aminophenol; meta-aminophenol

MBA: 3-methoxy-n-butyl acetate

MeTMS: methyl trimethoxysilane

MgAg: Magnesium-Argentum (magnesium-silver alloy)

NA: 5-norbornene-2,3-dicarboxylic acid anhydride; nadic acid anhydride

NC-7000L: epoxy resin (manufactured by Nippon Kayaku Co., Ltd.) used for synthesis of acid-modified epoxy resin having a structural unit as represented by general formula (38a)

NCI-831: Adeka ARKLS (registered trademark) NCI-831 (manufactured by ADEKA Corporation, oxime ester based photo-initiator)

NMP: N-methyl-2-pyrolidone

ODPA: bis(3,4-dicarboxyphenyl) ether dianhydride; oxydiphthalic acid dianhydride P.B.15:6:C.I.Pigment Blue 15:6

P.R.254:C.I.Pigment Red 254

P.Y.139:C.I.Pigment Yellow 139

PGMEA: propylene glycol monomethyl ether acetate

PHA: phthalic acid anhydride

PhTMS: phenyl trimethoxysilane

S-20000: SOLSPERSE (registered trademark) 20000 (manufactured by Lubrizol, polyether based dispersant)

SiDA: 1,3-bis(3-aminopropyl) tetramethyl disiloxane

STR: styrene

TCDM: tricyclo[5.2.1.0$^{2,6}$]decane-8-yl methacrylate; dimethylol-tricyclodecane dimethacrylate THPHA: 1,2,3,6-tetrahydrophthalic acid anhydride TMAH: tetramethylammonium hydroxide TMOS: tetramethoxysilane TMSSucA: 3-trimethoxysilylpropyl succinic acid anhydride TPK-1227: carbon black (manufactured by CABOT) surface-treated for introduction of sulfonic acid group TrisP-PA: 1,1-bis(4-hydroxyphenyl)-1-[4-[1-(4-hydroxyphenyl)-1-methylethyl]phenyl] ethane (manufactured by Honshu Chemical Industry Co., Ltd.)

WR-301: ADEKA ARKLS (registered trademark) WR-301 (manufactured by ADEKA Corporation, polycyclic side chain-containing resin obtainable by reacting carboxylic acid anhydride with a resin obtainable through ring opening addition reaction of epoxy group-containing aromatic compound and unsaturated carboxylic acid)

ZXR-1816H: "KAYARAD" (registered trademark) ZXR-1816H (manufactured by Nippon Kayaku Co., Ltd.:

acid-modified epoxy resin having an ethylenically unsaturated double bond group and a carboxy group)

Synthesis Example (A)

In a three neck flask, 18.31 g (0.05 mol) of BAHF, 17.42 g (0.3 mol) of propylene oxide, and 100 mL of acetone were weighed out and dissolved. To this liquid, a solution of 20.41 g (0.11 mol) of 3-nitrobenzoyl chloride dissolved in 10 mL of acetone was added dropwise. After the end of dropping, the solution was allowed to react at −15° C. for 4 hours, followed by allowing it to return to room temperature. The resulting white solid precipitate was separated out by filtration and vacuum-dried at 50° C. A 30 g portion of the resulting solid material was put in a 300 mL stainless steel autoclave and dispersed in 250 mL of 2-methoxy ethanol, followed by adding 2 g of 5% palladium-carbon. Then, a balloon was used to introduce hydrogen to allow a reaction to continue for 2 hours at room temperature. After the 2-hour period, it was confirmed that the balloon would deflate no more. After the end of the reaction, the solution was filtrated to remove the palladium compound used as catalyst and concentrated by evaporation under reduced pressure to produce a hydroxyl group-containing diamine compound (HFHA) having a structure as given below.

[Chemical formula 32]

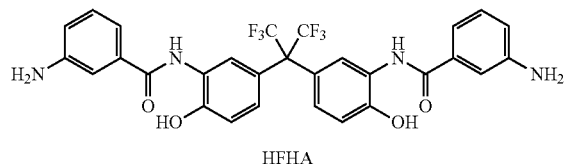

HFHA

Synthesis Example (B) Synthesis of Compound Having Naphthoquinone Diazide Structure (QD-1)

In a three neck flask in a dry nitrogen flow, 21.23 g (0.05 mol) of TrisP-PA and 37.62 g (0.14 mol) of 5-naphthoquinone diazide sulfonic acid chloride were weighed out and dissolved in 450 g of 1,4-dioxane and maintained at room temperature. To this liquid, a mixed solution of 50 g of 1,4-dioxane and 15.58 g (0.154 mol) of triethyl amine was added dropwise while stirring it to maintain the temperature below 35° C. After the end of dropping, the mixed solution was stirred at 30° C. for 2 hours. After the stirring, the precipitated triethyl amine salt was removed by filtering and the filtrate was poured in water and stirred, followed by separating out the precipitated solid sediment by filtering. The resulting solid was dried by drying under reduced pressure to provide a compound having a naphthoquinone diazide structure as given below (QD-1).

[Chemical formula 33]

QD-1

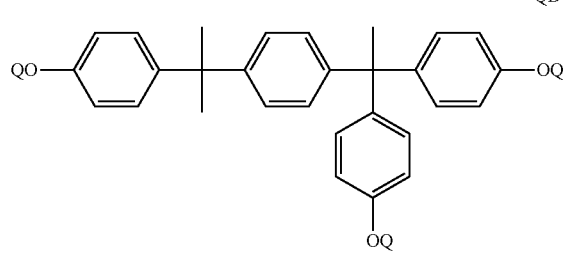

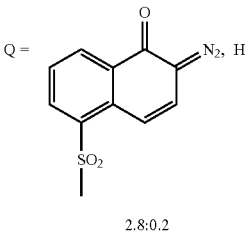

2.8:0.2

Synthesis Example 1 Synthesis of Polyimide (PI-1)

In a three neck flask in a dry nitrogen flow, 31.13 g of BAHF (0.085 mol; 77.3 mol % relative to total quantity of structural units derived from amines and derivatives thereof), 1.24 g of SiDA (0.0050 mol; 4.5 mol % relative to total quantity of structural units derived from amines and derivatives thereof), 2.18 g of MAP as end capping agent (0.020 mol; 18.2 mol % relative to total quantity of structural units derived from amines and derivatives thereof), and 150.00 g of NMP were weighed out and dissolved. To this liquid, a solution of 31.02 g (0.10 mol; 100 mol % relative to total quantity of structural units derived from carboxylic acids and derivatives thereof) of ODPA dissolved in 50.00 g of NMP was added, stirred at 20° C. for 1 hour, and then stirred at 50° C. for 4 hours. Subsequently, 15 g of xylene was added and stirred at 150° C. for 5 hours while boiling water azeotropically with xylene. After the end of the reaction, the reaction solution was poured in 3 L of water, and the precipitated solid sediment was separated out by filtering. The solid obtained was washed with water three times and dried for 24 hours at 80° C. in a vacuum dryer to provide polyimide (PI-1). The resulting polyimide had an Mw of 27,000 and an acid equivalent of 350.

Synthesis Examples 2 to 4 Synthesis of Polyimide (PI-2) to Polyimide (PI-4)

According to Table 1-1 for the species of monomers and their ratios, the same polymerization procedure as in Synthesis example 1 was carried out to prepare polyimide (PI-2) to polyimide (PI-4).

Synthesis Example 5 Synthesis of Polyimide Precursor (PIP-1)

In a three neck flask in a dry nitrogen flow, 44.42 g (0.10 mol; 100 mol % relative to total quantity of structural units derived from carboxylic acids and derivatives thereof) of 6FDA and 150 g of NMP were weighed out and dissolved. To this liquid, a solution of 14.65 g (0.040 mol; 32.0 mol % relative to total quantity of structural units derived from amines and derivatives thereof) of BAHF, 18.14 g (0.030 mol; 24.0 mol % relative to total quantity of structural units derived from amines and derivatives thereof) of HFHA, 1.24 g (0.0050 mol; 4.0 mol % relative to total quantity of structural units derived from amines and derivatives thereof) of SiDA dissolved in 50 g of NMP was added, stirred at 20° C. for 1 hour, and then stirred at 50° C. for 2 hours. Then, a solution of 5.46 g (0.050 mol; 40.0 mol % relative to total quantity of structural units derived from amines and derivatives thereof) of MAP, used as end capping agent, dissolved in 15 g of NMP was added and stirred at 50° C. for 2 hours. Subsequently, a solution of 23.83 g (0.20 mol) of DFA dissolved in 15 g of NMP was added dropwise over 10 minutes. After the end of dropping, stirring was performed at 50° C. for 3 hours. After the end of the reaction, the reaction solution was cooled to room temperature and then the reaction solution was poured in 3 L of water. The precipitated solid sediment was separated out by filtering. The solid obtained was washed with water three times and dried for 24 hours at 80° C. in a vacuum dryer to provide polyimide precursor (PIP-1). The resulting polyimide precursor had an Mw of 20,000 and an acid equivalent of 450.

Synthesis Example 6 Synthesis of Polyimide Precursor (PIP-2)

According to Table 1-2 for the species of monomers and their ratios, the same polymerization procedure as in Synthesis example 5 was carried out to prepare a polyimide precursor (PIP-2).

Synthesis Example 7 Synthesis of Polybenzoxazole (PBO-1)

In a 500 mL round bottom flask equipped with a toluene-filled Dean-Stark water separator and a cooling pipe, 34.79 g (0.095 mol; 95.0 mol % relative to total quantity of structural units derived from amines and derivatives thereof) of BAHF, 1.24 g (0.0050 mol; 5.0 mol % relative to total quantity of structural units derived from amines and derivatives thereof) of SiDA, and 75.00 g of NMP were weighed out and dissolved. To this liquid, a solution of 19.06 g (0.080 mol; 66.7 mol % relative to total quantity of structural units derived from carboxylic acids and derivatives thereof) of BFE and 6.57 g (0.040 mol; 33.3 mol % relative to total quantity of structural units derived from carboxylic acids and derivatives thereof) of NA, used as end capping agent, dissolved in 25.00 g of NMP was added, stirred at 20° C. for 1 hour, and then stirred at 50° C. for 1 hour. Subsequently, heating and stirring was performed at 200° C. or more for 10 hours in a nitrogen atmosphere to promote dehydration reaction. After the end of the reaction, the reaction solution was poured in 3 L of water, and the precipitated solid sediment was separated out by filtering. The solid obtained was washed with water three times and dried for 24 hours at 80° C. in a vacuum dryer to provide polybenzoxazole (PBO-1). The resulting polybenzoxazole had an Mw of 25,000 and an acid equivalent of 330.

Synthesis Example 8 Synthesis of Polybenzoxazole Precursor (PBOP-1)

In a 500 mL round bottom flask equipped with a toluene-filled Dean-Stark water separator and a cooling pipe, 34.79 g (0.095 mol; 95.0 mol % relative to total quantity of structural units derived from amines and derivatives thereof) of BAHF, 1.24 g (0.0050 mol; 5.0 mol % relative to total quantity of structural units derived from amines and derivatives thereof) of SiDA, and 70.00 g of NMP were weighed out and dissolved. To this liquid, a solution of 19.06 g (0.080 mol; 66.7 mol % relative to total quantity of structural units derived from carboxylic acids and derivatives thereof) of BFE dissolved in 20.00 g of NMP was added, stirred at 20° C. for 1 hour, and then stirred at 50° C. for 2 hours. Then, a solution of 6.57 g (0.040 mol; 33.3 mol % relative to total quantity of structural units derived from carboxylic acids and derivatives thereof) of NA, used as end capping agent, dissolved in 10 g of NMP was added and stirred at 50° C. for 2 hours. Then, in a nitrogen atmosphere, stirring was performed at 100° C. for 2 hours. After the end of the reaction, the reaction solution was poured in 3 L of water, and the precipitated solid sediment was separated out by filtering. The solid obtained was washed with water three times and dried for 24 hours at 80° C. in a vacuum dryer to provide a polybenzoxazole precursor (PBOP-1). The resulting polybenzoxazole precursor had an Mw of 20,000 and an acid equivalent of 330.

Synthesis Example 9 Synthesis of Polysiloxane Solution (PS-1)

In a three neck flask, 23.84 g (35 mol %) of MeTMS, 49.57 g (50 mol %) of PhTMS, 3.81 g (5 mol %) of TMOS, and 76.36 g of PGMEA were fed. A flow of air was supplied to the flask at 0.05 L/min, and the mixed solution was heated in an oil bath at 40° C. while stirring it. While further continuing the stirring of the mixed solution, an aqueous phosphoric acid solution of 0.271 g of phosphoric acid dissolved in 28.38 g of water was added dropwise over 10 minutes. After the end of dropping, stirring was performed at 40° C. for 30 minutes to hydrolyze the silane compound. After the end of hydrolysis, a solution of 13.12 g (10 mol %) of TMSSucA dissolved in 8.48 g of PGMEA was added. Subsequently, the bath temperature was increased to 70° C., followed by stirring for 1 hour and then increasing the bath temperature to 115° C. About 1 hour after the start of temperature rise, the internal temperature in the solution reached 100° C. and heating was continued further while stirring for additional 2 hours (the internal temperature maintained at 100° C. to 110° C.). The resin solution obtained from the 2-hour heating and stirring was cooled in an ice bath, and then an anion exchange resin and a cation exchange resin, both in an amount of 2 mass % relative to the resin solution, were added and stirred for 12 hours. After the stirring, the anion exchange resin and cation exchange resin were removed by filtering to provide a polysiloxane solution (PS-1). The resulting polysiloxane had a Mw of 4,200 and a carboxylic acid equivalent of 700 g/mol.

Synthesis Example 10 Synthesis of Polysiloxane Solution (PS-2)

In a three neck flask, 13.62 g (20 mol %) of MeTMS, 49.57 g (50 mol %) of PhTMS, 23.43 g (20 mol %) of AcrTMS, and 89.84 g of PGMEA were fed. A flow of nitrogen was supplied to the flask at 0.05 L/min, and the mixed solution was heated in an oil bath at 40° C. while stirring it. While further continuing the stirring of the mixed solution, an aqueous phosphoric acid solution of 0.499 g of phosphoric acid dissolved in 27.93 g of water was added over 10 minutes. After the end of addition, stirring was performed at 40° C. for 30 minutes to hydrolyze the silane compound. After the end of hydrolysis, a solution of 13.12 g (10 mol %) of TMSSucA dissolved in 9.98 g of PGMEA was added. Subsequently, the bath temperature was increased to 70° C., followed by stirring for 1 hour and then increasing the bath temperature to 115° C. About 1 hour after the start of temperature rise, the internal temperature in the solution reached 100° C. and heating was continued further while stirring for additional 2 hours (the internal temperature maintained at 100° C. to 110° C.). The resin solution obtained from the 2-hour heating and stirring was cooled in an ice bath, and then an anion exchange resin and a cation exchange resin, both in an amount of 2 mass % relative to the resin solution, were added and stirred for 12 hours. After the stirring, the anion exchange resin and cation exchange resin were removed by filtering to provide a polysiloxane solution (PS-2). The resulting polysiloxane had a Mw of 5,200, a carboxylic acid equivalent of 800 g/mol, and a double bond equivalent of 800 g/mol.

Synthesis Example 11

According to Table 1-5 for the ratios, the same polymerization procedure as in Synthesis example 10 was carried out to prepare a polysiloxane solution (PS-3).

Synthesis Example 12 Synthesis of Polycyclic Side Chain-Containing Resin (CR-1)

In a three neck flask, 35.04 g (0.10 mol) of BHPF and 40.31 g of MBA were weighed out and dissolved. A solution of 27.92 g (0.090 mol) of ODPA and 2.96 g (0.020 mol) of PHA, used as end capping agent, dissolved in 30.00 g of MBA was added thereto and stirred at 20° C. for 1 hour. Then, in a nitrogen atmosphere, stirring was performed at 150° C. for 5 hours. After completion of the reaction, a solution of 14.22 g (0.10 mol) of GMA, 0.135 g (0.0010 mol) of dibenzyl amine, and 0.037 g (0.0003 mol) of 4-methoxyphenol dissolved in 10.00 g of MBA was added to the resulting solution, followed by stirring at 90° C. for 4 hours to provide a polycyclic side chain-containing resin solution (CR-1). The resulting polycyclic side chain-containing resin had a Mw of 4,000, a carboxylic acid equivalent of 810 g/mol, and a double bond equivalent of 810 g/mol.

Synthesis Example 13 Synthesis of Polycyclic Side Chain-Containing Resin (CR-2)

In a three neck flask, 46.25 g (0.10 mol) of BGPF and 54.53 g of MBA were weighed out and dissolved. To this liquid, a solution of 17.22 g (0.20 mol) of MAA, 0.135 g (0.0010 mol) of dibenzyl amine, and 0.037 g (0.0003 mol) of 4-methoxyphenol dissolved in 10.00 g of MBA was added and stirred at 90° C. for 4 hours. Subsequently, a solution of 27.92 g (0.090 mol) of ODPA and 2.96 g (0.020 mol) of PHA, used as end capping agent, dissolved in 30.00 g of MBA was added and stirred at 20° C. for 1 hour. Then, in a nitrogen atmosphere, stirring was performed at 150° C. for 5 hours to provide a polycyclic side chain-containing resin solution (CR-2). The resulting polycyclic side chain-containing resin had a Mw of 4,700, a carboxylic acid equivalent of 470 g/mol, and a double bond equivalent of 470 g/mol.

Synthesis Example 14 Synthesis of Acrylic Resin Solution (AC-1)

In a three neck flask, 0.821 g (1 mol %) of 2,2'-azobis (isobutyronitrile) and 29.29 g of PGMEA were fed. Then, 21.52 g (50 mol %) of MAA, 22.03 g (20 mol %) of TCDM, and 15.62 g (30 mol %) of STR were fed and stirred for a while at room temperature, followed by filling the flask with nitrogen sufficiently by bubbling and subsequently stirring at 70° C. for 5 hours. Next, a solution of 14.22 g (20 mol %) of GMA, 0.676 g (1 mol %) of dibenzyl amine, and 0.186 g (0.3 mol %) of 4-methoxyphenol dissolved in 59.47 g of PGMEA was added to the resulting solution, followed by stirring at 90° C. for 4 hours to provide an acrylic resin solution (AC-1). The resulting acrylic resin had a Mw of 15,000, a carboxylic acid equivalent of 490 g/mol, and a double bond equivalent of 740 g/mol.

Synthesis Example 15 Synthesis of Acid-Modified Epoxy Resin (AE-1)

In a three neck flask, 46.00 g of NC-7000L (epoxy equivalent: 230 g/mol) and 47.91 g of MBA were weighed out and dissolved. To this liquid, a solution of 17.22 g (0.20 mol) of MAA, 0.270 g (0.0020 mol) of dibenzyl amine, and 0.074 g (0.0006 mol) of 4-methoxyphenol dissolved in 10.00 g of MBA was added and stirred at 90° C. for 4 hours. Subsequently, a solution of 24.34 g (0.160 mol) of THPHA dissolved in 30.00 g of MBA was added and stirred at 20° C. for 1 hour. Then, in a nitrogen atmosphere, stirring was performed at 150° C. for 5 hours to provide an acid-modified epoxy resin solution (AE-1). The resulting acid-modified epoxy resin had a Mw of 5,000, an acid equivalent of 540 g/mol, and a double bond equivalent of 430 g/mol.

The components used in Synthesis examples 1 to 15 are summarized in Table 1-1 to Table 1-8.

TABLE 1-1

| | | Monomer [molar ratio] | | | | | Structural unit derived from monomer having fluorine atom of all structural units [mol %] | Structural unit derived from monomer having fluorine atom of all structural units derived from carboxylic acid and derivative [mol %] | Structural unit derived from monomer having fluorine atom of all structural units derived from amine and derivative [mol %] | Acid equivalent [g/mol] |
|---|---|---|---|---|---|---|---|---|---|---|
| | Polymer | Tetracarboxylic acid and derivative thereof | | Diamine and derivative thereof | | End-capping agent | | | | |
| Synthesis example 1 | Polyimide (PI-1) | ODPA (100) | — | BAHF (85) | — | SiDA (5) | MAP (20) | 40.5 | 0.0 | 77.3 | 350 |
| Synthesis example 2 | Polyimide (PI-2) | ODPA (100) | — | BAHF (35) | Bis-A-AF (50) | SiDA (5) | MAP (20) | 16.7 | 0.0 | 31.8 | 270 |
| Synthesis example 3 | Polyimide (PI-3) | ODPA (60) | 6FDA (40) | BAHF (85) | — | SiDA (5) | MAP (20) | 59.5 | 40.0 | 77.3 | 380 |
| Synthesis example 4 | Polyimide (PI-4) | — | 6FDA (100) | BAHF (85) | — | SiDA (5) | MAP (20) | 88.1 | 100.0 | 77.3 | 420 |

TABLE 1-2

| | Polymer | Monomer [molar ratio] | | | | | Structural unit derived from monomer having fluorine atom of all structural units [mol %] | Structural unit derived from monomer having fluorine atom of all structural units derived from carboxylic acid and derivative [mol %] | Structural unit derived from monomer having fluorine atom of all structural units derived from amine and derivative [mol %] | Acid equivalent [g/mol] |
|---|---|---|---|---|---|---|---|---|---|---|
| | | Tetracarboxylic acid and derivative thereof | | Diamine and derivative thereof | | End-capping agent | | | | |
| Synthesis example 5 | Polyimide precursor (PIP-1) | — | 6FDA (100) | BAHF (40) | HFHA (30) | SiDA (5) | MAP (50) | 75.6 | 100.0 | 56.0 | 450 |
| Synthesis example 6 | Polyimide precursor (PIP-2) | ODPA (40) | 6FDA (60) | BAHF (40) | HFHA (30) | SiDA (5) | MAP (50) | 57.8 | 60.0 | 56.0 | 420 |

TABLE 1-3

| | Polymer | Monomer [molar ratio] | | | | Structural unit derived from monomer having fluorine atom of all structural units [mol %] | Structural unit derived from monomer having fluorine atom of all structural units derived from carboxylic acid and derivative [mol %] | Structural unit derived from monomer having fluorine atom of all structural units derived from amine and derivative [mol %] | Acid equivalent [g/mol] |
|---|---|---|---|---|---|---|---|---|---|
| | | Dicarboxylic acid and its derivative diformyl compound and its derivative | Bisaminophenol compound and its derivative dihydroxydiamine and its derivative | | End-capping agent | | | | |
| Synthesis example 7 | Poly-benzoxazole (PBO-1) | BFE (80) | BAHF (95) | SiDA (5) | NA (40) | 43.2 | 0.0 | 95.0 | 330 |

TABLE 1-4

| | Polymer | Monomer [molar ratio] | | | | Structural unit derived from monomer having fluorine atom of all structural units [mol %] | Structural unit derived from monomer having fluorine atom of all structural units derived from carboxylic acid and derivative [mol %] | Structural unit derived from monomer having fluorine atom of all structural units derived from amine and derivative [mol %] | Acid equivalent [g/mol] |
|---|---|---|---|---|---|---|---|---|---|
| | | Dicarboxylic acid and its derivative Diformyl compound and its derivative | Bisaminophenol compound and its derivative Dihydroxydiamine and its derivative | | End-capping agent | | | | |
| Synthesis example 8 | Poly-benzoxazole precursor (PBOP-1) | BFE (80) | BAHF (95) | SiDA (5) | NA (40) | 43.2 | 0.0 | 95.0 | 330 |

TABLE 1-5

| | Polymer | Monomer [mol %] | | | | | | Structural unit derived from organosilane having aromatic group in polysiloxane [mol %] | Acid equivalent [g/mol] | Double bond equivalent [g/mol] |
|---|---|---|---|---|---|---|---|---|---|---|
| | | Trifunctional organosilane | | | | Tetrafunctional organosilane Tetrafunctional organosilane oligomer | Difunctional organosilane Monofunctional organosilane | | | |
| Synthesis example 9 | Polysiloxane solution (PS-1) | MeTMS (35) | PhTMS (50) | TMSSucA (10) | — | TMOS (5) | — | 50.0 | 700 | — |
| Synthesis example 10 | Polysiloxane solution (PS-2) | MeTMS (20) | PhTMS (50) | TMSSucA (10) | AcrTMS (20) | — | — | 50.0 | 800 | 800 |

TABLE 1-5-continued

| | | Monomer [mol %] | | | | | Structural unit derived from organosilane having aromatic group in polysiloxane [mol %] | Acid equivalent [g/mol] | Double bond equivalent [g/mol] |
|---|---|---|---|---|---|---|---|---|---|
| | Polymer | Trifunctional organosilane | | | | Tetrafunctional organosilane Tetrafunctional organosilane oligomer | Difunctional organosilane Monofunctional organosilane | | | |
| Synthesis example 11 | Polysiloxane solution (PS-3) | MeTMS (10) | PhTMS (50) | TMSSucA (10) | AcrTMS (20) | — | DMeDMS (10) | 50.0 | 800 | 800 |

TABLE 1-6

| | Polymer | Monomer [molar ratio] | | | |
|---|---|---|---|---|---|
| | | Compound having two or more aromatic groups and hydroxyl group | Compound having two or more aromatic groups and epoxy group | Tetracarboxylic acid dianhydride Tetracarboxylic acid | End-capping agent |
| Synthesis example 12 | Polycyclic side chain-containing resin solution (CR-1) | BHPF (100) | — | ODPA (90) | PHA (20) |
| Synthesis example 13 | Polycyclic side chain-containing resin solution (CR-2) | — | BGPF (100) | ODPA (90) | PHA (20) |

| | Monomer [molar ratio] | | | | |
|---|---|---|---|---|---|
| | Unsaturated compound having ethylenically unsaturated double bond group and epoxy group | Unsaturated carboxylic acid having ethylenically unsaturated double bond group | Structural unit derived from monomer having aromatic group of all structural units derived from carboxylic acid and derivative [mol %] | Acid equivalent [g/mol] | Double bond equivalent [g/mol] |
| Synthesis example 12 | GMA (100) | — | 100.0 | 810 | 810 |
| Synthesis example 13 | — | MAA (200) | 100.0 | 470 | 470 |

TABLE 1-7

| | Polymer | Monomer [molar ratio] | | | | Structural unit derived from monomer having aromatic group of all structural units derived from copolymerization component [mol %] | Acid equivalent [g/mol] | Double bond equivalent [g/mol] |
|---|---|---|---|---|---|---|---|---|
| | | Copolymerization component having acidic group | Copolymerization component having aromatic group | Copolymerization component having alicyclic group | Unsaturated compound having ethylenically unsaturated double bond group and epoxy group | | | |
| Synthesis example 14 | Acrylic resin solution (AC-1) | MAA (50) | STR (30) | TCDM (20) | GMA (20) | 30.0 | 490 | 740 |

TABLE 1-8

| | | Monomer [mass, mol, and molar ratio] | | | | |
|---|---|---|---|---|---|---|
| | Polymer | Compound having aromatic groups and epoxy group | Dicarboxylic acid anhydride Dicarboxylic acid | Unsaturated carboxylic acid having ethylenically unsaturated double bond group | Acid equivalent [g/mol] | Double bond equivalent [g/mol] |
| Synthesis example 15 | Acid-modified epoxy resin (AE-1) | NC-7000L (epoxy equivalent: 230 g/mol) 46.00 g (based on epoxy group: 0.2 mol) (molar ratio based on epoxy group: 100) | THPHA 24.34 g (0.16 mol) (molar ratio: 80) | MAA 17.22 g (0.20 mol) (molar ratio: 100) | 540 | 430 |

Covering Example 1 Synthesis of Surface-Coated Benzofuranone Based Black Pigment (Bk-CBF 1)

As a black pigment, 150 g of a benzofuranone based black pigment Bk-S0100CF (surface untreated product; pH 4.5 on the pigment surface) was charged into a glass container containing 2,850 g of deionized water to be stirred with a dissolver, and thus to obtain an aqueous pigment suspension. This aqueous pigment suspension was sucked up with a tube pump and sent into a horizontal bead mill filled with 0.4 mmφ zirconia beads ("TORAYCERAM" (registered trademark); manufactured by Toray Industries, Inc.) to perform two pass dispersion treatment, and then the whole amount was discharged into an original glass container and again stirred with a dissolver. A pH meter was set such that its tip electrode portion was immersed in the glass container at a depth of 3 to 5 cm from a liquid surface of the aqueous pigment suspension being stirred, and the pH of the obtained aqueous pigment suspension was measured. As a result of the measurement, it showed a pH of 4.5 (liquid temperature 25° C.). Thereafter, while stirring, the liquid temperature of the aqueous pigment suspension was raised to 60° C., stirring was stopped once after 30 minutes, after 2 minutes it was confirmed that no sedimentary deposits were present at the bottom of the glass container, and stirring was performed again.

A liquid prepared by diluting an aqueous solution of sodium silicate ($Na_2O \cdot nSiO_2 \cdot mH_2O$; 30 mass % as sodium oxide, 10 mass % as silicon dioxide) 100 times with deionized water and 0.001 mol/L of sulfuric acid were added in parallel to the aqueous pigment suspension so that the covering amount of silica was 10.0 parts by mass in terms of $SiO_2$ equivalent relative to 100 parts by mass of the black pigment while adjusting their addition rates so that the pH was maintained in the range of 2 or more and less than 7, and silica was precipitated on the surface of the black pigment particles and covered. Subsequently, a liquid prepared by diluting an aqueous solution of sodium aluminate ($Na_2O \cdot nAl_2O_3 \cdot mH_2O$; 40 mass % as sodium oxide, 50 mass % as alumina) 100 times with deionized water and 0.001 mol/L of sulfuric acid were added in parallel to the aqueous pigment suspension so that the covering amount of alumina was 2.0 parts by mass in terms of $Al_2O_3$ equivalent relative to 100 parts by mass of the black pigment while adjusting their addition rates so that the pH was maintained in the range of 2 or more and less than 7, and alumina was precipitated on the surface of the silica covering layer and covered. Subsequently, filtration and water washing operations were repeated three times to remove a portion of water-soluble impurities in the aqueous pigment suspension, and the solution was sent into a horizontal bead mill filled with 0.4 mmφ zirconia beads and subjected to one-pass dispersion treatment. In addition, in order to remove ionic impurities, 10 g of each cation exchange resin and anion exchange resin (Amberlite; manufactured by Organo Corporation) were added to the aqueous pigment suspension, stirred for 12 hours, and filtered to obtain a black filtrate. This black filtrate was dried in a drying oven at 90° C. for 6 hours and in a drying oven at 200° C. for 30 minutes and then size controlled by a dry pulverization treatment using a jet mill to obtain a surface-coated benzofuranone based black pigment (Bk-CBF1).

As a result of time-of-flight secondary ion mass spectrometry and analysis by X-ray diffraction method, the covering amounts of silica and alumina of the surface-coated benzofuranone based black pigment (Bk-CBF1) obtained were 10.0 parts by mass in terms of $SiO_2$ equivalent and 2.0 parts by mass in terms of $Al_2O_3$ equivalent, respectively, relative to 100 parts by mass of the black pigment, and the average coverage of the covering layer to the pigment was 97.5%.

Preparation Example 1 Preparation of Pigment Dispersion Liquid (Bk-1)

First, 34.5 g of S-20000 used as dispersant, 782.0 g of MBA as solvent, and 103.5 g of Bk-S0100CF as coloring agent were weighed, mixed, and stirred for 20 minutes in a high speed disperser (Homodisper, Model 2.5, manufactured by PRIMIX Corporation) to provide a preliminary dispersion liquid. In Ultra Apex Mill (UAM-015, manufactured by Kotobuki Industry Co., Ltd.) equipped with a centrifugal separator filled to 75% with zirconia crushing balls with a diameter of 0.30 mmφ (YTZ, manufactured by Tosoh Corporation) as ceramic beads for pigment dispersion, the preliminary dispersion liquid obtained above was fed and treated for 3 hours at a rotor's circumferential speed of 7.0 m/s to provide a pigment dispersion liquid (Bk-1) with a solid content of 15 mass % and a coloring agent/dispersant ratio of 75/25 (by weight). The pigment in the resulting pigment dispersion liquid had a number average particle diameter of 100 nm.

Preparation Example 2 Preparation of Pigment Dispersion Liquid (Bk-2)

First, 92.0 g of the 30 mass % polyimide (PI-1) solution in MBA prepared in Synthesis example 1, used as resin, 27.6 g of S-20000 as dispersant, 717.6 g of MBA as solvent, and 82.8 g of Bk-S0100CF as coloring agent were weighed, mixed, and stirred for 20 minutes in a high speed disperser (Homodisper, Model 2.5, manufactured by PRIMIX Corporation) to provide a preliminary dispersion liquid. In Ultra Apex Mill (UAM-015, manufactured by Kotobuki Industry Co., Ltd.) equipped with a centrifugal separator filled to 75% with zirconia crushing balls with a diameter of 0.30 mmφ (YTZ, manufactured by Tosoh Corporation) as ceramic beads for pigment dispersion, the preliminary dispersion liquid obtained above was fed and treated for 3 hours at a rotor's circumferential speed of 7.0 m/s to provide a pigment dispersion liquid (Bk-2) with a solid content of 15 mass % and a coloring agent/resin/dispersant ratio of 60/20/20 (by weight). The pigment in the resulting pigment dispersion liquid had a number average particle diameter of 100 nm.

Preparation Examples 3 to 10 Preparation of Pigment Dispersion Liquid (Bk-3) to Pigment Dispersion Liquid (Bk-10)

According to the types of coloring agent, the first resin (A1), and the dispersant (E) and their ratios given in Table 2-1, pigments were dispersed as described in Preparation example 2 to prepare a pigment dispersion liquid (Bk-3) to a pigment dispersion liquid (Bk-10).

The components used in Preparation examples 1 to 10 are summarized in Table 2-1.

TABLE 2-1

| | | Composition [mass %] | | | | | Number average particle diameter of pigment in pigment dispersion liquid [nm] |
|---|---|---|---|---|---|---|---|
| | Dispersion liquid | Coloring agent | | | First resin (A1) | Dispersant (E) | |
| Preparation example 1 | Pigment dispersion liquid (Bk-1) | Bk-S0100CF (75) | — | — | — | S-20000 (25) | 100 |
| Preparation example 2 | Pigment dispersion liquid (Bk-2) | Bk-S0100CF (60) | — | — | Polyimide (PI-1) (20) | S-20000 (20) | 100 |
| Preparation example 3 | Pigment dispersion liquid (Bk-3) | Bk-S0100CF (65) | — | — | Polyimide (PI-1) (25) | S-20000 (10) | 120 |
| Preparation example 4 | Pigment dispersion liquid (Bk-4) | Bk-S0084 (60) | — | — | Polyimide (PI-1) (20) | D.BYK-167 (20) | 120 |
| Preparation example 5 | Pigment dispersion liquid (Bk-5) | Bk-A1103 (60) | — | — | Polyimide (PI-1) (20) | D.BYK-167 (20) | 120 |
| Preparation example 6 | Pigment dispersion liquid (Bk-6) | TPK-1227 (60) | — | — | Polyimide (PI-1) (20) | D.BYK-167 (20) | 120 |
| Preparation example 7 | Pigment dispersion liquid (Bk-7) | P.R.254 (21) | P.Y.139 (9) | P.B.15:6 (30) | Polyimide (PI-1) (20) | D.BYK-167 (20) | 110 |
| Preparation example 8 | Pigment dispersion liquid (Bk-8) | P.V.23 (30) | P.Y.139 (30) | — | Polyimide (PI-1) (20) | D.BYK-167 (20) | 110 |
| Preparation example 9 | Pigment dispersion liquid (Bk-9) | Bk-CBF1 (75) | — | — | — | S-20000 (25) | 100 |
| Preparation example 10 | Pigment dispersion liquid (Bk-10) | Bk-CBF1 (60) | — | — | Polyimide (PI-1) (20) | S-20000 (20) | 100 |

A list and physical property values of the radical-polymerizable compound (B), the flexible chain-containing radical-polymerizable compound (B1), and the flexible chain-containing bifunctional radical-polymerizable compound (B2) used in the respective Examples and Comparative Examples are summarized in Table 2-2.

TABLE 2-2

| | | Physical property value of radical-polymerizable compound (B) | | | | |
|---|---|---|---|---|---|---|
| Radical-polymerizable compound (B) | Structure derived from compound having hydroxyl groups in molecule | Number of ethylenically unsaturated double bond groups | Aliphatic chain (structure of aliphatic chain) | Average molecular weight of aliphatic chain | Molecular weight | Double bond equivalent [g/mol] |
| 1 DPHA | Structure derived from dipenta erythritol | 6 | — | — | 578.56 | 96 |
| 2 DPCA-20 | Structure derived from dipenta erythritol | 6 | 2 ε-caprolactone modified chains (oxypentylene carbonyl structure) | 114.14 | 806.85 | 134 |
| 3 DPCA-30 | Structure derived from dipenta erythritol | 6 | 3 ε-caprolactone modified chains (oxypentylene carbonyl structure) | 114.14 | 920.99 | 153 |
| 4 DPCA-60 | Structure derived from dipenta erythritol | 6 | 6 ε-caprolactone modified chains (oxypentylene carbonyl structure) | 114.14 | 1263.42 | 211 |
| 5 DPCA-120 | Structure derived from dipenta erythritol | 6 | 6 × 2 ε-caprolactone modified chains (oxypentylene carbonyl structure) | 228.28 | 1948.27 | 325 |
| 6 A-DPH-6E | Structure derived from dipenta erythritol | 6 | 6 ethylene oxide modified chains (oxyethylene structure) | 44.05 | 842.88 | 140 |
| 7 A-DPH-12E | Structure derived from dipenta erythritol | 6 | 6 × 2 ethylene oxide modified chains (oxyethylene structure) | 88.11 | 1107.19 | 185 |
| 8 A-DPH-6P | Structure derived from dipenta erythritol | 6 | 6 propylene oxide modified chains (oxypropylene structure) | 73.11 | 927.04 | 155 |
| 9 ATM-4CL | Structure derived from pentaerythritol | 4 | 4 ε-caprolactone modified chains (oxypentylene carbonyl structure) | 114.14 | 808.91 | 202 |
| 10 ATM-8CL | Structure derived from pentaerythritol | 4 | 4 × 2 ε-caprolactone modified chains (oxypentylene carbonyl structure) | 228.28 | 1265.48 | 316 |
| 11 ATM-4VL | Structure derived from pentaerythritol | 4 | 4 δ-valerolactone modified chains (oxybutylene carbonyl structure) | 100.12 | 752.80 | 188 |
| 12 AD-TMP-4CL | Structure derived from ditrimethylolpropane | 4 | 4 ε-caprolactone modified chains (oxypentylene carbonyl structure) | 114.14 | 923.09 | 231 |
| 13 A-9300-3CL | Structure derived from 1,3,5-tris(hydroxyethyl) isocyanurate | 3 | 3 ε-caprolactone modified chains (oxypentylene carbonyl structure) | 114.14 | 765.80 | 255 |
| 14 5CPL-1 | Structure derived from dipenta erythritol | 5 | 5 ε-caprolactone modified chains (oxypentylene carbonyl structure) | 114.14 | 1095.23 | 219 |
| 15 HX-220 | Structure derived from hydroxypivalic acid neopentyl glycol | 2 | 2 ε-caprolactone modified chains (oxypentylene carbonyl structure) | 114.14 | 540.64 | 270 |

The structure of 5CPL-1 (ε-caprolactone modified dipentaerythritol pentaacrylate having five oxypentylene carbonyl structures in the molecule) is shown below.

[Chemical formula 34]

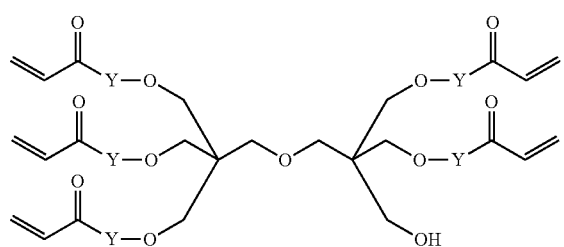

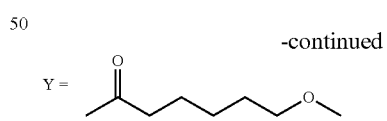

Structural units of ZXR-1816H (manufactured by Nippon Kayaku Co., Ltd.; acid-modified epoxy resin having ethylenically unsaturated double bond group and carboxy group) and acid-modified epoxy resin (AE-1) obtained in Synthesis Example 15 are shown below. ZXR-1816H has a structural unit as represented by general formula (37a). The acid-modified epoxy resin (AE-1) has a structural unit as represented by general formula (38a).

[Chemical Formula 35]

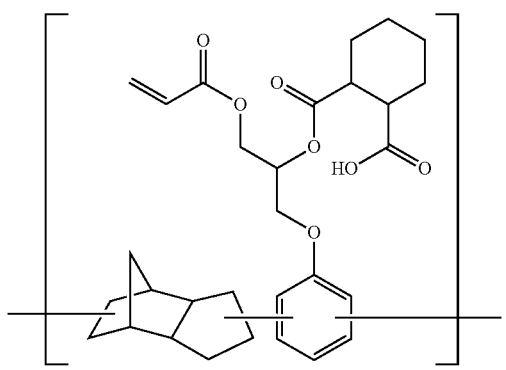

(37a)

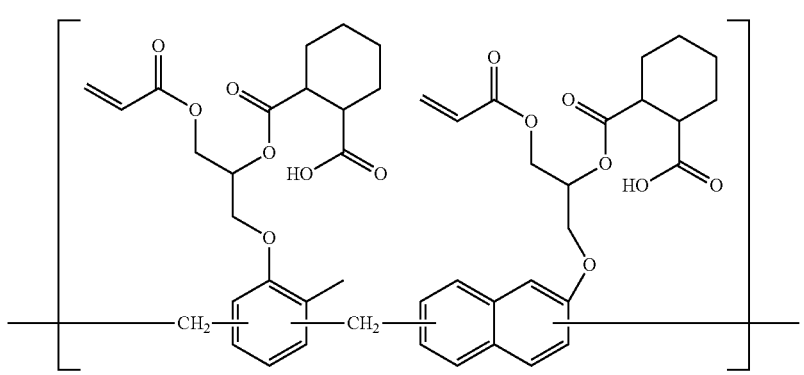

(38a)

The evaluation methods used for each Example and Comparative example are described below.

(1) Weight Average Molecular Weight of Resin

Using a GPC analysis apparatus (HLC-8220, manufactured by Tosoh Corporation) containing tetrahydrofuran or NMP as fluidized bed, the polystyrene based weight average molecular weight was determined according to JIS K7252-3 (2008) from measurements taken near room temperature.

(2) Acid Value and Acid Equivalent

Using an automatic potentiometric titration apparatus (AT-510; manufactured by Kyoto Electronics Manufacturing Co., Ltd.) with a 0.1 mol/L sodium hydroxide/ethanol solution as titration reagent and a 1/1 (by weight) xylene/N,N-dimethyl formamide mixture as titration solvent, the acid value (in mgKOH/g) was determined by potentiometric titration according to JIS K2501 (2003). From the measured acid value, the acid equivalent (in g/mol) was calculated.

(3) Double Bond Equivalent

Using an automatic potentiometric titration apparatus (AT-510; manufactured by Kyoto Electronics Manufacturing Co., Ltd.) with an iodine monochloride solution (mixed solution of 7.9 g of iodine trichloride, 8.9 g of iodine, and 1,000 mL of acetic acid) as iodine supply source, 100 g/L of an aqueous potassium iodide solution as aqueous solution for capturing unreacted iodine, and 0.1 mol/L of an aqueous sodium thiosulfate solution as titration reagent, the iodine value of resin was determined by the Wijs method according to Item 6 "Iodine Value" of JIS K0070 (1992) "Test Method for Acid Value, Saponification Value, Ester Value, Iodine Value, Hydroxyl Value, and Unsaponifiable Components of Chemical Products". From the measured iodine value (in gI/100 g), the double bond equivalent (in g/mol) was calculated.

(4) Contents Various Organosilane Units in Polysiloxane

After performing $^{29}$Si-NMR measurement, the proportion of the integrated value of Si atoms attributed to a specific organosilane unit to the integrated value of Si atoms attributed to all organosilane units was calculated to determine its content. The specimen (liquid) for measurement was put in a Teflon (registered trademark) NMR sample tube with a diameter of 10 mm. The measuring conditions for $^{29}$Si-NMR were as described below.

Apparatus: magnetic nuclear resonance apparatus (JNM-GX270; manufactured by JEOL Ltd.)
Measuring method: gated decoupling
Nuclear frequency: 53.6693 MHz ($^{29}$Si nucleus)
Spectral band width: 20,000 Hz
Pulse width: 12 μs (45° pulse)
Pulse repeating time: 30.0 seconds
Solvent: acetone-d6
Reference substance: tetramethyl silane
Measuring temperature: 23° C.
Specimen rotating speed: 0.0 Hz (5) Average Coverage of Covering Layer to Pigment A two-component room temperature-curable acrylic transparent resin (Techovit 4006; manufactured by Heraeus Kulzer Gmbh) was impregnated with the surface-coated benzofuranone based black pigment (Bk-CBF1) obtained in Covering example 1 and allowed to stand at 25° C. for 3 hours, to be reacted and cured, and thus to obtain an observation sample. The observation sample was roughly mechanically polished using diamond abrasive paper, and then a smooth cross section was formed on a portion of the observation sample by argon ion beam polishing using an ion milling apparatus (IM 4000; manufactured by Hitachi High-Technologies Corporation). Using a transmission electron microscope (H9500; manufactured by Hitachi High-Technologies Corporation), the cross section was observed under conditions of an accelerating voltage of 300 kV with an enlarging magnification of 100,000 times, and the lightness and contrast of a display monitor were adjusted so that the outer periphery of particles of the black pigment could be recognized as a contrast difference, thus obtaining an image of the cross section. With respect to imaging of 100 black pigment particles randomly selected, the coverage M (%) of each black pigment was obtained by the following formula to calculate the number average value, whereby an average coverage N (%) of the black pigment was obtained.

With respect to the black pigment in which an interface with the air was observed in the outer periphery of the particles of the black pigment, the embedded resin was not sufficiently immersed during the preparation of the observation sample, and a case where the coverage was reduced due to chipping of a portion of the covering layer during polishing was included; therefore, the black pigment was excluded from the target for calculation of the average coverage N (%).

$$\text{Coverage } M(\%) = \{L1/(L1+L2)\} \times 100$$

L1: Total length (nm) of a portion covered with the covering layer in the outer periphery of the particle.

L2: Total length (nm) of a portion not covered with the covering layer (portion where an interface and the embedding resin are in direct contact with each other) in the outer periphery of the particle.

L1+L2: Outer peripheral length (nm) of the nucleus.

(6) Number Average Particle Diameter of Pigment

A zeta potential/particle diameter/molecular weight measuring apparatus (Zetasizer Nano ZS, manufactured by Sysmex Corporation) was used, and a pigment dispersion liquid was diluted with PGMEA used as dilution solvent to a concentration of $1.0 \times 10^{-5}$ to 40 vol %. Adopting the refractive index of the PGMEA as that of dilution solvent and 1.8 as the refractive index of the specimen, laser beam with a wavelength of 633 nm was applied to determine the number average particle diameter of the pigment in the pigment dispersion liquid.

(7) Pre-Treatment of Substrate

The glass substrate used (manufactured by Geomatec Co., Ltd.; hereinafter referred to as ITO/Ag substrate) consists mainly of a 10 nm film of APC (silver/palladium/copper=98.07/0.87/1.06 (by weight)) formed by sputtering on a glass plate and a 100 nm film of ITO formed by sputtering on the APC layer, and it was cleaned before use by subjecting it to UV-$O_3$ cleaning treatment for 100 seconds using a desktop type optical surface treatment apparatus (PL16-110; Sen Lights Co., Ltd.). An Si wafer (made by Electronics and Materials Corporation) was subjected to a dehydration bake process by heating at 130° C. for 2 minutes through the use of a hot plate (HP-1SA, made by As One Corporation) and then was used.

(8) Film Thickness Measurement

A surface roughness/contour form measuring machine (SURFCOM 1400D, manufactured by Tokyo Seimitsu Co., Ltd.) was used to measure the film thickness of a prebaked specimen, a developed specimen, and a heat-cured specimen under the measuring conditions of a magnification of 10,000 times, a measuring length of 1.0 mm, and a measuring speed of 0.30 mm/s.

(9) Sensitivity

According to the method described in Example 1 given below, a double side alignment type single side aligner (Mask Aligner PEM-6M; manufactured by Union Optical Co., Ltd.) was used to perform patterning exposure to i-line (wavelength 365 nm), h-line (wavelength 405 nm), or g-line (wavelength 436 nm) beam from an ultrahigh pressure mercury lamp through a gray scale mask (MDRM MODEL 4000-5-FS; manufactured by Opto-Line International) designed for sensitivity measurement, followed by development using a small development apparatus for photolithography (AD-2000; manufactured by Takizawa Sangyo Co., Ltd.) to prepare a developed film of the composition.

The resolution pattern on the developed film prepared above was observed by a FPD/LSI inspection microscope (OPTIPHOT-300; manufactured by Nicon Corporation) and the light exposure (as measured by i-line illuminance meter) required to form a 20 µm line-and-space pattern with a 1 to 1 width ratio was measured to represent the sensitivity. Evaluations were made according to the criteria given below, and samples rated as A+, A, B, or C, which had a sensitivity of 90 mJ/cm$^2$ or less, were judged as acceptable. Those rated as A+, A, or B, which had a sensitivity of 60 mJ/cm$^2$ or less, were judged as having a good sensitivity and those rated as A+ or A, which had a sensitivity of 45 mJ/cm$^2$ or less, were judged as having an excellent sensitivity.

A+: sensitivity of 1 to 30 mJ/cm$^2$
A: sensitivity of 31 to 45 mJ/cm$^2$
B: sensitivity of 46 to 60 mJ/cm$^2$
C: sensitivity of 61 to 90 mJ/cm$^2$
D: sensitivity of 91 to 150 mJ/cm$^2$
E: sensitivity of 151 to 500 mJ/cm$^2$

(10) Development Residue

According to the method described in Example 1 given below, a double side alignment type single side aligner (Mask Aligner PEM-6M; manufactured by Union Optical Co., Ltd.) was used to perform patterning exposure to i-line (wavelength 365 nm), h-line (wavelength 405 nm), or g-line (wavelength 436 nm) beam from an ultrahigh pressure mercury lamp through a gray scale mask (MDRM MODEL 4000-5-FS; manufactured by Opto-Line International) designed for sensitivity measurement, followed by development using a small development apparatus for photolithography (AD-2000; manufactured by Takizawa Sangyo Co., Ltd.) and heating in a high temperature inert gas oven (INH-9CD-S; manufactured by Koyo Thermo Systems Co., Ltd.) to prepare a cured film of the composition.

The resolution pattern on the cured film prepared above was observed using a FPD/LSI inspection microscope (OPTIPHOT-300; manufactured by Nicon Corporation), and presence of residues caused by the pigment at an opening of a 20 µm line-and-space pattern was observed. Determination was made as indicated below, and A+, A, and B, in which the area where residues were present at the opening was 10% or less, were considered as passing, and A+ and A, in which the area where residues were present at the opening was 5% or less, were considered as good in development residues, and A+, in which there was no area where residues were present at the opening, was considered as excellent in development residues.

A+: no residue at the opening
A: the area where residues were present at the opening of 1 to 5%
B: the area where residues were present at the opening of 6 to 10%
C: the area where residues were present at the opening of 11 to 30%
D: the area where residues were present at the opening of 31 to 50%
E: the area where residues were present at the opening of 51 to 100%.

(11) Cross-Sectional Shape of Pattern

According to the method described in Example 1 given below, a double side alignment type single side aligner (Mask Aligner PEM-6M; manufactured by Union Optical Co., Ltd.) was used to perform patterning exposure to i-line (wavelength 365 nm), h-line (wavelength 405 nm), or g-line (wavelength 436 nm) beam from an ultrahigh pressure mercury lamp through a gray scale mask (MDRM MODEL 4000-5-FS; manufactured by Opto-Line International) designed for sensitivity measurement, followed by development using a small development apparatus for photolithography (AD-2000; manufactured by Takizawa Sangyo Co., Ltd.) and heating in a high temperature inert gas oven (INH-9CD-S; manufactured by Koyo Thermo Systems Co., Ltd.) to prepare a cured film of the composition.

From the resolution patterns of the cured films prepared, line-and-space patterns with a space width of 20 μm were selected and their cross sections were observed by a field emission-type scanning electron microscope (S-4800, manufactured by Hitachi High-Technologies Corporation) to measure the taper angle of each cross section.

Determination was made as indicated below, and A+, A, and B, in which the taper angle of the sectional surface was 60° or less, were considered as passing, and A+ and A, in which the taper angle of the sectional surface was 45° or less, were considered as good in pattern shape, and A+, in which the taper angle of the sectional surface was 30° or less, was considered as excellent in pattern shape.

A+: cross section having a taper angle of 1° to 30°
A: cross section having a taper angle of 31° to 45°
B: cross section having a taper angle of 46° to 60°
C: cross section having a taper angle of 61° to 70°
D: cross section having a taper angle of 71° to 80°
E: cross section having a taper angle of 81° to 179°

(12) Heat Resistance (High Temperature Weight Residue Ratio)

According to the method described in Example 1 given below, a cured film of the composition was prepared using a high temperature inert gas oven (INH-9CD-S; manufactured by Koyo Thermo Systems Co., Ltd.).

After being thermoset, the cured film created was scraped off from the substrate, and then, about 10 mg of the film was placed in an aluminum cell. Using a thermogravimetry apparatus (TGA-50, made by Shimadzu Corporation), this aluminum cell was subjected to thermogravimetric analysis by keeping the aluminum cell at 30° C. in a nitrogen atmosphere for 10 minutes, heating it to 150° C. at a temperature increase speed of 10° C./min, and then keeping it at 150° C. for 30 minutes, and further heating it to 500° C. at a temperature increase speed of 10° C./min. With respect to the weight subsequent to the heating at 150° C. for 30 minutes being 100 mass %, the weight residual ratio at 350° C. subsequent to further heating was denoted by ($M_a$) mass % and the weight residual ratio at 400° C. was denoted by ($M_b$) mass %, and a high temperature weight residue ratio difference (($M_a$)−($M_b$)) was calculated as an indicator of heat resistance.

Determination was made as indicated below, and A+, A, and B, in which the high temperature weight residue ratio difference was 25.0 mass % or less, were considered as passing, A+ and A, in which the high temperature weight residue ratio difference was 15.0% or less, were considered as good in heat resistance, and A+, in which the high temperature weight residue ratio difference was 5.0% or less, was considered as excellent in heat resistance.

A+: high temperature weight residue ratio difference being 0 to 5.0%.

A: high temperature weight residual rate difference being 5.1 to 15.0%
B: high temperature weight residual rate difference being 15.1 to 25.0%
C: high temperature weight residual rate difference being 25.1 to 35.0%
D: high temperature weight residual rate difference being 35.1 to 45.0%
E: high temperature weight residual rate difference being 45.1 to 100%.

(13) Light Blocking Capability (Optical Density (Hereinafter OD))

According to the method described in Example 1 given below, a cured film of the composition was prepared using a high temperature inert gas oven (INH-9CD-S; manufactured by Koyo Thermo Systems Co., Ltd.).

A transmission densitometer (X-Rite 361T (V); manufactured by X-Rite) was used to measure the incident light intensity ($I_0$) and penetrated light intensity (I) for the cured film prepared above. As an indicator of the light blocking capability, the OD value was calculated by the equation given below.

$$OD\ value = \log_{10}(I_0/I)$$

(14) Insulation Properties (Surface Resistivity)

According to the method described in Example 1 given below, a double side alignment type single side aligner (Mask Aligner PEM-6M; manufactured by Union Optical Co., Ltd.) was used to perform patterning exposure to i-line (wavelength 365 nm), h-line (wavelength 405 nm), or g-line (wavelength 436 nm) beam from an ultrahigh pressure mercury lamp through a gray scale mask (MDRM MODEL 4000-5-FS; manufactured by Opto-Line International) designed for sensitivity measurement, followed by development using a small development apparatus for photolithography (AD-2000; manufactured by Takizawa Sangyo Co., Ltd.) and heating in a high temperature inert gas oven (INH-9CD-S; manufactured by Koyo Thermo Systems Co., Ltd.) to prepare a cured film of the negative-type photosensitive resin composition.

The surface resistivity (Ω/□) of the prepared cured film was measured using a high resistance meter ("Hiresta" UP; manufactured by Mitsubishi Chemical Corporation).

(15) Luminescence Characteristics of Organic EL Display Device (Production Method for Organic EL Display Device)

Figure 3:
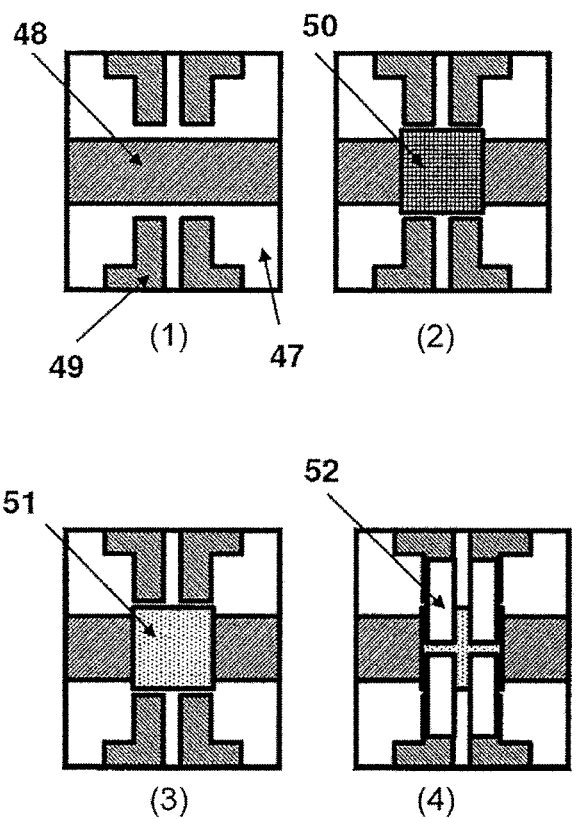
FIGS. 3(1) to (4) are schematic diagrams of an organic EL display device used for light emission characteristic evaluation.

FIGS. 3 (1) to (4) show schematic views of the substrates used. First, an ITO transparent conductive coating film of 10 nm was formed by sputtering over the entire surface of a non-alkali glass substrate 47 with a size of 38 mm×46 mm and etched to produce a first electrode 48, thus forming a transparent electrode. An auxiliary electrode 49 was formed simultaneously to produce a second electrode (FIG. 3 (1)). The resulting substrate was subjected to ultrasonic cleaning for 10 minutes using Semico Clean (registered trademark) 56 (manufactured by Furuuchi Chemical Corporation) and then rinsed with ultrapure water. Then, the negative-type photosensitive resin composition was spread on this substrate and prebaked by the method described in Example 1, followed by patterning exposure through a photomask having a predetermined pattern, development, rinsing, heating, and heat-curing. In this way, an insulation layer 50 having openings with a width of 70 μm and a length of 260 μm aligned at intervals of 155 μm in the width direction and 465 μm in the length of direction, each opening exposing the first electrode, was formed in a limited effective area of the substrate (FIG. 3 (2)). These openings would finally form light emitting pixels of an organic EL display device. The limited effective area of the substrate had a size of 16 mm×16 mm and the insulation layer 50 had a thickness of about 1.0 μm.

Then, an organic EL display device was produced using the substrate having a first electrode 48, auxiliary electrode 49, and insulation layer 50 formed thereon. After carrying out nitrogen plasma treatment as pre-treatment, an organic EL layer 51 that included a light emitting layer was formed by vacuum deposition (FIG. 3 (3)). Here, the degree of vacuum used for deposition was $1\times10^{-3}$ Pa or less and the substrate was rotated relative to the deposition source during deposition. First, a compound (HT-1) was deposited to a thickness of 10 nm to form a hole injection layer and a compound (HT-2) was deposited to a thickness of 50 nm to form a hole transport layer. Subsequently, a compound (GH-1) and a compound (GD-1) were deposited as host material and dopant material, respectively, on the light emitting layer to a thickness of 40 nm to ensure a doping concentration of 10%. Then, a 40 nm thick layer of compounds (ET-1) and (LiQ) combined at a volume ratio of 1:1, adopted as electron transport materials, was formed thereon. The structures of the compounds used in the organic EL layer are shown blow.

[Chemical formula 36]

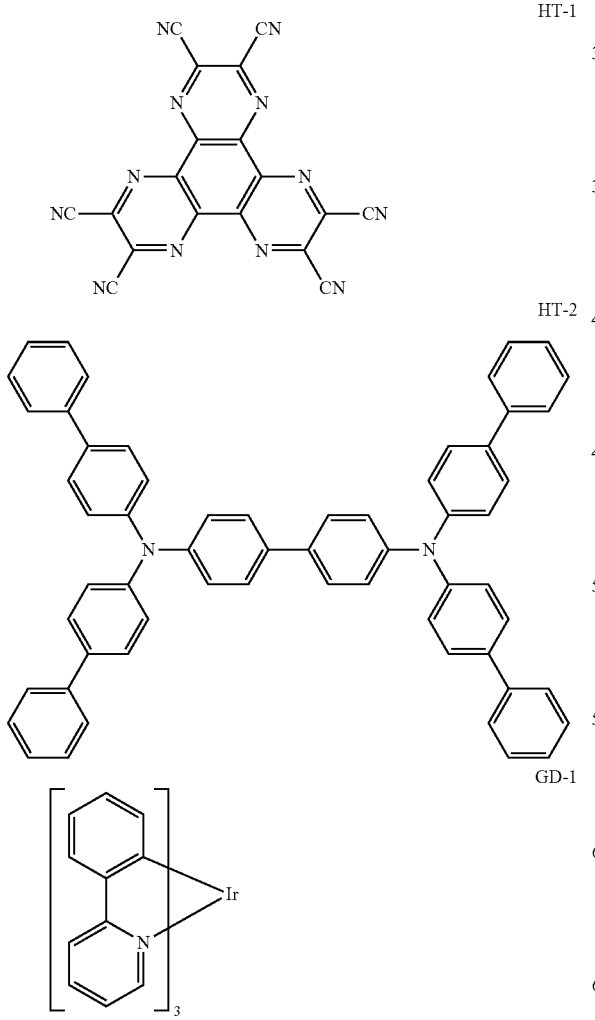

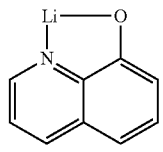

LiQ

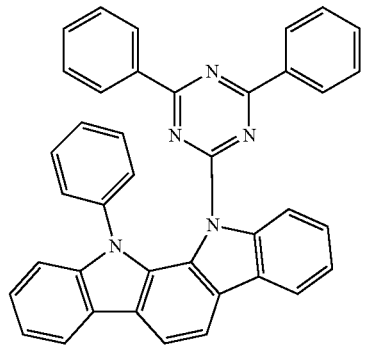

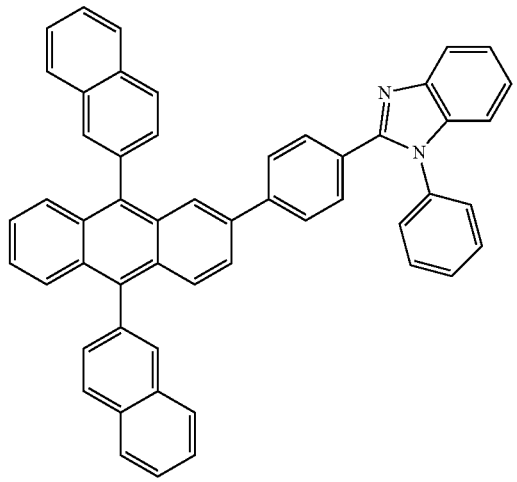

Then, a compound (LiQ) was deposited to a thickness of 2 nm and MgAg was deposited at a volume ratio of 10:1 to a thickness of 100 nm to form a second electrode 52, thereby providing a reflecting electrode (FIG. 3 (4)). Subsequently, in a low-humidity nitrogen atmosphere, a cap-shaped glass plate was adhered with an epoxy resin based adhesion agent to ensure sealing, thus producing four 5 mm×5 mm bottom emission type organic EL display devices on one substrate. The film thickness referred to here is the reading on a crystal oscillation type film thickness monitor.

(Evaluation of Luminescence Characteristics)

The organic EL display devices prepared by the above procedure were caused to emit light by driving it with a direct current of 10 mA/cm² and observed to check for light emission defects such as non-luminescent regions and uneven brightness. The organic EL display devices produced above were held at 80° C. for 500 hours as durability test. After the durability test, the organic EL display devices were caused to emit light by driving it with a direct current of 10 mA/cm² and observed to check for changes in luminescence characteristics such as luminescent regions and uneven brightness. Determination was made as indicated below, and when the area of the luminescent region before a durability test was 100%, A+, A, and B, in which the area of the luminescent region was 80% or more after the durability test, were considered as passing, A+ and A, in which the area of the luminescent region was 90% or more, were considered as good in luminescence characteristics, and A+, in which the area of the luminescent region was 95% or more, was considered as excellent in luminescence characteristics.

A+: the area of the luminescent region after the durability test of 95 to 100%

A: the area of the luminescent region after the durability test of 90 to 94%

B: the area of the luminescent region after the durability test of 80 to 89%

C: the area of the luminescent region after the durability test of 70 to 79%

D: the area of the luminescent region after the durability test of 50 to 69%

E: the area of the luminescent region after the durability test of 0 to 49%

Example 1

Under yellow light, 0.341 g of NCI-831 was weighed out, and 12.730 g of MBA was added, followed by stirring to ensure dissolution. Then, 6.157 g of a 30 mass % solution of the polyimide (PI-1) obtained in Synthesis example 1 in MBA, 1.421 g of a 50 mass % solution of DPCA-60 in MBA, and 0.568 g of a 50 mass % solution of DPHA in MBA were added and stirred to provide a preparation liquid as a uniform solution. Then, 7.319 g of the pigment dispersion liquid (Bk-1) obtained in Preparation example 1 was weighed out and 17.681 g of the preparation liquid obtained above was added and stirred to provide a uniform solution. Subsequently, the resulting solution was filtered through a filter with a pore size of 0.45 μmφ to prepare a composition 1.

The composition 1 prepared was spread on an ITO/Ag substrate by spin coating using a spin coater (MS-A100; manufactured by Mikasa Co., Ltd.) at an appropriate rotating speed and prebaked on a buzzer hot plate (HPD-3000BZN; manufactured by As One Corporation) at 110° C. for 120 seconds to produce a prebaked film with a thickness of about 1.8 μm.

The prebaked film produced was subjected to spray development with a 2.38 mass % aqueous TMAH solution by a small development apparatus for photolithography (AD-2000; manufactured by Takizawa Sangyo Co., Ltd.), and the time period (breaking point; hereinafter referred to as B. P.) required for complete dissolution of the prebaked film (unexposed parts) was measured.

A prebaked film was prepared by the same procedure as above, and then a double side alignment type single side aligner (Mask Aligner PEM-6M; manufactured by Union Optical Co., Ltd.) was used to apply i-line (wavelength 365 nm), K-line (wavelength 405 nm), or g-line (wavelength 436 nm) beam from an ultrahigh pressure mercury lamp to the resulting prebaked film through a gray scale mask designed for sensitivity measurement (MDRM MODEL 4000-5-FS; manufactured by Opto-Line International) to carry out patterning exposure. After the light exposure, a small development apparatus for photolithography (AD-2000; manufactured by Takizawa Sangyo Co., Ltd.) was used to perform development with a 2.38 mass % aqueous TMAH solution, followed rinsing with water for 30 seconds. The development time was 1.5 times the B. P.

After the development, a high temperature inert gas oven (INH-9CD-S; manufactured by Koyo Thermo Systems Co., Ltd.) was used to perform heat-curing at 250° C. to produce a cured film with a film thickness of about 1.2 μm. Regarding the heat-curing conditions, the film was heat-cured in a nitrogen atmosphere at 250° C. for 60 minutes.

Examples 2 to 61 and Comparative Examples 1 to 6

In the same manner as in Example 1, compositions 2 to 67 were prepared with the compositions given in Tables 3-1 to 11-1. Using each of the compositions obtained, a film of the composition was formed on a substrate and evaluated for photosensitive characteristics and cured film characteristics as in Example 1. The evaluation results of these are summarized in Tables 3-2 to 11-2. For ease of comparison, the components used and evaluation results obtained in Example 9 are included in Tables 5-1 and 10-1 as well as Tables 5-2 to 10-2.

TABLE 3-1

| | | Composition [part(s) by mass] | | | | | |
|---|---|---|---|---|---|---|---|
| | Composition | Pigment dispersion liquid | First resin (A1) derived from pigmennt dispersion liquid | First resin (A1) derived from preparation liquid added to pigment dispersion liquid | Second resin (A2) derived from preparation liquid added to pigment dispersion liquid | Radical-polymerizable compound (B) Compound (B1) Compound (B2) | Photopolymerization initiator (C1) |
| Example 1 | 1 | Bk-1 | — | PI-1 (65) | — | DPHA (10) DPCA-60 (25) | NCI-831 (12) |
| Example 2 | 2 | Bk-1 | — | PIP-1 (65) | — | DPHA (10) DPCA-60 (25) | NCI-831 (12) |
| Example 3 | 3 | Bk-1 | — | PBO-1 (65) | — | DPHA (10) DPCA-60 (25) | NCI-831 (12) |
| Example 4 | 4 | Bk-1 | — | PBOP-1 (65) | — | DPHA (10) DPCA-60 (25) | NCI-831 (12) |

TABLE 3-1-continued

| | | | | | | | |
|---|---|---|---|---|---|---|---|
| Example 5 | 5 | Bk-1 | — | — | CR-1 (65) | DPHA (10) DPCA-60 (25) | NCI-831 (12) |

| | | Composition [part(s) by mass] | | | Content of (A1) relative to total of (A1) and (A2) [mass %] | Content of (B) relative to total of (A1), (A2), and (B) [mass %] | Content of coloring agent (D) in total solid content [mass %] |
|---|---|---|---|---|---|---|---|
| | | Coloring agent (D) derived from pigment dispersion liquid | Dispersant (E) derived from pigment dispersion liquid | Solvent | | | |
| | Example 1 | Bk-S0100CF (34.8) | S-20000 (11.6) | MBA | 100 | 35 | 22.0 |
| | Example 2 | Bk-S0100CF (34.8) | S-20000 (11.6) | MBA | 100 | 35 | 22.0 |
| | Example 3 | Bk-S0100CF (34.8) | S-20000 (11.6) | MBA | 100 | 35 | 22.0 |
| | Example 4 | Bk-S0100CF (34.8) | S-20000 (11.6) | MBA | 100 | 35 | 22.0 |
| | Example 5 | Bk-S0100CF (34.8) | S-20000 (11.6) | MBA PGMEA | 0 | 35 | 22.0 |

TABLE 3-2

| | | Photosensitive characteristics/cured film characteristics | | | | | | |
|---|---|---|---|---|---|---|---|---|
| | Composition | Sensitivity [mJ/cm$^2$] | Development residue [%] | Cross-sectional shape of pattern [°] | Heat resistance High temperature weight residue ratio difference [mass %] | Light blocking capability OD value | Insulation properties Surface resistivity [Ω/□] | Luminescence characteristics of organic EL display device | |
| | | | | | | | | Initial characteristics | Characteristics after durability test [%] |
| Example 1 | 1 | 40 A | 2 A | 35 A | 9.5 A | 1.0 | >1.0 × 10^15 | Good | 100 A+ |
| Example 2 | 2 | 30 A+ | 2 A | 30 A+ | 19.3 B | 1.0 | >1.0 × 10^15 | Good | 100 A+ |
| Example 3 | 3 | 40 A | 2 A | 35 A | 9.7 A | 1.0 | >1.0 × 10^15 | Good | 100 A+ |
| Example 4 | 4 | 30 A+ | 2 A | 31 A | 19.5 B | 1.0 | >1.0 × 10^15 | Good | 100 A+ |
| Example 5 | 5 | 25 A+ | 10 B | 30 A+ | 30.5 C | 1.0 | >1.0 × 10^15 | Good | 80 B |

TABLE 4-1

| | | Composition [part(s) by mass] | | | | | |
|---|---|---|---|---|---|---|---|
| | Composition | Pigment dispersion liquid | First resin (A1) derived from pigment dispersion liquid | First resin (A1) derived from preparation liquid added to pigment dispersion liquid | Second resin (A2) derived from preparation liquid added to pigment dispersion liquid | Radical-polymerizable compound (B) Compound (B1) Compound (B2) | Photopolymerization initiator (C1) |
| Example 6 | 6 | Bk-2 | PI-1 (2) | PI-1 (63) | — | DPHA (10) DPCA-60 (25) | NCI-831 (12) |
| Example 7 | 7 | Bk-2 | PI-1 (4.3) | PI-1 (60.7) | — | DPHA (10) DPCA-60 (25) | NCI-831 (12) |
| Example 8 | 8 | Bk-2 | PI-1 (7) | PI-1 (58) | — | DPHA (10) DPCA-60 (25) | NCI-831 (12) |

TABLE 4-1-continued

| | | | | | | | |
|---|---|---|---|---|---|---|---|
| Example 9 | 9 | Bk-2 | PI-1 (11.6) | PI-1 (53.4) | — | DPHA (10) DPCA-60 (25) | NCI-831 (12) |
| Example 10 | 10 | Bk-2 | PI-1 (14.8) | PI-1 (50.2) | — | DPHA (10) DPCA-60 (25) | NCI-831 (12) |
| Example 11 | 11 | Bk-2 | PI-1 (20.9) | PI-1 (44.1) | — | DPHA (10) DPCA-60 (25) | NCI-831 (12) |
| Example 12 | 12 | Bk-3 | PI-1 (29.1) | PI-1 (35.9) | — | DPHA (10) DPCA-60 (25) | NCI-831 (12) |
| Example 13 | 13 | Bk-3 | PI-1 (40.35) | PI-1 (24.65) | — | DPHA (10) DPCA-60 (25) | NCI-831 (12) |
| Example 14 | 14 | Bk-3 | PI-1 (51) | PI-1 (14) | — | DPHA (10) DPCA-60 (25) | NCI-831 (12) |

| | Composition [part(s) by mass] | | | Content of (A1) relative to total of (A1) and (A2) [mass %] | Content of (B) relative to total of (A1), (A2), and (B) [mass %] | Content of coloring agent (D) in total solid content [mass %] |
|---|---|---|---|---|---|---|
| | Coloring agent (D) derived from pigment dispersion liquid | Dispersant (E) derived from pigment dispersion liquid | Solvent | | | |
| Example 6 | Bk-S0100CF (6) | S-20000 (2) | MBA | 100 | 35 | 5.0 |
| Example 7 | Bk-S0100CF (12.9) | S-20000 (4.3) | MBA | 100 | 35 | 10.0 |
| Example 8 | Bk-S0100CF (20.9) | S-20000 (7) | MBA | 100 | 35 | 15.0 |
| Example 9 | Bk-S0100CF (34.8) | S-20000 (11.6) | MBA | 100 | 35 | 22.0 |
| Example 10 | Bk-S0100CF (44.5) | S-20000 (14.8) | MBA | 100 | 35 | 26.0 |
| Example 11 | Bk-S0100CF (62.6) | S-20000 (20.9) | MBA | 100 | 35 | 32.0 |
| Example 12 | Bk-S0100CF (75.8) | S-20000 (11.7) | MBA | 100 | 35 | 38.0 |
| Example 13 | Bk-S0100CF (104.9) | S-20000 (16.1) | MBA | 100 | 35 | 45.0 |
| Example 14 | Bk-S0100CF (132.6) | S-20000 (20.4) | MBA | 100 | 35 | 50.0 |

TABLE 4-2

| | | Photosensitive characteristics/cured film characteristics | | | | | | Luminescence characteristics of organic EL display device | |
|---|---|---|---|---|---|---|---|---|---|
| | Composition | Sensitivity [mJ/cm$^2$] | Development residue [%] | Cross-sectional shape of pattern [°] | Heat resistance High temperature weight residue ratio difference [mass %] | Light blocking capability OD value | Insulation properties Surface resistivity [Ω/□] | Initial characteristics | Characteristics after durability test [%] |
| Example 6 | 6 | 20 A+ | 0 A+ | 30 A+ | 6.2 A | 0.3 | >1.0 × 10^15 | Good | 100 A+ |
| Example 7 | 7 | 25 A+ | 0 A+ | 32 A | 7.4 A | 0.5 | >1.0 × 10^15 | Good | 100 A+ |
| Example 8 | 8 | 30 A+ | 0 A+ | 33 A | 8.5 A | 0.7 | >1.0 × 10^15 | Good | 100 A+ |
| Example 9 | 9 | 40 A | 0 A+ | 35 A | 9.3 A | 1.0 | >1.0 × 10^15 | Good | 100 A+ |
| Example 10 | 10 | 50 B | 0 A+ | 37 A | 10.1 A | 1.2 | >1.0 × 10^15 | Good | 100 A+ |

TABLE 4-2-continued

| | | Photosensitive characteristics/cured film characteristics | | | | | | |
|---|---|---|---|---|---|---|---|---|
| | | | | | | | | Luminescence characteristics of organic EL display device |
| | | | Cross-sectional | Heat resistance High temperature weight | Light | Insulation properties | | |
| | Composition | Sensitivity [mJ/cm²] | Development residue [%] | shape of pattern [°] | residue ratio difference [mass %] | blocking capability OD value | Surface resistivity [Ω/□] | Initial characteristics | Characteristics after durability test [%] |
| Example 11 | 11 | 60 B | 0 A+ | 39 A | 11.3 A | 1.5 | >1.0 × 10^15 | Good | 100 A+ |
| Example 12 | 12 | 70 C | 3 A | 42 A | 12.4 A | 1.7 | >1.0 × 10^15 | Good | 100 A+ |
| Example 13 | 13 | 80 C | 4 A | 45 A | 13.5 A | 2.0 | >1.0 × 10^15 | Good | 100 A+ |
| Example 14 | 14 | 90 C | 5 A | 50 B | 14.7 A | 2.2 | >1.0 × 10^15 | Good | 100 A+ |

TABLE 5-1

| | | Composition [part(s) by mass] | | | | |
|---|---|---|---|---|---|---|
| | Composition | Pigment dispersion liquid | First resin (A1) derived from pigment dispersion liquid | First resin (A1) derived from preparation liquid added to pigment dispersion liquid | Second resin (A2) derived from preparation liquid added to pigment dispersion liquid | Radical-polymerizable compound (B) Compound (B1) Compound (B2) | Photopolymerization initiator (C1) |
| Example 15 | 15 | Bk-2 | PI-1 (11.6) | PI-1 (53.4) | — | DPHA (10) DPCA-20 (25) | NCI-831 (12) |
| Example 16 | 16 | Bk-2 | PI-1 (11.6) | PI-1 (53.4) | — | DPHA (10) DPCA-30 (25) | NCI-831 (12) |
| Example 9 | 9 | Bk-2 | PI-1 (11.6) | PI-1 (53.4) | — | DPHA (10) DPCA-60 (25) | NCI-831 (12) |
| Example 17 | 17 | Bk-2 | PI-1 (11.6) | PI-1 (53.4) | — | DPHA (10) DPCA-120 (25) | NCI-831 (12) |
| Example 18 | 18 | Bk-2 | PI-1 (11.6) | PI-1 (53.4) | — | DPHA (10) A-DPH-6E (25) | NCI-831 (12) |
| Example 19 | 19 | Bk-2 | PI-1 (11.6) | PI-1 (53.4) | — | DPHA (10) A-DPH-12E (25) | NCI-831 (12) |
| Example 20 | 20 | Bk-2 | PI-1 (11.6) | PI-1 (53.4) | — | DPHA (10) A-DPH-6P (25) | NCI-831 (12) |

| | Composition [part(s) by mass] | | | Content of (A1) relative to total of (A1) and (A2) [mass %] | Content of (B) relative to total of (A1), (A2), and (B) [mass %] | Content of coloring agent (D) in total solid content [mass %] |
|---|---|---|---|---|---|---|
| | Coloring agent (D) derived from pigment dispersion liquid | Dispersant (E) derived from pigment dispersion liquid | Solvent | | | |
| Example 15 | Bk-S0100CF (34.8) | S-20000 (11.6) | MBA | 100 | 35 | 22.0 |
| Example 16 | Bk-S0100CF (34.8) | S-20000 (11.6) | MBA | 100 | 35 | 22.0 |
| Example 9 | Bk-S0100CF (34.8) | S-20000 (11.6) | MBA | 100 | 35 | 22.0 |

TABLE 5-1-continued

|  |  |  |  |  |  |  |
|---|---|---|---|---|---|---|
| Example 17 | Bk-S0100CF (34.8) | S-20000 (11.6) | MBA | 100 | 35 | 22.0 |
| Example 18 | Bk-S0100CF (34.8) | S-20000 (11.6) | MBA | 100 | 35 | 22.0 |
| Example 19 | Bk-S0100CF (34.8) | S-20000 (11.6) | MBA | 100 | 35 | 22.0 |
| Example 20 | Bk-S0100CF (34.8) | S-20000 (11.6) | MBA | 100 | 35 | 22.0 |

TABLE 5-2

| | | | | Photosensitive characteristics/cured film characteristics | | | | |
|---|---|---|---|---|---|---|---|---|
| | | | | Heat resistance High temperature weight | | Insulation properties | Luminescence characteristics of organic EL display device | |
| | | | Cross-sectional | | Light | | | |
| | | Development | shape of | residue ratio | blocking | Surface | | Characteristics |
| | Sensitivity | residue | pattern | difference | capability | resistivity | Initial | after durability |
| Composition | [mJ/cm²] | [%] | [°] | [mass %] | OD value | [Ω/□] | characteristics | test [%] |
| Example 15 | 15 | 45 A | 3 A | 34 A | 9.6 A | 1.0 | >1.0 × 10^15 | Good | 100 A+ |
| Example 16 | 16 | 45 A | 2 A | 35 A | 9.5 A | 1.0 | >1.0 × 10^15 | Good | 100 A+ |
| Example 9 | 9 | 40 A | 0 A+ | 35 A | 9.3 A | 1.0 | >1.0 × 10^15 | Good | 100 A+ |
| Example 17 | 17 | 35 A | 0 A+ | 35 A | 9.1 A | 1.0 | >1.0 × 10^15 | Good | 100 A+ |
| Example 18 | 18 | 40 A | 9 B | 35 A | 10.3 A | 1.0 | >1.0 × 10^15 | Good | 100 A+ |
| Example 19 | 19 | 40 A | 8 B | 34 A | 10.7 A | 1.0 | >1.0 × 10^15 | Good | 100 A+ |
| Example 20 | 20 | 40 A | 7 B | 35 A | 10.4 A | 1.0 | >1.0 × 10^15 | Good | 100 A+ |

TABLE 6-1

| | | | Composition [part(s) by mass] | | | | |
|---|---|---|---|---|---|---|---|
| | | | First resin (A1) derived from preparation liquid added to pigment dispersion liquid | Second resin (A2) derived from preparation liquid added to pigment dispersion liquid | Radical-polymerizable compound (B) Compound (B1) Compound (B2) | Photopolymerization initiator (C1) |
| | Composition | Pigment dispersion liquid | First resin (A1) derived from pigment dispersion liquid | | | | |
| Example 9 | 9 | Bk-2 | PI-1 (11.6) | PI-1 (53.4) | — | DPHA (10) DPCA-60 (25) | NCI-831 (12) |
| Example 21 | 21 | Bk-2 | PI-1 (11.6) | PI-1 (53.4) | — | DPHA (10) ATM-4CL (25) | NCI-831 (12) |
| Example 22 | 22 | Bk-2 | PI-1 (11.6) | PI-1 (53.4) | — | DPHA (10) ATM-8CL (25) | NCI-831 (12) |
| Example 23 | 23 | Bk-2 | PI-1 (11.6) | PI-1 (53.4) | — | DPHA (10) ATM-4VL (25) | NCI-831 (12) |
| Example 24 | 24 | Bk-2 | PI-1 (11.6) | PI-1 (53.4) | — | DPHA (10) AD-TMP-4CL (25) | NCI-831 (12) |
| Example 25 | 25 | Bk-2 | PI-1 (11.6) | PI-1 (53.4) | — | DPHA (10) A-9300-3CL (25) | NCI-831 (12) |

TABLE 6-1-continued

| | | | | | | | |
|---|---|---|---|---|---|---|---|
| Example 26 | 26 | Bk-2 | PI-1 (11.6) | PI-1 (53.4) | — | DPHA (10) 5CPL-1 (25) | NCI-831 (12) |
| Example 27 | 27 | Bk-2 | PI-1 (11.6) | PI-1 (53.4) | — | DPCA-60 (25) HX-220 (10) | NCI-831 (12) |

| | Composition [part(s) by mass] | | | Content of (A1) relative to total of (A1) and (A2) [msss %] | Content of (B) relative to total of (A1), (A2), and (B) [mass %] | Content of coloring agent (D) in total solid content [mass %] |
|---|---|---|---|---|---|---|
| | Coloring agent (D) derived from pigment dispersion liquid | Dispersant (E) derived from pigment dispersion liquid | Solvent | | | |
| Example 9 | Bk-S0100CF (34.8) | S-20000 (11.6) | MBA | 100 | 35 | 22.0 |
| Example 21 | Bk-S0100CF (34.8) | S-20000 (11.6) | MBA | 100 | 35 | 22.0 |
| Example 22 | Bk-S0100CF (34.8) | S-20000 (11.6) | MBA | 100 | 35 | 22.0 |
| Example 23 | Bk-S0100CF (34.8) | S-20000 (11.6) | MBA | 100 | 35 | 22.0 |
| Example 24 | Bk-S0100CF (34.8) | S-20000 (11.6) | MBA | 100 | 35 | 22.0 |
| Example 25 | Bk-S0100CF (34.8) | S-20000 (11.6) | MBA | 100 | 35 | 22.0 |
| Example 26 | Bk-S0100CF (34.8) | S-20000 (11.6) | MBA | 100 | 35 | 22.0 |
| Example 27 | Bk-S0100CF (34.8) | S-20000 (11.6) | MBA | 100 | 35 | 22.0 |

TABLE 6-2

| | | Photosensitive characteristics/cured film characteristics | | | | | | Luminescence characteristics of organic EL display device | |
|---|---|---|---|---|---|---|---|---|---|
| | Composition | Sensitivity [mJ/cm$^2$] | Development residue [%] | Cross-sectional shape of pattern [°] | Heat resistance High temperature weight residue ratio difference [mass %] | Light blocking capability OD value | Insulation properties Surface resistivity [Ω/□] | Initial characteristics | Characteristics after durability test [%] |
| Example 9 | 9 | 40 A | 0 A+ | 35 A | 9.3 A | 1.0 | >1.0 × 10^15 | Good | 100 A+ |
| Example 21 | 21 | 40 A | 2 A | 35 A | 9.4 A | 1.0 | >1.0 × 10^15 | Good | 100 A+ |
| Example 22 | 22 | 40 A | 2 A | 35 A | 9.6 A | 1.0 | >1.0 × 10^15 | Good | 100 A+ |
| Example 23 | 23 | 40 A | 2 A | 35 A | 9.4 A | 1.0 | >1.0 × 10^15 | Good | 100 A+ |
| Example 24 | 24 | 40 A | 2 A | 35 A | 9.5 A | 1.0 | >1.0 × 10^15 | Good | 100 A+ |
| Example 25 | 25 | 45 A | 5 A | 36 A | 7.8 A | 1.0 | >1.0 × 10^15 | Good | 100 A+ |
| Example 26 | 26 | 40 A | 0 A+ | 32 A | 9.1 A | 1.0 | >1.0 × 10^15 | Good | 100 A+ |
| Example 27 | 27 | 35 A | 0 A+ | 37 A | 9.0 A | 1.0 | >1.0 × 10^15 | Good | 100 A+ |

TABLE 7-1

| | Composition | Composition [part(s) by mass] | | | | |
|---|---|---|---|---|---|---|
| | | Pigment dispersion liquid | First resin (A1) derived from pigment dispersion liquid | First resin (A1) derived from preparation liquid added to pigment dispersion liquid | Second resin (A2) derived from preparation liquid added to pigment dispersion liquid | Radical-polymerizable compound (B) Compound (B1) Compound (B2) | Photopolymerization initiator (C1) |

| | Composition | Pigment dispersion liquid | First resin (A1) derived from pigment dispersion liquid | First resin (A1) derived from preparation liquid added to pigment dispersion liquid | Second resin (A2) derived from preparation liquid added to pigment dispersion liquid | Radical-polymerizable compound (B) Compound (B1) Compound (B2) | Photopolymerization initiator (C1) |
|---|---|---|---|---|---|---|---|
| Example 28 | 28 | Bk-2 | PI-1 (11.6) | PI-1 (53.4) | — | DPHA (30) DPCA-60 (5) | NCI-831 (12) |
| Example 29 | 29 | Bk-2 | PI-1 (11.6) | PI-1 (53.4) | — | DPHA (25) DPCA-60 (10) | NCI-831 (12) |
| Example 30 | 30 | Bk-2 | PI-1 (11.6) | PI-1 (53.4) | — | DPHA (20) DPCA-60 (15) | NCI-831 (12) |
| Example 31 | 31 | Bk-2 | PI-1 (11.6) | PI-1 (53.4) | — | DPHA (15) DPCA-60 (20) | NCI-831 (12) |
| Example 9 | 9 | Bk-2 | PI-1 (11.6) | PI-1 (53.4) | — | DPHA (10) DPCA-60 (25) | NCI-831 (12) |
| Example 32 | 32 | Bk-2 | PI-1 (11.6) | PI-1 (53.4) | — | DPHA (5) DPCA-60 (30) | NCI-831 (12) |
| Example 33 | 33 | Bk-2 | PI-1 (11.6) | PI-1 (53.4) | — | DPCA-60 (35) | NCI-831 (12) |
| Example 34 | 34 | Bk-2 | PI-1 (11.6) | PI-1 (48.4) | — | DPCA-60 (40) | NCI-831 (12) |
| Example 35 | 35 | Bk-2 | PI-1 (11.6) | PI-1 (43.4) | — | DPCA-60 (45) | NCI-831 (12) |
| Example 36 | 36 | Bk-2 | PI-1 (11.6) | PI-1 (38.4) | — | DPCA-60 (50) | NCI-831 (12) |
| Example 37 | 37 | Bk-2 | PI-1 (11.6) | PI-1 (33.4) | — | DPCA-60 (55) | NCI-831 (12) |

| | Composition [part(s) by mass] | | | Content of (A1) relative to total of (A1) and (A2) [mass %] | Content of (B) relative to total of (A1), (A2), and (B) [mass %] | Content of coloring agent (D) in total solid content [mass %] |
|---|---|---|---|---|---|---|
| | Coloring agent (D) derived from pigment dispersion liquid | Dispersant (E) derived from pigment dispersion liquid | Solvent | | | |
| Example 28 | Bk-S0100CF (34.8) | S-20000 (11.6) | MBA | 100 | 35 | 22.0 |
| Example 29 | Bk-S0100CF (34.8) | S-20000 (11.6) | MBA | 100 | 35 | 22.0 |
| Example 30 | Bk-S0100CF (34.8) | S-20000 (11.6) | MBA | 100 | 35 | 22.0 |
| Example 31 | Bk-S0100CF (34.8) | S-20000 (11.6) | MBA | 100 | 35 | 22.0 |
| Example 9 | Bk-S0100CF (34.8) | S-20000 (11.6) | MBA | 100 | 35 | 22.0 |
| Example 32 | Bk-S0100CF (34.8) | S-20000 (11.6) | MBA | 100 | 35 | 22.0 |
| Example 33 | Bk-S0100CF (34.8) | S-20000 (11.6) | MBA | 100 | 35 | 22.0 |
| Example 34 | Bk-S0100CF (34.8) | S-20000 (11.6) | MBA | 100 | 40 | 22.0 |
| Example 35 | Bk-S0100CF (34.8) | S-20000 (11.6) | MBA | 100 | 45 | 22.0 |
| Example 36 | Bk-S0100CF (34.8) | S-20000 (11.6) | MBA | 100 | 50 | 22.0 |
| Example 37 | Bk-S0100CF (34.8) | S-20000 (11.6) | MBA | 100 | 55 | 22.0 |

TABLE 7-2

| | Composition | Sensitivity [mJ/cm$^2$] | Development residue [%] | Cross-sectional shape of pattern [°] | Heat resistance High temperature weight residue ratio difference [mass %] | Light blocking capability OD value | Insulation properties Surface resistivity [Ω/□] | Luminescence characteristics of organic EL display device | |
|---|---|---|---|---|---|---|---|---|---|
| | | | | | | | | Initial characteristics | Characteristics after durability test [%] |
| Example 28 | 28 | 50 B | 6 B | 30 A+ | 10.7 A | 1.0 | >1.0 × 10^15 | Good | 100 A+ |
| Example 29 | 29 | 45 A | 3 A | 30 A+ | 10.3 A | 1.0 | >1.0 × 10^15 | Good | 100 A+ |
| Example 30 | 30 | 40 A | 0 A+ | 32 A | 9.9 A | 1.0 | >1.0 × 10^15 | Good | 100 A+ |
| Example 31 | 31 | 40 A | 0 A+ | 33 A | 9.6 A | 1.0 | >1.0 × 10^15 | Good | 100 A+ |
| Example 9 | 9 | 40 A | 0 A+ | 35 A | 9.3 A | 1.0 | >1.0 × 10^15 | Good | 100 A+ |
| Example 32 | 32 | 40 A | 0 A+ | 38 A | 9.0 A | 1.0 | >1.0 × 10^15 | Good | 100 A+ |
| Example 33 | 33 | 35 A | 0 A+ | 43 A | 8.8 A | 1.0 | >1.0 × 10^15 | Good | 100 A+ |
| Example 34 | 34 | 25 A+ | 0 A+ | 55 B | 8.4 A | 1.0 | >1.0 × 10^15 | Good | 100 A+ |
| Example 35 | 35 | 20 A+ | 0 A+ | 57 B | 8.1 A | 1.0 | >1.0 × 10^15 | Good | 100 A+ |
| Example 36 | 36 | 15 A+ | 0 A+ | 59 B | 9.1 A | 1.0 | >1.0 × 10^15 | Good | 100 A+ |
| Example 37 | 37 | 15 A+ | 0 A+ | 66 C | 10.3 A | 1.0 | >1.0 × 10^15 | Good | 100 A+ |

TABLE 8-1

| | Composition | Composition [part(s) by mass] | | | | | |
|---|---|---|---|---|---|---|---|
| | | Pigment dispersion liquid | First resin (A1) derived from pigment dispersion liquid | First resin (A1) derived from preparation liquid added to pigment dispersion liquid | Second resin (A2) derived from preparation liquid added to pigment dispersion liquid | Radical-polymerizable compound (B) Compound (B1) Compound (B2) | Photopolymerization initiator (C1) |
| Example 9 | 9 | Bk-2 | PI-1 (11.6) | PI-1 (53.4) | — | DPHA (10) DPCA-60 (25) | NCI-831 (12) |
| Example 38 | 38 | Bk-2 | PI-1 (11.6) | PI-2 (53.4) | — | DPHA (10) DPCA-60 (25) | NCI-831 (12) |
| Example 39 | 39 | Bk-2 | PI-1 (11.6) | PI-3 (53.4) | — | DPHA (10) DPCA-60 (25) | NCI-831 (12) |
| Example 40 | 40 | Bk-2 | PI-1 (11.6) | PI-4 (53.4) | — | DPHA (10) DPCA-60 (25) | NCI-831 (12) |
| Example 41 | 41 | Bk-2 | PI-1 (11.6) | PI-1 (38.4) PIP-1 (15) | — | DPHA (10) DPCA-60 (25) | NCI-831 (12) |
| Example 42 | 42 | Bk-2 | PI-1 (11.6) | PI-1 (38.4) PIP-2 (15) | — | DPHA (10) DPCA-60 (25) | NCI-831 (12) |
| Example 43 | 43 | Bk-2 | PI-1 (11.6) | PI-1 (38.4) PBO-1 (15) | — | DPHA (10) DPCA-60 (25) | NCI-831 (12) |

TABLE 8-1-continued

| | | | | | | | |
|---|---|---|---|---|---|---|---|
| Example 44 | 44 | Bk-2 | PI-1 (11.6) | PI-1 (38.4) PBOP-1 (15) | — | DPHA (10) DPCA-60 (25) | NCI-831 (12) |
| Example 45 | 45 | Bk-2 | PI-1 (11.6) | PI-1 (38.4) | PS-1 (15) | DPHA (10) DPCA-60 (25) | NCI-831 (12) |
| Example 46 | 46 | Bk-2 | PI-1 (11.6) | PI-1 (38.4) | PS-2 (15) | DPHA (10) DPCA-60 (25) | NCI-831 (12) |
| Example 47 | 47 | Bk-2 | PI-1 (11.6) | PI-1 (38.4) | PS-3 (15) | DPHA (10) DPCA-60 (25) | NCI-831 (12) |

| | Composition [part(s) by mass] | | | Content of (A1) relative to total of (A1) and (A2) [mass %] | Content of (B) relative to total of (A1), (A2), and (B) [mass %] | Content of coloring agent (D) in total solid content [mass %] |
|---|---|---|---|---|---|---|
| | Coloring agent (D) derived from pigment dispersion liquid | Dispersant (E) derived from pigment dispersion liquid | Solvent | | | |
| Example 9 | Bk-S0100CF (34.8) | S-20000 (11.6) | MBA | 100 | 35 | 22.0 |
| Example 38 | Bk-S0100CF (34.8) | S-20000 (11.6) | MBA | 100 | 35 | 22.0 |
| Example 39 | Bk-S0100CF (34.8) | S-20000 (11.6) | MBA | 100 | 35 | 22.0 |
| Example 40 | Bk-S0100CF (34.8) | S-20000 (11.6) | MBA | 100 | 35 | 22.0 |
| Example 41 | Bk-S0100CF (34.8) | S-20000 (11.6) | MBA | 100 | 35 | 22.0 |
| Example 42 | Bk-S0100CF (34.8) | S-20000 (11.6) | MBA | 100 | 35 | 22.0 |
| Example 43 | Bk-S0100CF (34.8) | S-20000 (11.6) | MBA | 100 | 35 | 22.0 |
| Example 44 | Bk-S0100CF (34.8) | S-20000 (11.6) | MBA | 100 | 35 | 22.0 |
| Example 45 | Bk-S0100CF (34.8) | S-20000 (11.6) | MBA PGMEA | 77 | 35 | 22.0 |
| Example 46 | Bk-S0100CF (34.8) | S-20000 (11.6) | MBA PGMEA | 77 | 35 | 22.0 |
| Example 47 | Bk-S0100CF (34.8) | S-20000 (11.6) | MBA PGMEA | 77 | 35 | 22.0 |

TABLE 8-2

| | | Photosensitive characteristics/cured film characteristics | | | | | | | |
|---|---|---|---|---|---|---|---|---|---|
| | Composition | Sensitivity [mJ/cm$^2$] | Development residue [%] | Cross-sectional shape of pattern [°] | Heat resistance High temperature weight residue ratio difference [mass %] | Light blocking capability OD value | Insulation properties Surface resistivity [Ω/□] | Luminescence characteristics of organic EL display device | |
| | | | | | | | | Initial characteristics | Characteristics after durability test [%] |
| Example 9 | 9 | 40 A | 0 A+ | 35 A | 9.3 A | 1.0 | >1.0 × 10^15 | Good | 100 A+ |
| Example 38 | 38 | 45 A | 0 A+ | 35 A | 9.4 A | 1.0 | >1.0 × 10^15 | Good | 100 A+ |
| Example 39 | 39 | 35 A | 0 A+ | 35 A | 9.3 A | 1.0 | >1.0 × 10^15 | Good | 100 A+ |
| Example 40 | 40 | 35 A | 0 A+ | 35 A | 9.4 A | 1.0 | >1.0 × 10^15 | Good | 100 A+ |
| Example 41 | 41 | 35 A | 0 A+ | 32 A | 10.5 A | 1.0 | >1.0 × 10^15 | Good | 100 A+ |
| Example 42 | 42 | 35 A | 0 A+ | 32 A | 10.4 A | 1.0 | >1.0 × 10^15 | Good | 100 A+ |
| Example 43 | 43 | 40 A | 0 A+ | 35 A | 9.5 A | 1.0 | >1.0 × 10^15 | Good | 100 A+ |

TABLE 8-2-continued

| | | Photosensitive characteristics/cured film characteristics | | | | | | | |
|---|---|---|---|---|---|---|---|---|---|
| | | | | | Heat resistance High temperature weight | | Insulation properties | Luminescence characteristics of organic EL display device | |
| | | | | Cross-sectional | | Light | | | |
| | Composition | Sensitivity [mJ/cm²] | Development residue [%] | shape of pattern [°] | residue ratio difference [mass %] | blocking capability OD value | Surface resistivity [Ω/□] | Initial characteristics | Characteristics after durability test [%] |
| Example 44 | 44 | 35 A | 0 A+ | 33 A | 10.6 A | 1.0 | >1.0 × 10^15 | Good | 100 A+ |
| Example 45 | 45 | 30 A+ | 0 A+ | 29 A+ | 13.6 A | 1.0 | >1.0 × 10^15 | Good | 100 A+ |
| Example 46 | 46 | 25 A+ | 0 A+ | 39 A | 14.1 A | 1.0 | >1.0 × 10^15 | Good | 100 A+ |
| Example 47 | 47 | 25 A+ | 0 A+ | 29 A+ | 14.2 A | 1.0 | >1.0 × 10^15 | Good | 100 A+ |

TABLE 9-1

| | | Composition [part(s) by mass] | | | | | |
|---|---|---|---|---|---|---|---|
| | Composition | Pigment dispersion liquid | First resin (A1) derived from pigment dispersion liquid | First resin (A1) derived from preparation liquid added to pigment dispersion liquid | Second resin (A2) derived from preparation liquid added to pigment dispersion liquid | Radical-polymerizable compound (B) Compound (B1) Compound (B2) | Photopolymerization initiator (C1) |
| Example 9 | 9 | Bk-2 | PI-1 (11.6) | PI-1 (53.4) | — | DPHA (10) DPCA-60 (25) | NCI-831 (12) |
| Example 48 | 48 | Bk-2 | PI-1 (11.6) | PI-1 (38.4) | CR-1 (15) | DPHA (10) DPCA-60 (25) | NCI-831 (12) |
| Example 49 | 49 | Bk-2 | PI-1 (11.6) | PI-1 (38.4) | CR-2 (15) | DPHA (10) DPCA-60 (25) | NCI-831 (12) |
| Example 50 | 50 | Bk-2 | PI-1 (11.6) | PI-1 (38.4) | WR-301 (15) | DPHA (10) DPCA-60 (25) | NCI-831 (12) |
| Example 51 | 51 | Bk-2 | PI-1 (11.6) | PI-1 (38.4) | AC-1 (15) | DPHA (10) DPCA-60 (25) | NCI-831 (12) |
| Example 52 | 52 | Bk-2 | PI-1 (11.6) | PI-1 (38.4) | ZXR-1816H (15) | DPHA (10) DPCA-60 (25) | NCI-831 (12) |
| Example 53 | 53 | Bk-2 | PI-1 (11.6) | PI-1 (38.4) | AE-1 (15) | DPHA (10) DPCA-60 (25) | NCI-831 (12) |
| Example 54 | 54 | Bk-9 | — | — | CR-1 (65) | DPHA (10) DPCA-60 (25) | NCI-831 (12) |
| Example 55 | 55 | Bk-9 | — | — | AC-1 (65) | DPHA (10) DPCA-60 (25) | NCI-831 (12) |
| Example 56 | 56 | Bk-10 | PI-1 (11.6) | PI-1 (53.4) | — | DPHA (10) DPCA-60 (25) | NCI-831 (12) |

TABLE 9-1-continued

| | | Composition [part(s) by mass] | | | Content of (A1) relative to total of (A1) and (A2) [mass %] | Content of (B) relative to total of (A1), (A2), and (B) [mass %] | Content of coloring agent (D) in total solid content [mass %] |
|---|---|---|---|---|---|---|---|
| | | Coloring agent (D) derived from pigment dispersion liquid | Dispersant (E) derived from pigment dispersion liquid | Solvent | | | |
| | Example 9 | Bk-S0100CF (34.8) | S-20000 (11.6) | MBA | 100 | 35 | 22.0 |
| | Example 48 | Bk-S0100CF (34.8) | S-20000 (11.6) | MBA | 77 | 35 | 22.0 |
| | Example 49 | Bk-S0100CF (34.8) | S-20000 (11.6) | MBA | 77 | 35 | 22.0 |
| | Example 50 | Bk-S0100CF (34.8) | S-20000 (11.6) | MBA PGMEA | 77 | 35 | 22.0 |
| | Example 51 | Bk-S0100CF (34.8) | S-20000 (11.6) | MBA PGMEA | 77 | 35 | 22.0 |
| | Example 52 | Bk-S0100CF (34.8) | S-20000 (11.6) | MBA PGMEA | 77 | 35 | 22.0 |
| | Example 53 | Bk-S0100CF (34.8) | S-20000 (11.6) | MBA PGMEA | 77 | 35 | 22.0 |
| | Example 54 | Bk-CBF1 (34.8) | S-20000 (11.6) | MBA PGMEA | 0 | 35 | 22.0 |
| | Example 55 | Bk-CBF1 (34.8) | S-20000 (11.6) | MBA | 100 | 35 | 22.0 |
| | Example 56 | Bk-CBF1 (34.8) | S-20000 (11.6) | MBA | 100 | 35 | 22.0 |

TABLE 9-2

| | | Photosensitive characteristics/cured film characteristics | | | | | | Luminescence characteristics of organic EL display device | |
|---|---|---|---|---|---|---|---|---|---|
| | | | | | Heat resistance High temperature weight | Light | Insulation properties | | |
| | Composition | Sensitivity [mJ/cm$^2$] | Development residue [%] | Cross-sectional shape of pattern [°] | residue ratio difference [mass %] | blocking capability OD value | Surface resistivity [Ω/□] | Initial characteristics | Characteristics after durability test [%] |
| Example 9 | 9 | 40 A | 0 A+ | 35 A | 9.3 A | 1.0 | >1.0 × 10^15 | Good | 100 A+ |
| Example 48 | 48 | 25 A+ | 0 A+ | 30 A+ | 17.7 B | 1.0 | >1.0 × 10^15 | Good | 95 A |
| Example 49 | 49 | 25 A+ | 0 A+ | 30 A+ | 17.3 B | 1.0 | >1.0 × 10^15 | Good | 95 A |
| Example 50 | 50 | 25 A+ | 0 A+ | 30 A+ | 17.4 B | 1.0 | >1.0 × 10^15 | Good | 95 A |
| Example 51 | 51 | 25 A+ | 0 A+ | 29 A+ | 20.1 B | 1.0 | >1.0 × 10^15 | Good | 85 B |
| Example 52 | 52 | 25 A+ | 0 A+ | 30 A+ | 18.2 B | 1.0 | >1.0 × 10^15 | Good | 90 A |
| Example 53 | 53 | 25 A+ | 0 A+ | 30 A+ | 18.5 B | 1.0 | >1.0 × 10^15 | Good | 90 A |
| Example 54 | 54 | 25 A+ | 5 A | 30 A+ | 24.7 B | 1.0 | >1.0 × 10^15 | Good | 95 A |
| Example 55 | 55 | 25 A+ | 10 B | 30 A+ | 31.9 C | 1.0 | >1.0 × 10^15 | Good | 80 B |
| Example 56 | 56 | 40 A | 0 A+ | 34 A | 7.8 A | 1.0 | >1.0 × 10^15 | Good | 100 A+ |

TABLE 10-1

| | | Composition [part(s) by mass] | | | | | |
|---|---|---|---|---|---|---|---|
| | Composition | Pigment dispersion liquid | First resin (A1) derived from pigment dispersion liquid | First resin (A1) derived from preparation liquid added to pigment dispersion liquid | Second resin (A2) derived from preparation liquid added to pigment dispersion liquid | Radical polymerizable compound (B) Compound (B1) Compound (B2) | Photopolymerization initiator (C1) |
| Example 9 | 9 | Bk-2 | PI-1 (11.6) | PI-1 (53.4) | — | DPHA (10) DPCA-60 (25) | NCI-831 (12) |
| Example 57 | 57 | Bk-4 | PI-1 (11.6) | PI-1 (53.4) | — | DPHA (10) DPCA-60 (25) | NCI-831 (12) |
| Example 58 | 58 | Bk-5 | PI-1 (11.6) | PI-1 (53.4) | — | DPHA (10) DPCA-60 (25) | NCI-831 (12) |
| Example 59 | 59 | Bk-6 | PI-1 (7) | PI-1 (58) | — | DPHA (10) DPCA-60 (25) | NCI-831 (12) |
| Example 60 | 60 | Bk-7 | PI-1 (20.9) | PI-1 (44.1) | — | DPHA (10) DPCA-60 (25) | NCI-831 (12) |
| Example 61 | 61 | Bk-8 | PI-1 (20.9) | PI-1 (44.1) | — | DPHA (10) DPCA-60 (25) | NCI-831 (12) |

| | Composition [part(s) by mass] | | | Content of (A1) relative to total of (A1) and (A2) [mass %] | Content of (B) relative to total of (A1), (A2), and (B) [mass %] | Content of coloring agent (D) in total solid content [mass %] |
|---|---|---|---|---|---|---|
| | Coloring agent (D) derived from pigment dispersion liquid | Dispersant (E) derived from pigment dispersion liquid | Solvent | | | |
| Example 9 | Bk-S0100CF (34.8) | S-20000 (11.6) | MBA | 100 | 35 | 22.0 |
| Example 57 | Bk-S0084 (34.8) | D.BYK-167 (11.6) | MBA | 100 | 35 | 22.0 |
| Example 58 | Bk-A1103 (34.8) | D.BYK-167 (11.6) | MBA | 100 | 35 | 22.0 |
| Example 59 | TPK-1227 (20.9) | D.BYK-167 (7) | MBA | 100 | 35 | 15.0 |
| Example 60 | P.R.254 (21.9) P.Y.139 (9.4) P.B.15:6 (31.3) | D.BYK-167 (20.9) | MBA | 100 | 35 | 32.0 |
| Example 61 | P.V.23 (31.3) P.Y.139 (31.3) | D.BYK-167 (20.9) | MBA | 100 | 35 | 32.0 |

TABLE 10-2

| | | | | Heat resistance High temperature weight residue ratio difference [mass %] | Light blocking capability OD value | Insulation properties Surface resistivity [Ω/□] | Luminescence characteristics of organic EL display device | |
|---|---|---|---|---|---|---|---|---|
| | Composition | Sensitivity [mJ/cm$^2$] | Development residue [%] | Cross-sectional shape of pattern [°] | | | Initial characteristics | Characteristics after durability test [%] |
| Example 9 | 9 | 40 | 0 | 35 | 9.3 | 1.0 | >1.0 × 10^15 | Good | 100 |
| | | A | A+ | A | A | | | | A+ |
| Example 57 | 57 | 50 | 0 | 35 | 10.6 | 1.0 | >1.0 × 10^15 | Good | 100 |
| | | B | A+ | A | A | | | | A+ |
| Example 58 | 58 | 50 | 0 | 36 | 10.8 | 1.0 | >1.0 × 10^15 | Good | 100 |
| | | B | A+ | A | A | | | | A+ |
| Example 59 | 59 | 60 | 0 | 37 | 11.8 | 1.0 | 1.0 × 10^13 | Good | 80 |
| | | B | A+ | A | A | | | | B |
| Example 60 | 60 | 55 | 0 | 35 | 11.6 | 1.0 | 1.0 × 10^14 | Good | 95 |
| | | B | A+ | A | A | | | | A |
| Example 61 | 61 | 55 | 0 | 35 | 11.5 | 1.0 | 1.0 × 10^14 | Good | 95 |
| | | B | A+ | A | A | | | | A |

TABLE 11-1

| | Composition [part(s) by mass] | | | | | |
|---|---|---|---|---|---|---|
| | Composition | Pigment dispersion liquid | First resin (A1) derived from pigment dispersion liquid | First resin (A1) derived from preparation liquid added to pigment dispersion liquid | Second resin (A2) derived from preparation liquid added to pigment dispersion liquid | Radical-polymerizable compound (B) Compound (B1) Compound (B2) | Photopolymerization initiator (C1) |
| Comparative example 1 | 62 | Bk-2 | PI-1 (1) | PI-1 (64) | — | DPHA (35) | NCI-831 (12) |
| Comparative example 2 | 63 | Bk-2 | PI-1 (4.3) | PI-1 (60.7) | — | DPHA (35) | NCI-831 (12) |
| Comparative example 3 | 64 | Bk-2 | PI-1 (11.6) | PI-1 (53.4) | — | DPHA (35) | NCI-831 (12) |
| Comparative example 4 | 65 | Bk-2 | PI-1 (11.6) | PI-1 (53.4) | — | DPHA (10) HX-220 (25) | NCI-831 (12) |
| Comparative example 5 | 66 | Bk-7 | PI-1 (20.9) | PI-1 (44.1) | — | DPHA (35) | NCI-831 (12) |
| Comparative example 6 | 67 | — | — | PI-1 (65) | — | DPHA (10) DPCA-60 (25) | NCI-831 (12) |

| | Composition [part(s) by mass] | | | Content of (A1) relative to total of (A1) and (A2) [mass %] | Content of (B) relative to total of (A1), (A2), and (B) [mass %] | Content of coloring agent (D) in total solid content [mass %] |
|---|---|---|---|---|---|---|
| | Coloring agent (D) derived from pigment dispersion liquid | Dispersant (E) derived from pigment dispersion liquid | Solvent | | | |
| Comparative example 1 | Bk-S0100CF (3) | S-20000 (1) | MBA | 100 | 35 | 2.5 |
| Comparative example 2 | Bk-S0100CF (12.9) | S-20000 (4.3) | MBA | 100 | 35 | 10.0 |
| Comparative example 3 | Bk-S0100CF (34.8) | S-20000 (11.6) | MBA | 100 | 35 | 22.0 |
| Comparative example 4 | Bk-S0100CF (34.8) | S-20000 (11.6) | MBA | 100 | 35 | 22.0 |

TABLE 11-1-continued

| | | | | | | |
|---|---|---|---|---|---|---|
| Comparative example 5 | P.R.254 (21.9) P.Y.139 (9.4) P.B.15:6 (31.3) | D.BYK-167 (20.9) | MBA | 100 | 35 | 32.0 |
| Comparative example 6 | — | — | MBA | 100 | 35 | 0.0 |

TABLE 11-2

Photosensitive characteristics/cured film characteristics

| | Composition | Sensitivity [mJ/cm$^2$] | Development residue [%] | Cross-sectional shape of pattern [°] | Heat resistance High temperature weight residue ratio difference [mass %] | Light blocking capability OD value | Insulation properties Surface resistivity [Ω/□] | Luminescence characteristics of organic EL display device | |
|---|---|---|---|---|---|---|---|---|---|
| | | | | | | | | Initial characteristics | Characteristics after durability test [%] |
| Comparative example 1 | 62 | 55 B | 20 C | 33 A | 8.5 A | 0.15 | >1.0 × 10$^{15}$ | Good | 100 A+ |
| Comparative example 2 | 63 | 65 C | 40 D | 37 A | 10.1 A | 0.5 | >1.0 × 10$^{15}$ | Good | 100 A+ |
| Comparative example 3 | 64 | 90 C | 80 E | 40 A | 12.2 A | 1.0 | >1.0 × 10$^{15}$ | Good | 100 A+ |
| Comparative example 4 | 65 | 60 B | 30 C | 35 A | 10.4 A | 1.0 | >1.0 × 10$^{15}$ | Good | 100 A+ |
| Comparative example 5 | 66 | 110 D | 50 E | 40 A | 15.1 B | 1.0 | 1.0 × 10$^{14}$ | Good | 95 A |
| Comparative example 6 | 67 | 20 A+ | 0 A+ | 30 A+ | 7.1 A | — | >1.0 × 10$^{15}$ | Good | 100 A+ |

Example 62

(Production Method for an Organic EL Display Device not Having a Polarizing Layer)

Figure 4:
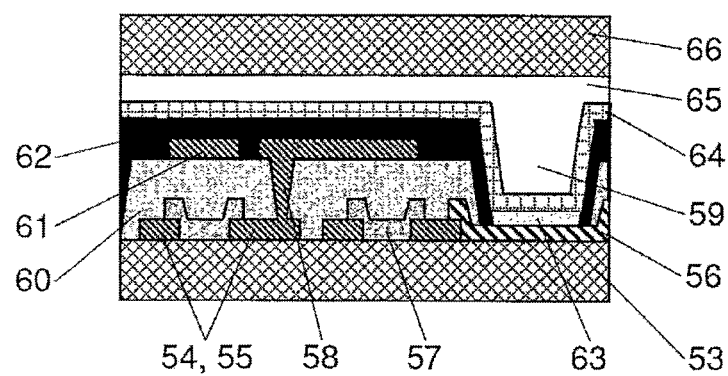
FIG. 4 is a schematic diagram exemplifying an organic EL display device that does not include a polarizing layer.

A schematic diagram of the organic EL display device is shown in FIG. 4. First, on a non-alkali glass substrate 53 with a size of 38×46 mm, an overlying film of chromium and gold was formed by electron beam deposition and etched to form a source electrode 54 and a drain electrode 55. Then, a 100 nm film of APC (silver/palladium/copper=98.07/0.87/1.06 (by weight)) was formed by sputtering and etched for pattern processing to form an APC layer, and another 10 nm film of ITO is formed on the APC layer by sputtering and etched to form a reflecting electrode 56 as first electrode. After cleaning the electrode surface with oxygen plasma, a film of amorphous IGZO was formed by sputtering and etched to form an oxide semiconductor layer 57 between the source and drain electrodes. Then, a film of a positive type photosensitivity polysiloxane based material (SP-P2301; manufactured by Toray Industries, Inc.) was formed by spin coating, and a via hole 58 and a pixel region 59 were opened by photolithography, followed by heat-curing to form a gate insulation layer 60. Subsequently, a film of gold is formed by electron beam deposition and etched to form a gate electrode 61, thus producing an oxide TFT array.

By the same method as described in Example 1, a composition 9 was spread on the oxide TFT array, prebaked to form a film, subjected to patterning exposure through a photomask having a predetermined pattern, developed, rinsed to open a pixel region, and heat-cured to form a TFT protection layer/pixel dividing layer 62 having a light blocking capability. In this way, a pixel dividing layer having openings with a width of 70 μm and a length of 260 μm aligned at intervals of 155 μm in the width direction and 465 μm in the length of direction, each opening exposing a reflecting electrode, was formed in an limited effective area of the substrate. These openings would finally form light emitting pixels of an organic EL display device. The limited effective area of the substrate had a size of 16 mm×16 mm and the pixel dividing layer had a thickness of about 1.0 μm.

Then, by the method described in paragraph (15), an organic EL light emitting layer 63 was formed using the compound (HT-1) for a hole injection layer, the compound (HT-2) for a hole transport layer, the compound (GH-1) as host material, the compound (GD-1) as dopant material, and the compound (ET-1) and compound (LiQ) as electronic transport materials.

Subsequently, MgAg was deposited at a volume ratio of 10:1 to form a film with a thickness of 10 nm and etched to form a transparent electrode 64 as second electrode. Then, in a low-humidity nitrogen atmosphere, an organic EL sealing material (Struct Bond (registered trademark) XMF-T; manufactured by Mitsui Chemicals, Inc.) was used to form a sealing film 65. In addition, a non-alkali glass substrate 66 was fixed on the sealing film, and four 5 mm×5 mm top-emission type organic EL display devices having no polarizing layer were formed on one substrate. The film thickness referred to here is the reading on a crystal oscillation type film thickness monitor.

(Evaluation of Luminescence Characteristics)

Organic EL display devices prepared by the above method were driven by a direct current of 10 mA/cm$^2$ to emit light and observed to determine the brightness (Y') in the case where external light was applied to the pixel dividing layer and the brightness (Y$_0$) in the case where no external light was applied. As an indicator of the decrease in external light reflection, the contrast was calculated by the equation given below.

$$\text{Contrast} = Y_0/Y'$$

Evaluations were made according to the criteria given below, and samples rated as A+, A, or B, which had a contrast of 0.80 or more, were judged as acceptable. Those rated as A+ or A, which had a contrast of 0.90 or more, were judged as having a good external light reflection decreasing effect and those rated as A+, which had a contrast of 0.95 or more, were judged as having an excellent external light reflection decreasing effect. The organic EL display devices prepared by the above method had a contrast of 0.90 or more, proving that external light reflection was decreased.

A+: having a contrast of 0.95 to 1.00
A: having a contrast of 0.90 to 0.94
B: having a contrast of 0.80 to 0.89
C: having a contrast of 0.70 to 0.79
D: having a contrast of 0.50 to 0.69
E: having a contrast of 0.01 to 0.49

REFERENCE SIGNS LIST 1 glass substrate
2 TFT
3 cured film for TFT planarization
4 reflecting electrode
5a prebaked film
5b cured pattern
6 mask
7 active actinic ray
8 EL light emitting layer
9 transparent electrode
10 cured film for planarization
11 cover glass
12 glass substrate
13 BLU
14 glass substrate with BLU
15 glass substrate
16 TFT
17 cured film for TFT planarization
18 transparent electrode
19 planarization film
20 alignment layer
21a prebaked film
21b cured pattern
22 mask
23 active actinic ray
27 glass substrate with BCS
25 glass substrate with BLU and BCS
26 glass substrate
27 color filter
28 cured pattern
29 cured film for planarization
30 alignment layer
31 color filter substrate
32 glass substrate with BLU, BCS, and BM
33 liquid crystal layer
47 non-alkali glass substrate
48 first electrode
49 auxiliary electrode
50 insulation layer
51 organic EL layer
52 second electrode
53 non-alkali glass substrate
54 source electrode
55 drain electrode
56 reflecting electrode
57 oxide semiconductor layer
58 via hole
59 pixel region
60 gate insulation layer
61 gate electrode
62 TFT protective layer/pixel dividing layer
63 organic EL light emitting layer
64 transparent electrode
65 sealing film
66 non-alkali glass substrate

The invention claimed is:
1. A negative-type photosensitive resin composition comprising: an alkali-soluble resin (A); a radical-polymerizable compound (B); a photopolymerization initiator (C1); a pigment (D1); a dispersant (E); and a solvent, wherein
the radical-polymerizable compound (B) includes a flexible chain-containing radical-polymerizable compound (B1) that includes a compound having (I) a structure derived from a compound having at least three hydroxyl groups in the molecule, (II) at least three ethylenically unsaturated double bond groups, and (III) at least one aliphatic chain that has an average molecular weight of 40 to 500, and
the content of the pigment (D1) is 5 to 70 mass % of the total solid content,
the pigment (D1) includes a black pigment (D1a) that includes a black organic pigment (D1a-1) that includes one or more selected from the group consisting of a benzofuranone based black pigment (D1a-1a), a perylene based black pigment (D1a-1b), and an azo based black pigment (D1a-1c), and
the solvent includes a solvent having a carbonyl group or an ester bond and having an acetate bond,
wherein the flexible chain-containing radical-polymerizable compound (B1) has at least one lactone-modified chain and/or at least one lactam-modified chain,
wherein the flexible chain-containing radical-polymerizable compound (B1) includes a compound represented by formula (27) and/or a compound represented by formula (28):

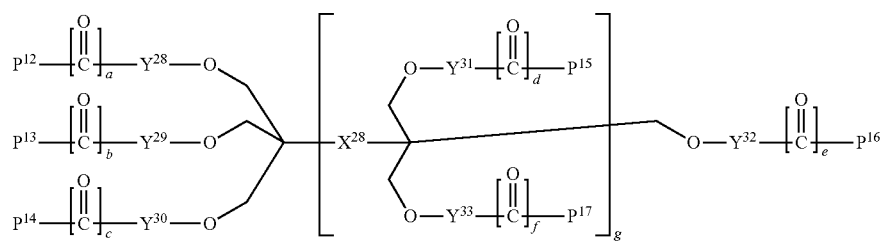

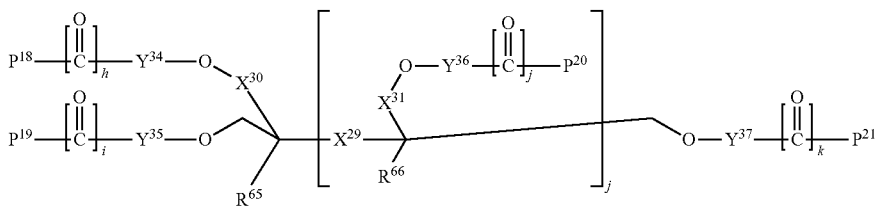

wherein, in formula (27),
$X^{28}$ is a divalent organic group;
$Y^{28}$ to $Y^{33}$ are each independently a direct bond or a group represented by formula (24), and at least one of $Y^{28}$ to $Y^{33}$ is a group represented by formula (24);
$P^{12}$ to $P^{17}$ are each independently a hydrogen atom or a group represented by formula (25), and at least three of $P^{12}$ to $P^{17}$ are groups represented by formula (25); and
a, b, c, d, e, and f are each independently one, and g is an integer of 0 to 10;
wherein, in formula (28),
$X^{29}$ is a divalent organic group;
$X^{30}$ and $X^{31}$ are each independently a direct bond or an alkylene chain containing 1 to 10 carbon atoms;
$Y^{34}$ to $Y^{37}$ are each independently a direct bond or a group represented by formula (24), and at least one of $Y^{34}$ to $Y^{37}$ is a group represented by general formula (24); $R^{65}$ and $R^{66}$ are each independently a hydrogen atom or an alkyl group containing 1 to 10 carbon atoms;
$P^{18}$ to $P^{21}$ are each independently a hydrogen atom or a group represented by formula (25), and at least three of $P^{18}$ to $P^{21}$ are groups represented by formula (25); and
h, i, j, and k are each independently one, and l is an integer of 0 to 10:

[Chemical formula 2]

(24)

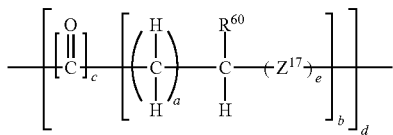

(25)

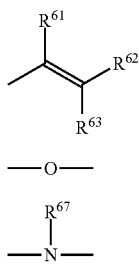

—O—   (29)

—N—   (30)
 |
 $R^{67}$ wherein, in formula (24),
$R^{60}$ is a hydrogen atom or an alkyl group containing 1 to 10 carbon atoms;
$Z^{17}$ represents a group represented by formula (29) or a group represented by formula (30); a is an integer of 1 to 10, b is an integer of 1 to 4, c is 1, d is an integer of 1 to 4, and e is 1;
wherein, in formula (25), $R^{61}$ to $R^{63}$ are each independently a hydrogen atom, an alkyl group containing 1 to 10 carbon atoms, or an aryl group containing 6 to 15 carbon atoms; and wherein, in formula (30), $R^{67}$ is a hydrogen atom or an alkyl group containing 1 to 10 carbon atoms.

2. A negative-type photosensitive resin composition as set forth in claim 1, wherein the alkali-soluble resin (A) includes a first resin (A1) that includes at least one selected from the group consisting of a polyimide (A1-1), a polyimide precursor (A1-2), polybenzoxazole (A1-3), and a polybenzoxazole precursor (A1-4).

3. A negative-type photosensitive resin composition as set forth in claim 1, wherein
the radical-polymerizable compound (B) further includes a flexible chain-containing bifunctional radical-polymerizable compound (B2) that includes a compound having (I) a structure derived from a compound having at least two hydroxyl groups in the molecule, (II) two ethylenically unsaturated double bond groups, and (III) at least one lactone-modified chain and/or lactam-modified chain, and
the average molecular weights of the lactone-modified chain and the lactam-modified chain are 40 to 500.

4. A negative-type photosensitive resin composition as set forth in claim 1, wherein the alkali-soluble resin (A) includes an alkali-soluble resin (A) that has no ethylenically unsaturated double bond group.

5. A negative-type photosensitive resin composition as set forth in claim 1, wherein the alkali-soluble resin (A) further comprises a second resin (A2) that includes one or more selected from the group consisting of polysiloxane (A2-1), polycyclic side chain-containing resin (A2-2), acrylic resin (A2-3), and acid-modified epoxy resin (A2-4).

6. A negative-type photosensitive resin composition as set forth in claim 1, wherein the black organic pigment (D1a-1) further includes a covering layer (DC) that includes one or more selected from the group consisting of a silica covering layer (DC-1), a metal oxide covering layer (DC-2), and a metal hydroxide covering layer (DC-3).

7. A cured film formed by curing a negative-type photosensitive resin composition as set forth in claim 1.

8. A cured film as set forth in claim 7, wherein the optical density per micrometer of film thickness is 0.3 to 5.0.

9. An element comprising the cured film as set forth in either claim 7.

10. A display device comprising the cured film as set forth in either claim 7.

11. A display device as set forth in claim 10, wherein an aperture ratio of an opening of a pixel dividing layer in a display area is 20% or less.

12. A display device as set forth in claim 10 in the form of an organic EL display device or a liquid crystal display device.

13. A production method for the display device as set forth in claim 10, comprising:
(1) a step for forming a coating film of the negative-type photosensitive resin composition on a substrate;
(2) a step for applying active actinic ray to the coating film of the negative-type photosensitive resin composition through a photomask;
(3) a step for developing it with an alkaline solution to form a pattern of the negative-type photosensitive resin composition; and
(4) a step for heating the pattern to produce a cured pattern of the negative-type photosensitive resin composition.

14. A negative-type photosensitive resin composition as set forth in claim 1, wherein the dispersant (E) includes a dispersant having only an amine value, a dispersant having both an amine value and an acid value, or a dispersant having a structure in which the amino group and/or the acidic group form a salt with an acid and/or a base.

15. A negative-type photosensitive resin composition as set forth in claim 1, wherein the solvent having a carbonyl group or an ester bond accounts for 30 to 100 mass % of the total solvent quantity.

16. A negative-type photosensitive resin composition as set forth in claim 2, wherein the first resin (A1) contains a structural unit having a fluorine atom and is one or more selected from the group consisting of the polyimide (A1-1), the polyimide precursor (A1-2), the polybenzoxazole (A1-3), and the polybenzoxazole precursor (A1-4).

17. A negative-type photosensitive resin composition comprising: an alkali-soluble resin (A); a radical-polymerizable compound (B); a photopolymerization initiator (C1); a pigment (D1); a dispersant (E); and a solvent, wherein
the radical-polymerizable compound (B) includes a flexible chain-containing radical-polymerizable compound (B1) that includes a compound having (I) a structure derived from a compound having at least three hydroxyl groups in the molecule, (II) at least three ethylenically unsaturated double bond groups, and (III) at least one aliphatic chain that has an average molecular weight of 40 to 500,
the content of the pigment (D1) is 5 to 70 mass % of the total solid content,
the pigment (D1) includes a black pigment (D1a),
the dispersant (E) includes a dispersant having only an amine value, a dispersant having both an amine value and an acid value, or a dispersant having a structure in which the amino group and/or the acidic group form a salt with an acid and/or a base, and
the solvent includes a solvent having a carbonyl group or an ester bond and having an acetate bond, wherein
the solvent having a carbonyl group or an ester bond accounts for 30 to 100 mass % of the total solvent quantity,
wherein the flexible chain-containing radical-polymerizable compound (B1) has at least one lactone-modified chain and/or at least one lactam-modified chain,
wherein the flexible chain-containing radical-polymerizable compound (B1) includes a compound represented by formula (27) and/or a compound represented by formula (28):

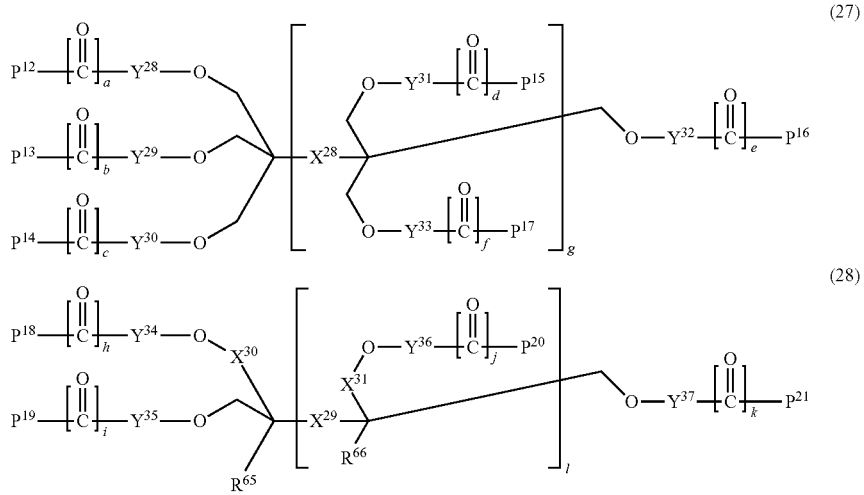

wherein, in formula (27), $X^{28}$ is a divalent organic group;

$Y^{28}$ to $Y^{33}$ are each independently a direct bond or a group represented by formula (24), and at least one of $Y^{28}$ to $Y^{33}$ is a group represented by formula (24);

$P^{12}$ to $P^{17}$ are each independently a hydrogen atom or a group represented by formula (25), and at least three of $P^{12}$ to $P^{17}$ are groups represented by formula (25); and a, b, c, d, e, and f are each independently one, and g is an integer of 0 to 10;

wherein, in formula (28), $X^{29}$ is a divalent organic group;

$X^{30}$ and X' are each independently a direct bond or an alkylene chain containing 1 to 10 carbon atoms;

$Y^{34}$ to $Y^{37}$ are each independently a direct bond or a group represented by formula (24), and at least one of $Y^{34}$ to $Y^{37}$ is a group represented by formula (24);

$R^{65}$ and $R^{66}$ are each independently a hydrogen atom or an alkyl group containing 1 to 10 carbon atoms;

$P^{18}$ to $P^{21}$ are each independently a hydrogen atom or a group represented by formula (25), and at least three of $P^{18}$ to $P^{21}$ are groups represented by formula (25); and h, i, j, and k are each independently one, and l is an integer of 0 to 10:

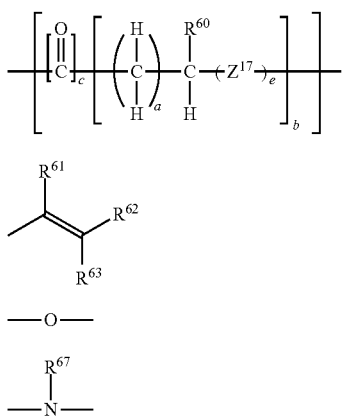

(24)

(25)

(29)

(30)

wherein, in formula (24),
R$^{60}$ is a hydrogen atom or an alkyl group containing 1 to 10 carbon atoms;
Z$^{17}$ represents a group represented by formula (29) or a group represented by formula (30);
a is an integer of 1 to 10, b is an integer of 1 to 4, c is 1, d is an integer of 1 to 4, and e is 1;
wherein, in formula (25), R$^{61}$ to R$^{63}$ are each independently a hydrogen atom, an alkyl group containing 1 to 10 carbon atoms, or an aryl group containing 6 to 15 carbon atoms; and
wherein, in formula (30), R$^{67}$ is a hydrogen atom or an alkyl group containing 1 to 10 carbon atoms.

18. A negative-type photosensitive resin composition comprising: an alkali-soluble resin (A); a radical-polymerizable compound (B); a photopolymerization initiator (C1); and a pigment (D1), wherein the radical-polymerizable compound (B) includes a flexible chain-containing radical-polymerizable compound (B1) that includes a compound having (I) a structure derived from a compound having at least three hydroxyl groups in the molecule, (II) at least three ethylenically unsaturated double bond groups, and (III) at least one aliphatic chain that has an average molecular weight of 40 to 500, the content of the pigment (D1) is 5 to 70 mass % of the total solid content, the pigment (D1) includes a black pigment (D1a) that includes a black organic pigment (D1a-1) that includes one or more selected from the group consisting of a benzofuranone based black pigment (D1a-1a), a perylene based black pigment (D1a-1b), and an azo based black pigment (D1a-1c), and the black organic pigment (D1a-1) further includes a covering layer (DC) that includes one or more selected from the group consisting of a silica covering layer (DC-1), a metal oxide covering layer (DC-2), and a metal hydroxide covering layer (DC-3).

19. A negative-type photosensitive resin composition as set forth in claim 1, wherein a black organic pigment (D1a-1) includes one or more selected from the group consisting of a benzofuranone based black pigment (D1a-1a), and an azo based black pigment (D1a-1c).

20. A negative-type photosensitive resin composition as set forth in claim 17, wherein the alkali-soluble resin (A) includes a first resin (A1) that includes at least one selected from the group consisting of a polyimide (A1-1), a polyimide precursor (A1-2), polybenzoxazole (A1-3), and a polybenzoxazole precursor (A1-4).

\* \* \* \* \*